United States Patent
Hirano

(10) Patent No.: US 10,928,727 B2
(45) Date of Patent: Feb. 23, 2021

(54) ACTINIC RAY-SENSITIVE OR RADIATION-SENSITIVE RESIN COMPOSITION, ACTINIC RAY-SENSITIVE OR RADIATION-SENSITIVE FILM, MASK BLANK INCLUDING ACTINIC RAY-SENSITIVE OR RADIATION-SENSITIVE FILM, PATTERN FORMING METHOD, AND METHOD FOR MANUFACTURING

(71) Applicant: FUJIFILM Corporation, Tokyo (JP)

(72) Inventor: Shuji Hirano, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 105 days.

(21) Appl. No.: 15/856,064

(22) Filed: Dec. 28, 2017

(65) Prior Publication Data

US 2018/0120701 A1    May 3, 2018

Related U.S. Application Data

(63) Continuation of application No. PCT/JP2016/066801, filed on Jun. 6, 2016.

(30) Foreign Application Priority Data

Jun. 30, 2015  (JP) .............................. JP2015-132082

(51) Int. Cl.
| | |
|---|---|
| G03F 7/038 | (2006.01) |
| G03F 7/075 | (2006.01) |
| G03F 1/50 | (2012.01) |
| C09D 125/18 | (2006.01) |
| G03F 7/004 | (2006.01) |
| G03F 7/20 | (2006.01) |
| G03F 7/00 | (2006.01) |
| G03F 7/16 | (2006.01) |
| G03F 7/32 | (2006.01) |
| C08F 12/24 | (2006.01) |
| C08F 212/14 | (2006.01) |
| C08F 112/14 | (2006.01) |
| C08F 222/10 | (2006.01) |
| C08F 220/28 | (2006.01) |
| C08F 220/30 | (2006.01) |
| C08F 220/24 | (2006.01) |

(52) U.S. Cl.
CPC .............. *G03F 7/038* (2013.01); *C08F 12/24* (2013.01); *C09D 125/18* (2013.01); *G03F 1/50* (2013.01); *G03F 7/0046* (2013.01); *G03F 7/0382* (2013.01); *G03F 7/075* (2013.01); *G03F 7/0758* (2013.01); *G03F 7/20* (2013.01); *C08F 112/14* (2013.01); *C08F 212/14* (2013.01); *C08F 220/24* (2013.01); *C08F 220/281* (2020.02); *C08F 220/282* (2020.02); *C08F 220/283* (2020.02); *C08F 220/301* (2020.02); *C08F 220/302* (2020.02); *C08F 220/303* (2020.02); *C08F 222/10* (2013.01); *C08F 222/102* (2020.02); *G03F 7/0002* (2013.01); *G03F 7/0757* (2013.01); *G03F 7/16* (2013.01); *G03F 7/322* (2013.01)

(58) Field of Classification Search
CPC . G03F 7/038; G03F 1/50; G03F 7/075; G03F 7/0382; G03F 7/004; G03F 7/20; G03F 7/0758; G03F 7/0757; G03F 7/16; G03F 7/322

See application file for complete search history.

(56) References Cited

U.S. PATENT DOCUMENTS

| | | | |
|---|---|---|---|
| 6,159,653 A  * | 12/2000 | Malik et al. ......... | G03F 7/0045 430/270.1 |
| 8,404,426 B2 | 3/2013 | Abe et al. | |
| 8,771,921 B2 | 7/2014 | Sho et al. | |
| 10,444,627 B2 | 10/2019 | Takizawa et al. | |
| 2015/0309408 A1 | 10/2015 | Tsuchimura et al. | |
| 2015/0338736 A1 | 11/2015 | Kawabata et al. | |
| 2016/0209747 A1 | 7/2016 | Yamaguchi | |

FOREIGN PATENT DOCUMENTS

| | | | | |
|---|---|---|---|---|
| JP | 2008181107 | 8/2008 | | |
| JP | 2012-108499 | 6/2012 | | |
| JP | 5172505 | 3/2013 | | |
| JP | 2014-126767 | 7/2014 | | |
| JP | 2014-134686 | 7/2014 | | |
| JP | 2015-028576 | 2/2015 | | |
| JP | 2015-068860 | 4/2015 | | |
| JP | 2015108847 | 6/2015 | | |
| JP | 2015-147925 | 8/2015 | | |
| TW | 201510048 | 3/2015 | | |
| WO | WO-2011149035 A1 * | 12/2011 | .......... | G03F 7/0045 |

OTHER PUBLICATIONS

English translation of JP 2015-068860 A (2015), from machine translation from AIPN Japan Patent Office National Center for Industrial Property Information and Training, generated Apr. 12, 2019, 187 pages. (Year: 2015).*
English translation of JP 2015-147925 A (2015), from machine translation J-PLATPat [JPP] generated Jul. 2-19, 2014, 102 pages, Japanese document published Aug. 20, 2015. (Year: 2015).*
English translation of JP JP 2008/181107 A as obtained from J-PlatPat [JPP] 103 pages (description only) machine generated from description of JP application 2007-326118 on Jan. 13, 2020. (Year: 2020).*
English translation of JP 2008-181107 A Description only from Japan Platform for Patent Information , from the filed application thereof (Patents Application 2007-326118) downloaded Jan. 13, 2020, 103 pages. (Year: 2008).*

(Continued)

*Primary Examiner* — Cynthia Hamilton
(74) *Attorney, Agent, or Firm* — JCIPRNET

(57) ABSTRACT

According to the present invention, an actinic ray-sensitive or radiation-sensitive resin composition including a compound (A) whose dissolution rate in an alkali developer decreases by the action of an acid, a hydrophobic resin (B), and a resin (C) having an aromatic ring, as well as a film, a mask blank, a pattern forming method, and a method for manufacturing an electronic device, each using the composition, are provided.

13 Claims, No Drawings

(56) References Cited

OTHER PUBLICATIONS

"Office Action of Korea Counterpart Application," dated Feb. 1, 2019, with English translation thereof, p. 1-p. 12.
"Office Action of Japan Counterpart Application," dated Mar. 5, 2019, with English translation thereof, p. 1-p. 5.
"International Search Report (Form PCT/ISA/210) of PCT/JP2016/066801," dated Aug. 23, 2016, with English translation thereof, pp. 1-5.
"Written Opinion of the International Searching Authority (Form PCT/ISA/237) of PCT/JP2016/066801," dated Aug. 23, 2016, with English translation thereof, pp. 1-12.
"Office Action of Japan Counterpart Application", dated Sep. 11, 2018, with English translation thereof, p. 1-p. 6.
"Office Action of Korea Counterpart Application", dated Aug. 8, 2019, with English translation thereof, pp. 1-16.
"Office Action of Japan Counterpart Application," with English translation thereof, dated Dec. 17, 2019, p. 1-p. 5.
Office Action of Taiwan Counterpart Application, with English translation thereof, dated Jan. 17, 2020, pp. 1-16.
"Office Action of Korea Counterpart Application", dated Apr. 10, 2020, with English translation thereof, p. 1-p. 8.

\* cited by examiner

ACTINIC RAY-SENSITIVE OR RADIATION-SENSITIVE RESIN COMPOSITION, ACTINIC RAY-SENSITIVE OR RADIATION-SENSITIVE FILM, MASK BLANK INCLUDING ACTINIC RAY-SENSITIVE OR RADIATION-SENSITIVE FILM, PATTERN FORMING METHOD, AND METHOD FOR MANUFACTURING

CROSS REFERENCE TO RELATED APPLICATIONS

This is a continuation of International Application No. PCT/JP2016/066801 filed on Jun. 6, 2016, and claims priority from Japanese Patent Application filed on Jun. 30, 2015 (Japanese Patent Application No. 2015-132082), the entire disclosures of which are incorporated herein by reference.

BACKGROUND OF THE INVENTION

1. Field of the Invention

The present invention relates to an actinic ray-sensitive or radiation-sensitive resin composition which is suitably used in an ultramicrolithographic process which is applicable to a process for manufacturing an ultra-large scale integrated circuit (LSI) and high-capacity microchip, a process for manufacturing a mold for nanoimprints, a process for manufacturing a high-density information recording medium, and the like, and to other photofabrication processes, as well as an actinic ray-sensitive or radiation-sensitive film, a mask blank including the actinic ray-sensitive or radiation-sensitive film, a pattern forming method, and a method for manufacturing an electronic device. More specifically, the present invention relates to an actinic ray-sensitive or radiation-sensitive resin composition which can be suitably used for microfabrication of a semiconductor device using electron beams, X-rays, or extreme ultraviolet (EUV) light, as well as an actinic ray-sensitive or radiation-sensitive film, a mask blank including the actinic ray-sensitive or radiation-sensitive film, a pattern forming method, and a method for manufacturing an electronic device.

2. Description of the Related Art

In microfabrication using a resist composition, formation of an ultrafine pattern has been required due to an increased integration degree of an integrated circuit. Accordingly, there is a tendency that the exposure wavelength becomes shorter, such as from a g line and an i line to KrF laser light or ArF laser light. More recently, lithographic technology using electron beams, X-rays, or EUV light instead of excimer laser light has been under development.

However, from the viewpoint of overall performance for a resist composition, it remains very difficult to find a suitable combination of a resin, a photoacid generator, a basic compound, an additive, a solvent, and the like to be used. In particular, in consideration of a recent demand for formation of an ultrafine pattern (for example, a pattern having a line width of 50 nm or less) with high performance, it cannot be said yet that the lithographic technology is enough.

In the formation of a negative tone resist pattern, typically, even in a case of providing an unexposed area intended to be removed by a developer and an exposed area not intended to be removed by a developer on a resist film when performing exposure, a region within the unexposed area being adjacent to the exposed area is subjected to an exposure of even a low exposure dose (hereinafter, this region is referred to as a weakly exposed area). Therefore, even a weakly exposed area becomes insoluble or poorly-soluble in a developer, which leads to generation of scum between patterns formed by the development.

In the field of electron beam (EB) lithography, it can be seen that the influence of electron scattering, that is, forward scattering in a resist film is reduced by increasing the acceleration voltage of an EB. Accordingly, there has recently been a tendency to increase the acceleration voltage of an EB. However, if the acceleration voltage of an EB increases, the influence of forward scattering is reduced, whereas the influence of scattering of electrons reflected in a resist substrate, that is, backward scattering increases. In addition, in a case of forming an isolated space pattern having a large exposure area, the influence of backward scattering is particularly significant. Thus, for example, there is a possibility that an increase in the acceleration voltage of an EB results in the generation of scum between isolated space patterns.

Particularly, in a case of patterning on a photomask blank for use in semiconductor exposure, a light-shielding film containing heavy atoms, such as chromium, molybdenum, and tantalum is present in the underlayer of a resist film, and thus, the influence of backward scattering due to reflection from the resist underlayer is more significant, as compared with a case of applying a resist onto a silicon wafer. As a result, in a case of forming an isolated space pattern on a photomask blank, the pattern is particularly susceptible to the influence of backward scattering, and the resolution thereof is highly likely to decrease. On the other hand, in extreme ultraviolet (EUV) lithography, there is a possibility of generating scum between patterns due to the flare light generated by the surface topology and a phase difference of a reflection mirror constituting an optical system of an exposure apparatus, and the unintended light of different wavelengths (Out of Band light: OoB light) from that of EUV light, which is generated due to the reflection mirror also exhibiting a certain degree of reflection characteristics with respect to light having wavelengths different from an exposure wavelength of EUV light (typically 13.5 nm).

Moreover, microfabrication with a resist composition is not only used directly in the manufacture of integrated circuits but has also recently been applied to a case of manufacturing an EL element of a display device, or the like by an ink jet method or the like, with a patterned resist composition being used as a partition wall. For example, JP2012-108499A describes that a pattern having excellent liquid repellency and heat resistance can be formed by incorporating a specific fluorine-based liquid repellent into a resist composition to be processed for a partition wall.

In addition, various polar conversion negative tone resist compositions have been proposed as a resist composition. For example, a negative tone resist composition including an alkali soluble resin component containing a base dissociating group, an acid generator component, and a crosslinking agent component has been proposed (JP5172505B).

SUMMARY OF THE INVENTION

However, according to JP2012-108499A, it has been an important object to satisfy resist performance such as high resolution and good roughness characteristics, in particular, even in a case of forming an ultrafine pattern (for example, a pattern having a line width of 50 nm or less) using X-rays, soft X-rays, or electron beams as an exposure light source, and there has been a demand for accomplishing such the object.

In addition, according to JP5172505B, it has also been an object to obtain a resist pattern having a good shape by suppressing generation of scum, but it is difficult to satisfy various characteristics such as collapse performance of patterns, and suppressed generation of scum at high levels.

Taking this circumstance into consideration, it is an object of the present invention to provide an actinic ray-sensitive or radiation-sensitive resin composition capable of forming a pattern which has excellent sensitivity, resolution, and collapse performance, suppressed generation of scum, and excellent line edge roughness performance, in particular, in the formation of an ultrafine pattern (for example, a pattern having a line width of 50 nm or less), as well as an actinic ray-sensitive or radiation-sensitive film, a mask blank having the actinic ray-sensitive or radiation-sensitive film, a pattern forming method, a method for manufacturing an electronic device, including the pattern forming method, and an electronic device, each using the actinic ray-sensitive or radiation-sensitive resin composition.

The present inventors have presumed that scum generated during formation of a pattern using a resist composition including a resin having an aromatic ring and a crosslinking agent is due to sparingly soluble materials formed on the surface of the pattern. Further, they have found that by adding a resin (B) having a specific hydrophobic group and exhibiting uneven distribution on a surface to the resist composition, formation of the sparingly soluble materials is suppressed, and thus, scum is dramatically reduced. As a result, it is considered that generation of scum could be suppressed while maintaining various characteristics such as collapse performance of the pattern.

That is, the present inventors have found that the above-mentioned objects can be achieved by the following means.

<1>

An actinic ray-sensitive or radiation-sensitive resin composition comprising:

a compound (A) whose dissolution rate in an alkali developer decreases by the action of an acid;

a resin (B) including a repeating unit having one or more groups selected from the group consisting of a fluorine atom, a group having a fluorine atom, a group having a silicon atom, an alkyl group having 6 or more carbon atoms, a cycloalkyl group having 5 or more carbon atoms, an aryl group having 6 or more carbon atoms, and an aralkyl group having 7 or more carbon atoms; and a resin (C) having an aromatic ring, different from the resin (B).

<2>

The actinic ray-sensitive or radiation-sensitive resin composition as described in <1>, in which the resin (B) further includes a repeating unit having a group which decomposes by the action of an acid.

<3>

The actinic ray-sensitive or radiation-sensitive resin composition as described in <1> or <2>, in which the resin (C) is a resin having a repeating unit represented by General Formula (30).

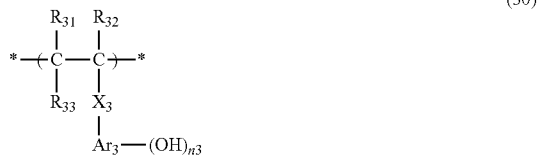

In General Formula (30), $R_{31}$, $R_{32}$, and $R_{33}$ each independently represent a hydrogen atom, an alkyl group, a cycloalkyl group, a halogen atom, a cyano group, or an alkoxycarbonyl group. $R_{33}$ may be bonded to $Ar_3$ to form a ring, and in this case, $R_{33}$ represents an alkylene group.

$X_3$ represents a single bond or a divalent linking group.

$Ar_3$ represents an (n3+1)-valent aromatic ring group, and in a case where $Ar_3$ is bonded to $R_{33}$ to form a ring, $Ar_3$ represents an (n3+2)-valent aromatic ring group.

n3 represents an integer of 1 to 4.

<4>

The actinic ray-sensitive or radiation-sensitive resin composition as described in any one of <1> to <3>, in which the compound (A) is a phenol derivative.

<5>

The actinic ray-sensitive or radiation-sensitive resin composition as described in any one of <1> to <4>, in which the compound (A) has a structure represented by General Formula (1).

In General Formula (1), $R_1$ to $R_6$ each independently represent a hydrogen atom, an organic group having 1 to 50 carbon atoms, or a bonding moiety to a linking group or a single bond represented by L in General Formula (3), provided that at least one of $R_2$, . . . , or $R_6$ is a structure represented by General Formula (2).

In General Formula (2), $R_7$ represents a hydrogen atom or an organic group having 1 to 30 carbon atoms, and * represents a bonding moiety in any one of $R_2$ to $R_6$.

In General Formula (3), L represents a linking group or a single bond, * represents a bonding moiety in any one of $R_1$ to $R_6$, and k represents an integer of 2 to 5.

<6>

The actinic ray-sensitive or radiation-sensitive resin composition as described in any one of <1> to <5>, in which the resin (B) contains at least one of a repeating unit represented by General Formula (A1) or a repeating unit represented by General Formula (A2).

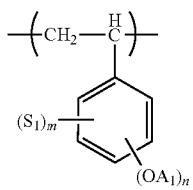
(A1)

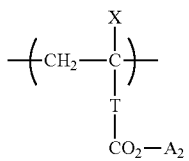
(A2)

In General Formula (A1), n represents an integer of 1 to 5, and m represents an integer of 0 to 4, satisfying the relationship of $1 \leq m+n \leq 5$.

$S_1$ represents a substituent, and in a case where m is 2 or more, a plurality of $S_1$'s may be the same as or different from each other.

$A_1$ represents a hydrogen atom or a group which leaves by the action of an acid, provided that at least one of $A_1$'s represents a group which leaves by the action of an acid. In a case of $n \geq 2$, a plurality of $A_1$'s may be the same as or different from each other.

In General Formula (A2),

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxy group, an alkyloxycarbonyl group, an alkylcarbonyloxy group, or an aralkyl group.

T represents a single bond or a divalent linking group.

$A_2$ represents a group which leaves by the action of an acid.

<7>

The actinic ray-sensitive or radiation-sensitive resin composition as described in any one of <1> to <6>, further comprising a compound which generates an acid upon irradiation with actinic rays or radiation.

<8>

The actinic ray-sensitive or radiation-sensitive resin composition as described in <7>, in which the compound which generates an acid upon irradiation with actinic rays or radiation is a sulfonium salt.

<9>

The actinic ray-sensitive or radiation-sensitive resin composition as described in any one of <1> to <8>, further comprising a basic compound whose basicity decreases upon irradiation with actinic rays or radiation, or an ammonium salt compound.

<10>

An actinic ray-sensitive or radiation-sensitive film formed using the actinic ray-sensitive or radiation-sensitive resin composition as described in any one of <1> to <9>.

<11>

A mask blank comprising the actinic ray-sensitive or radiation-sensitive film as described in <10>.

<12>

A pattern forming method comprising:

a step of applying the actinic ray-sensitive or radiation-sensitive resin composition as described in any one of <1> to <9> onto a substrate to form a film;

a step of exposing the film; and a step of developing the exposed film to form a negative tone pattern.

<13>

The pattern forming method as described in <12>, in which the step of exposing the film is a step of exposing the film using electron beams or extreme ultraviolet rays.

<14>

A method for manufacturing an electronic device, comprising the pattern forming method as described in <12> or <13>.

According to the present invention, it is possible to provide an actinic ray-sensitive or radiation-sensitive resin composition capable of forming a pattern having excellent sensitivity, resolution, and collapse performance, suppressed generation of scum, and excellent line edge roughness performance in the formation of an ultrafine pattern (for example, a pattern having a line width of 50 nm or less), as well as an actinic ray-sensitive or radiation-sensitive film, a mask blank having the actinic ray-sensitive or radiation-sensitive film, a pattern forming method, a method for manufacturing an electronic device, including the pattern forming method, and an electronic device, each using the actinic ray-sensitive or radiation-sensitive resin composition.

DESCRIPTION OF THE PREFERRED EMBODIMENTS

In citations for a group (atomic group) in the present specification, a description not referring to substitution or non-substitution includes both a group having no substituent and a group having a substituent. For example, an "alkyl group" includes not only an alkyl group having no substituent (an unsubstituted alkyl group) but also an alkyl group having a substituent (a substituted alkyl group).

Furthermore, "actinic rays" or "radiation" as used herein means, for example, a bright line spectrum of a mercury lamp, far ultraviolet rays represented by an excimer laser, extreme ultraviolet rays (EUV light), X-rays, electron beams (EB), or the like. In addition, in the present invention, light means actinic rays or radiation.

In addition, unless otherwise specified, "exposure" as used herein includes not only exposure by a mercury lamp, far ultraviolet rays represented by an excimer laser, extreme ultraviolet rays (EUV light), X-rays, or the like, but also writing by particle rays such as electron beams and ion beams.

In the present specification, the weight-average molecular weight of a resin is a value in terms of polystyrene, measured by a GPC method. GPC can be carried out in accordance with a method using TSK gel Multipore HXL-M (manufactured by Tosoh Corporation, 7.8 mmIDx30.0 cm) as a column and tetrahydrofuran (THF) as an eluent, using HLC-8120 (manufactured by Tosoh Corporation).

The radiation-sensitive or actinic ray-sensitive resin composition of the present invention is typically a resist composition, and preferably a negative tone resist composition. Further, the radiation-sensitive or actinic ray-sensitive resin composition of the present invention is typically a chemical amplification type resist composition. The radiation-sensitive or actinic ray-sensitive resin composition of the present invention is preferably a chemical amplification type and negative tone resist composition.

The radiation-sensitive or actinic ray-sensitive resin composition of the present invention is preferably for exposure with electron beams or extreme ultraviolet rays.

Hereinafter, embodiments of the present invention will be described in detail.

The actinic ray-sensitive or radiation-sensitive resin composition of the present invention (also referred to as "the composition of the present invention") is an actinic ray-sensitive or radiation-sensitive resin composition including a compound (A) whose dissolution rate in an alkali developer decreases by the action of an acid, a resin (B) including a repeating unit having one or more groups selected from the group consisting of a fluorine atom, a group having a fluorine atom, a group having a silicon atom, an alkyl group having 6 or more carbon atoms, a cycloalkyl group having 5 or more carbon atoms, an aryl group having 6 or more carbon atoms, and an aralkyl group having 7 or more carbon atoms, and a resin (C) having an aromatic ring, different from the resin (B).

[Compound (A) Whose Dissolution Rate in Alkali Developer Decreases by Action of Acid]

The actinic ray-sensitive or radiation-sensitive resin composition of the present invention includes a compound (A) whose dissolution rate in an alkali developer decreases by the action of an acid (also referred to a "compound (A)").

The compound (A) may be either a high-molecular-weight compound or a low-molecular-weight compound.

From the viewpoints of reactivity and developability, it is preferable that the compound (A) is a phenol derivative.

[N-A] Resin Whose Dissolution Rate in Alkali Developer Decreases by Action of Acid The resin whose dissolution rate in an alkali developer decreases by the action of an acid (also referred to as a "resin [N-A]") is not particularly limited, but is preferably a resin whose dissolution rate in an alkali developer decreases by the action of an acid, and is generated from an acid generator which will be described later.

Examples of the resin [N-A] includes a resin having a group which is polymerized by the action of an acid or an active species, and is preferably a resin having at least one of the following repeating unit represented by General Formula (L-1) or the following repeating unit represented by General Formula (L-2).

As the resin having the repeating unit represented by General Formula (L-1), the compounds described in [0030] to [0047] of JP2012-242556A can be suitably used, and as the resin having the repeating unit represented by General Formula (L-2), the compounds described in [0044] to [0048] of JP2014-24999A and [0020] to [0031] of JP2013-164588A can be suitably used.

In the present invention, at least one of a repeating unit represented by General Formula (L-1) or a repeating unit represented by General Formula (L-2) may be included in a part of the resin (C) which will be described later or may also be included in a resin other than the resin (C).

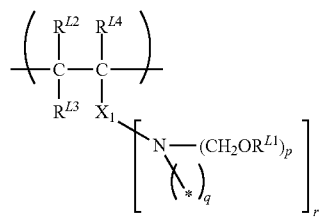

(L-1)

$R^{L1}$ represents a hydrogen atom, an alkyl group, or a cycloalkyl group. p represents 1 or 2. q represents an integer represented by (2-p). * represents a bonding arm to another atom constituting the repeating unit (L-1). In a case where p is 2, or r is 2 or more, a plurality of $R^{L1}$'s may be the same as or different from each other. $R^{L2}$, $R^{L3}$, and $R^{L4}$ each independently represent a hydrogen atom, an alkyl group, a cycloalkyl group, a halogen atom, a cyano group, or an alkoxycarbonyl group. $X_1$ represents a single bond, or a r+1-valent group a linear or branched hydrocarbon group selected from the group consisting of a cyclic hydrocarbon group which may contain a heteroatom as a ring member, —O—, —S—, —CO—, —SO$_2$—, —NR—, and a group formed by combination thereof. R represents a hydrogen atom, an alkyl group, or a group represented by —CH$_2$OR$^{L1}$. Further, $R^{L1}$ in the group represented by —CH$_2$OR$^{L1}$ has the same definition as $R^{L1}$. r represents an integer of 1 to 5, provided that in a case where $X_1$ is a single bond, r is 1.

The alkyl group in $R^{L1}$ may be either linear or branched, and examples thereof include an alkyl group having 1 to 20 carbon atoms (for example, a methyl group, an ethyl group, a propyl group, an isopropyl group, a butyl group, an isobutyl group, a t-butyl group, an n-pentyl group, an n-hexyl group, an n-octyl group, and an n-dodecyl group). The alkyl group is preferably an alkyl group having 1 to 8 carbon atoms, more preferably an alkyl group having 1 to 6 carbon atoms, and particularly preferably an alkyl group having 1 to 4 carbon atoms.

The cycloalkyl group in $R^{L1}$ may be either monocyclic or polycyclic, and examples thereof include a cycloalkyl group having 3 to 17 carbon atoms (for example, a cyclopentyl group, a cyclohexyl group, a norbornanyl group, and an adamantyl group). The cycloalkyl group is preferably a cycloalkyl group having 5 to 12 carbon atoms, more preferably a cycloalkyl group having 5 to 10 carbon atoms, and particularly preferably a cycloalkyl group having 5 or 6 carbon atoms.

As $R^{L1}$ in General Formula (L-1), a hydrogen atom or an alkyl group having 1 to 8 carbon atoms is preferable, a hydrogen atom or an alkyl group having 1 to 6 carbon atoms is more preferable, and a hydrogen atom or an alkyl group having 1 to 4 carbon atoms is particularly preferable.

$R^{L2}$, $R^{L3}$, and $R^{L4}$ each independently represent a hydrogen atom, an alkyl group, a cycloalkyl group, a halogen atom, a cyano group, or an alkoxycarbonyl group.

$X_1$ represents a single bond, or an (r+1)-valent group selected from the group consisting of a linear or branched hydrocarbon group, a cyclic hydrocarbon group which may contain a heteroatom as a ring member, —O—, —S—, —CO—, —SO$_2$—, —NR— (R is a hydrogen atom, an alkyl group, or a group represented by —CH$_2$OR$^{L1}$), or a group formed by combination thereof. Further, $R^{L1}$ in the group represented by —CH$_2$OR$^{L1}$ has the same definition as $R^{L1}$ in General Formula (L-1).

r represents an integer of 1 to 5, provided that in a case where $X_1$ is a single bond, r is 1.

Specific examples of the repeating unit represented by General Formula (L-1) are shown below, but are not limited thereto. R represents a hydrogen atom or a methyl group.

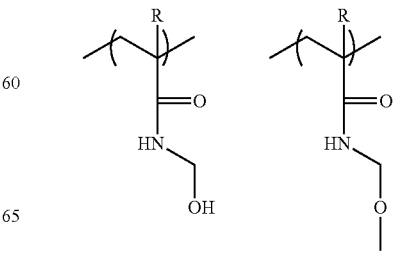

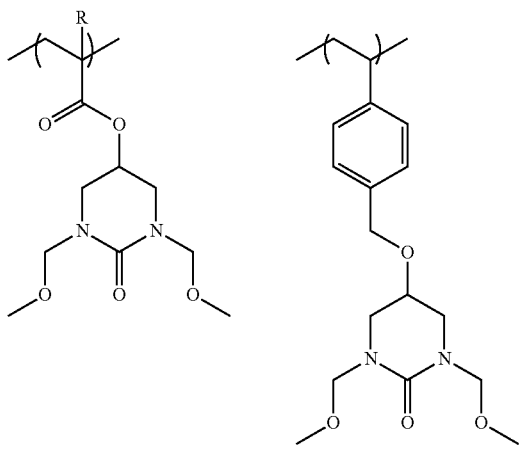

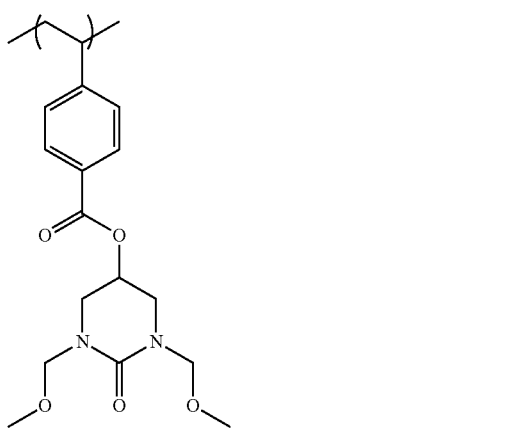

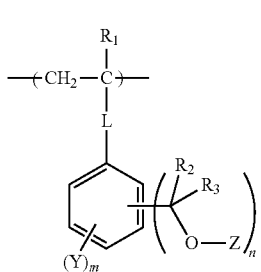

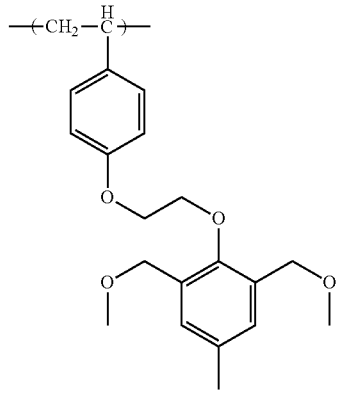

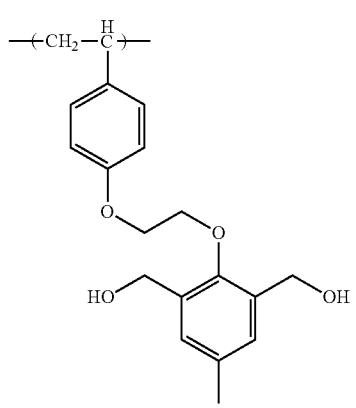

(L-2)

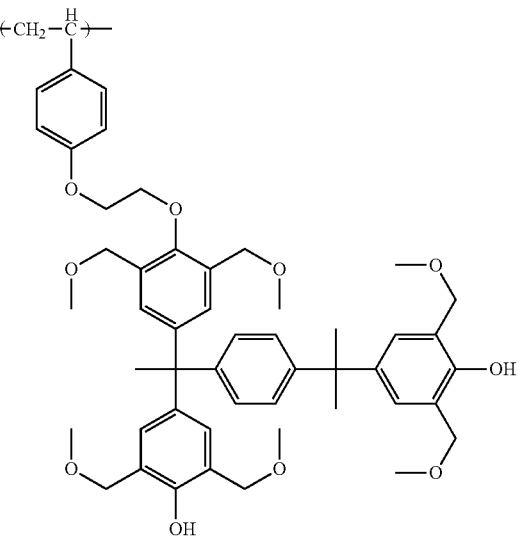

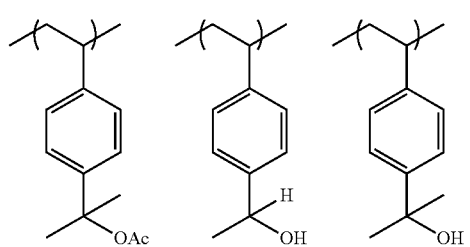

In General Formula (L-2), $R_1$ represents a hydrogen atom, a methyl group, or a halogen atom; $R_2$ and $R_3$ each independently represent a hydrogen atom, an alkyl group, or a cycloalkyl group; L represents a divalent linking group or a single bond; Y represents a monovalent substituent excluding a methylol group; Z represents a hydrogen atom or a monovalent substituent; m represents an integer of 0 to 4; n represents an integer of 1 to 5; m+n is 5 or less; in a case where m is 2 or more, a plurality of Y's may be the same as or different from each other, a plurality of Y's may be bonded to each other to form a ring structure; in a case where n is 2 or more, a plurality of $R_2$'s, $R_3$'s, and Z's, may be the same as or different from each other.

L preferably contains a divalent aromatic ring group or a linking group represented by —COO—.

Specific examples of the repeating unit represented by General Formula (L-2) are shown below, but are not limited thereto. Ac represents an acetyl group and Me represents a methyl group.

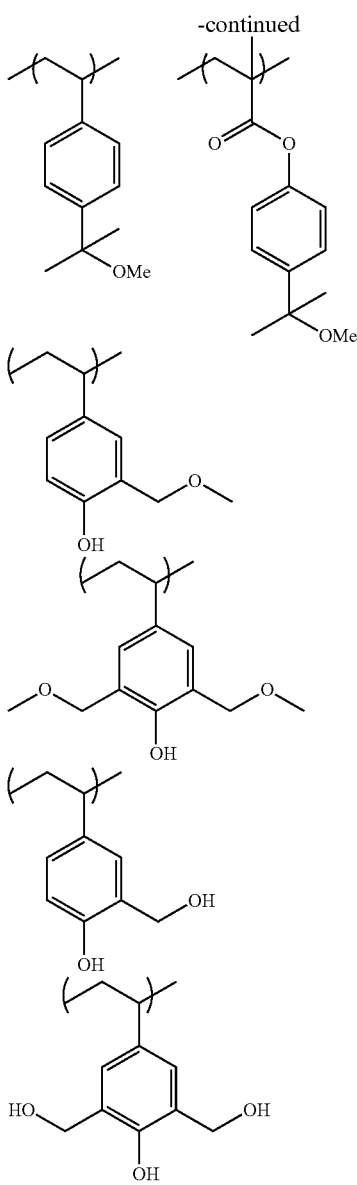

Furthermore, the resin [N-A] may include a repeating unit having an epoxy structure or an oxetane structure, and specifically, paragraphs [0076] to [0080] of JP2013-122569A can be incorporated herein by reference, the contents of which are incorporated in the present specification.

In a case of forming a negative tone image (that is, a case where the actinic ray-sensitive or radiation-sensitive resin composition is a negative tone actinic ray-sensitive or radiation-sensitive resin composition), the content of the repeating unit represented by General Formula (L-1) and the repeating unit represented by General Formula (L-2) is preferably 5% to 50% by mole, and more preferably 10% to 40% by mole, with respect to all the repeating units included in the resin [N-A].

The resin [N-A] may contain other repeating units, in addition to the repeating unit represented by General Formula (L-1) and the repeating unit represented by General Formula (L-2), and may also contain, for example, the repeating units mentioned with regard to the resin (C) which will be described later.

The resin [N-A] can be synthesized by a known radical polymerization method, an anion polymerization method, or a living radical polymerization method (an iniferter method or the like). For example, in the anion polymerization method, vinyl monomers can be dissolved in an appropriate organic solvent and reacted using a metal compound (butyl-lithium or the like) as an initiator, usually under cooling conditions, thereby obtaining a polymer.

The weight-average molecular weight of the resin [N-A] is preferably 1,000 to 50,000, and more preferably 2,000 to 20,000.

The resin [N-A] may be used singly or in combination of two or more kinds thereof. The content of the resin [N-A] is preferably 20% to 99% by mass, more preferably 30% to 99% by mass, and still more preferably 40% to 99% by mass, with respect to the total solid content of the actinic ray-sensitive or radiation-sensitive resin composition of the present invention.

[N-C] Low-Molecular-Weight Compound Whose Dissolution Rate in Alkali Developer Decreases by Action of Acid The low-molecular-weight compound whose dissolution rate in an alkali developer decreases by the action of an acid (also referred to as a "low-molecular-weight compound [N-C]") is not particularly limited, but examples thereof include the compound whose dissolution rate in an alkali developer decreases by the action of an acid, generated from the acid generator which will be described later.

The molecular weight of the low-molecular-weight compound [N-C] is preferably in the range of 100 to 1,000, more preferably in the range of 200 to 900, and particularly preferably in the range of 300 to 800.

Here, the low-molecular-weight compound in the present invention is a compound having a uniform molecular weight (a compound not substantially having a molecular weight distribution), not a so-called polymer or oligomer, obtained by subjecting a compound having an unsaturated bond (a so-called polymerizable monomer) to cleavage of the unsaturated bond using an initiator, leading to a chained growth of the bonds.

Examples of the low-molecular-weight compound [N-C] include an addition polymerizable compound having a double bond. In this case, the low-molecular-weight compound [N-C] is selected from the compounds having at least one ethylenically unsaturated bond at the terminal, and preferably two or more ethylenically unsaturated bonds at the terminal. Such a group of the compounds is widely known in the related industrial field, and can be widely used in the present invention without particular limitation.

As the addition polymerizable compound having a double bond, the monomers described in [0108] to [0113] in JP2014-104631A can be suitably used.

Suitable examples of the low-molecular-weight compound [N-C] include a compound (hereinafter also referred to as a "crosslinking agent") that crosslinks the resin (C) which will be described later. Here, a known crosslinking agent can be effectively used.

The crosslinking agent is, for example, a compound having a crosslinkable group capable of crosslinking the resin (C), and preferred examples of the crosslinkable group include a compound having two or more of a hydroxymethyl group, an alkoxymethyl group, an acyloxymethyl group, and an alkoxymethyl ether group, and an epoxy compound.

More preferred examples thereof include an alkoxymethylated or acyloxymethylated melamine compound, an alkoxymethylated or acyloxymethylated urea compound, a hydroxymethylated or alkoxymethylated phenol compound, and an alkoxymethyl etherified phenol compound.

Furthermore, as the compound [N-C], the epoxy compounds described in paragraphs [0196] to [0200] of JP2013-

64998A ([0271] to [0277] of the specification of the corresponding US2014/0178634A) or the oxetane compounds described in paragraph [0065] of JP2013-258332A can also be used, the contents of which are incorporated in the present specification.

The crosslinking agent preferably has a structure represented by General Formula (1).

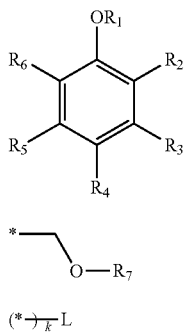

In General Formula (1), $R_1$ to $R_6$ each independently represent a hydrogen atom, an organic group having 1 to 50 carbon atoms, or a bonding moiety to the linking group or the single bond represented by L in General Formula (3), provided that at least one of $R_2, \ldots,$ or $R_6$ is the structure represented by General Formula (2).

In General Formula (2), $R_7$ represents a hydrogen atom or an organic group having carbon atoms 1 to 30, and * represents a bonding moiety in any one of $R_2$ to $R_6$.

In General Formula (3), L represents a linking group or a single bond, * represents a bonding moiety in any one of $R_1$ to $R_6$, and k represents an integer of 2 to 5.

In a case where the crosslinking agent is a compound represented by General Formula (1), $R_1$ to $R_6$ each independently represent a hydrogen atom or an organic group having 1 to 50 carbon atoms. Examples of the organic group having 1 to 50 carbon atoms include an alkyl group, a cycloalkyl group, or an aryl group, or a group having these groups linked via a group formed of an alkylene group, an arylene group, a carboxylic acid ester bond, a carbonic acid ester bond, an ether bond, a thioether bond, a sulfo group, a sulfone group, a urethane bond, a urea bond, or a combination thereof.

Furthermore, at least one of $R_2, \ldots,$ or $R_6$ is a structure represented by General Formula (2). Examples of the organic group having 1 to 30 carbon atoms represented by $R_7$ in General Formula (2) include the same ones as the specific examples of the above-mentioned organic group represented by $R_1$ to $R_6$. The organic group preferably has two or more structures represented by General Formula (2) in one molecule thereof.

In another aspect of the present invention, the crosslinking agent may be a compound in which 1 to 5 structures represented by General Formula (1) are linked via the linking group or the single bond represented by L in General Formula (3). In this case, at least one of $R_1, \ldots,$ or $R_6$ in General Formula (1) represents a bonding moiety to the linking group or the single bond represented by L in General Formula (3).

Examples of the linking group represented by L in General Formula (3) include an alkylene group, an arylene group, a carboxylic acid ester bond, a carbonic acid ester bond, an ether bond, a thioether bond, a sulfo group, a sulfone group, a urethane bond, a urea bond, and a group formed by combining two or more of these groups, and preferably an alkylene group, an arylene group, and a carboxylic acid ester bond.

k preferably represents 2 or 3.

In one aspect of the present invention, the crosslinking agent is, for example, the above-mentioned compound represented by General Formula (1), and the compound formed by the two or three compounds as a polarity converting group linked via a linking group or a single bond represented by L in General Formula (3a) is preferable.

In General Formula (3a), L has the same definition as L in General Formula (3) as described above, and $k_1$ represents 2 or 3.

Specific examples of L are shown below, but the present invention is not limited thereto.

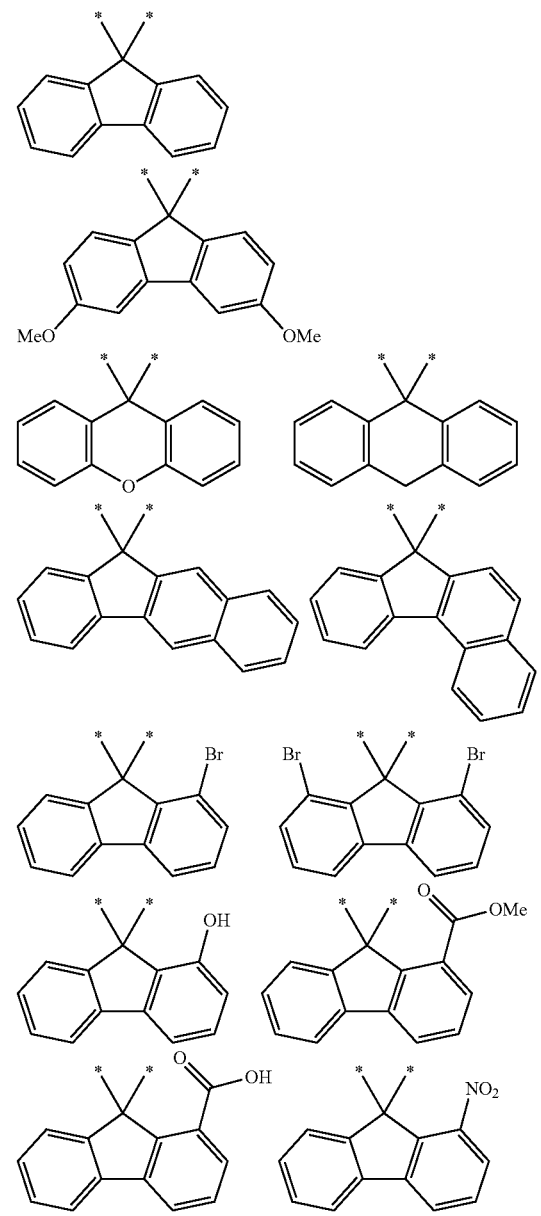

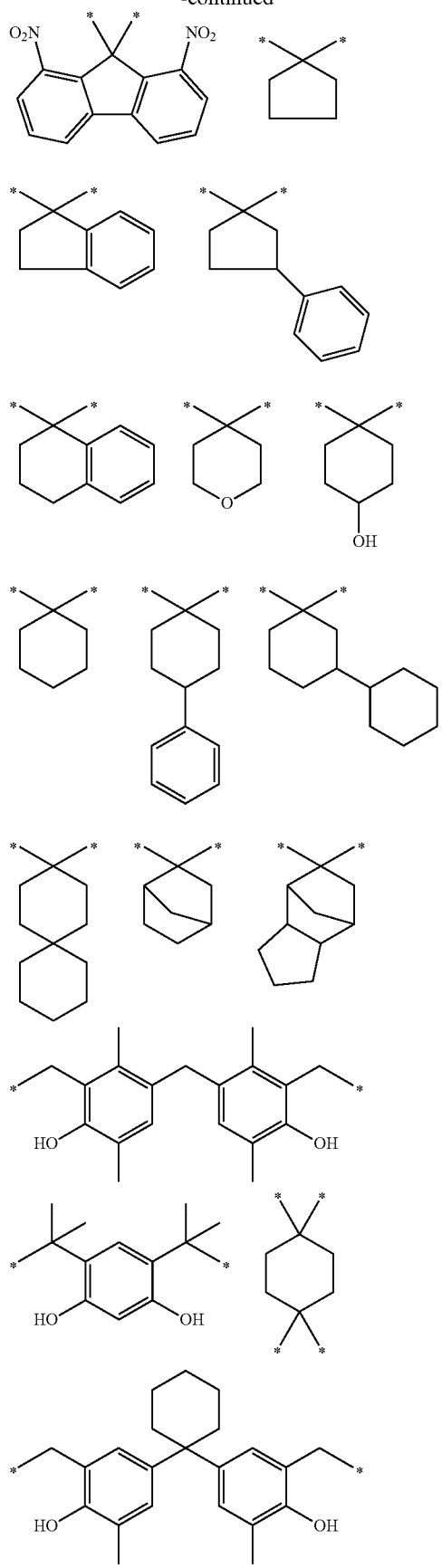
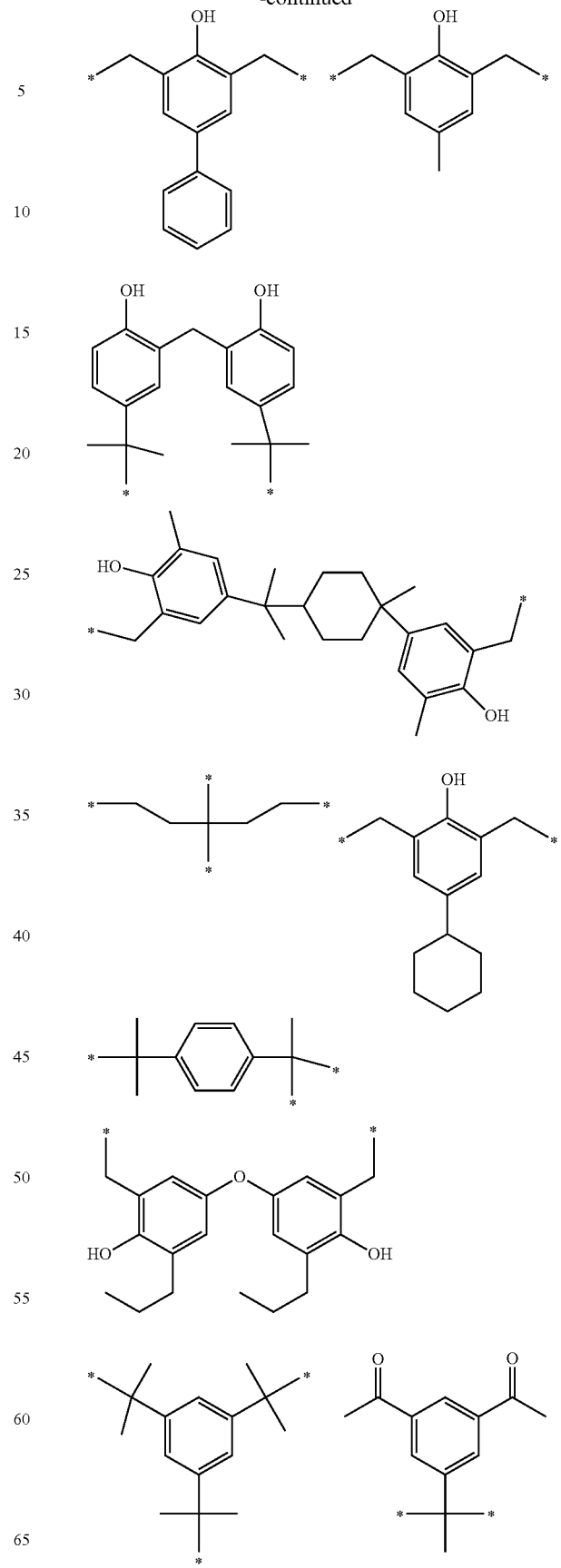

17
-continued
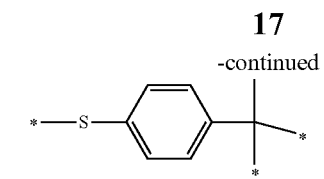
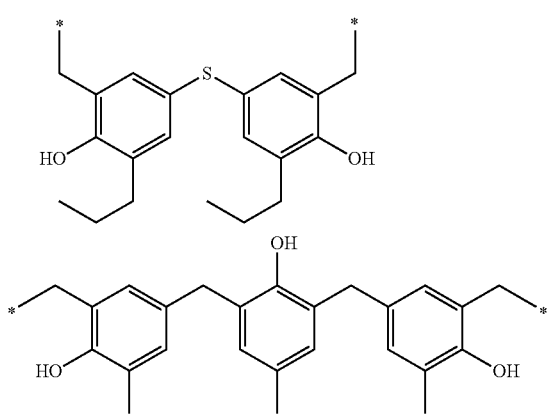
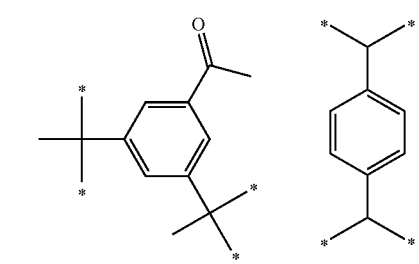
Specific examples of the crosslinking agent of the present invention are shown below, but the present invention is not limited thereto.
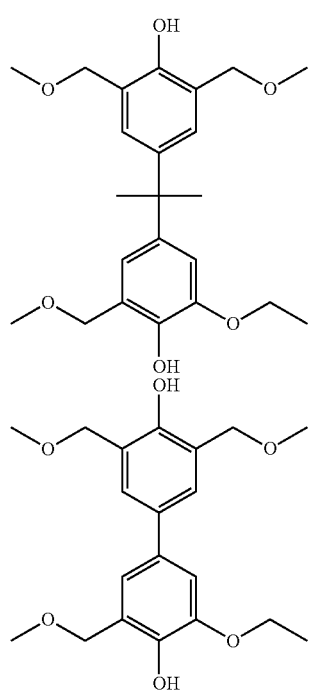
18
-continued
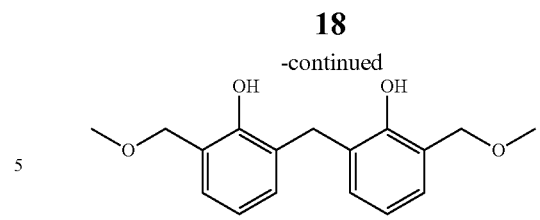
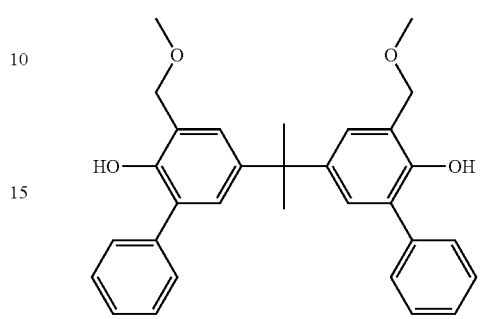
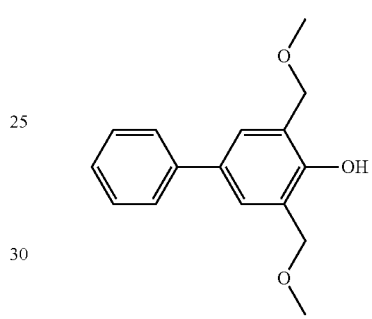
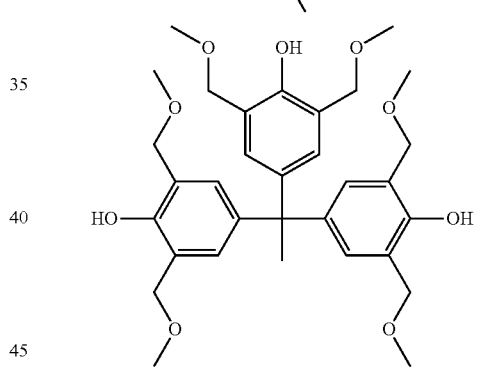
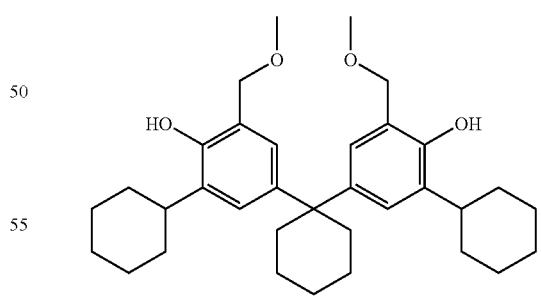
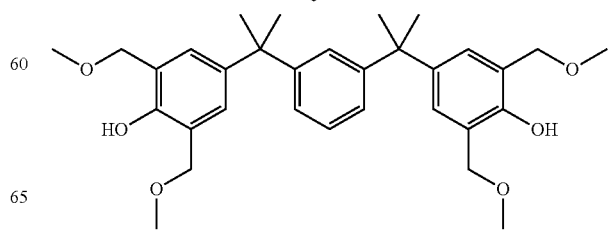

-continued
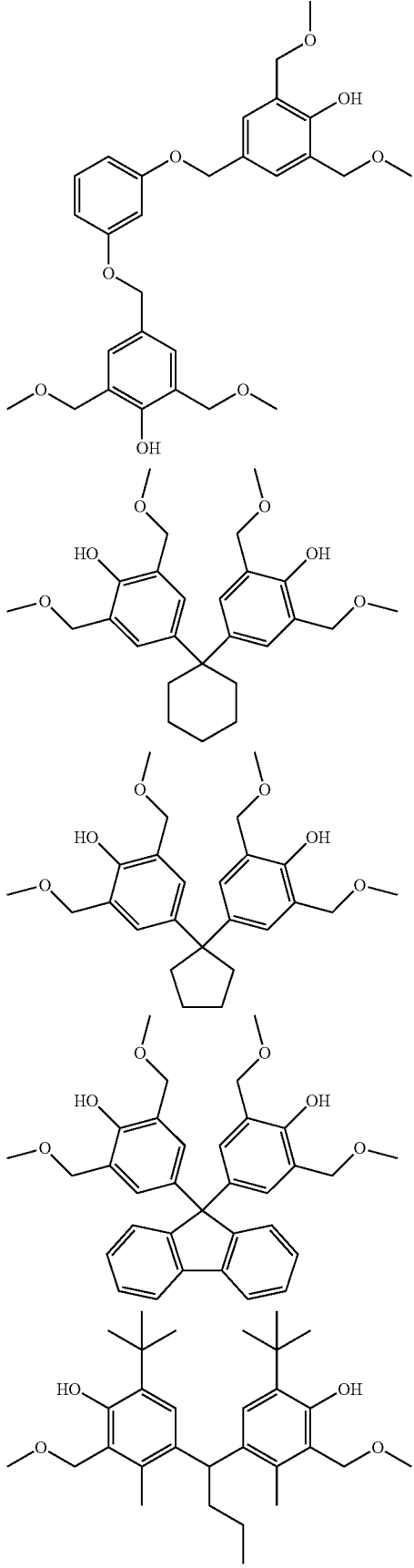
-continued
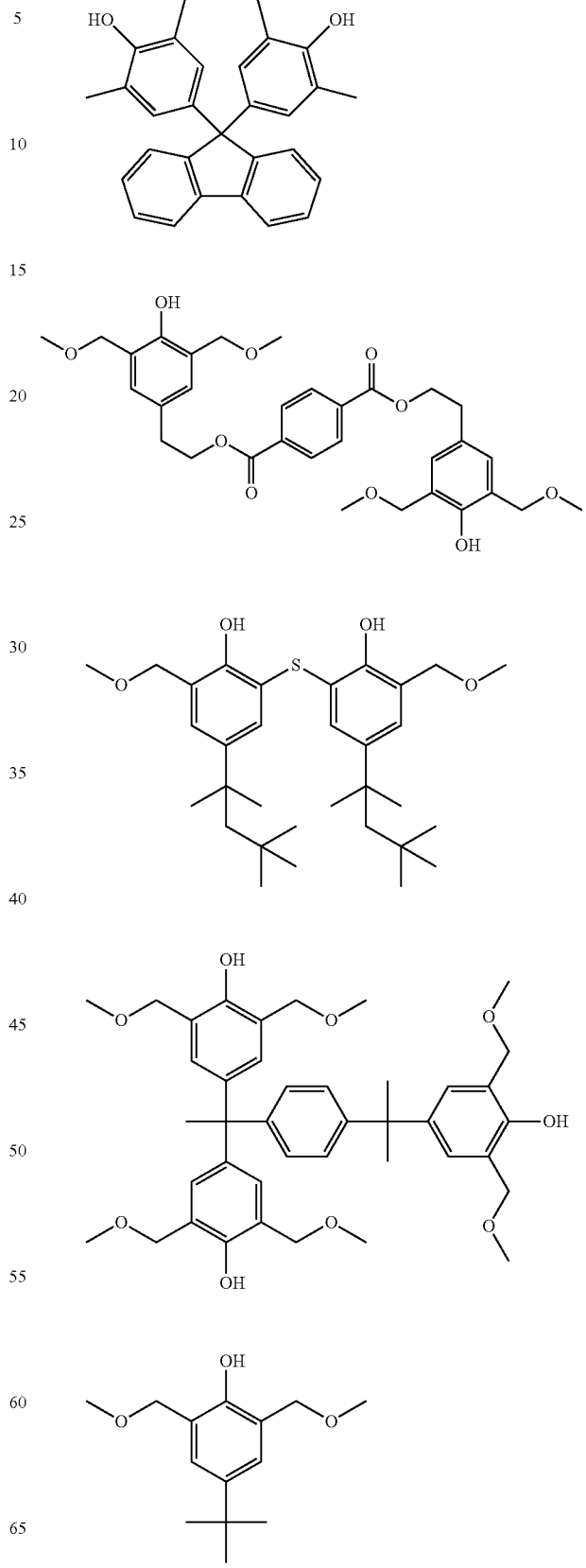

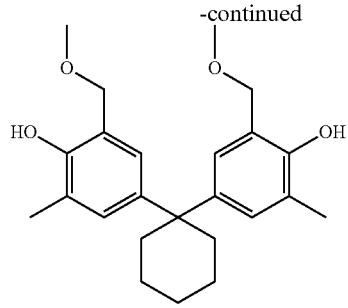
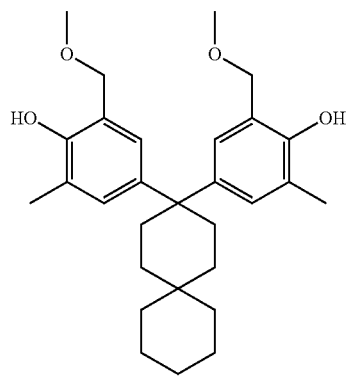
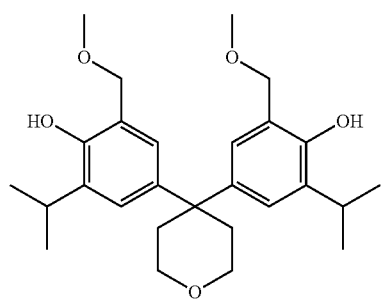
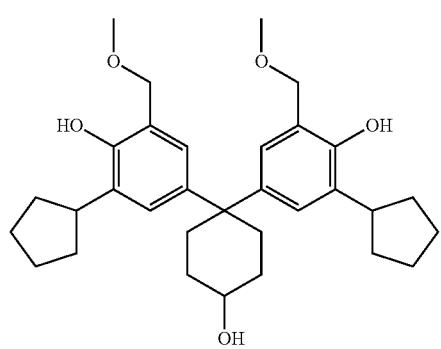
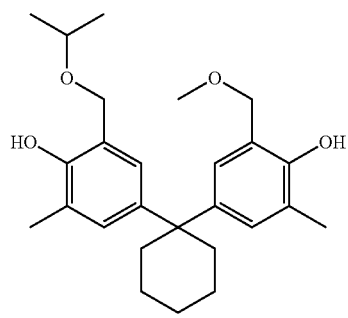
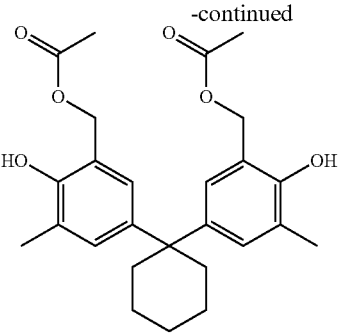
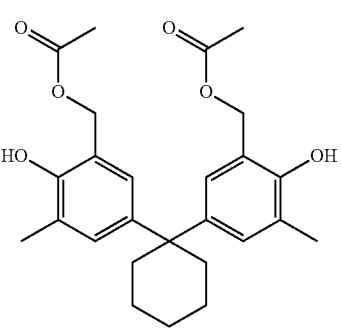 [SMILES: CC(=O)OCc1cc(C2(c3cc(C)c(O)c(COC(C)=O)c3)CCCCC2)cc(C)c1O]
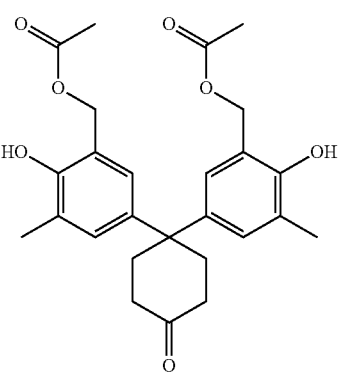
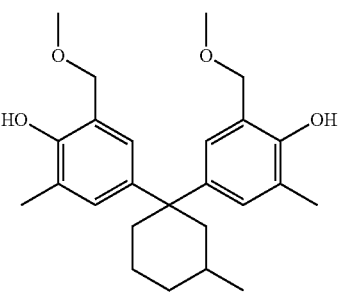
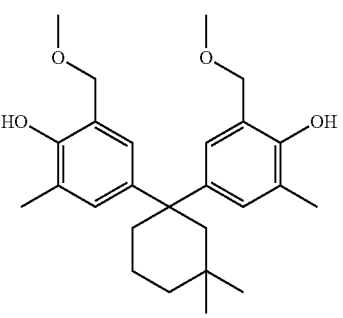

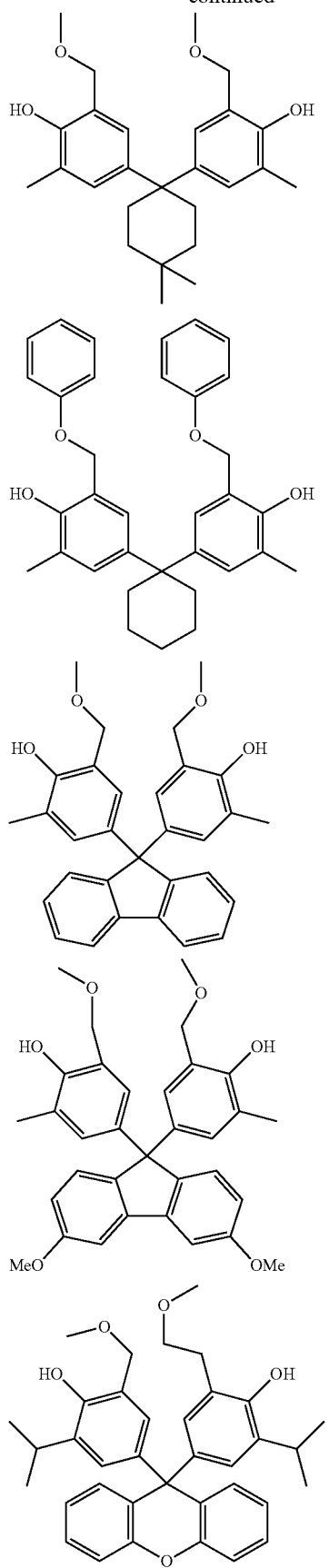
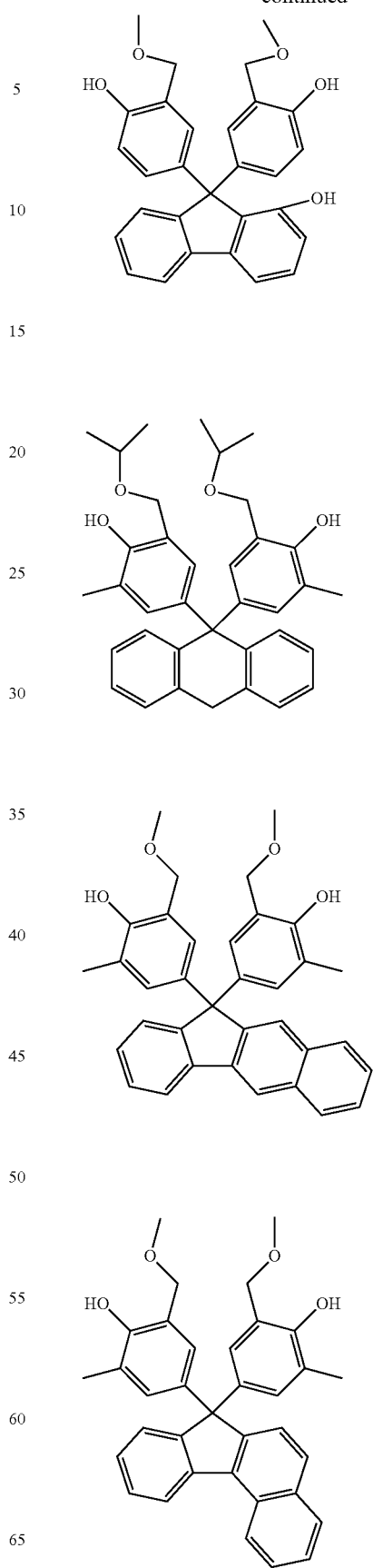

-continued
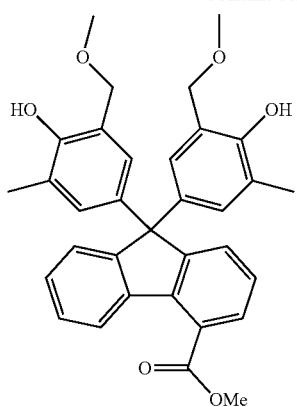
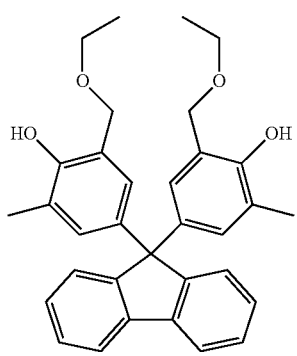
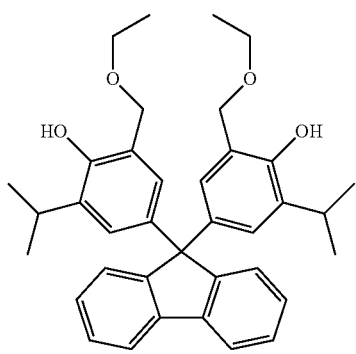
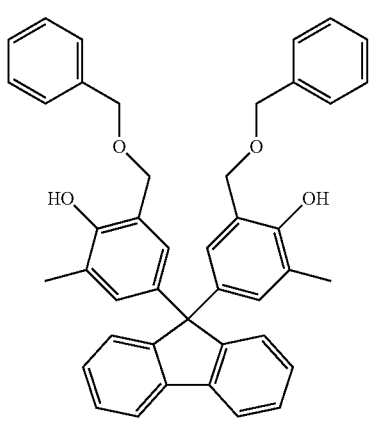
-continued
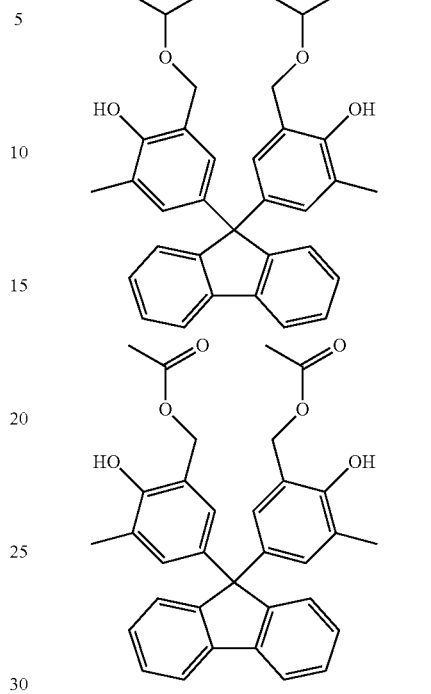
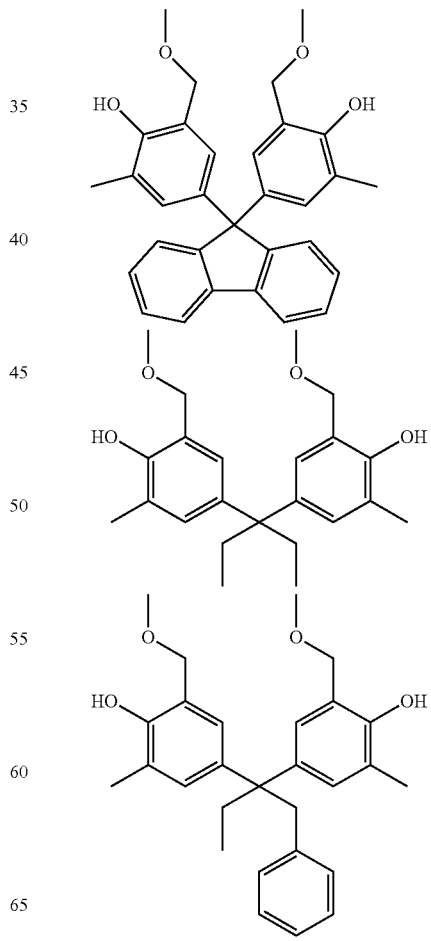

A method for synthesizing the crosslinking agent of the present invention can be appropriately selected depending on a desired compound, and is not limited to specific synthesis methods. By way of one example, a method in which a compound having both of a crosslinking group and a nucleophilic group (for example, a hydroxyl group) and a compound having a polarity converting group and leaving group (for example, a halogen atom such as bromine) are obtained as a raw material by a substitution reaction may be exemplified.

In the present invention, the content of the crosslinking agent is preferably 3% to 65% by mass, and more preferably 5% to 50% by mass, with respect to the solid content of the actinic ray-sensitive or radiation-sensitive resin composition of the present invention.

In addition, in the present invention, the crosslinking agent may be used singly or in combination of two or more kinds thereof.

As the crosslinking agent, commercially available products can also be used, or the crosslinking agent can also be synthesized by a known method. For example, a phenol derivative having a hydroxymethyl group can be obtained by reacting a phenol compound which does not have a corresponding hydroxymethyl group with a formaldehyde in the presence of a base catalyst. At this time, in order to prevent resinification or gelation, the reaction is preferably performed at a reaction temperature of 60° C. or lower. Specifically, synthesis can be performed by the methods described in JP1994-282067A (JP-H06-282067A), JP1995-64285A (JP-H07-64285A), and the like.

The phenol derivative having an alkoxymethyl group can be obtained by reacting a phenol derivative having a corresponding hydroxymethyl group with an alcohol in the presence of an acid catalyst. In such a case, in order to prevent resinification or gelation, the reaction is preferably performed at a reaction temperature of 100° C. or lower. Specifically, it is possible for the compounds to be synthesized with the methods which are described in EP632003A$_1$ and the like. The phenol derivative having a hydroxymethyl group or an alkoxymethyl group, synthesized in this manner is preferable from the viewpoint of stability during storage, and, the phenol derivative having an alkoxymethyl group is particularly preferable from the viewpoint of stability during storage. The phenol derivatives which have two or more combined hydroxymethyl groups or alkoxymethyl groups in which either are concentrated in the benzene rings or distributably bonded thereto may be used singly or in combination of two or more kinds thereof.

In addition, other examples of the crosslinking agent include (i) a compound having an N-hydroxymethyl group, an N-alkoxymethyl group, or an N-acyloxymethyl group, and (ii) an epoxy compound, which will be described below. Specifically, the compounds represented by the general formulae described in [0294] to [0315] in JP2012-242556A can be suitably used. In particular, as (i) the compound having an N-hydroxymethyl group, an N-alkoxymethyl group, or an N-acyloxymethyl group, a compound having two or more (more preferably two to eight) partial structures which are represented by General Formula (CLNM-1) is preferable.

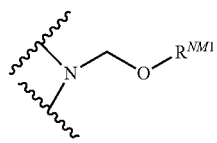

(CLNM-1)

In General Formula (CLNM-1),
$R^{NM1}$ represents a hydrogen atom, an alkyl group, a cycloalkyl group, or an oxoalkyl group.

Examples of more preferable aspects of the compound having two or more partial structures represented by General Formula (CLNM-1) include a urea-based crosslinking agent represented by General Formula (CLNM-2), an alkylene urea-based crosslinking agent represented by General Formula (CLNM-3), a glycoluril-based crosslinking agent represented by General Formula (CLNM-4), and a melamine-based crosslinking agent represented by General Formula (CLNM-5).

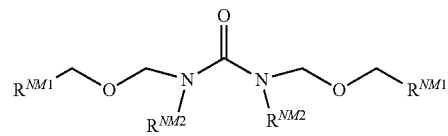

(CLNM-2)

In General Formula (CLNM-2),
$R^{NM1}$'s each independently have the same definition as $R^{NM1}$ in General Formula (CLNM-1).
$R^{NM2}$'s each independently represent a hydrogen atom, an alkyl group (preferably having 1 to 6 carbon atoms), or a cycloalkyl group (preferably having 5 or 6 carbon atoms).

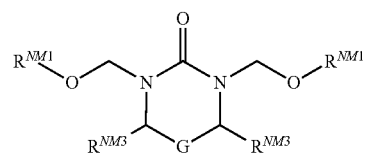

(CLNM-3)

In General Formula (CLNM-3),
$R^{NM1}$'s each independently have the same definition as $R^{NM1}$ in General Formula (CLNM-1).
$R^{NM3}$'s each independently represent a hydrogen atom, a hydroxyl group, a linear or branched alkyl group (preferably having 1 to 6 carbon atoms), a cycloalkyl group (preferably having 5 or 6 carbon atoms), an oxoalkyl group (preferably having 1 to 6 carbon atoms), an alkoxy group (preferably having 1 to 6 carbon atoms), or an oxoalkoxy group (preferably having 1 to 6 carbon atoms).
G represents a single bond, an oxygen atom, a sulfur atom, an alkylene group (preferably having 1 to 3 carbon atoms), or a carbonyl group.

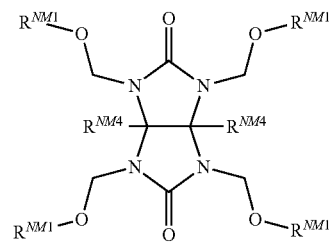

(CLNM-4)

In General Formula (CLNM-4),
$R^{NM1}$'s each independently have the same definition as $R^{NM1}$ in General Formula (CLNM-1).
$R^{NM4}$ each independently represent a hydrogen atom, a hydroxyl group, an alkyl group, a cycloalkyl group, or an alkoxy group.

(CLNM-5)

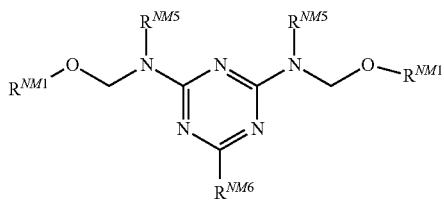

In General Formula (CLNM-5), $R^{NM1}$'s each independently have the same definition as $R^{NM1}$ in General Formula (CLNM-1).

$R^{NM5}$'s each independently represent a hydrogen atom, an alkyl group, a cycloalkyl group, an aryl group, or an atomic group represented by General Formula (CLNM-5').

$R^{NM6}$ represents a hydrogen atom, an alkyl group, a cycloalkyl group, an aryl group, or an atomic group represented by General Formula (CLNM-5'').

(CLNM-5')

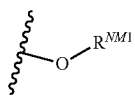

(CLNM-5'')

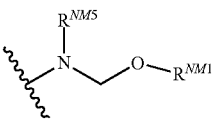

In General Formula (CLNM-5'), $R^{NM1}$ has the same definition as $R^{NM1}$ in General Formula (CLNM-1).

In General Formula (CLNM-5''), $R^{NM1}$ has the same definition as $R^{NM1}$ in General Formula (CLNM-1), and $R^{NM5}$ has the same definition as $R^{NM5}$ in General Formula (CLNM-5).

As the alkyl group of $R^{NM5}$ and $R^{NM6}$, an alkyl group having 1 to 6 carbon atoms is preferable, as the cycloalkyl group, a cycloalkyl group having 5 or 6 carbon atoms is preferable, and as an aryl group, an aryl group having 6 to 10 carbon atoms is preferable.

In General Formulae (CLNM-1) to (CLNM-5), the group represented by each of $R^{NM1}$ to $R^{NM6}$ may further have a substituent.

Specific examples of the compound having two or more partial structures represented by General Formula (CLNM-1) are shown below, but the present invention is not limited thereto.

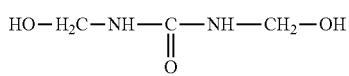

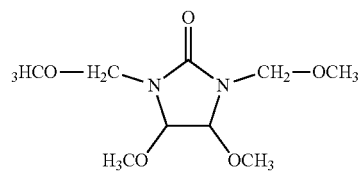

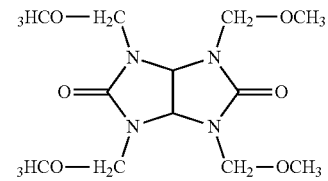

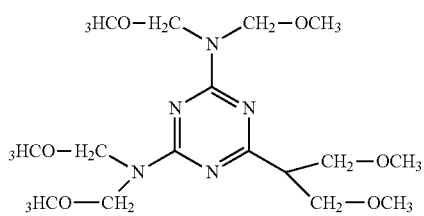

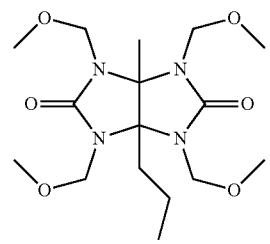

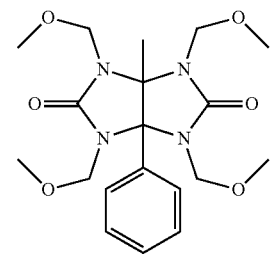

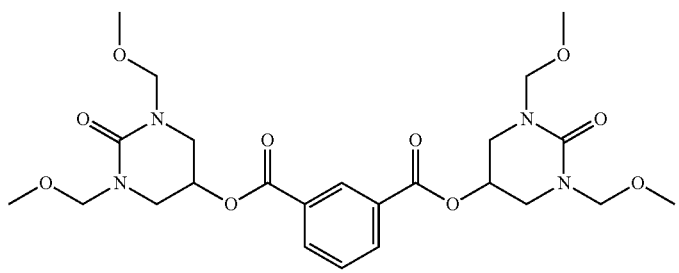

-continued

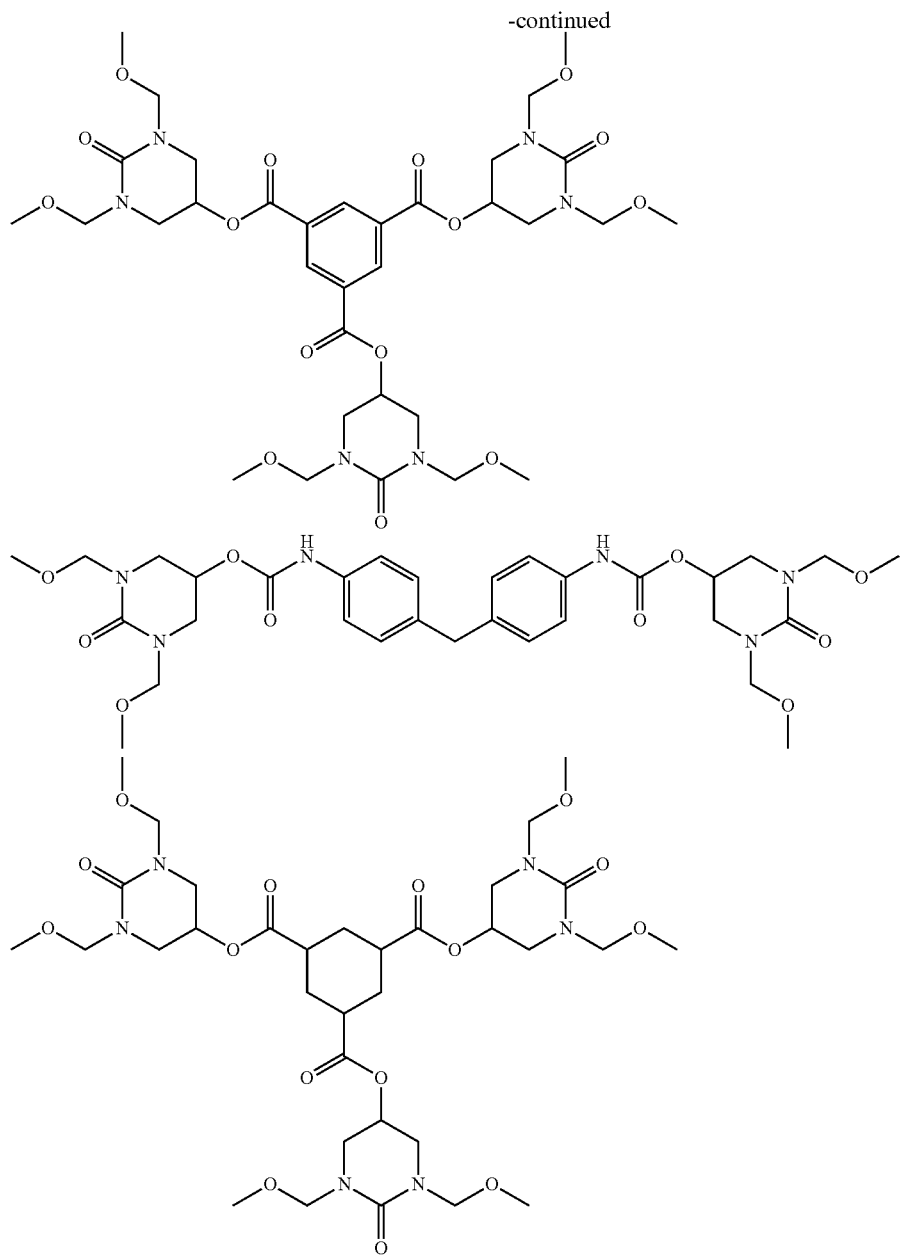

A tertiary alcohol having a hydroxyl group on carbon directly bonded to an aromatic ring can also be used as the low-molecular-weight compound [N-C]. The compounds described in JP1997-197672A (JP-H09-197672A), JP2001-324811A, and JP2000-31020A can be suitably used.

[Resin (B) Including Repeating Unit Having One or More Groups Selected from Group Consisting of Fluorine Atom, Group Having Fluorine Atom, Group Having Silicon Atom, Alkyl Group Having 6 or More Carbon Atoms, Cycloalkyl Group Having 5 or More Carbon Atoms, Aryl Group Having 6 or More Carbon Atoms, and Aralkyl Group Having 7 or More Carbon Atoms]

The composition of the present invention contains a resin (B) including a repeating unit having one or more groups selected from the group consisting of a fluorine atom, a group having a fluorine atom, a group having a silicon atom, an alkyl group having 6 or more carbon atoms, a cycloalkyl group having 5 or more carbon atoms, an aryl group having 6 or more carbon atoms, and an aralkyl group having 7 or more carbon atoms (also referred to as "resin (B)").

The resin (B) is a resin which includes the repeating unit and is unevenly distributed on a film surface by formation of a film to form a protecting film. Here, as for whether the resin (B) is unevenly distributed on a film surface by formation of a film to form a protecting film, for example, in a case where there is an increase in the contact angle in comparison between the surface static contact angle of a composition film without addition of the resin (B) (the contact angle with pure water) and the surface static contact angle of a composition film with addition of the resin (B), it is considered that the protective layer is formed.

By incorporating a hydrophobic resin (B) into the actinic ray-sensitive or radiation-sensitive resin composition of the present invention, the resin (B) is unevenly distributed on the surface layer of the film formed of the actinic ray-sensitive or radiation-sensitive resin composition and the liquid immersion medium is water, it is possible to improve the receding contact angle of the film surface with respect to water, and thus, improve the immersion liquid tracking properties.

In addition, it is presumed to uneven distribution of the resin (B) on the surface layer of the film can suppress formation of sparingly soluble materials, and thus, scum is drastically reduced. Thus, it is considered that generation of scum can be suppressed while maintaining various characteristics such as collapse performance of a pattern.

It is preferable that the resin (B) includes a repeating unit having a group which decomposes by the action of an acid for a reason that it is superior from the viewpoints of sensitivity and scum.

Furthermore, the present inventors have found that simply even with a use of a compound whose solubility in a developer varies by the action of an acid, and which is unevenly distributed on a film surface by formation of a film to form a protecting film, deterioration of a pattern shape (film reduction) due to Out of Band light in EUV lithography (ultraviolet rays other than those at a wavelength of EUV) may be relieved to some degrees, but reduction in sensitivity occurs. Accordingly, by developing a resin (B) including a repeating unit represented by General Formula (Aa1) or (Aa2) which will be described later and has a high reaction rate (sensitivity) by the action of an acid as a compound which is unevenly distributed on a film surface by the formation of a film to form a protecting film, it becomes possible to accomplish high sensitivity while relieving deterioration of a pattern shape (film reduction) due to Out-of-Band light in EUV lithography as one of effects.

In one aspect, the resin (B) preferably contains at least one of the repeating unit represented by General Formula (A1) or the repeating unit represented by (A2).

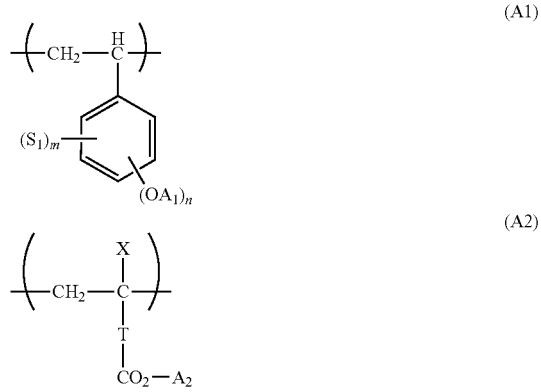

In General Formula (A1), n represents an integer of 1 to 5, and m represents an integer of 0 to 4, satisfying the relationship of $1 \leq m+n \leq 5$.

$S_1$ represents a substituent (excluding a hydrogen atom), and in a case where m is 2 or more, a plurality of $S_1$'s may be the same as or different from each other.

$A_1$ represents a hydrogen atom or a group which leaves by the action of an acid, provided that at least one of $A_1$'s represents a group which leaves by the action of an acid. In a case of $n \geq 2$, a plurality of $A_1$'s may be the same as or different from each other.

In General Formula (A2),

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxy group, an alkyloxycarbonyl group, an alkylcarbonyloxy group, or an aralkyl group.

T represents a single bond or a divalent linking group.

$A_2$ represents a group which leaves by the action of an acid.

First, the repeating unit represented by General Formula (A1) will be described.

n represents an integer of 1 to 5, as described above, and is preferably 1 or 2, and particularly preferably 1.

m represents an integer of 0 to 4, satisfying the relationship of $1 \leq m+n \leq 5$, as described above, and is preferably 0 to 2, more preferably 0 or 1, and particularly preferably 0.

$S_1$ represents a substituent (excluding a hydrogen atom), as described above.

Examples of the substituent represented by $S_1$ include an alkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group, and an aralkylthio group.

Examples of the alkyl group, a cycloalkyl group include a linear or branched alkyl group having 1 to 20 carbon atoms, such as a methyl group, an ethyl group, a propyl group, an isopropyl group, an n-butyl group, an isobutyl group, a t-butyl group, pentyl group, a cyclopentyl group, a hexyl group, a cyclohexyl group, an octyl group, and a dodecyl group, with a cycloalkyl group being preferable. These groups may further have a substituent.

Preferred examples of the substituent which may further be contained include a heterocyclic residue such as an alkyl group, an alkoxy group, a hydroxyl group, a halogen atom, nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a pyrrolidone residue, with a substituent having 12 or less carbon atoms being preferable.

Examples of the alkyl group having a substituent include a cyclohexylethyl group, an alkylcarbonyloxymethyl group, an alkylcarbonyloxyethyl group, a cycloalkylcarbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group, and an aralkylthioethyl group.

The alkyl group or the cycloalkyl group in these groups is not particularly limited, and may further have a substituent such as an alkyl group, a cycloalkyl group, and an alkoxy group, as described above.

Examples of the alkylcarbonyloxyethyl group or the cycloalkylcarbonyloxyethyl group include a cyclohexylcarbonyloxyethyl group, a t-butylcyclohexylcarbonyloxyethyl group, and an n-butylcyclohexylcarbonyloxyethyl group.

The aryl group is not particularly limited, but in general, examples thereof include aryl groups having 6 to 14 carbon atoms, such as a phenyl group, a xylyl group, a toluyl group, a cumenyl group, a naphthyl group, and an anthracenyl group, and may further have a substituent such as an alkyl group, a cycloalkyl group, and an alkoxy group, as described above.

Examples of the aryloxyethyl group include a phenyloxyethyl group and a cyclohexylphenyloxyethyl group. These groups may further have a substituent.

The aralkyl group is also not particularly limited, and examples thereof include a benzyl group.

Examples of the aralkylcarbonyloxyethyl group include a benzylcarbonyloxyethyl group. These groups may further have a substituent.

$A_1$ represents a hydrogen atom or a group which leaves by the action of an acid, as described above, and at least one of $A_1$'s is a group which leaves by the action of an acid.

Examples of the group which leaves by the action of an acid include tertiary alkyl groups such as a t-butyl group and a t-amyl group, a t-butoxycarbonyl group, a t-butoxycarbonylmethyl group, and an acetal group represented by Formula $—C(L_1)(L_2)-O-Z_2$.

Hereinbelow, the acetal group represented by Formula $—C(L_1)(L_2)-O-Z_2$ will be described. In the formula, $L_1$ and $L_2$ each independently represent a hydrogen atom, an alkyl group, a cycloalkyl group, or an aralkyl group. $Z_2$ represents an alkyl group, a cycloalkyl group, or an aralkyl group. Further, $Z_2$ and $L_1$ may be bonded to each other to form a 5- or 6-membered ring.

The alkyl group may be a linear alkyl group or a branched alkyl group.

The linear alkyl group is preferably a linear alkyl group having 1 to 30 carbon atoms, and more preferably a linear alkyl group having 1 to 20 carbon atoms. Examples of such the linear alkyl group include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, and an n-decanyl group.

The branched alkyl group is preferably a branched alkyl group having 3 to 30 carbon atoms, and more preferably a branched alkyl group having 3 to 20 carbon atoms. Examples of such the branched alkyl group include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group.

These alkyl groups may further have a substituent. Examples of the substituent include a hydroxyl group; halogen atoms such as fluorine, chlorine, bromine, and iodine atoms; a nitro group; a cyano group; an amido group; a sulfonamido group; alkyl groups such as a methyl group, an ethyl group, a propyl group, an isopropyl group, an n-butyl group, a sec-butyl group, a hexyl group, a 2-ethylhexyl group, an octyl group, and a dodecyl group; alkoxy groups such as a methoxy group, an ethoxy group, a hydroxyethoxy group, a propoxy group, a hydroxypropoxy group, and a butoxy group; alkoxycarbonyl groups such as a methoxycarbonyl group and an ethoxycarbonyl group; acyl groups such as a formyl group, an acetyl group, and a benzoyl group; acyloxy groups such as an acetoxy group and a butyryloxy group; and a carboxy group.

As the alkyl group, an ethyl group, an isopropyl group, an isobutyl group, a cyclohexylethyl group, a phenylmethyl group, or a phenylethyl group is particularly preferable.

The cycloalkyl group may be monocyclic or polycyclic, and in a case where the cycloalkyl group is polycyclic, it may be bridged. That is, in this case, the cycloalkyl group may have a crosslinked structure. Further, some of carbon atoms in the cycloalkyl group may be substituted with heteroatoms such as an oxygen atom.

The monocyclic cycloalkyl group is preferably a cycloalkyl group having 3 to 8 carbon atoms. Examples of the cycloalkyl group include a cyclopropyl group, a cyclopentyl group, a cyclohexyl group, a cyclobutyl group, and a cyclooctyl group.

Examples of the polycyclic cycloalkyl group include groups having a bicyclo structure, a tricyclo structure, or a tetracyclo structure. As the polycyclic cycloalkyl group, a polycyclic cycloalkyl group having 6 to 20 carbon atoms is preferable. Examples of such cycloalkyl group include an adamantyl group, a norbornyl group, an isobornyl group, a camphanyl group, a dicyclopentyl group, an α-pinanyl group, a tricyclodecanyl group, a tetracyclododecyl group, and an androstanyl group.

Examples of the aralkyl group in $L_1$, $L_2$, and $Z_2$ include an aralkyl group having 7 to 15 carbon atoms, such as a benzyl group and a phenethyl group.

These aralkyl groups may further have a substituent. Preferred examples of the substituent include an alkoxy group, a hydroxyl group, a halogen atom, a nitro group, an acyl group, an acylamino group, a sulfonylamino group, an alkylthio group, an arylthio group and an aralkylthio group. Examples of the aralkyl group having a substituent include an alkoxybenzyl group, a hydroxybenzyl group, and a phenylthiophenethyl group. Further, the number of carbon atoms of the substituent which the aralkyl group may have is preferably 12 or less.

Examples of the 5- or 6-membered ring in which $Z_2$ and $L_1$ are bonded to each other include a tetrahydropyran ring and a tetrahydrofuran ring. Among these, a tetrahydropyran ring is particularly preferable.

$Z_2$ is preferably a linear or branched alkyl group. Thus, the effect of the present invention becomes more apparent.

Specific examples of the repeating unit represented by General Formula (A1) are shown below, but the present invention is not limited thereto.

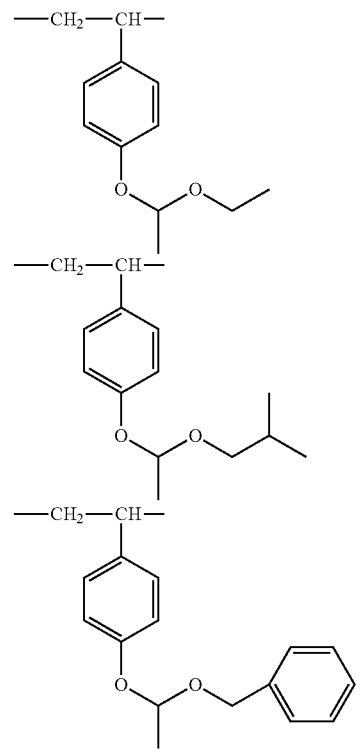

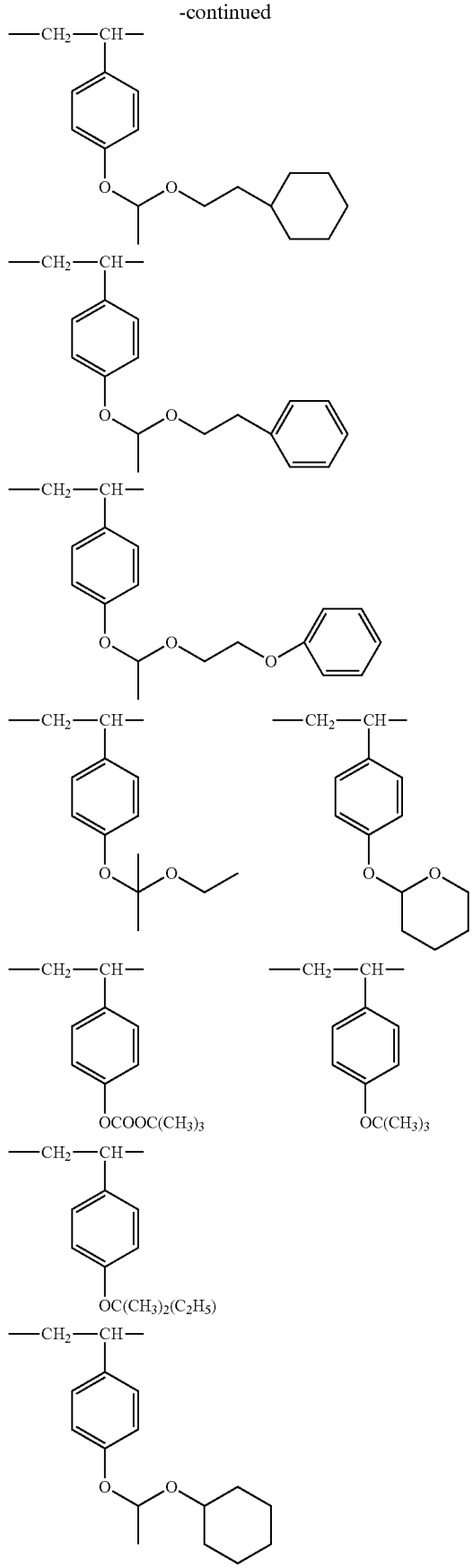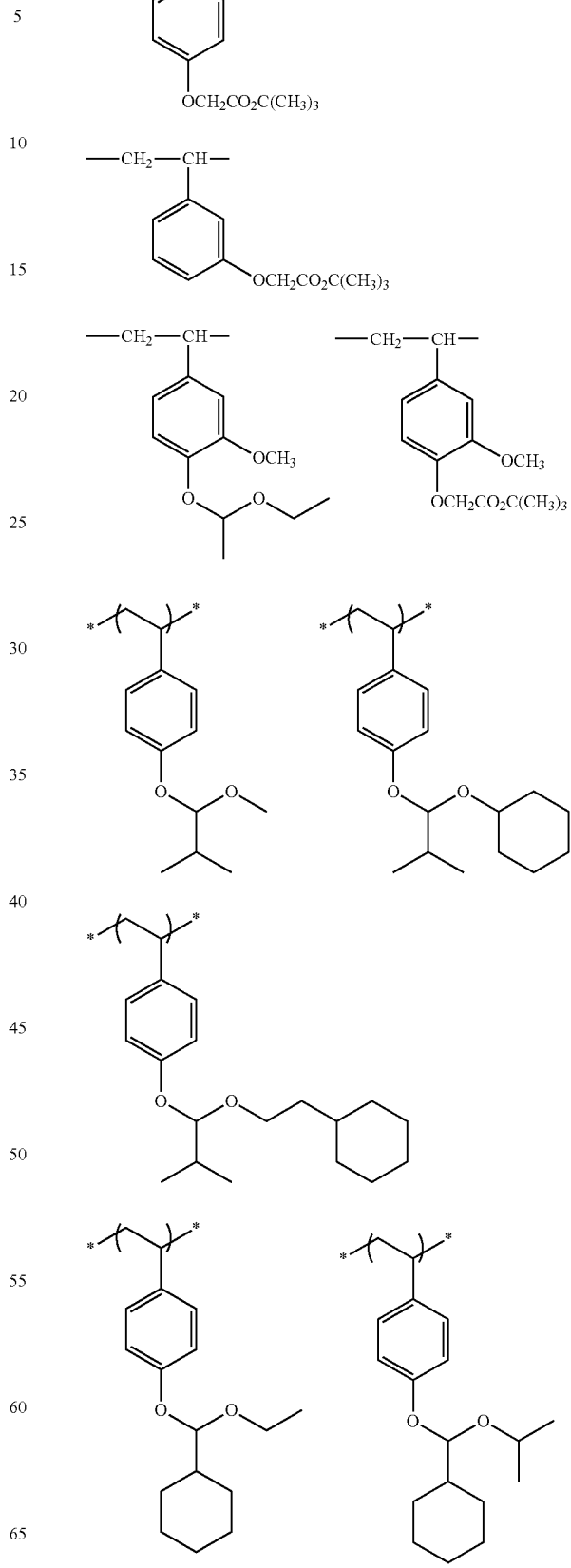

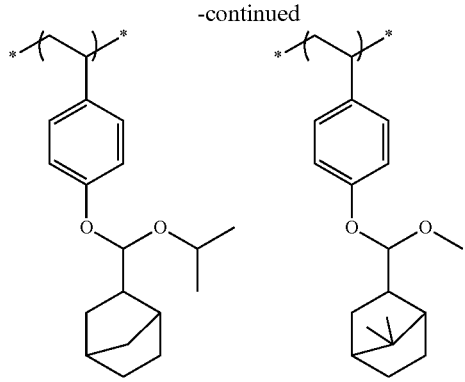
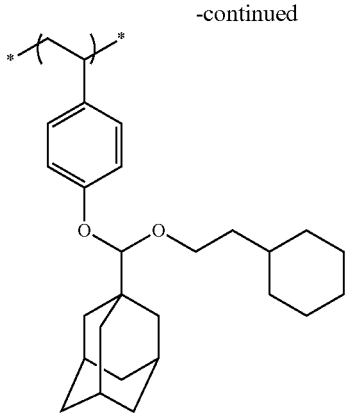
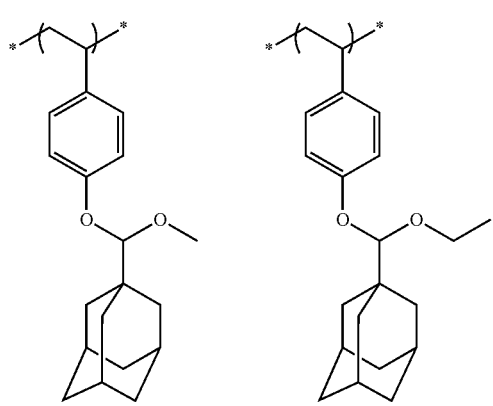
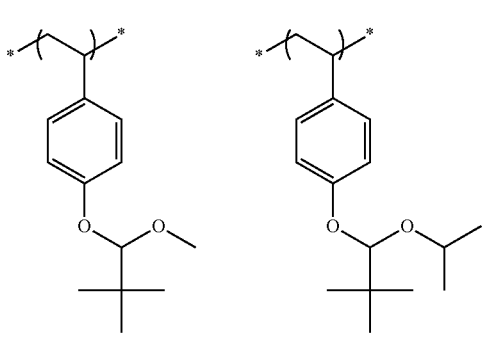
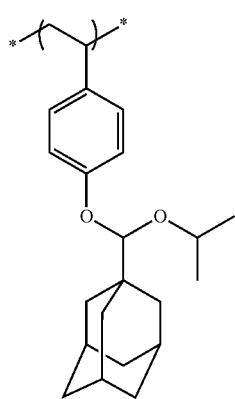
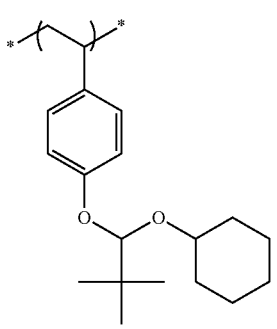
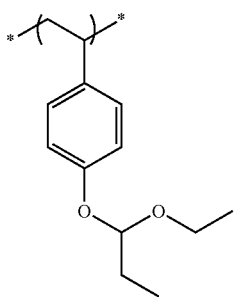
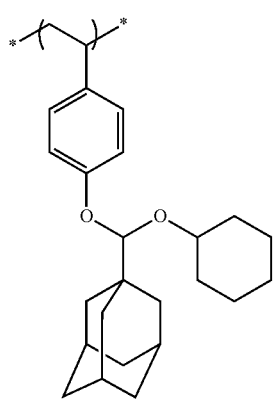
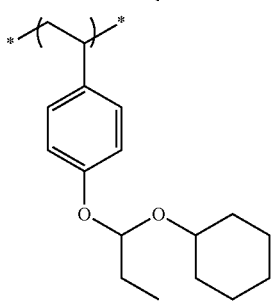

-continued

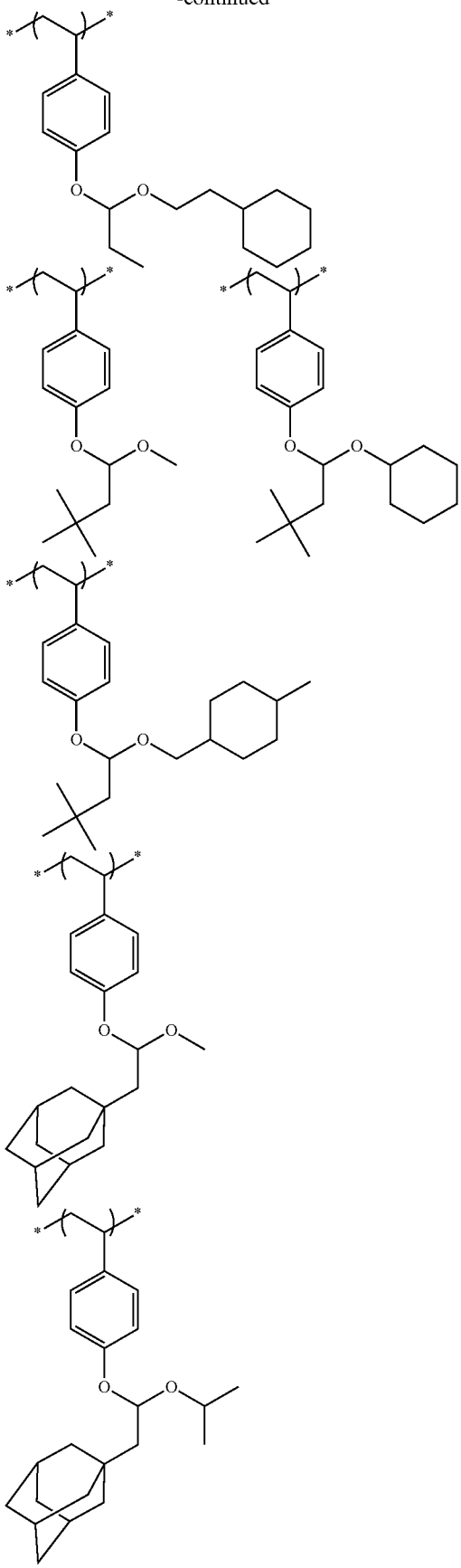

-continued

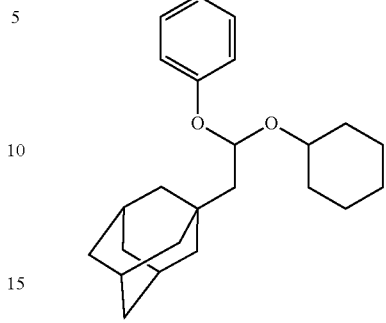

Next, the repeating unit represented by General Formula (A2) will be described.

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxy group, an alkyloxycarbonyl group, an alkylcarbonyloxy group, or an aralkyl group, as described above.

The alkyl group as X may have a substituent and may be either linear or branched. The linear alkyl group preferably has 1 to 30 carbon atoms, and more preferably has 1 to 20 carbon atoms, and examples of the linear alkyl group include a methyl group, an ethyl group, an n-propyl group, an n-butyl group, a sec-butyl group, a t-butyl group, an n-pentyl group, an n-hexyl group, an n-heptyl group, an n-octyl group, an n-nonyl group, and an n-decanyl group. The branched alkyl group is preferably an alkyl group having 3 to 30 carbon atoms, and more preferably an alkyl group having 3 to 20 carbon atoms, and examples of the branched alkyl group include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decanoyl group.

The alkoxy group as X may have a substituent, and it is, for example, an alkoxy group having 1 to 8 carbon atoms. Examples of the alkoxy group include a methoxy group, an ethoxy group, a propoxy group, a butoxy group, a pentyloxy group, a hexyloxy group, and a cyclohexyloxy group.

Examples of the halogen atom as X include a fluorine atom, a chlorine atom, a bromine atom and an iodine atom, with a fluorine atom being preferable.

The acyl group as X may have a substituent, and it is, for example, an acyl group having 2 to 8 carbon atoms. Specific preferred examples of the acyl group include a formyl group, an acetyl group, a propanoyl group, a butanoyl group, a pivaloyl group, and a benzoyl group.

The acyloxy group as X may have a substituent, and it is, for example, an acyloxy groups having 2 to 8 carbon atom. Examples of the acyloxy group include an acetoxy group, a propionyloxy group, a butylyloxy group, a valeryloxy group, a pivaloyloxy group, a hexanoyloxy group, an octanoyloxy group, and a benzoyloxy group.

The cycloalkyl group as X may have a substituent, and may be monocyclic, polycyclic, or bridged. For example, the cycloalkyl group may have a crosslinked structure. The monocyclic cycloalkyl group is preferably a cycloalkyl group having 3 to 8 carbon atoms, and examples thereof include a cyclopropyl group, a cyclopentyl group, a cyclohexyl group, a cyclobutyl group, and a cyclooctyl group. Examples of the polycyclic cycloalkyl group include a group having a bicyclo structure, a tricyclo structure, a tetracyclo structure, and the like, and having 5 or more carbon atoms, with a cycloalkyl group having 6 to 20 carbon atoms being preferable. Examples thereof include an adamantyl group, a norbornyl group, an isobornyl group, a camphanyl group, a dicyclopentyl group, an α-pinanyl group, a tricyclodecanyl group, a tetracyclododecyl group, and an androstanyl group. Further, some of carbon atoms in the cycloalkyl group may be substituted with a heteroatom such as an oxygen atom.

The aryl group as X may have a substituent, and is preferably an aryl group having 6 to 14 carbon atoms, and examples thereof include a phenyl group, a xylyl group, a tolyl group, a cumenyl group, a naphthyl group, and an anthracenyl group.

The alkyloxycarbonyl group as X may have a substituent, and is preferably an alkyloxycarbonyl group having 2 to 8 carbon atoms. Examples thereof include a methoxycarbonyl group, an ethoxycarbonyl group, and a propoxycarbonyl group.

The alkylcarbonyloxy group as X may have a substituent, and is preferably an alkylcarbonyloxy group having 2 to 8 carbon atoms, and examples thereof include a methylcarbonyloxy group and an ethylcarbonyloxy group.

The aralkyl group as X may have a substituent, and is preferably an aralkyl group having 7 to 16 carbon atom, and examples thereof include a benzyl group.

Examples of the substituent which the alkyl group, the alkoxy group, the acyl group, the cycloalkyl group, the aryl group, the alkyloxycarbonyl group, the alkylcarbonyloxy group, or the aralkyl group as X may further have include a hydroxyl group, a fluorine atom, a chlorine atom, a bromine atom, an iodine atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group, and an aralkyl group.

T represents a single bond or a divalent linking group, as described above.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$— group or a —(CH$_2$)$_3$— group.

T is particularly preferably a single bond.

A$_2$ represents a group which leaves by the action of an acid, as described above. That is, the repeating unit represented by General Formula (A2) is provided with a group represented by "—COOA$_2$" as the acid-decomposable group. Examples of A$_2$ include the same groups as described above with respect to A$_1$ in General Formula (A1) above.

A$_2$ is preferably a hydrocarbon group (preferably having 20 or less carbon atoms, and more preferably having 4 to 12 carbon atoms), and more preferably a t-butyl group, a t-amyl group, or a hydrocarbon group having an alicyclic structure (for example, an alicyclic group itself, and a group having the alkyl group substituted with an alicyclic group).

A$_2$ is preferably a tertiary alkyl group or a tertiary cycloalkyl group.

The alicyclic structure may be monocyclic or polycyclic, and specific examples thereof include groups having a monocyclo structure, a bicyclo structure, a tricyclo structure, and a tetracyclo structure, each having 5 or more carbon atoms. The number of carbon atoms is preferably 6 to 30, and particularly preferably 7 to 25. The hydrocarbon group having the alicyclic structure may have a substituent.

Examples of the alicyclic structure include the following alicyclic structures (1) to (50).

(1)

(2)

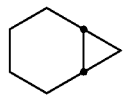

(3)

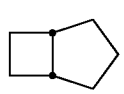

(4)

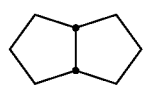

(5)

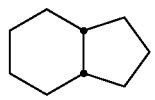

(6)

(7)

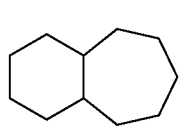

(8)

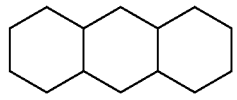

(9)

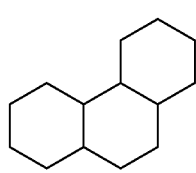

(10)

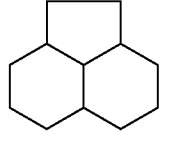

(11)

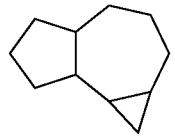

(12)

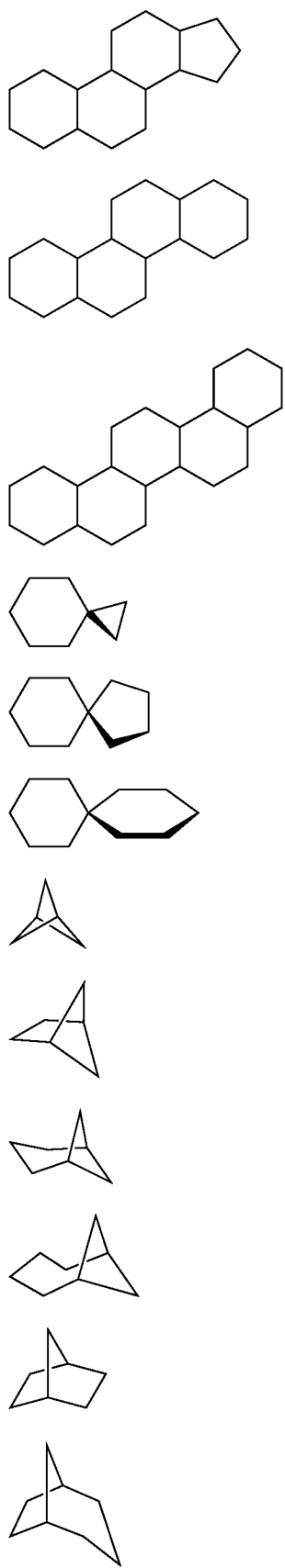
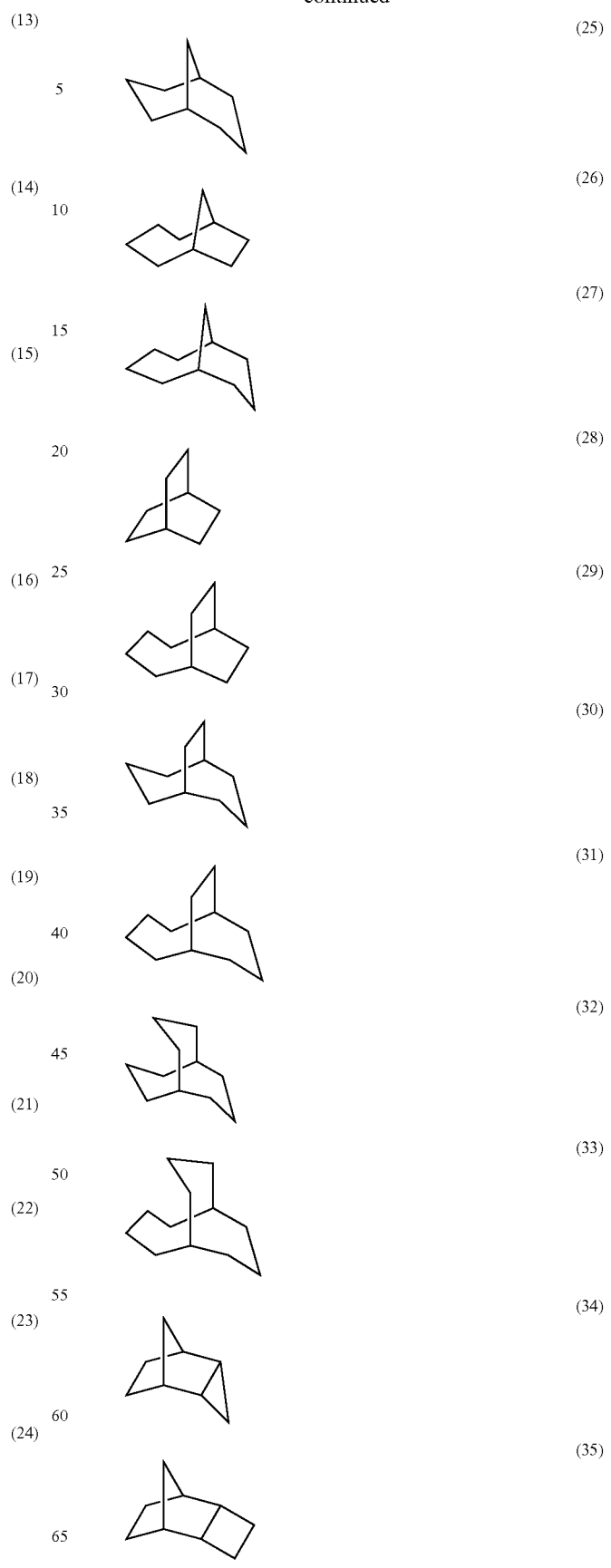

(36) 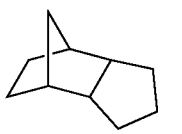

(37) 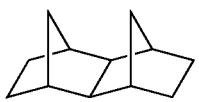

(38) 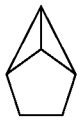

(39) 

(40) 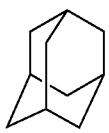

(41) 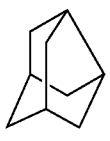

(42) 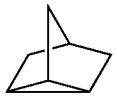

(43) 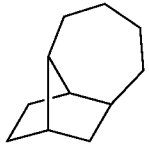

(44) 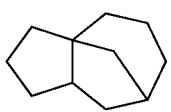

(45) 

(46) 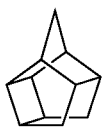

(47) 

(48) 

(49) 

(50) 

(51) 

Preferred examples of the alicyclic structure include an adamantyl group, a noradamantyl group, a decalin group, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group, and more preferred examples of the alicyclic structure include an adamantyl group, a decalin group, a norbornyl group, a cedrol group, a cyclohexyl group, a cycloheptyl group, a cyclooctyl group, a cyclodecanyl group, a cyclododecanyl group, or a tricyclodecanyl group.

Examples of the substituent which the alicyclic structure may have include an alkyl group, a halogen atom, a hydroxyl group, an alkoxy group, a carboxyl group, and an alkoxycarbonyl group. The alkyl group is preferably a lower alkyl group such as a methyl group, an ethyl group, a propyl group, an isopropyl group, and a butyl group, and more preferably represents a methyl group, an ethyl group, a propyl group, or an isopropyl group. Preferred examples of the alkoxy group include an alkoxy group having 1 to 4 carbon atoms, such as a methoxy group, an ethoxy group, a propoxy group, and a butoxy group. Examples of the substituent which the alkyl group and the alkoxy group may have include a hydroxyl group, a halogen atom, and an alkoxy group (preferably having 1 to 4 carbon atoms).

The groups above may further have a substituent, and examples of the additional substituent include a hydroxyl group, a halogen atom (fluorine, chlorine, bromine, and iodine), a nitro group, a cyano group, the above-described alkyl group, an alkoxy group such as a methoxy group, an ethoxy group, a hydroxyethoxy group, a propoxy group, a hydroxypropoxy group, an n-butoxy group, an isobutoxy group, a sec-butoxy group, and a t-butoxy group, an alkoxycarbonyl group such as a methoxycarbonyl group and an ethoxycarbonyl group, an aralkyl group such as a benzyl group, a phenethyl group, and a cumyl group, an aralkyloxy group, an acyl group such as a formyl group, an acetyl group, a butyryl group, a benzoyl group, a cinnamyl group, and a valeryl group, an acyloxy group such as a butyryloxy group, the above-described alkenyl group, an alkenyloxy group such as a vinyloxy group, a propenyloxy group, an allyloxy group, and a butenyloxy group, the above-described aryl group, an aryloxy group such as phenoxy group, and an aryloxycarbonyl group such as a benzoyloxy group.

The acid-decomposable group having an alicyclic structure is preferably a group represented by each of General Formulae (pI) to (pV).

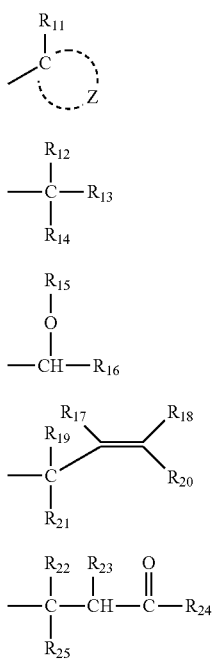

(pI)

(pII)

(pIII)

(pIV)

(pV)

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group which is necessary for forming an alicyclic hydrocarbon group, together with carbon atoms.

$R_{12}$ to $R_{16}$ each independently represent a linear or branched alkyl group having 1 to 4 carbon atoms, or an alicyclic hydrocarbon group, provided that at least one of $R_{12}, \ldots,$ or $R_{14}$, or any one of $R_{15}$ and $R_{16}$ represents an alicyclic hydrocarbon group.

$R_{17}$ to $R_{21}$ each independently represent a hydrogen atom, or a linear or branched alkyl group having 1 to 4 carbon atoms, or an alicyclic hydrocarbon group, provided that at least one of $R_{17}, \ldots,$ or $R_{21}$ represents an alicyclic hydrocarbon group. Further, any one of $R_{19}$ and $R_{21}$ is a linear or branched alkyl group having 1 to 4 carbon atoms, or an alicyclic hydrocarbon group.

$R_{22}$ to $R_{25}$ each independently represent a hydrogen atom, or a linear or branched alkyl group having 1 to 4 carbon atoms, or an alicyclic hydrocarbon group, provided that at least one of $R_{22}, \ldots,$ or $R_{25}$ represents an alicyclic hydrocarbon group. Further, $R_{23}$ and $R_{24}$ may be bonded to each other to form a ring.

In General Formulae (pI) to (pV), the alkyl group in each of $R_{12}$ to $R_{25}$ represents a linear or branched alkyl group having 1 to 4 carbon atoms, which may be either substituted or unsubstituted. Examples of the alkyl group include a methyl group, an ethyl group, an n-propyl group, an isopropyl group, an n-butyl group, an isobutyl group, a sec-butyl group, and a t-butyl group.

Furthermore, examples of the substituent which the alkyl group may further have include an alkoxy group having 1 to 4 carbon atoms, a halogen atom (a fluorine atom, a chlorine atom, a bromine atom, and an iodine atom), an acyl group, an acyloxy group, a cyano group, a hydroxyl group, a carboxy group, an alkoxycarbonyl group and a nitro group.

Examples of the alicyclic hydrocarbon group in each of $R_{11}$ to $R_{25}$ and the alicyclic hydrocarbon group formed by Z together with the carbon atom include the same groups mentioned above as the alicyclic structure.

In one aspect, the repeating unit represented by General Formula (A2) is preferably a repeating unit represented by the following formulae.

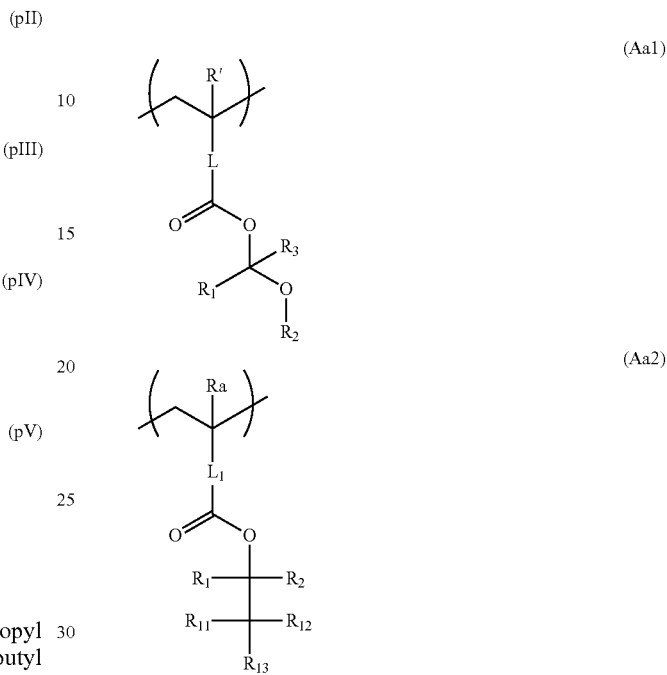

In General Formula (Aa1),

R' represents a hydrogen atom or an alkyl group.

L represents a single bond or a divalent linking group.

$R_1$ represents a hydrogen atom or a monovalent substituent.

$R_2$ represents a monovalent substituent not containing a fluorine atom. $R_1$ and $R_2$ may be bonded to each together to form a ring, together with an oxygen atom in the formulae.

$R_3$ represents a hydrogen atom, an alkyl group, or a cycloalkyl group.

In General Formula (Aa2),

Ra represents a hydrogen atom, an alkyl group, a cyano group, or a halogen atom.

$L_1$ represents a single bond or a divalent linking group.

$R_1$ and $R_2$ each independently represent an alkyl group, provided that the number of carbon atoms of the alkyl group of at least one of $R_1$ or $R_2$ is 2 or more.

$R_{11}$ and $R_{12}$ each independently represent an alkyl group, and $R_{13}$ represents a hydrogen atom or an alkyl group. Any two of $R_{11}$, $R_{12}$, and $R_{13}$ may be linked to each other to form a ring.

A repeating unit represented by General Formula (Aa1) (hereinafter also referred to as a "repeating unit (Aa1)") and a repeating unit represented by General Formula (Aa2) (hereinafter also referred to as a "repeating unit (Aa2)") each have a high reaction rate for an action of an acid, as described above, but the repeating unit (Aa1) has a higher reaction rate for an action of an acid. Accordingly, from the viewpoint of increasing the sensitivity, it is more preferable that the resin (B) includes the repeating unit (Aa1).

Hereinafter, the repeating unit (Aa1) and the repeating unit (Aa2) will be described in detail.

<Repeating Unit (Aa1)>

First, the repeating unit represented by General Formula (Aa1) will be described.

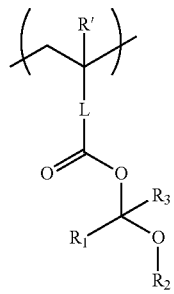
(Aa1)

In General Formula (Aa1), the alkyl group represented by R' is preferably an alkyl group having 1 to 10 carbon atoms, more preferably an alkyl group having 1 to 5 carbon atoms, still more preferably an alkyl group having 1 to 3 carbon atoms, and particularly preferably an alkyl group having 1 or 2 carbon atoms (that is, a methyl group or an ethyl group). Specific examples of the alkyl group represented by R' include a methyl group, an ethyl group, an n-propyl group, an isopropyl group, an n-butyl group, an isobutyl group, a sec-butyl group, and a t-butyl group.

R' is preferably a hydrogen atom or an alkyl group having 1 to 5 carbon atoms, more preferably a hydrogen atom, or an alkyl group having 1 to 3 carbon atoms, still more preferably a hydrogen atom, a methyl group, or an ethyl group, and particularly preferably a hydrogen atom.

Examples of the divalent linking group represented by L include an alkylene group, an aromatic ring group, a cycloalkylene group, a —COO-$L_1$'-, —O-$L_1$'-, —CONH—, and a group formed by combination of two or more thereof. Here, $L_1$' represents an alkylene group (preferably having carbon atoms 1 to 20), a cycloalkylene group (preferably having carbon atoms 3 to 20), a group having a lactone structure, an aromatic ring group, and a group formed by combination of an alkylene group and an aromatic ring group.

Preferred examples of the alkylene group as the divalent linking group represented by L include alkylene groups having 1 to 8 carbon atoms, such as a methylene group, an ethylene group, a propylene group, a butylene group, a hexylene group, and an octylene group. The alkylene group more preferably has 1 to 4 carbon atoms, and particularly preferably has 1 or 2 carbon atoms.

The cycloalkylene group as the divalent linking group represented by L is preferably a cycloalkylene group having 3 to 20 carbon atoms, and examples thereof include, a cyclopropylene group, a cyclobutylene group, a cyclopentylene group, a cyclohexylene group, a cycloheptylene group, a cyclooctylene group, a norbornylene group, and an adamantylene group.

Preferred examples of the aromatic ring group as the divalent linking group represented by L include aromatic ring groups having 6 to 18 carbon atoms (more preferably having 6 to 10 carbon atoms), such as a benzene ring and a naphthalene ring, and aromatic ring groups including a heterocycle, such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring, and the aromatic ring group is particularly preferably a benzene ring group.

The definitions and the preferable ranges of the alkylene group, the cycloalkylene group, and the aromatic ring group represented by $L_1$' are the same as those for the alkylene group, the cycloalkylene group, and the aromatic ring group as the divalent linking group represented by L.

As a group having a lactone structure represented by L any group having a lactone structure can be used, but is preferably a 5- to 7-membered ring lactone structure, with a 5- to 7-membered ring lactone structure to which another ring structure is fused so as to form a bicyclo structure or a spiro structure being preferable. Examples of the group include KA-1-1 to KA-1-17 below, but KA-1-1, KA-1-4, KA-1-5, and KA-1-17 being preferable.

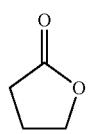
KA-1-1

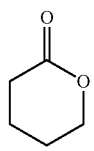
KA-1-2

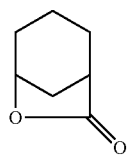
KA-1-3

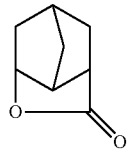
KA-1-4

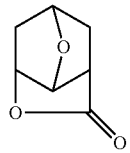
KA-1-5

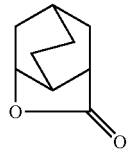
KA-1-6

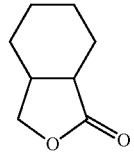
KA-1-7

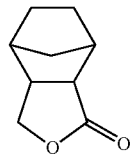
KA-1-8

KA-1-9

KA-1-10
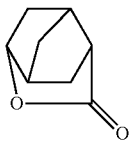

KA-1-11
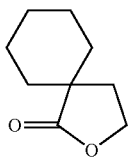

KA-1-12
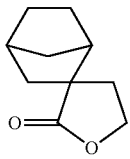

KA-1-13
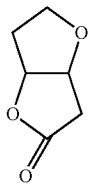

KA-1-14
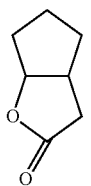

KA-1-15
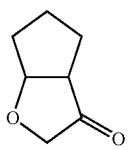

KA-1-16
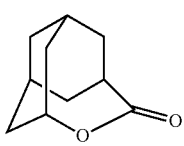

KA-1-17
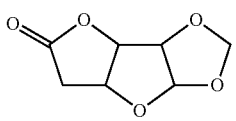

The definitions and the preferable ranges of the alkylene group and the aromatic group in the divalent linking group represented by L in a group formed by combination of the alkylene group and the aromatic ring group represented by Le are the same as those for the alkylene group and the aromatic ring group.

L is preferably a single bond, an aromatic ring group, a norbornane ring group, or an adamantane ring group, more preferably a single bond, a norbornane ring group, or an adamantane ring group, still more preferably a single bond or a norbornane ring group, and particularly preferably a single bond.

The monovalent substituent of $R_1$ is preferably a group represented by *—$C(R_{111})(R_{112})(R_{113})$. * represents a bonding arm linked to a carbon atom in the repeating unit represented by General Formula (Aa1). $R_{111}$ to $R_{113}$ each independently represent a hydrogen atom, an alkyl group, a cycloalkyl group, an aryl group, an aralkyl group, or a heterocyclic group.

The alkyl group of each of $R_{111}$ to $R_{113}$ is preferably an alkyl group having 1 to 15 carbon atoms, more preferably an alkyl group having 1 to 10 carbon atoms, and still more preferably an alkyl group having 1 to 6 carbon atoms. Specific examples of the alkyl group of each of $R_{111}$ to $R_{113}$ include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group. The alkyl group of each of $R_{111}$ to $R_{113}$ is preferably a methyl group, an ethyl group, a propyl group, an isopropyl group, or a t-butyl group.

At least two of $R_{111}$ to $R_{113}$ each independently represent an alkyl group, a cycloalkyl group, an aryl group, an aralkyl group, or a heterocyclic group, and it is preferable that all of $R_{111}$ to $R_{113}$ represent an alkyl group, a cycloalkyl group, an aryl group, an aralkyl group, or a heterocyclic group.

The cycloalkyl group of each of $R_{111}$ to $R_{113}$ may be monocyclic or polycyclic, and is preferably a cycloalkyl group having 3 to 15 carbon atoms, more preferably a cycloalkyl group having 3 to 10 carbon atoms, and still more preferably a cycloalkyl group having 3 to 6 carbon atoms. Specific examples of the cycloalkyl group of each of $R_{111}$ to $R_{113}$ include a cyclopropyl group, a cyclobutyl group, a cyclopentyl group, a cyclohexyl group, a cycloheptyl group, a cyclooctyl group, a decahydronaphthyl group, a cyclodecyl group, a 1-adamantyl group, a 2-adamantyl group, a 1-norbornyl group, and a 2-norbornyl group. The cycloalkyl group of each of $R_{111}$ to $R_{113}$ is preferably a cyclopropyl group, a cyclopentyl group, or a cyclohexyl group.

The aryl group of each of $R_{111}$ to $R_{113}$ is preferably an aryl group having 6 to 15 carbon atoms, and more preferably an aryl group having 6 to 12 carbon atoms, and encompasses a structure where a plurality of aromatic rings are linked to each other through a single bond (for example, a biphenyl group and a terphenyl group). Specific examples of the aryl group of each of $R_{111}$ to $R_{113}$ include a phenyl group, a naphthyl group, an anthranyl group, a biphenyl group, and a terphenyl group. The aryl group of each of $R_{111}$ to $R_{113}$ is preferably a phenyl group, a naphthyl group, or a biphenyl group.

The aralkyl group of each of $R_{111}$ to $R_{113}$ is preferably an aralkyl group having 6 to 20 carbon atoms, and more preferably an aralkyl group having 7 to 12 carbon atoms. Specific examples of the aralkyl group of each of $R_{111}$ to $R_{113}$ include a benzyl group, a phenethyl group, a naphthylmethyl group, and a naphthylethyl group.

The heterocyclic group of each of $R_{111}$ to $R_{113}$ is preferably a heterocyclic group having 6 to 20 carbon atoms, and more preferably a heterocyclic group having 6 to 12 carbon atoms. Specific examples of the heterocyclic group of each of $R_{111}$ to $R_{113}$ include a pyridyl group, a pyrazyl group, a tetrahydrofuranyl group, a tetrahydropyranyl group, a tetrahydrothiophene group, a piperidyl group, a piperazyl group, a furanyl group, a pyranyl group, and a chromanyl group.

The alkyl group, the cycloalkyl group, the aryl group, the aralkyl group, and the heterocyclic group represented by each of $R_{111}$ to $R_{113}$ may further have a substituent.

Examples of the substituent which the alkyl group represented by each of $R_{111}$ to $R_{113}$ may further have include a cycloalkyl group, an aryl group, an amino group, an amido group, a ureido group, a urethane group, a hydroxy group, a carboxy group, a halogen atom, an alkoxy group, an aralkyloxy group, a thioether group, an acyl group, an acyloxy group, an alkoxycarbonyl group, a cyano group, and a nitro group. The substituents may be bonded to each other to form a ring, and in a case where the substituents are bonded to each other to form a ring, the ring is a cycloalkyl group having 3 to 10 carbon atoms or a phenyl group.

Examples of the substituent which the cycloalkyl group represented by each of $R_{111}$ to $R_{113}$ may further have include an alkyl group and the groups mentioned above as specific examples of the substituent which the alkyl group represented by each of $R_{111}$ to $R_{113}$ may further have.

Incidentally, each of the number of carbon atoms of the substituent which the cycloalkyl group may further have is preferably 1 to 8.

Examples of the substituent which the aryl group, the aralkyl group, and the heterocyclic group represented by each of $R_{111}$ to $R_{113}$ may further have include a nitro group, halogen atoms such as fluorine atom, a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

At least two of $R_{111}$ to $R_{113}$ may be combined with each other to form a ring.

In a case where at least two of $R_{111}$ to $R_{113}$ are bonded to each other to form a ring, examples of the ring thus formed include a tetrahydropyrane ring, a cyclopentane ring, a cyclohexane ring, an adamantane ring, a norbornene ring, and a norbornane ring. These rings may have a substituent, and examples of the substituent which the ring may have include an alkyl group and the groups mentioned above as specific examples of the substituent which the alkyl group represented by each of $R_{111}$ to $R_{113}$ may further have.

In a case where all of $R_{111}$ to $R_{113}$ are bonded to each other to form a ring, examples of the ring thus formed include an adamantane ring, a norbornane ring, a norbornene ring, a bicyclo[2,2,2]octane ring, and a bicyclo[3,1,1]heptane ring. Among these, an adamantane ring is particularly preferable. These rings may have a substituent, and examples of the substituent which the ring may have include an alkyl group and the groups mentioned above as specific examples of the substituent which the alkyl group represented by each of $R_{111}$ to $R_{113}$ may further have.

The monovalent substituent of $R_2$ does not contain a fluorine atom. If the monovalent substituent contains an electron withdrawing group such as a fluorine atom, the reaction rate (sensitivity) by the action of an acid is decreased, and therefore, desired performance is not exerted, while oxygen or nitrogen acts as an electron withdrawing group. However, the present inventors have found that even though those atoms are contained, desired performance is exerted.

In one aspect of the present invention, the monovalent substituent of $R_2$ is preferably a group formed of two or more atoms selected from a carbon atom, a hydrogen atom, an oxygen atom, a nitrogen atom, a silicon atom, and a sulfur atom, more preferably a group formed of two or more atoms selected from a carbon atom, a hydrogen atom, an oxygen atom, and a nitrogen atom, still more preferably a group formed of two or more atoms selected from a carbon atom, a hydrogen atom, and an oxygen atom, and particularly preferably a group formed of a carbon atom and a hydrogen atom.

In one aspect of the present invention, the monovalent substituent represented by $R_2$ is preferably a group represented by *-M-Q. * represents a bonding arm linked to an oxygen atom in General Formula (Aa1). M represents a single bond or a divalent linking group. Q represents an alkyl group, a cycloalkyl group, an aryl group, or a heterocyclic group (not containing a fluorine atom).

The divalent linking group as M is, for example, an alkylene group (preferably an alkylene group having 1 to 8 carbon atoms, for example, a methylene group, an ethylene group, a propylene group, a butylene group, a hexylene group, or an octylene group), a cycloalkylene group (preferably a cycloalkylene group having 3 to 15 carbon atoms, for example, a cyclopentylene group or a cyclohexylene group), —S—, —O—, —CO—, —CS—, —SO$_2$—, —N(R$_0$)—, or a combination of two or more of the same, and the divalent linking group preferably has 20 or less carbon atoms in total. Here, $R_0$ is a hydrogen atom or an alkyl group (for example, an alkyl group having 1 to 8 carbon atoms, specifically a methyl group, an ethyl group, a propyl group, an n-butyl group, a sec-butyl group, a hexyl group, and an octyl group).

M is preferably a single bond, an alkylene group, or a divalent linking group including a combination of an alkylene group with at least one of —O—, —CO—, —CS—, or —N(R$_0$)—, and more preferably a single bond, an alkylene group, or a divalent linking group including a combination of an alkylene group with —O—. Here, $R_0$ has the same definition as $R_0$ described above.

M may further have a substituent, and the substituent which M may further have is the same as the substituent which the alkyl group represented by each of $R_{111}$ to $R_{113}$ described above may further have.

Specific examples and preferred examples of the alkyl group as Q include the same as those described as the alkyl group represented by each of $R_{111}$ to $R_{113}$ described above.

The cycloalkyl group as Q may be monocyclic or polycyclic. The cycloalkyl group preferably has 3 to 10 carbon atoms. Examples of the cycloalkyl group include a cyclopropyl group, a cyclobutyl group, a cyclopentyl group, a cyclohexyl group, a cycloheptyl group, a cyclooctyl group, a 1-adamantyl group, a 2-adamantyl group, a 1-norbornyl group, a 2-norbornyl group, a bornyl group, an isobornyl group, a 4-tetracyclo[6.2.1.1$^{3,6}$.0$^{2,7}$]dodecyl group, an 8-tricyclo[5.2.1.0$^{2,6}$]decyl group, and a 2-bicyclo[2.2.1]heptyl group. Among these, a cyclopentyl group, a cyclohexyl group, a 2-adamantyl group, an 8-tricyclo[5.2.1.0$^{2,6}$]decyl group, or a 2-bicyclo[2.2.1]heptyl group is preferable.

Specific examples and preferred examples of the aryl group as Q include the same as those described as the aryl group represented by each of $R_{111}$ to $R_{113}$ described above.

Specific examples and preferred examples of the heterocyclic group as Q include the same as those described as the heterocyclic group represented by each of $R_{111}$ to $R_{113}$ described above.

Each of the alkyl group, the cycloalkyl group, the aryl group, and the heterocyclic group (not containing a fluorine atom) as Q may have a substituent, and examples thereof include an alkyl group, a cycloalkyl group, a cyano group, a halogen atom, a hydroxyl group, an alkoxy group, a carboxyl group, and an alkoxycarbonyl group.

$R_2$ is preferably an alkyl group, an alkyl group substituted with a cycloalkyl group, a cycloalkyl group, an aralkyl group, an aryloxyalkyl group, or a heterocyclic group (not containing a fluorine atom), and more preferably an alkyl group or a cycloalkyl group. Specific examples and preferred examples of the alkyl group as $R_2$, the cycloalkyl group in "the cycloalkyl group" and "the alkyl group substituted with a cycloalkyl group" as $R_2$, and the aryl group in "the aralkyl group (arylalkyl group)" and "the aryloxyalkyl group" as the group represented by $R_2$ include the same as those described as the alkyl group, the cycloalkyl group, and the aryl group as Q, respectively.

Specific examples and preferred examples of the alkyl moiety in "the alkyl group substituted with a cycloalkyl group", "the aralkyl group (arylalkyl group)", and "the aryloxyalkyl group" as $R_2$ include the same as those described as the alkylene group as M, respectively.

Specific examples and preferred examples of the heterocyclic group (not containing a fluorine atom) as $R_2$ include the same as those described as the heterocyclic group (not containing a fluorine atom) as Q.

Specific examples of the substituent represented by $R_2$ include a methyl group, an ethyl group, an isopropyl group, a cyclopentyl group, a cyclohexyl group, a cyclohexylethyl group, a 2-adamantyl group, an 8-tricyclo[5.2.1.0$^{2,6}$]decyl group, a 2-bicyclo[2.2.1]heptyl group, a benzyl group, a 2-phenethyl group, and a 2-phenoxyethylene group.

$R_1$ and $R_2$ may be bonded to each other to form a ring (oxygen-containing heterocycle), together with an oxygen atom in the formula. The oxygen-containing heterocyclic structure may be a monocycle, a polycycle, or a Spiro ring, and preferably has a monocyclic oxygen-containing heterocyclic structure, and the number of carbon atoms is preferably 3 to 10, and more preferably 4 or 5.

In addition, as described above, in a case where M is a divalent linking group, Q may be bonded to M to form a ring via a single bond or another linking group. Examples of such another linking group include an alkylene group (preferably an alkylene group having 1 to 3 carbon atoms), and the ring thus formed is preferably a 5- or 6-membered ring.

$R_3$ is preferably a hydrogen atom or an alkyl group having 1 to 5 carbon atoms, more preferably a hydrogen atom, or an alkyl group having 1 to 3 carbon atoms, still more preferably a hydrogen atom, a methyl group, or an ethyl group, and particularly preferably a hydrogen atom.

In one aspect of the present invention, one of $R_1$ and $R_3$ is preferably a group containing 2 or more carbon atoms.

Specific preferred examples of each of the partial structures and each of the groups in General Formula (Aa1) are shown below.

Specific preferred examples of the partial structure represented by General Formula (Aa1') in General Formula (Aa1) are shown below. In General Formula (Aa1') and specific examples thereof, * represents a bonding arm linked to a carbon atom to which $R_1$ and $R_3$ in General Formula (Aa1) are bonded, and R' and L each represent R' and L, respectively, in General Formula (Aa1).

-continued
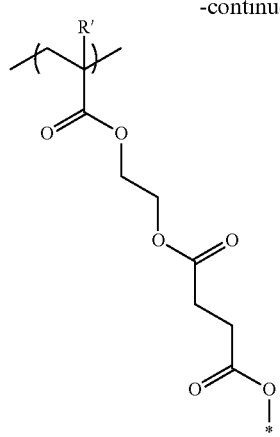
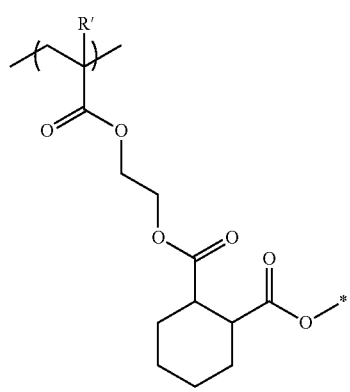
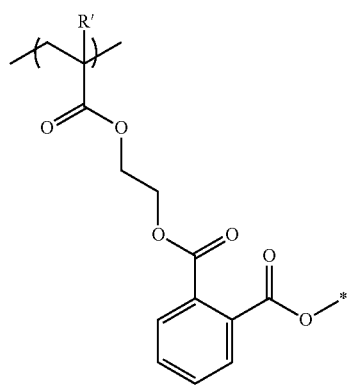
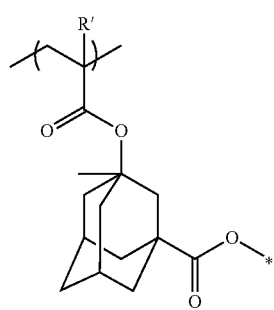
-continued
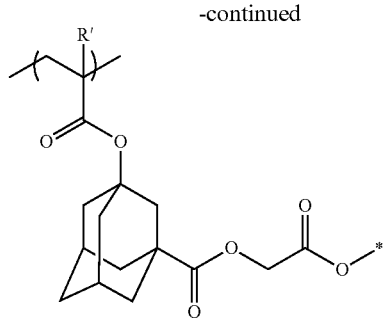
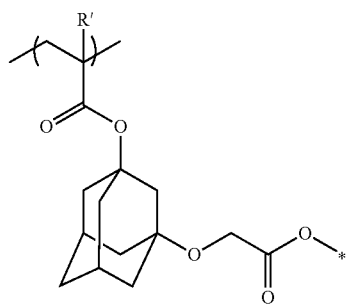
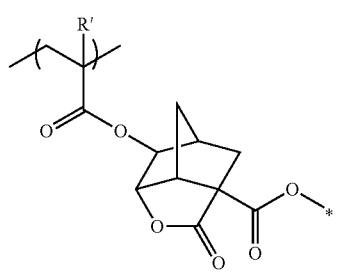
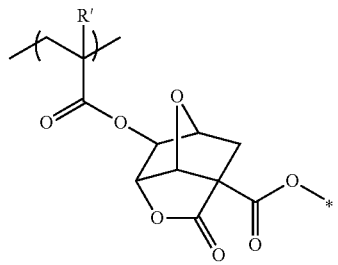
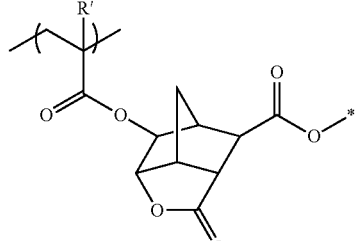
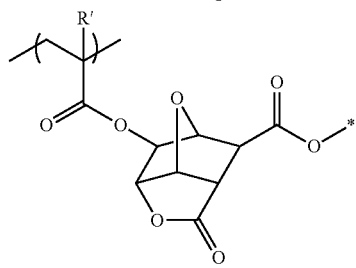

-continued
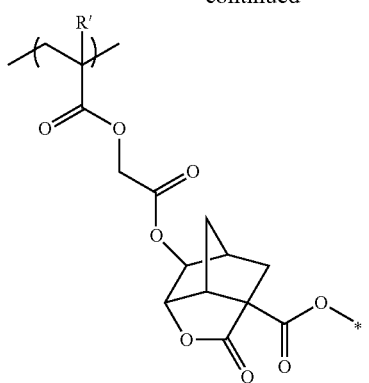
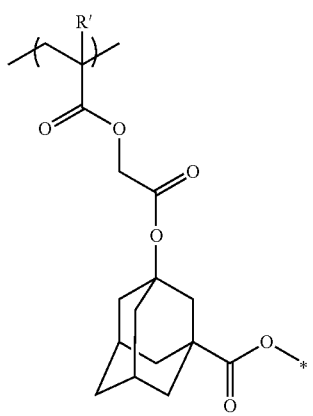
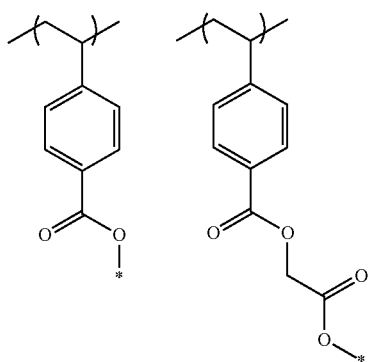
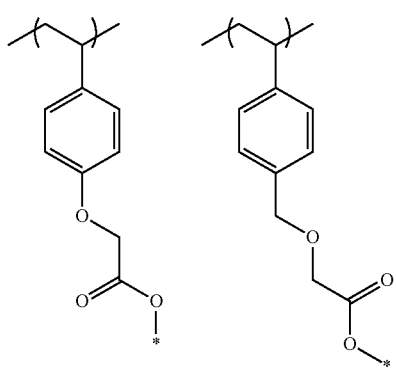
-continued
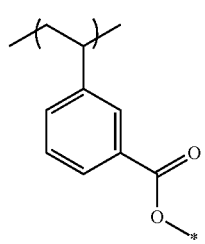
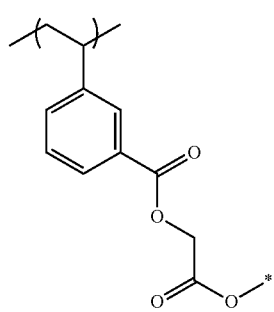
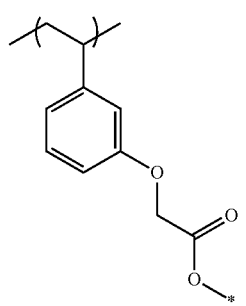
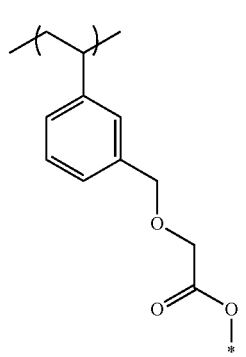
Specific examples of the monovalent substituent of $R_1$ in General Formula (Aa1) include the following ones. * represents a bonding arm linked to a carbon atom in General Formula (Aa1).
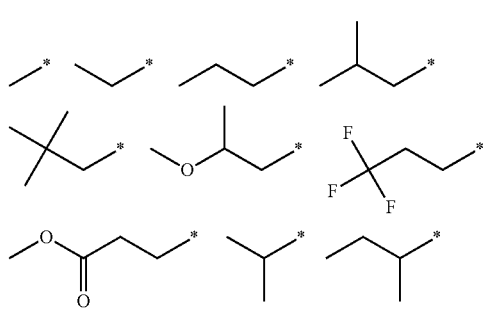

-continued
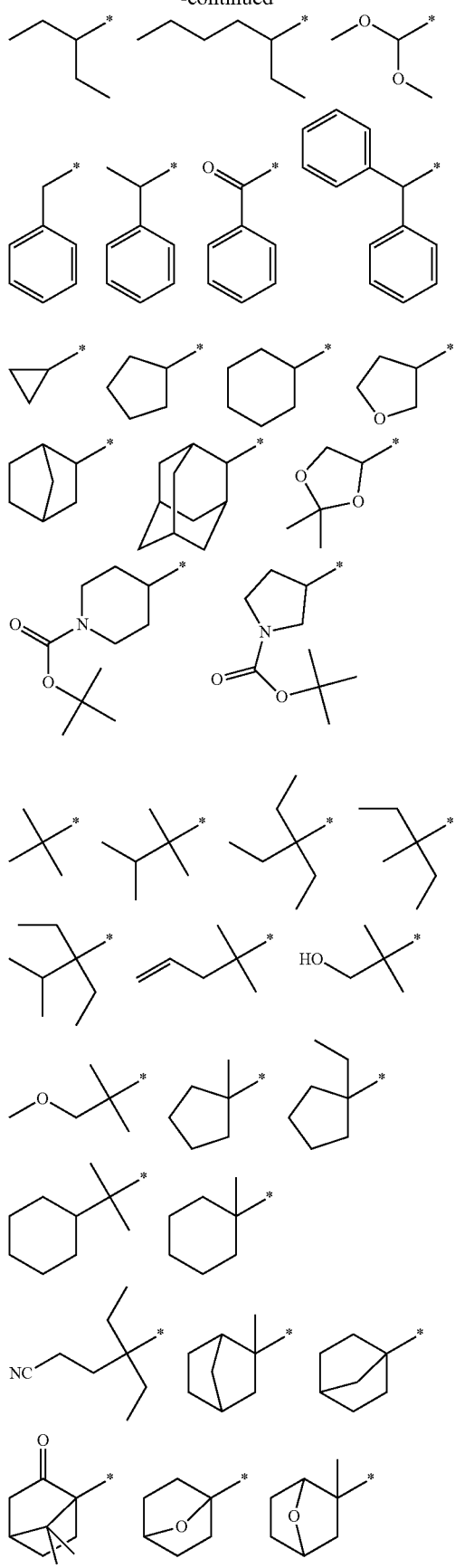
-continued
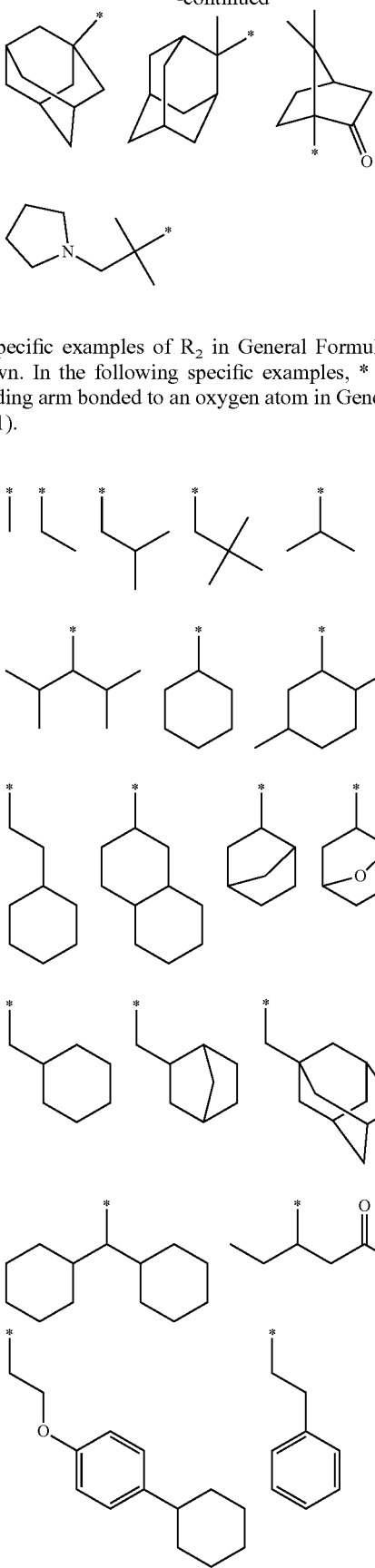
Specific examples of $R_2$ in General Formula (Aa1) are shown. In the following specific examples, * represents a bonding arm bonded to an oxygen atom in General Formula (Aa1).

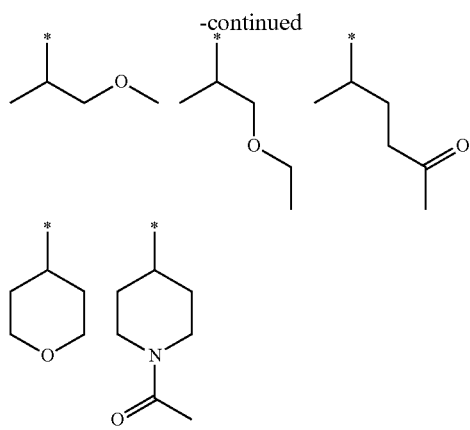

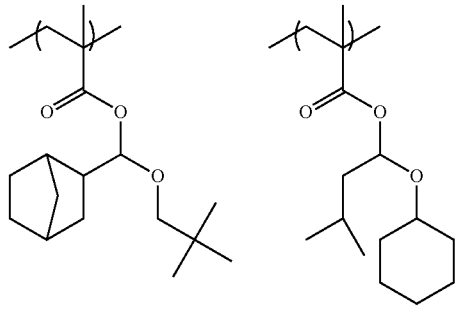

For the repeating unit represented by General Formula (Aa1), specific examples of an oxygen-containing heterocycle in a case where $R_1$ and $R_2$ are bonded to each other to form a ring, together with an oxygen atom in the formulae are shown below. * represents a bonding arm linked to an oxygen atom in General Formula (Aa1), and $R_{3f}$ is the same as $R_3$ in General Formula (Aa1).

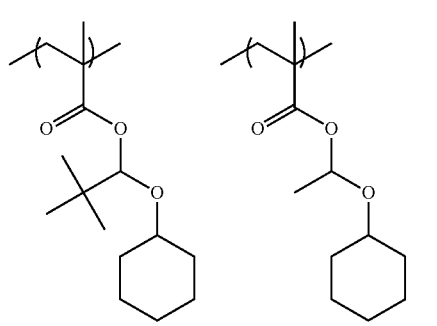

Specific examples of the repeating unit represented by General Formula (Aa1) are shown below, but the present invention is not limited thereto.

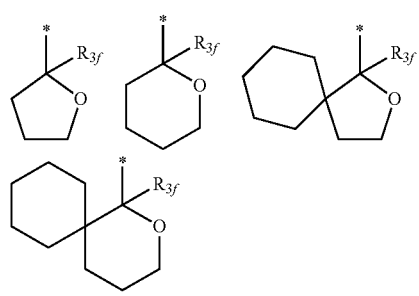

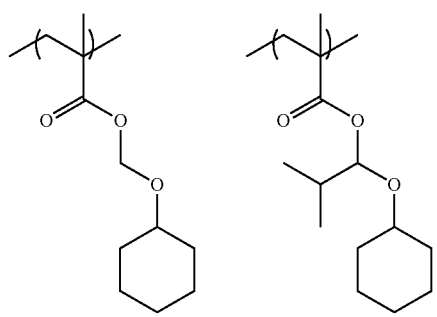

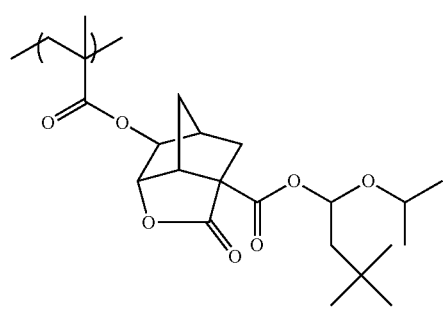

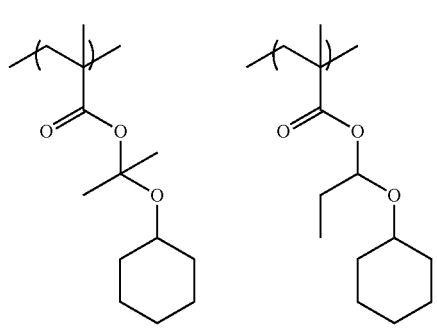

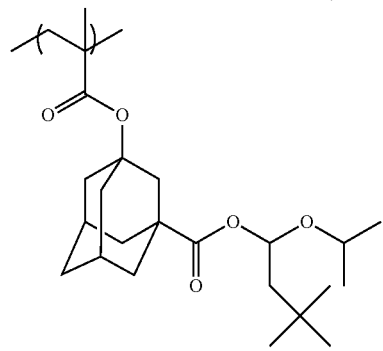

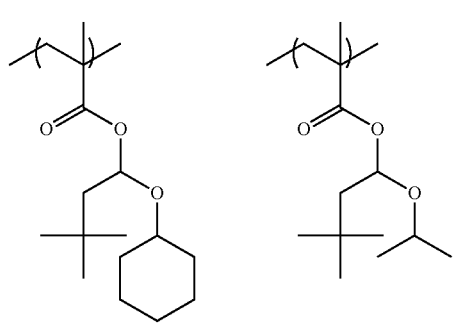

67
-continued
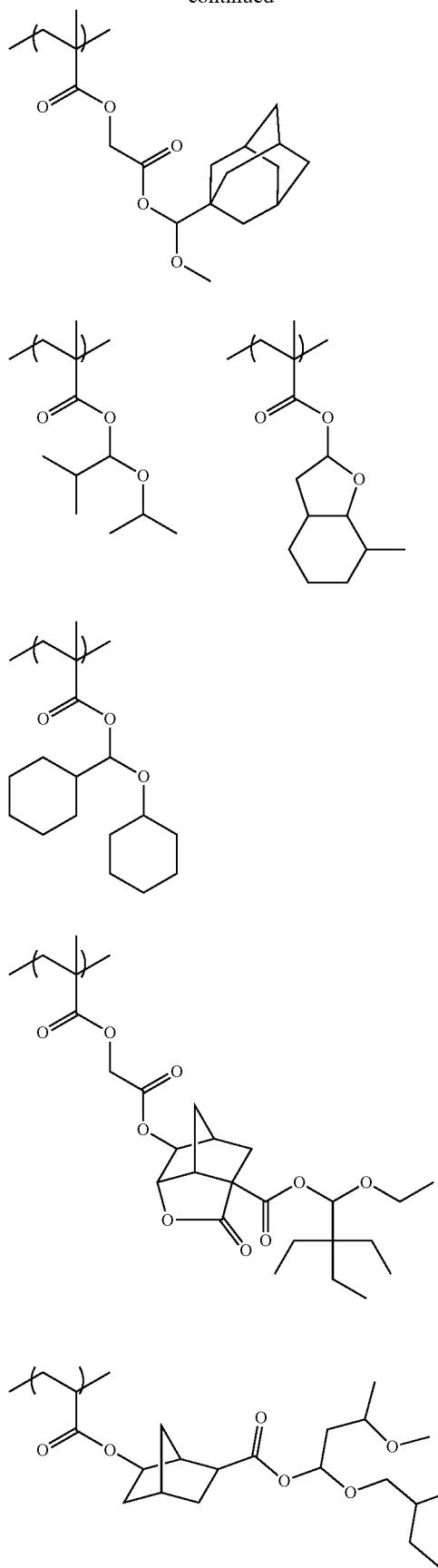
68
-continued
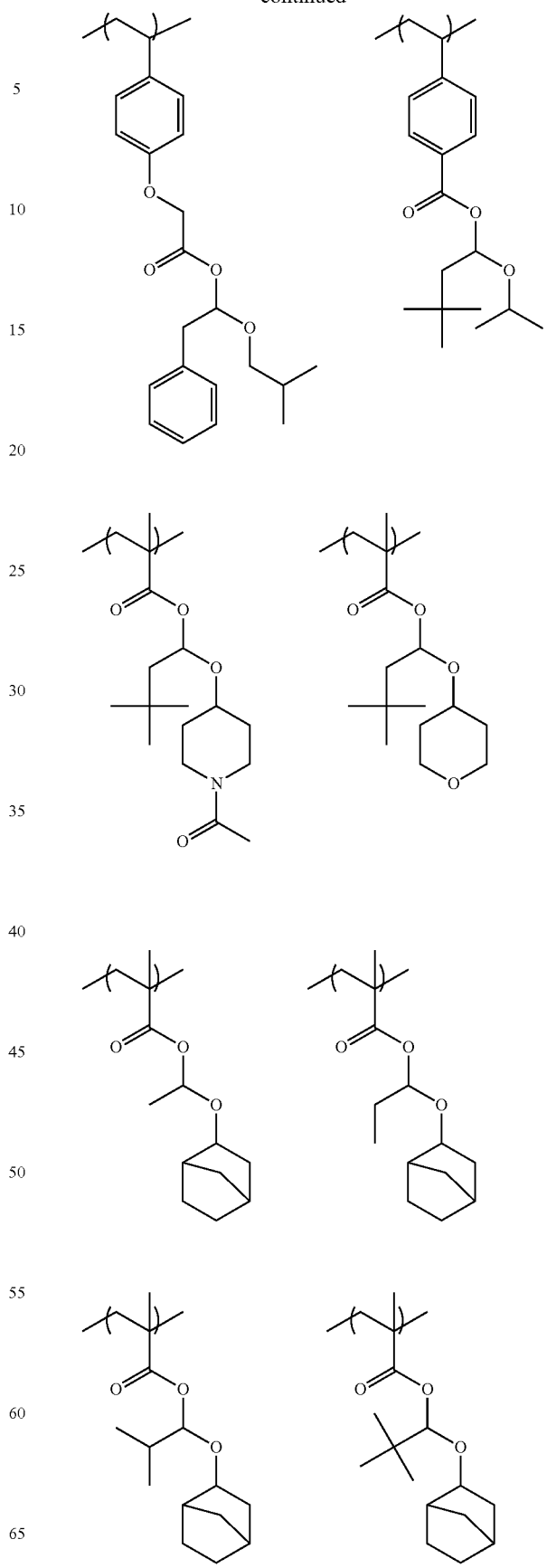

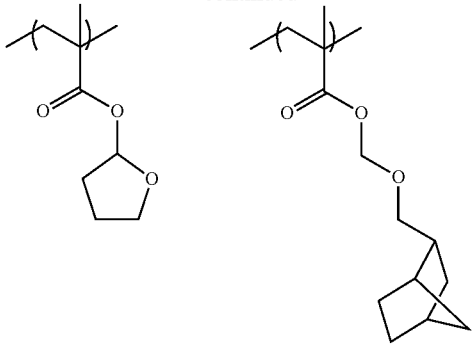

The content (a total sum thereof in a case of including a plurality of kinds) of the repeating unit represented by General Formula (Aa1) in the resin (B) is preferably 5% to 80% by mole, more preferably 5% to 60% by mole, and still more preferably 10% to 40% by mole, with respect to all the repeating units in the resin (B).

<Repeating Unit (Aa2)>

Next, the repeating unit represented by General Formula (Aa2) will be described in detail.

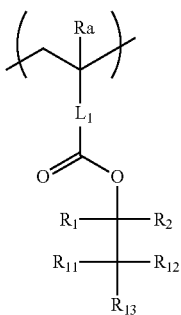

(Aa2)

In General Formula (Aa2), $R_1$ and $R_2$ each represent an alkyl group, as described above, provided that the number of carbon atoms which at least one of the alkyl groups have is 2 or more. From the viewpoint of more reliably accomplishing the effects of the present invention, it is preferable that both of $R_1$ and $R_2$ are alkyl groups having 2 or more carbon atoms, it is more preferable that both of $R_1$ and $R_2$ are alkyl groups having 2 to 10 carbon atoms, and it is still more preferable that both of $R_1$ and $R_2$ are ethyl groups.

In General Formula (Aa2), $R_{11}$ and $R_{12}$ each independently represent an alkyl group, as described above, and $R_{13}$ represents a hydrogen atom or an alkyl group. The alkyl group as each of $R_{11}$ to $R_{13}$ is preferably an alkyl group having 1 to 10 carbon atoms, and examples thereof include a methyl group, an ethyl group, a propyl group, an isopropyl group, an n-butyl group, a sec-butyl group, a t-butyl group, a neopentyl group, a hexyl group, a 2-ethylhexyl group, an octyl group, and a dodecyl group.

The alkyl group as each of $R_{11}$ and $R_{12}$ is more preferably an alkyl group having 1 to 4 carbon atoms, still more preferably a methyl group or an ethyl group, and particularly preferably a methyl group.

$R_{13}$ is more preferably a hydrogen atom or a methyl group.

$R_{11}$ and $R_{12}$ may be linked to each other to form a ring, as described above, and $R_{11}$ and $R_{13}$ may be linked to each other to form a ring. The ring thus formed is preferably, for example, a monocyclic or polycyclic alicyclic hydrocarbon group, and it is particularly preferable that $R_{11}$ and $R_{12}$ are bonded to each other to form a monocyclic or polycyclic alicyclic hydrocarbon group.

The ring formed by $R_{11}$ and $R_{12}$ linked to each other is preferably a 3- to 8-membered ring, and more preferably a 5- or 6-membered ring.

The ring formed by $R_{11}$ and $R_{13}$ linked to each other is preferably a 3- to 8-membered ring, and more preferably a 5- or 6-membered ring.

The ring formed by $R_{11}$ and $R_{12}$, or $R_{11}$ and $R_{13}$ linked to each other is preferably an alicyclic group which will be described later as X in General Formula (Aa2-1).

The alkyl group as each of $R_1$, $R_2$, and $R_{11}$ to $R_{13}$ may further have a substituent. Examples of such a substituent include a cycloalkyl group, an aryl group, an amino group, a hydroxyl group, a carboxy group, a halogen atom, an alkoxy group, an aralkyloxy group, a thioether group, an acyl group, an acyloxy group, an alkoxycarbonyl group, a cyano group, and a nitro group.

Furthermore, the ring formed by $R_{11}$ and $R_{12}$ linked to each other and the ring formed by $R_H$ and Ru linked to each other may each further have a substituent, and examples of such a substituent include alkyl groups (a methyl group, an ethyl group, a propyl group, a butyl group, and a perfluoroalkyl group (for example, a trifluoromethyl group)), and specific examples of the substituent which the alkyl group as each of $R_1$, $R_2$, and $R_{11}$ to $R_{13}$ may further have include the respective groups as described above.

The substituents may be bonded to each other to form a ring, and examples of the ring formed by the substituents bonded to each other include a cycloalkyl group having 3 to 10 carbon atoms and a phenyl group.

Ra represents a hydrogen atom, an alkyl group, a cyano group, or a halogen atom, as described above.

The alkyl group for Ra is preferably an alkyl group having 1 to 4 carbon atoms, and may have a substituent.

Preferred examples of the substituent which the alkyl group of Ra may have include a hydroxyl group and a halogen atom.

Examples of the halogen atom of Ra include a fluorine atom, a chlorine atom, a bromine atom, and an iodine atom.

Ra is preferably a hydrogen atom, a methyl group, a hydroxyl methyl group, and a perfluoroalkyl group having 1 to 4 carbon atoms (for example, a trifluoromethyl group), and particularly preferably a methyl group from the viewpoint of improving the glass transition point (Tg), the resolving power, and the space width roughness of the resin (A).

However, in a case where $L_1$ described below is a phenylene group, it is also preferable that Ra is a hydrogen atom.

$L_1$ represents a single bond or a divalent linking group, as described above.

Examples of the divalent linking group represented by $L_1$ include an alkylene group, a divalent aromatic ring group, —COO-$L_{11}$-, —O-$L_{11}$-, and a group formed by combination of two or more thereof. Here, $L_{11}$ represents an alkylene group, a cycloalkylene group, a divalent aromatic ring group, and a group formed by combination of an alkylene group and a divalent aromatic ring group.

Examples of the alkylene group for each of $L_1$ and $L_{11}$ include an alkylene group having 1 to 8 carbon atoms, such as a methylene group, an ethylene group, a propylene group, a butylene group, a hexylene group, and an octylene group. An alkylene group having 1 to 4 carbon atoms is more preferable, and an alkylene group having 1 or 2 carbon atoms is particularly preferable.

The cycloalkylene group for $L_{11}$ is preferably a cycloalkylene group having 3 to 20 carbon atoms, and examples thereof include a cyclopropylene group, a cyclobutylene group, a cyclopentylene group, a cyclohexylene group, a cycloheptylene group, a cyclooctylene group, a norbornylene group, and an adamantylene group.

In the cycloalkylene group for $L_{11}$, carbon constituting a ring (carbon contributing to ring formation) may be carbonyl carbon, may be a heteroatom such as an oxygen atom, and may contain an ester bond to form a lactone ring.

The divalent aromatic ring group of each of $L_1$ and $L_{11}$ is preferably a phenylene group such as 1,4-phenylene group, a 1,3-phenylene group, a 1,2-phenylene group, and a 1,4-naphthylene group, and more preferably a 1,4-phenylene group.

$L_1$ is preferably a single bond, a divalent aromatic ring group, a divalent group having a norbornylene group, or a divalent group having an adamantylene group, and particularly preferably a single bond.

Specific preferred examples of the divalent linking group for $L_1$ are shown below, but the present invention is not limited thereto.

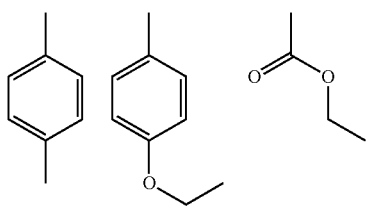

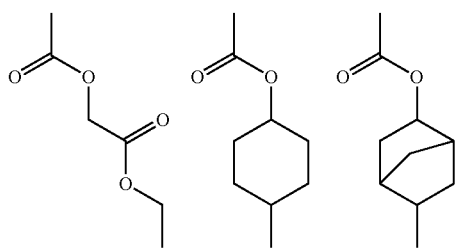

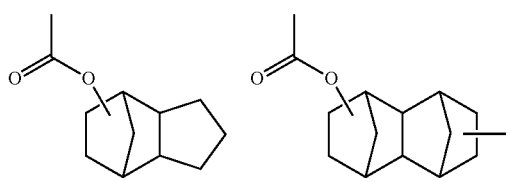

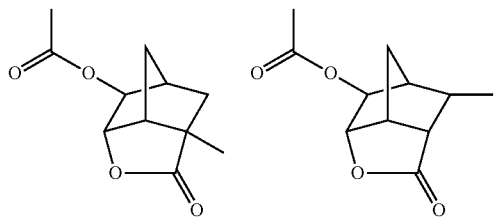

In one aspect of the present invention, the repeating unit represented by General Formula (Aa2) is preferably a repeating unit represented by General Formula (Aa2-1).

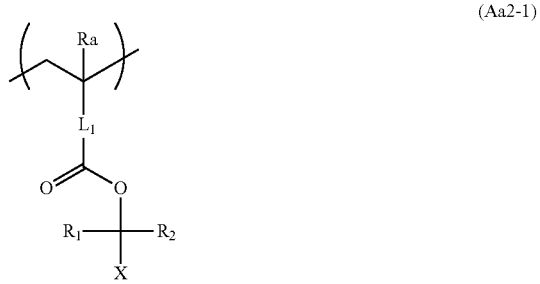

(Aa2-1)

In General Formula (Aa2-1),

X represents an alicyclic group.

$R_1$, $R_2$, Ra, and $L_1$ have the same definitions as $R_1$, $R_2$, Ra, and $L_1$, respectively, in General Formula (Aa2), and specific examples and preferred examples thereof are also the same as those for $R_1$, $R_2$, Ra, and $L_1$, respectively, in General Formula (Aa2).

The alicyclic group as X may be monocyclic, polycyclic, or bridged, and preferably represents an alicyclic group having 3 to 25 carbon atoms.

Furthermore, the alicyclic group may have a substituent, and examples of the substituent include the same substituents as described as the substituents which the ring formed by Ru and Rig linked to each other may have.

Specific examples of the repeating unit represented by General Formula (Aa2) or (Aa2-1) are shown below, but the present invention is not limited thereto.

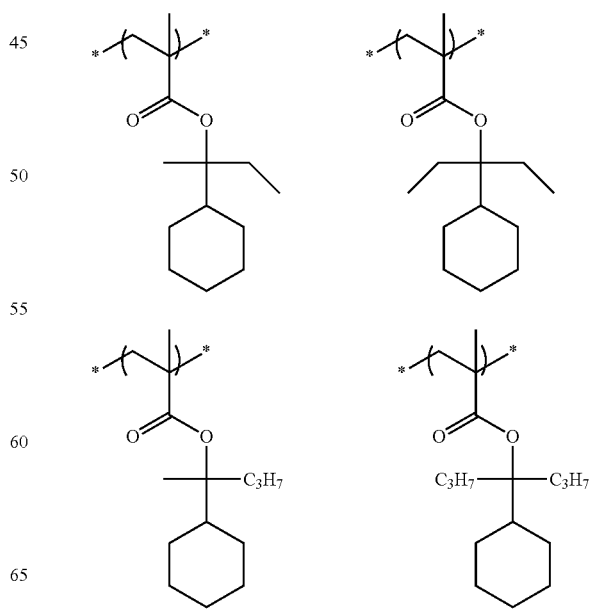

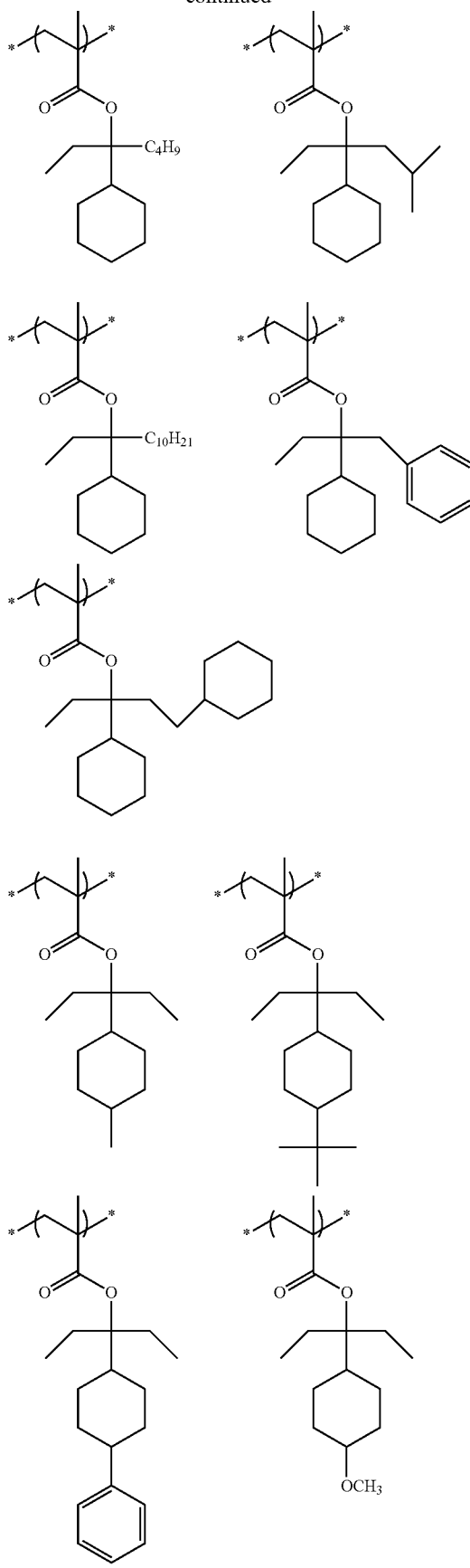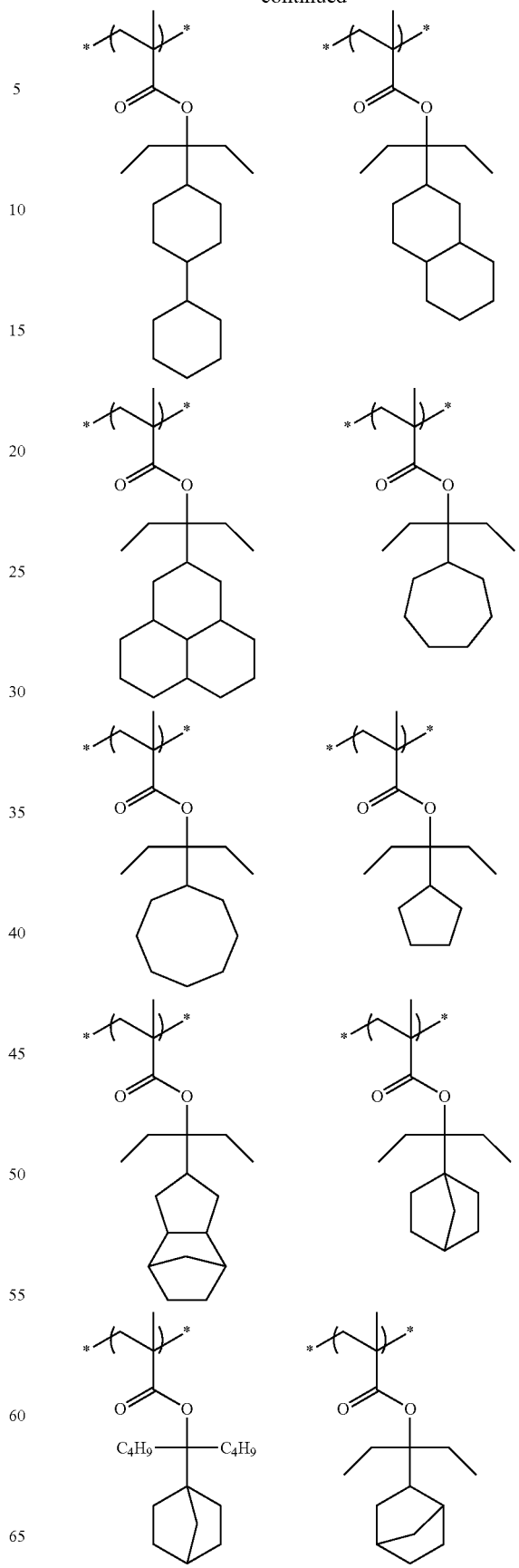

75
-continued
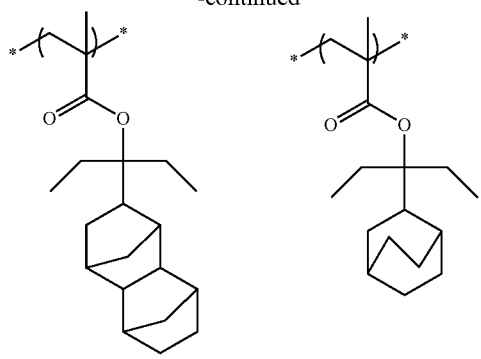
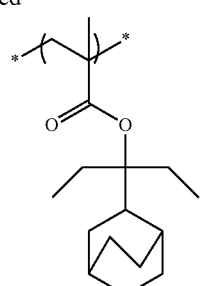
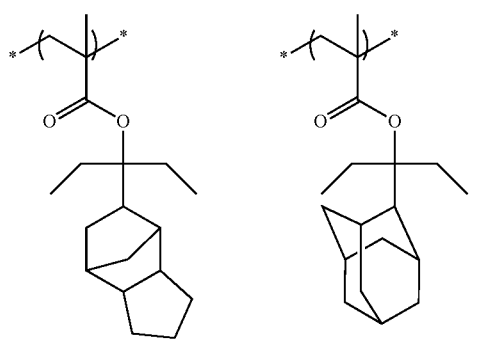
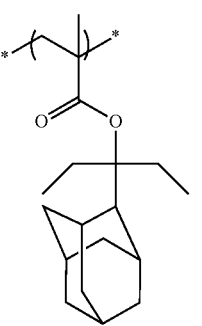
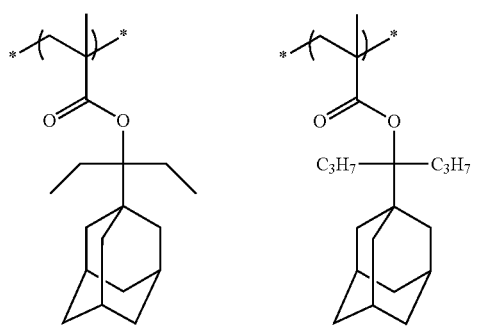
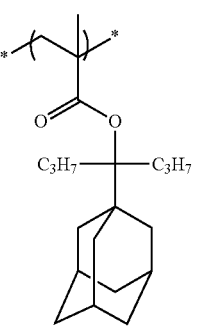
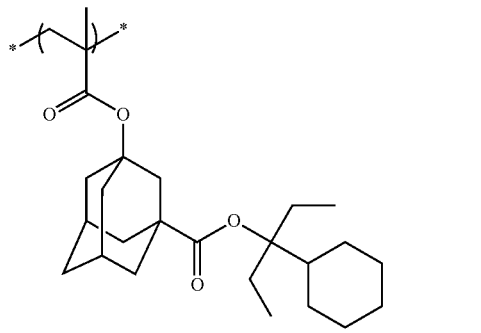
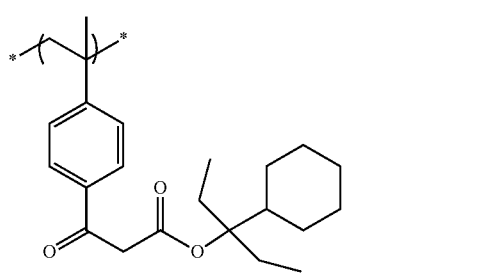
76
-continued
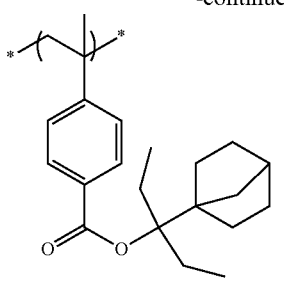
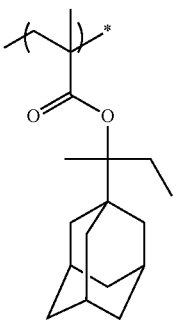
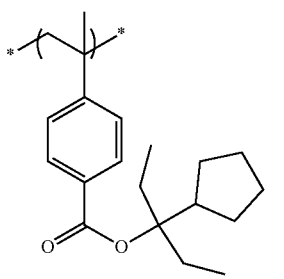
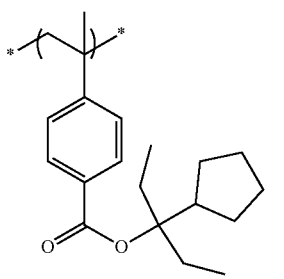
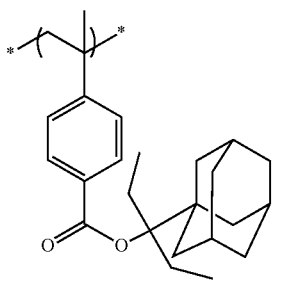
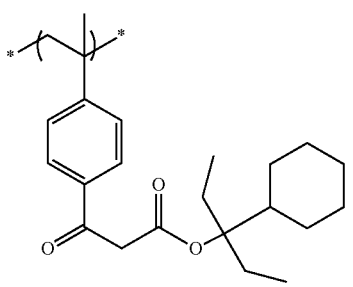
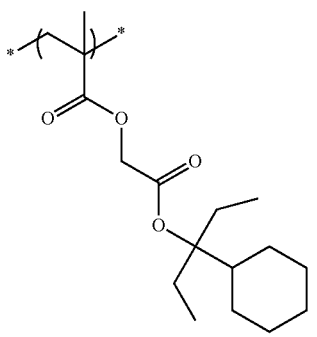

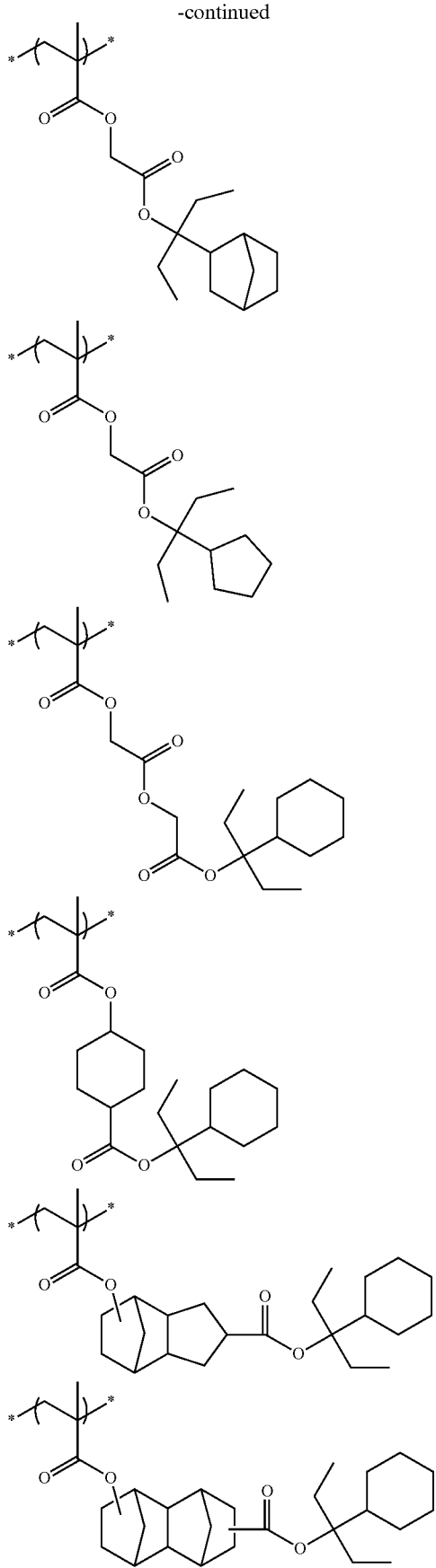
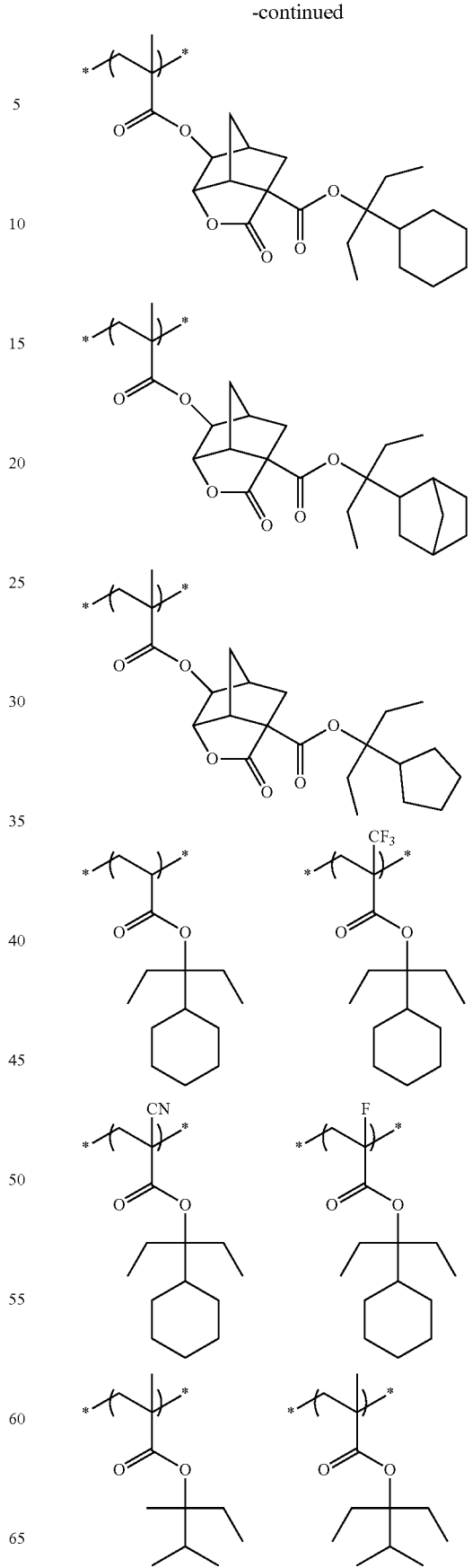

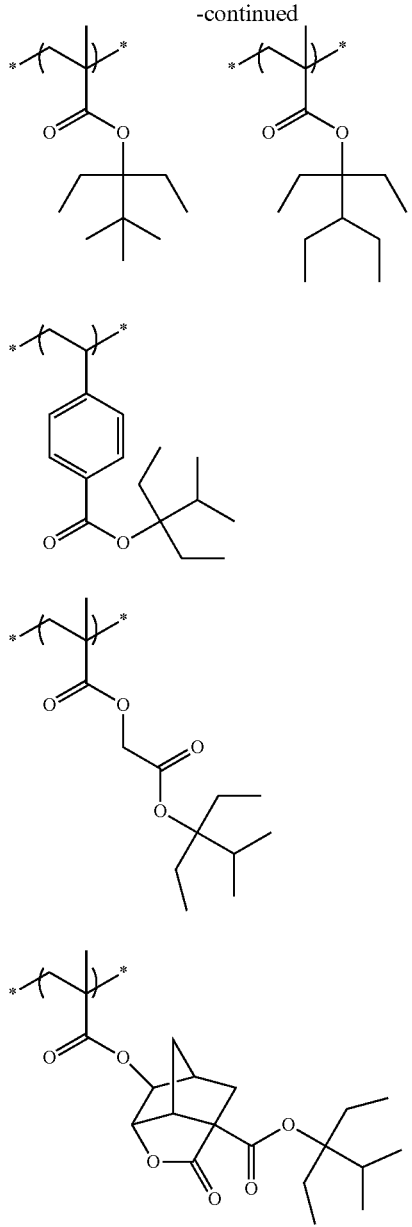

Specific examples of the repeating unit having one or more groups selected from the group consisting of fluorine atom, a group having a fluorine atom, a group having a silicon atom, an alkyl group having 6 or more carbon atoms, a cycloalkyl group having 5 or more carbon atoms, an aryl group having 6 or more carbon atoms, and an aralkyl group having 7 or more carbon atoms, contained in the resin (B), include, but are not limited to, the following repeating units.

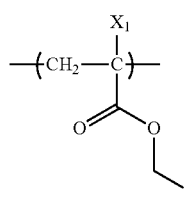
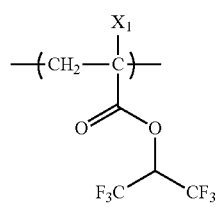
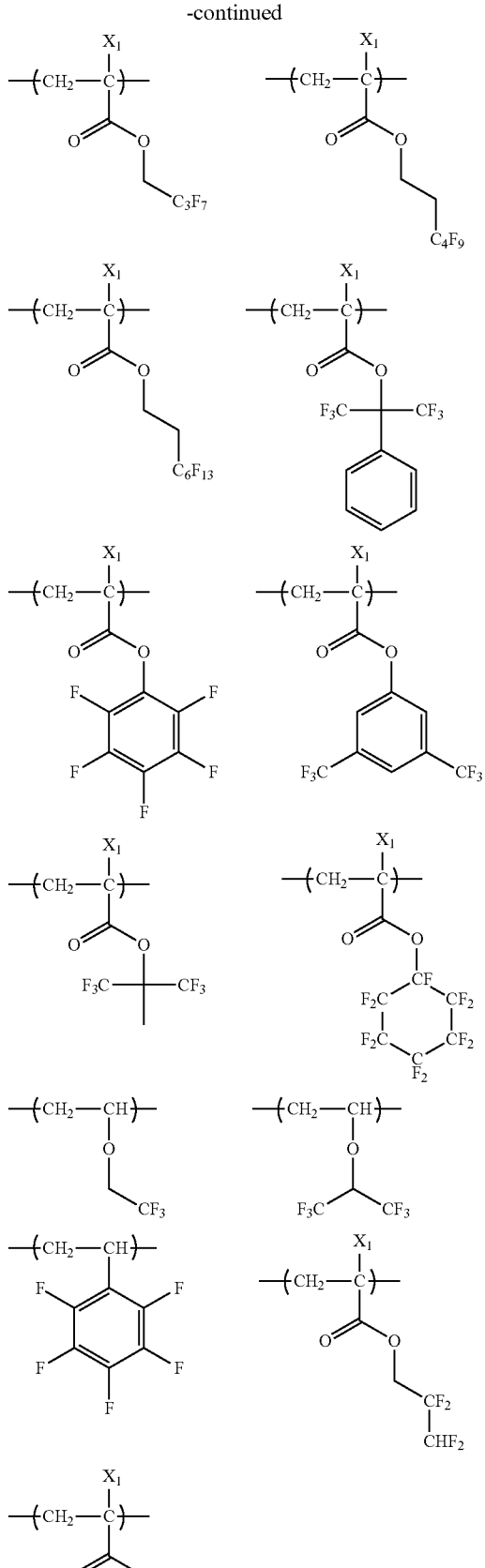
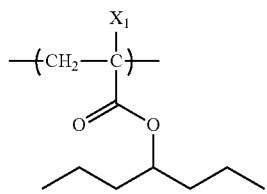

81
-continued
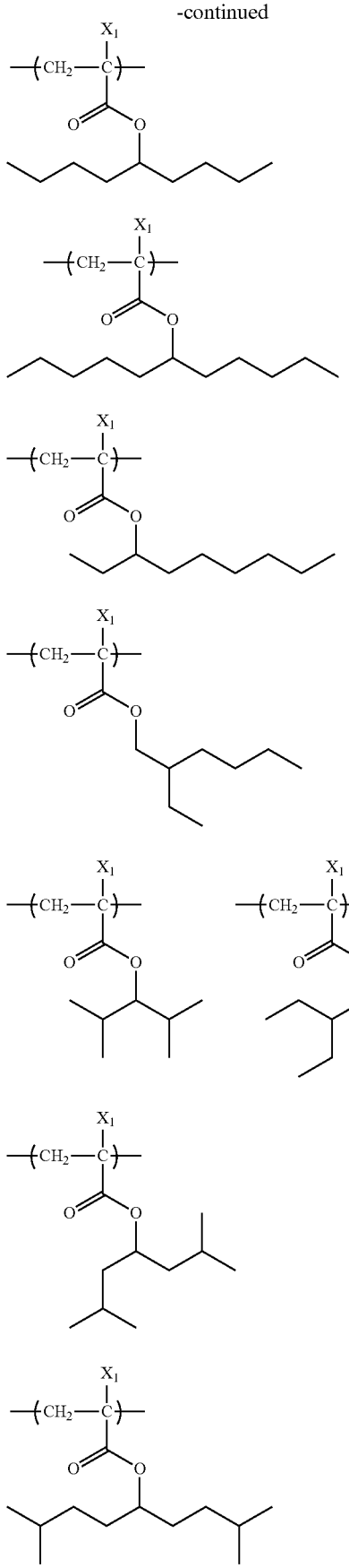
82
-continued
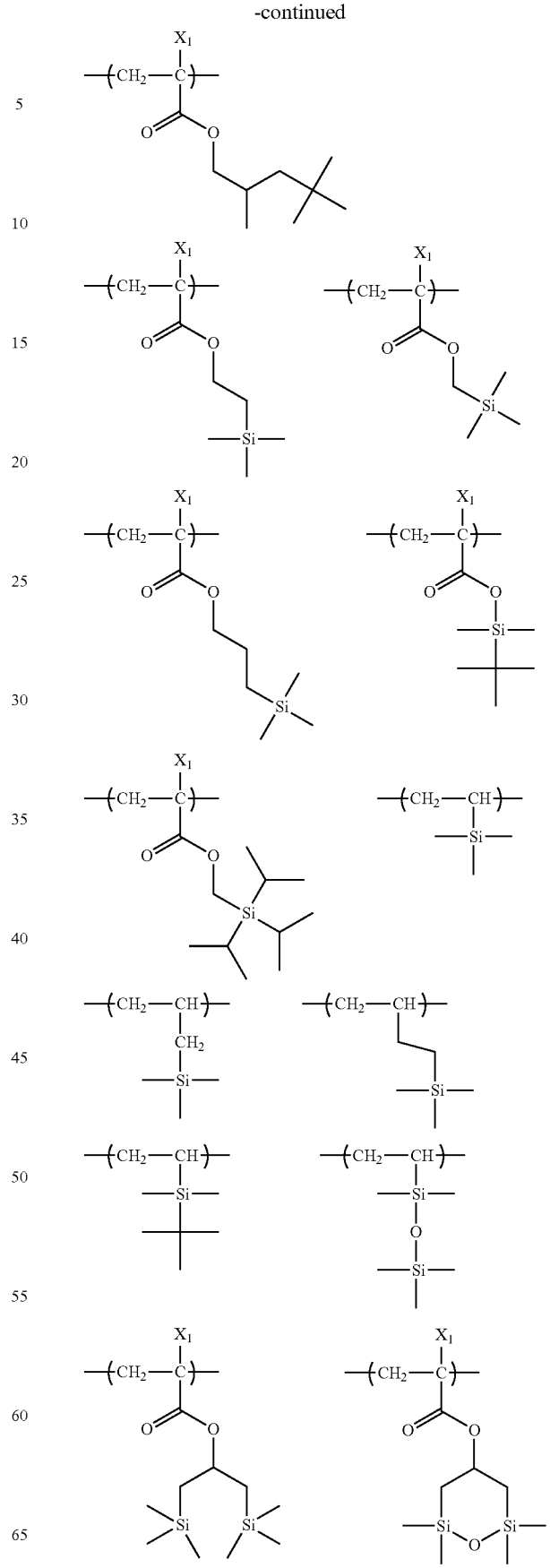

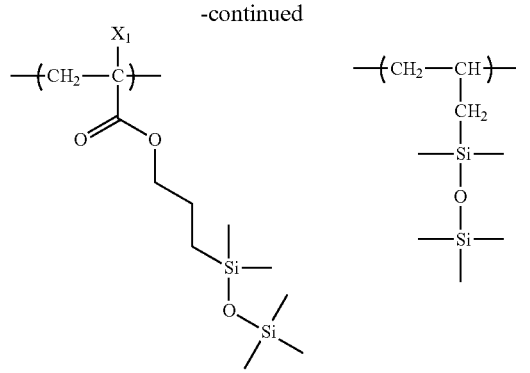
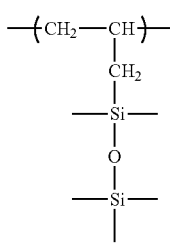
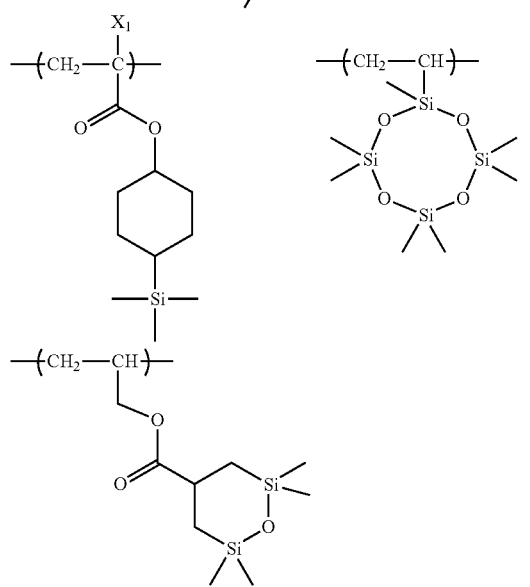
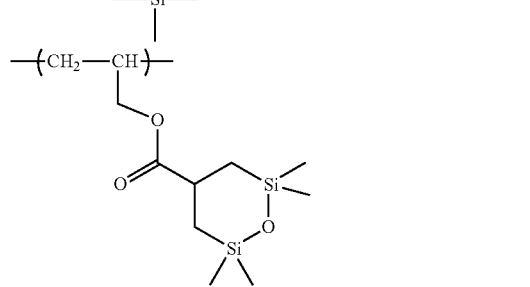
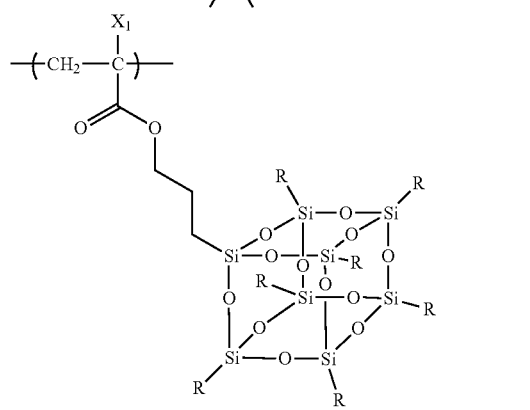
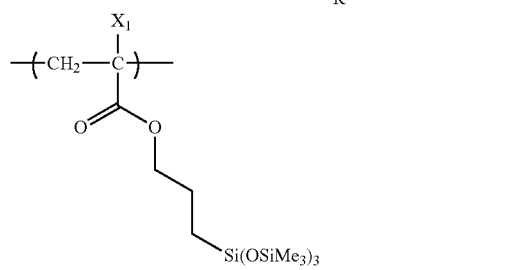
R = CH$_3$, C$_2$H$_5$, C$_3$H$_7$, C$_4$H$_9$
Specific examples of the resin (B) of the present invention are shown below, but the present invention is not limited thereto.
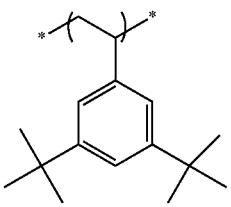
Aa-1
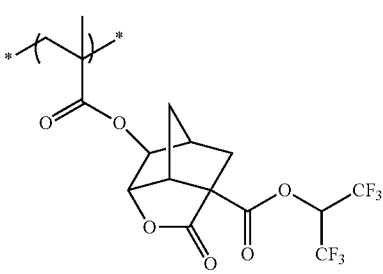
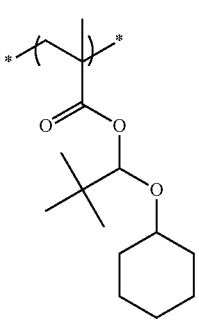
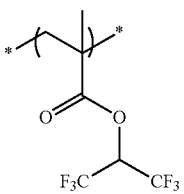
Aa-2
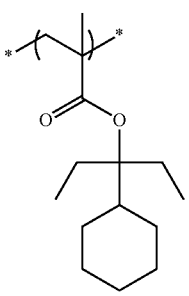
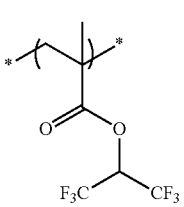
Aa-3

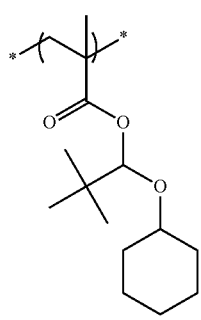
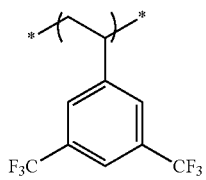
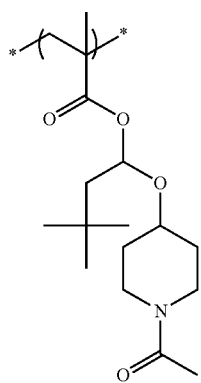
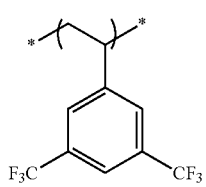
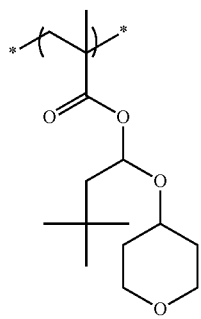
Aa-4
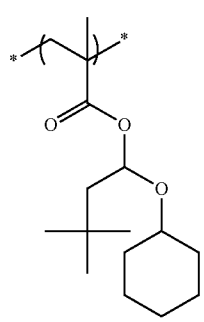
Aa-5
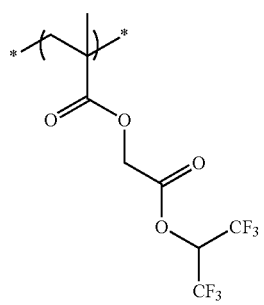
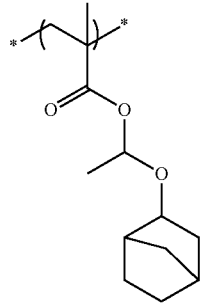
Aa-6
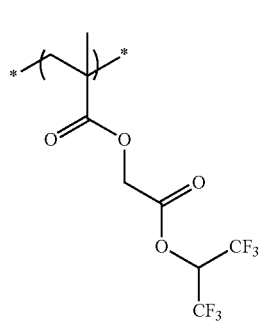
Aa-7
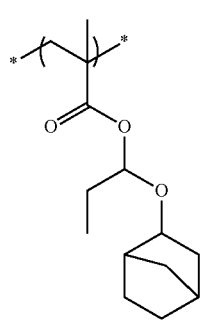
Aa-8

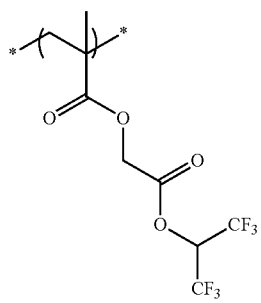
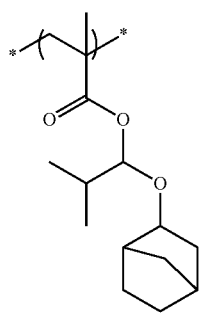
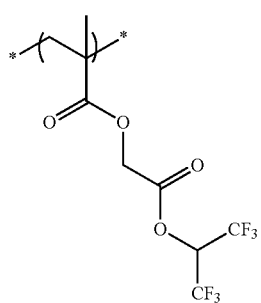
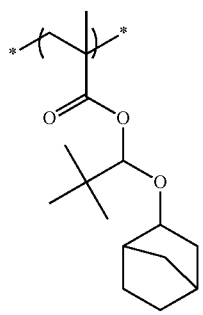
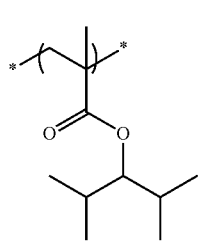
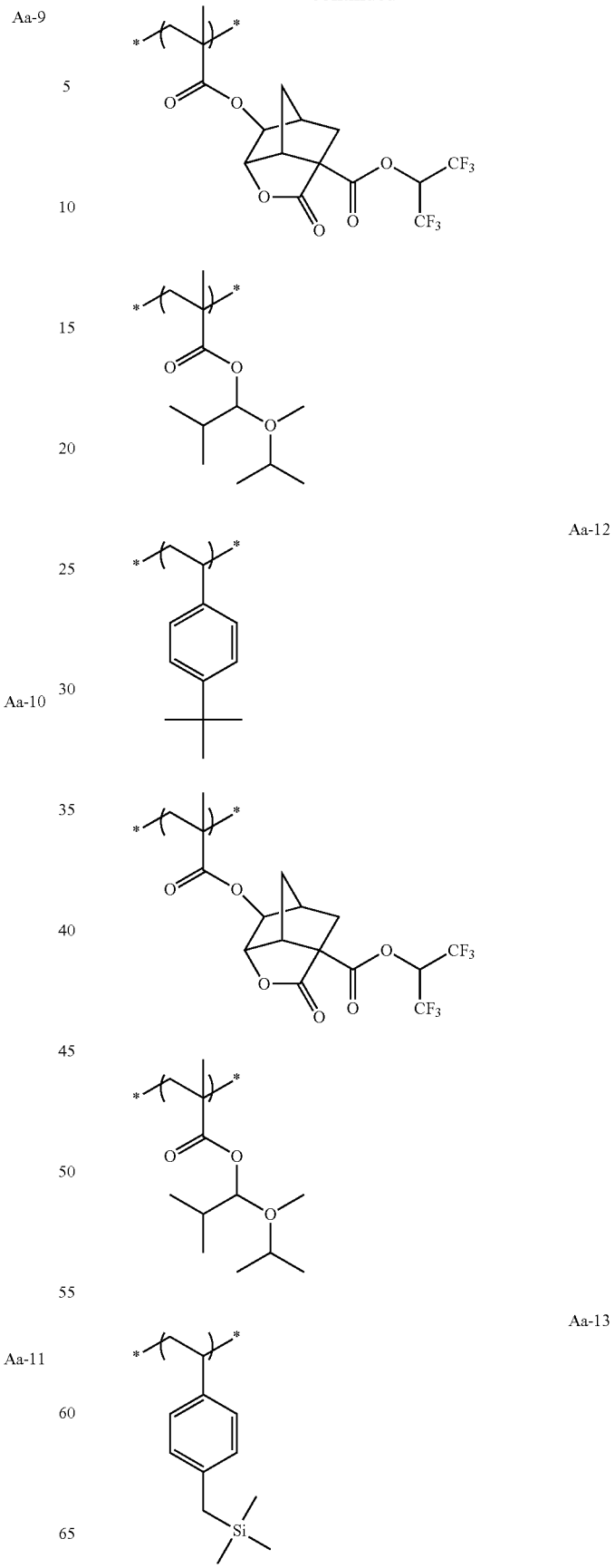

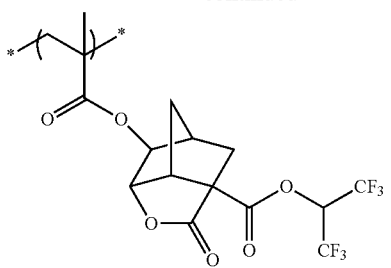
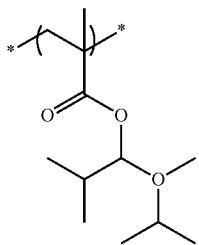
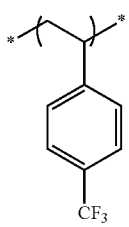
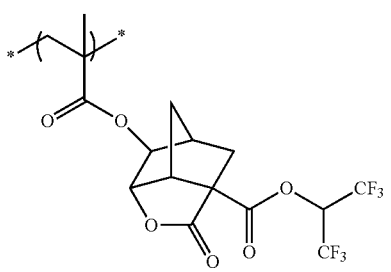
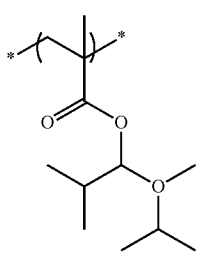
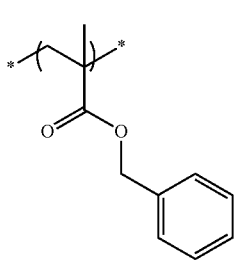
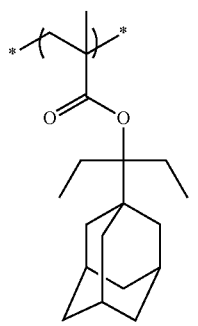
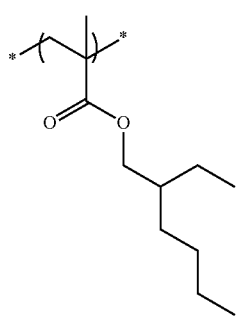
Aa-16
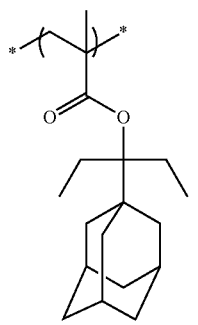
Aa-17
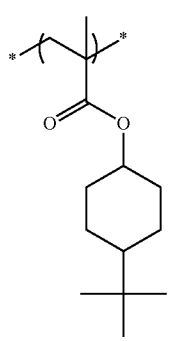
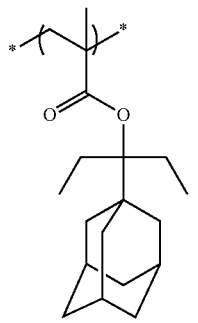

-continued
Aa-18
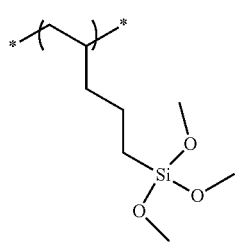
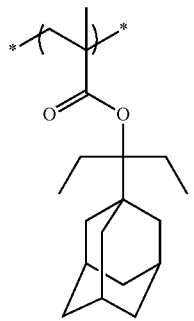
Aa-19
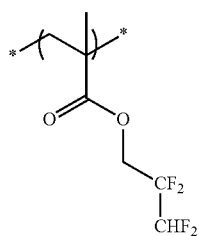
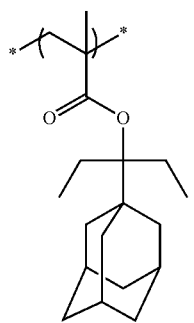
Aa-20
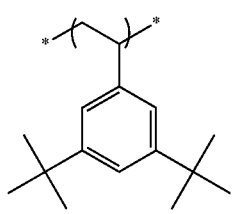
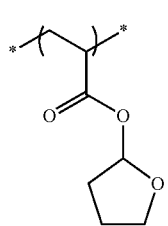
-continued
Aa-21
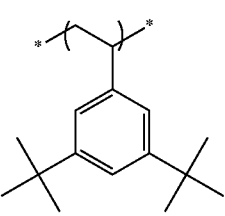
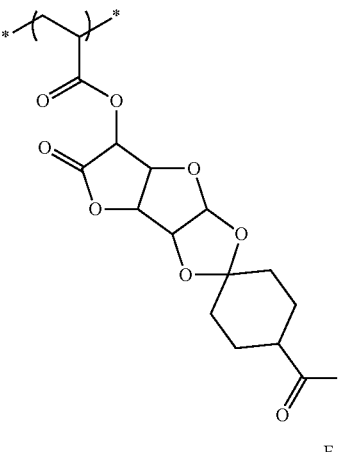
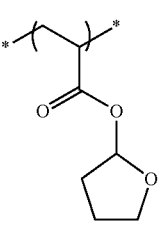
Aa-22
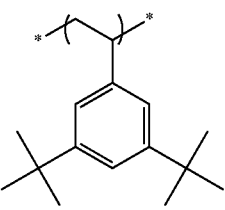
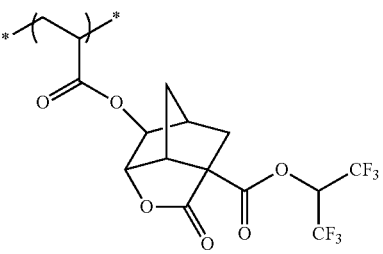
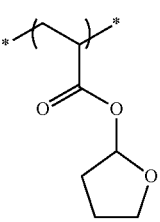

Aa-23
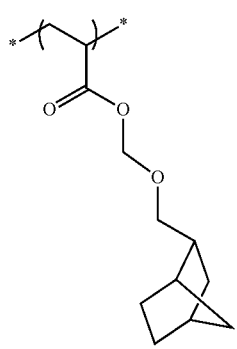
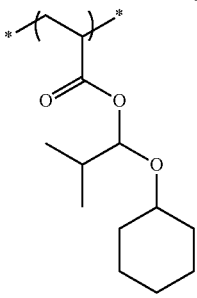
Aa-24
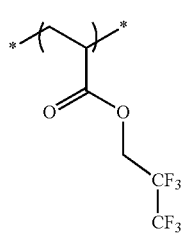
Aa-26
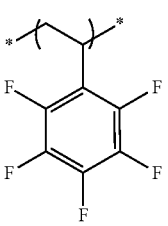
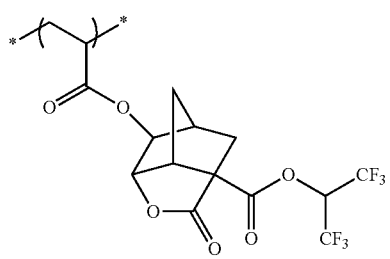
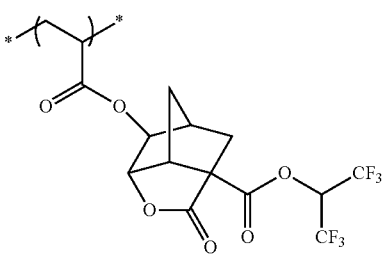
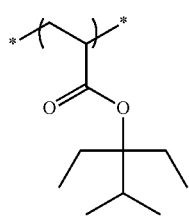
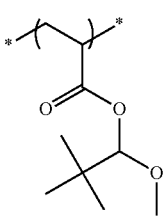
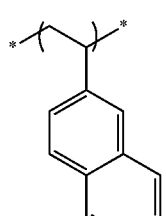
Aa-27
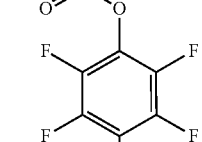
Aa-25
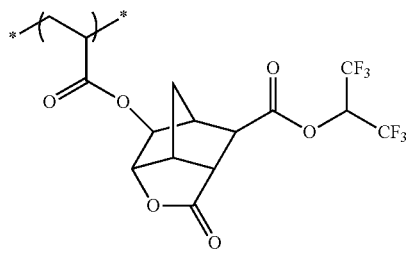
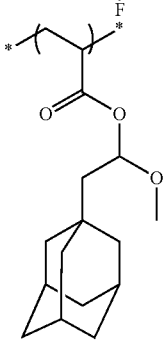

Aa-28
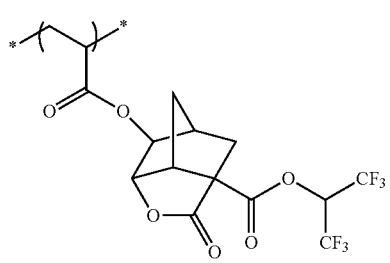
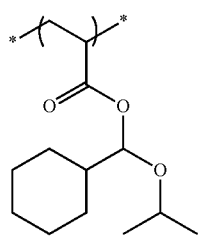
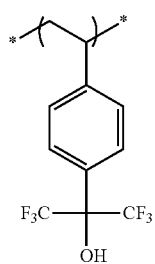
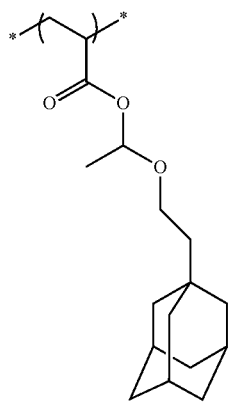
Aa-30
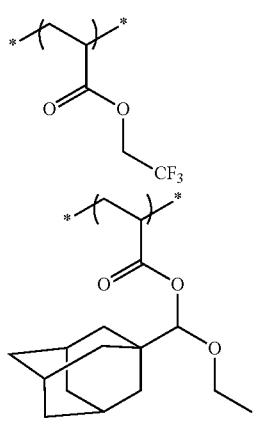
Aa-31
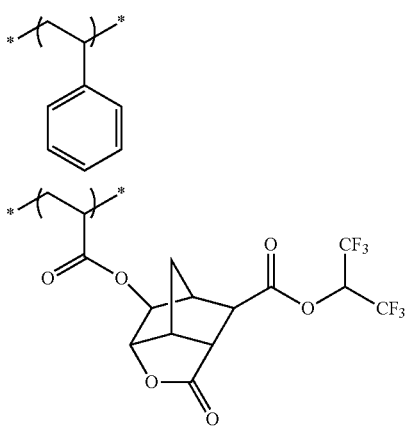
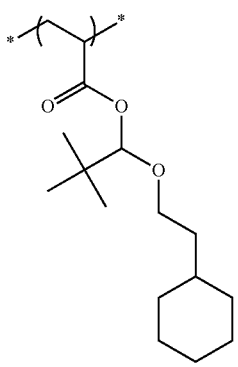
Aa-32
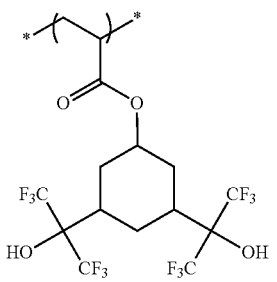
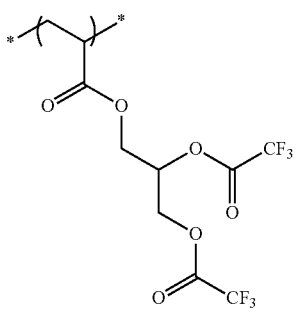
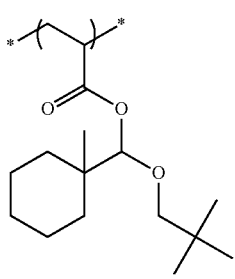

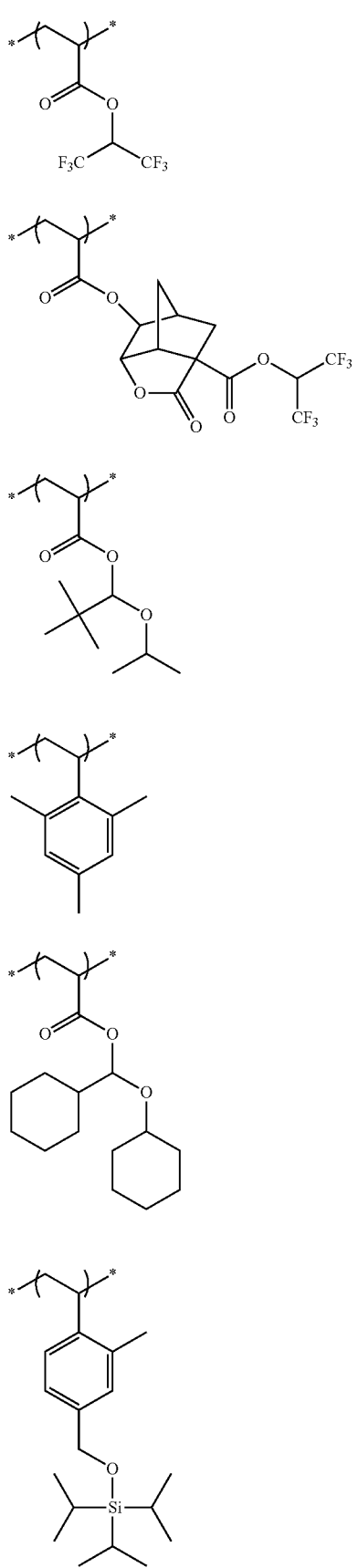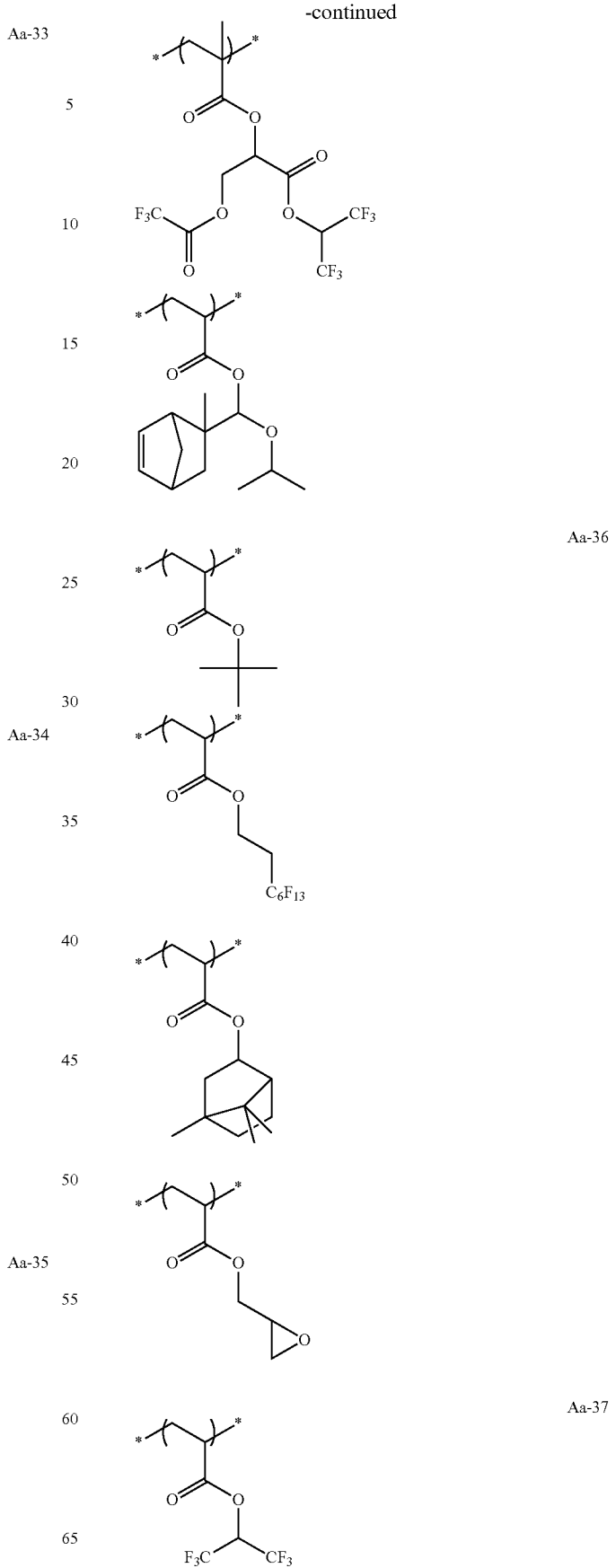

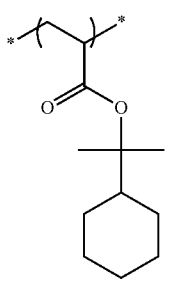
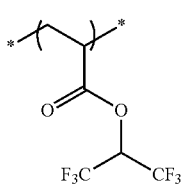
Aa-38
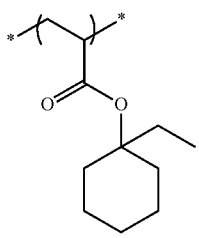
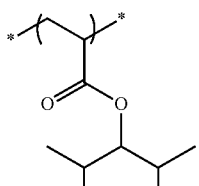
Aa-39
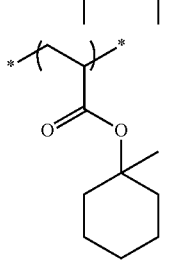
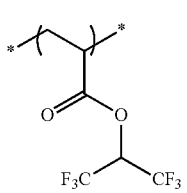
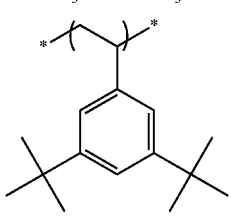
Aa-40
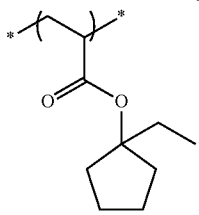
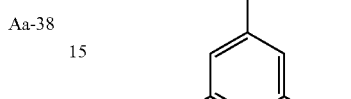
Aa-41
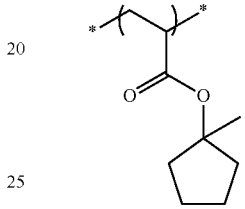
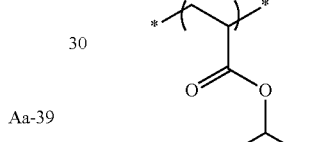
Aa-42
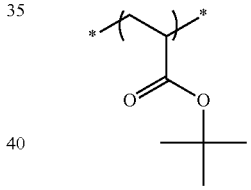
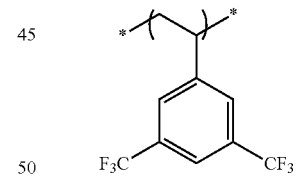
Aa-43
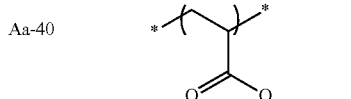
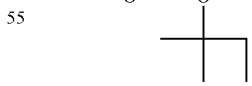
Aa-44
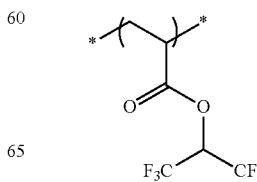

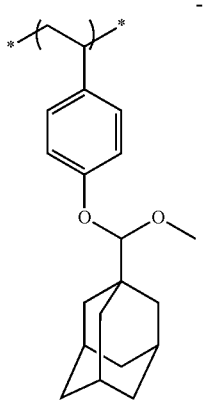
Aa-45
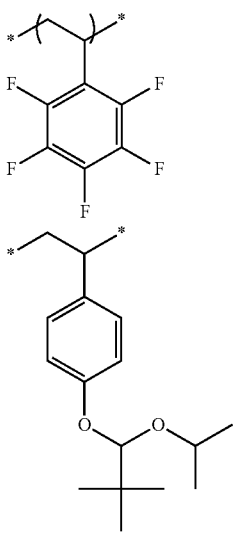
Aa-46
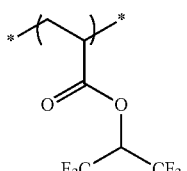
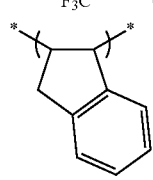
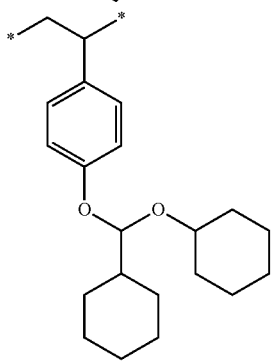
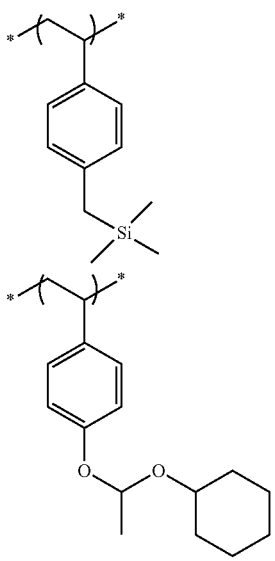
Aa-47
Aa-48
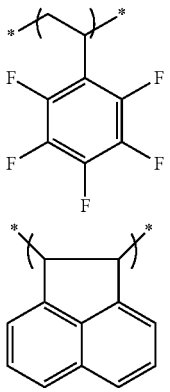
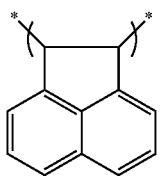
Aa-49
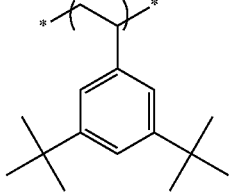

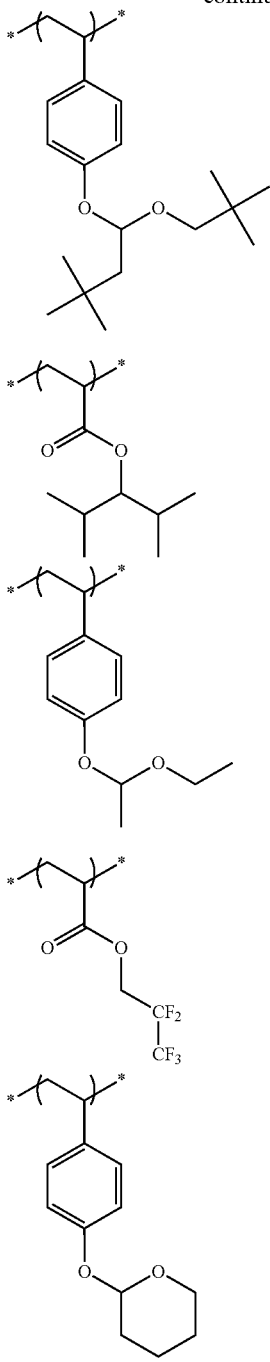

Aa-50

Aa-51

The weight-average molecular weight, the compositional ratio (molar ratio) of the repeating units, and the dispersity of each of the repeating units (Aa-1) to (Aa-51) included in the resin (B) are shown in Table 1. Incidentally, the compositional ratio of the repeating units is described in correspondence with the repeating units in order as described.

TABLE 1

| | | Weight-average molecular weight | Compositional ratio | | | | Dispersity |
|---|---|---|---|---|---|---|---|
| Aa- | 1 | 8,000 | 10 | 80 | 10 | — | 1.51 |
| Aa- | 2 | 5,000 | 60 | 40 | — | — | 1.45 |
| Aa- | 3 | 5,000 | 60 | 40 | — | — | 1.43 |
| Aa- | 4 | 3,000 | 80 | 20 | — | — | 1.65 |
| Aa- | 5 | 4,000 | 80 | 20 | — | — | 1.62 |
| Aa- | 6 | 3,000 | 80 | 20 | — | — | 1.63 |
| Aa- | 7 | 20,000 | 90 | 10 | — | — | 1.48 |
| Aa- | 8 | 21,000 | 90 | 10 | — | — | 1.48 |
| Aa- | 9 | 22,000 | 90 | 10 | — | — | 1.47 |
| Aa- | 10 | 21,000 | 90 | 10 | — | — | 1.47 |
| Aa- | 11 | 10,000 | 15 | 75 | 10 | — | 1.50 |
| Aa- | 12 | 9,000 | 15 | 75 | 10 | — | 1.51 |
| Aa- | 13 | 8,000 | 15 | 75 | 10 | — | 1.53 |
| Aa- | 14 | 9,000 | 15 | 75 | 10 | — | 1.56 |
| Aa- | 15 | 15,000 | 70 | 30 | — | — | 1.55 |
| Aa- | 16 | 16,000 | 70 | 30 | — | — | 1.54 |
| Aa- | 17 | 15,000 | 70 | 30 | — | — | 1.58 |
| Aa- | 18 | 17,000 | 70 | 30 | — | — | 1.55 |
| Aa- | 19 | 16,000 | 70 | 30 | — | — | 1.57 |
| Aa- | 20 | 12,000 | 85 | 15 | — | — | 1.50 |
| Aa- | 21 | 11,000 | 5 | 80 | 15 | — | 1.52 |
| Aa- | 22 | 12,000 | 5 | 80 | 15 | — | 1.51 |
| Aa- | 23 | 15,000 | 100 | — | — | — | 1.77 |
| Aa- | 24 | 12,000 | 10 | 85 | 5 | — | 1.54 |
| Aa- | 25 | 18,000 | 20 | 40 | 40 | — | 1.62 |
| Aa- | 26 | 4,000 | 30 | 50 | 20 | — | 1.55 |
| Aa- | 27 | 5,000 | 40 | 60 | — | — | 1.53 |
| Aa- | 28 | 16,000 | 70 | 30 | — | — | 1.58 |
| Aa- | 29 | 9,000 | 40 | 60 | — | — | 1.59 |
| Aa- | 30 | 8,000 | 30 | 70 | — | — | 1.49 |
| Aa- | 31 | 8,000 | 15 | 70 | 15 | — | 1.67 |
| Aa- | 32 | 7,000 | 30 | 30 | 40 | — | 1.56 |
| Aa- | 33 | 10,000 | 20 | 70 | 10 | — | 1.55 |
| Aa- | 34 | 11,000 | 50 | 50 | — | — | 1.50 |
| Aa- | 35 | 15,000 | 50 | 10 | 40 | — | 1.51 |
| Aa- | 36 | 7,000 | 40 | 30 | 15 | 15 | 1.56 |
| Aa- | 37 | 5,000 | 60 | 40 | — | — | 1.44 |
| Aa- | 38 | 25,000 | 40 | 60 | — | — | 1.65 |
| Aa- | 39 | 7,000 | 45 | 55 | — | — | 1.47 |
| Aa- | 40 | 24,000 | 40 | 40 | 20 | — | 1.60 |
| Aa- | 41 | 4,000 | 55 | 45 | — | — | 1.51 |
| Aa- | 42 | 12,000 | 70 | 30 | — | — | 1.56 |
| Aa- | 43 | 5,000 | 50 | 50 | — | — | 1.58 |
| Aa- | 44 | 15,000 | 15 | 85 | — | — | 1.61 |
| Aa- | 45 | 12,000 | 30 | 70 | — | — | 1.54 |
| Aa- | 46 | 19,000 | 20 | 15 | 65 | — | 1.63 |
| Aa- | 47 | 9,000 | 30 | 70 | — | — | 1.45 |
| Aa- | 48 | 22,000 | 10 | 10 | 80 | — | 1.50 |
| Aa- | 49 | 6,000 | 25 | 25 | 50 | — | 1.41 |
| Aa- | 50 | 7,000 | 60 | 40 | — | — | 1.58 |
| Aa- | 51 | 11,000 | 75 | 25 | — | — | 1.55 |

The content of the resin (B) is preferably 0.01% to 30% by mass, more preferably 0.1% to 15% by mass, and particularly preferably 1.0% to 8% by mass, with respect to the total solid content in the actinic ray-sensitive or radiation-sensitive resin composition of the present invention.

The resin (B) may be used singly or in combination of two or more kinds thereof.

[Resin (C) Having Aromatic Ring, Different from Resin (B)]

The actinic ray-sensitive or radiation-sensitive resin composition of the present invention contains a resin (C) having an aromatic ring (also referred to as a "resin (C)"), different from the resin (B).

Furthermore, the resin (C) may be the compound (A), as described above. That is, the resin (C) may be a compound whose dissolution rate in an alkali developer decreases by the action of an acid.

In addition, in the present invention, the resin (B) is unevenly distributed on the surface of a resist pattern, as described above, and suppresses formation of sparingly soluble materials, which is considered to reduce scum. Therefore, the resin (C) is preferably selected such that the resin (B) may be unevenly distributed on the surface. Accordingly, in a case where the resin (B) includes a repeating unit having a fluorine atom, it is preferable that the resin (C) does not include a repeating unit having a fluorine atom; in a case where the resin (B) includes a repeating unit having a group having a fluorine atom, it is preferable that the resin (C) does not include a repeating unit having a group having a fluorine atom; in a case where the resin (B) includes a repeating unit having a group having a silicon atom, it is preferable that the resin (C) does not include a repeating unit having a group having a silicon atom; in a case where the resin (B) includes a repeating unit having an alkyl group having 6 or more carbon atoms, it is preferable that the resin (C) does not include a repeating unit having an alkyl group having 6 or more carbon atoms; and in a case where the resin (B) includes a repeating unit having a cycloalkyl group having 5 or more carbon atoms, it is preferable that the resin (C) does not include a repeating unit having a cycloalkyl group having 5 or more carbon atoms.

In a case where resin (B) has an aryl group or an aralkyl group, the aryl group or the aralkyl group contained in the resin (C) is preferably the aryl group of the resin (B), an aryl group having a less number of carbon atoms than that of an aralkyl group, or an aralkyl group. The number of carbon atoms of the aryl group of the resin (B) is preferably 7 or more, and more preferably 10 or more. The number of carbon atoms of the aralkyl group of the resin (B) is preferably 8 or more, and more preferably 10 or more.

The aromatic ring in the present invention is a monocyclic or polycyclic aromatic ring, and examples thereof include a benzene ring and a naphthalene ring.

The resin (C) is preferably a resin having a repeating unit represented by General Formula (30).

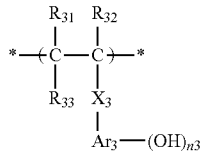

General Formula (30)

In General Formula (30), $R_{31}$, $R_{32}$, and $R_{33}$ each independently represent a hydrogen atom, an alkyl group, a cycloalkyl group, a halogen atom, a cyano group, or an alkoxycarbonyl group. $R_{33}$ may be bonded to $Ar_3$ to form a ring, and $R_{33}$ in this case represents an alkylene group.

$X_3$ represents a single bond or a divalent linking group.

$Ar_3$ represents an (n3+1)-valent aromatic ring group, and in a case of being bonded with $R_{33}$ to form a ring, $Ar_3$ represents an (n3+2)-valent aromatic ring group.

n3 represents an integer of 1 to 4.

$Ar_3$ represents an (n3+1)-valent aromatic ring group. The divalent aromatic ring group in a case where n3 is 1 may have a substituent, and preferred examples thereof include arylene groups having 6 to 18 carbon atoms, such as a phenylene group, a tolylene group, a naphthylene group, and an anthracenylene group, and aromatic ring groups including a heterocycle, such as thiophene, furan, pyrrole, benzothiophene, benzofuran, benzopyrrole, triazine, imidazole, benzimidazole, triazole, thiadiazole, and thiazole.

Suitable specific examples of the (n3+1)-valent aromatic ring group in a case where n3 is an integer of 2 or greater can include a group obtained by excluding (n3−1) arbitrary hydrogen atoms from the specific examples described above of the divalent aromatic ring group.

The (n3+1)-valent aromatic ring group may further have a substituent.

Examples of the substituent which the alkylene group and the (n3+1)-valent aromatic ring group described above can have include an alkyl group (preferably an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, which may have a substituent, more preferably an alkyl group having 8 or less carbon atoms, and particularly preferably an alkyl group having 3 or less carbon atoms), an alkoxy group such as a methoxy group, an ethoxy group, a hydroxyethoxy group, a propoxy group, a hydroxylpropoxy group, and a butoxy group, and an aryl group such as a phenyl group.

Examples of the divalent linking group of $X_3$ include —COO— and —CONR$_{64}$—.

Examples of the alkyl group of $R_{64}$ in —CONR$_{64}$— ($R_{64}$ represents a hydrogen atom or an alkyl group) represented by $X_3$ include the same groups as the alkyl groups of each of $R_{61}$ to $R_{63}$.

$X_3$ is preferably a single bond, —COO—, or —CONH—, and more preferably a single bond or —COO—.

$Ar_3$ is more preferably an aromatic ring group having 6 to 18 carbon atoms, which may have a substituent, and particularly preferably a benzene ring group, a naphthalene ring group, or a biphenylene ring group.

The repeating unit represented by General Formula (30) preferably has a hydroxystyrene structure. That is, $Ar_3$ is preferably a benzene ring group.

n3 represents an integer of 1 to 4, preferably 1 or 2, and more preferably 1.

The resin (C) may be constituted only with the repeating unit having an aromatic ring as described above. The resin (C) may also have the repeating unit which will be described later, in addition to the repeating unit having an aromatic ring as described above. In this case, the content of the repeating unit having an aromatic ring is preferably 10% to 98% by mole, more preferably 30% to 97% by mole, and still more preferably 40% to 95% by mole, with respect to all the repeating units of the resin (C). With these contents, particularly, in a case where the resist film is a thin film (for example, a case where the thickness of the resist film is 10 to 150 nm), the dissolution rate of an exposed area of a resist film formed using the composition of the present invention in an alkali developer can be more reliably reduced (that is, the dissolution rate of the resist film using the composition of the present invention can be more reliably controlled to an optimal value). As a result, the sensitivity can be more reliably improved.

Specific examples of the repeating unit having an aromatic ring are shown below, but are not limited thereto.

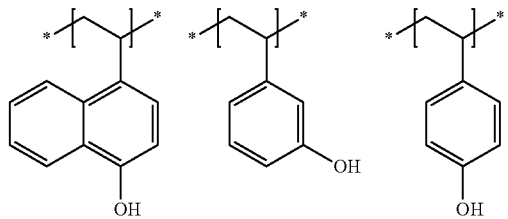

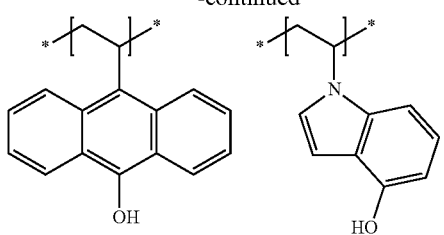
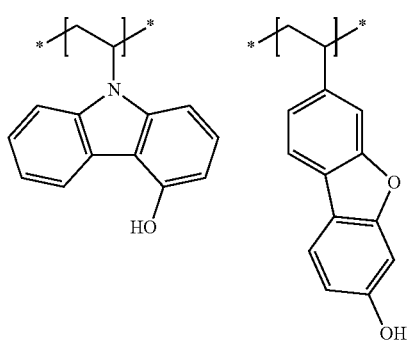
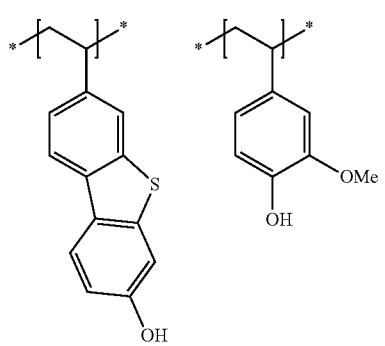
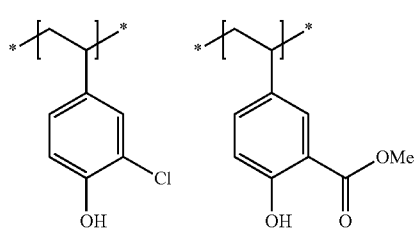
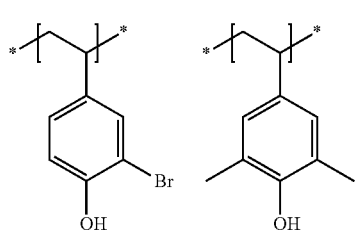
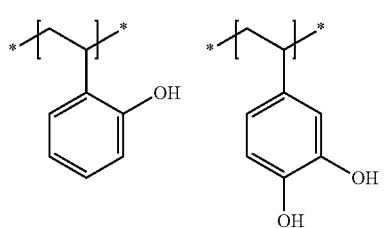
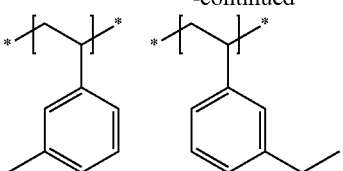
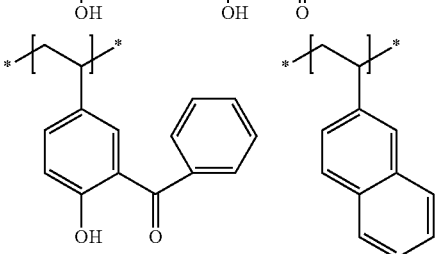
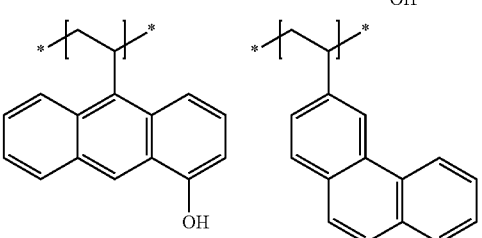
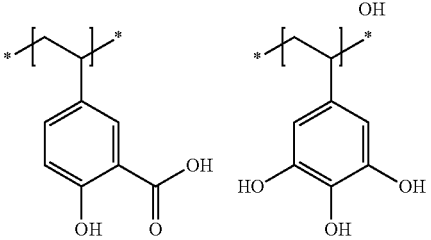
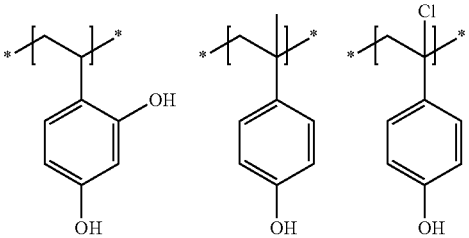
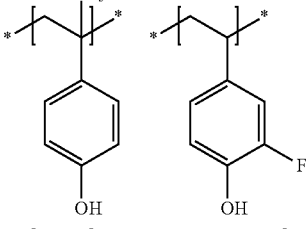
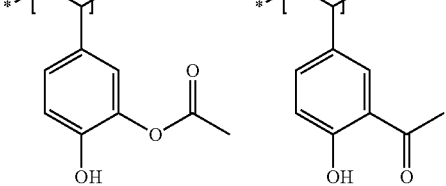

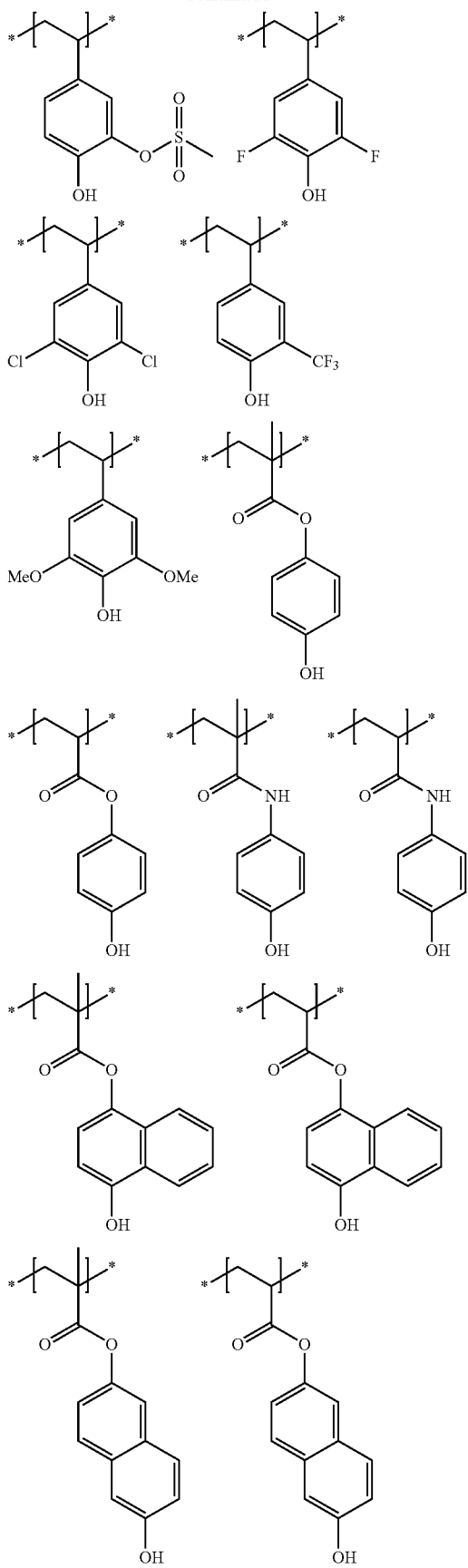

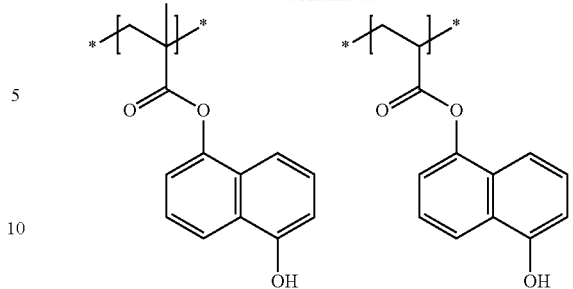

The resin (C) preferably has a phenolic hydroxyl group, but preferably a structure in which the phenolic hydroxyl group is substituted with a group having non-acid-decomposable alicyclic hydrocarbon structure which is polycyclic, in view that a high glass transition temperature (Tg) is obtained and the dry etching resistance is improved.

When the resin (C) has the above-mentioned specific structure, the glass transition temperature (Tg) of the resin (C) becomes higher, and thus, a very hard resist film can be formed, and diffusivity or dry etching resistance of an acid can be controlled. Accordingly, since the diffusivity of an acid is highly suppressed in an exposed area with actinic rays or radiation such as electron beams and extreme ultraviolet rays, the resolving power, the pattern shape, and the LER performance of fine patterns are more excellent. Further, it is considered that the resin (C) which has a non-acid-decomposable alicyclic hydrocarbon structure which is polycyclic contributes to further improvement of dry etching resistance. In addition, further details are not clear, but the alicyclic hydrocarbon structure which is polycyclic has high donating properties of a hydrogen radical and becomes a hydrogen source upon decomposition of a photoacid generator, and therefore, it is presumed that the decomposition efficiency of the photoacid generator is further improved, and the acid generating efficiency further increases, which is considered to contribute to superior sensitivity.

In the above-mentioned specific structure which the resin (C) may have, an aromatic ring such as a benzene ring and a group having a non-acid-decomposable alicyclic hydrocarbon structure which is polycyclic are linked to each other through an oxygen atom derived from a phenolic hydroxyl group. As described above, the structure cannot only contribute to high dry etching resistance, but also enhance the glass transition temperature (Tg) of the resin (C), and it is presumed that a combination thereof provides a higher resolving power.

In the present invention, the non-acid-decomposability means a property that a decomposition reaction does not occur by an acid generated by a photoacid generator.

More specifically, a group having a non-acid-decomposable alicyclic hydrocarbon structure which is polycyclic is preferably a group which is stable against an acid and an alkali. The group which is stable against an acid and an alkali means a group which does not exhibit acid decomposability and alkali decomposability. Here, acid-decomposability means a property that a photoacid generator causes a decomposition reaction by the action of the generated acid.

In addition, the alkali decomposability means a property of causing a decomposition reaction by the action of an alkali developer, and examples of a group exhibiting alkali decomposability include a group (for example, a group having a lactone structure) which is decomposed by the action of an alkali developer known in the related art, included in a resin suitably used in a positive tone and chemical amplification type resist composition, and thus, its dissolution rate in an alkali developer increases.

The group having an alicyclic hydrocarbon structure which is polycyclic is not particularly limited as long as it is a monovalent group having an alicyclic hydrocarbon structure which is polycyclic, but preferably has a total number of carbon atoms of 5 to 40, and more preferably has a total number of carbon atoms of 7 to 30. The alicyclic hydrocarbon structure which is polycyclic may have an unsaturated bond within a ring.

The alicyclic hydrocarbon structure which is polycyclic in the group having an alicyclic hydrocarbon structure which is polycyclic means a structure having a plurality of alicyclic hydrocarbon groups which are of monocyclic types, or an alicyclic hydrocarbon structure which is of a polycyclic type, and may be bridged. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group. The structure having a plurality of alicyclic hydrocarbon groups which are of monocyclic types have a plurality of the above groups. The structure having a plurality of alicyclic hydrocarbon groups which are of monocyclic types preferably has 2 to 4 alicyclic hydrocarbon groups which are of monocyclic types, and particularly preferably 2 alicyclic hydrocarbon groups which are of monocyclic types.

Examples of the alicyclic hydrocarbon structure which is of a polycyclic type include bicyclo, tricyclo, or tetracyclo structure having 5 or more carbon atoms, and the structure is preferably a polycyclic cyclo structure having 6 to 30 carbon atoms, and examples thereof include an adamantane structure, a decalin structure, a norbornane structure, a norbornene structure, a cedrol structure, an isobornane structure, a bornane structure, a dicyclopentane structure, an α-pinene structure, a tricyclodecane structure, a tetracyclododecane structure, and an androstane structure. In addition, some of carbon atoms in the monocyclic or polycyclic cycloalkyl group may also be substituted with heteroatoms such as an oxygen atom.

Preferred examples of the alicyclic hydrocarbon structure which is polycyclic include an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, and a tricyclodecane structure, and the adamantane structure is the most preferable from the viewpoint of dry etching resistance (that is, the group having the non-acid-decomposable alicyclic hydrocarbon structure which is polycyclic is most preferably a group having a non-acid-decomposable adamantane structure).

Examples of these alicyclic hydrocarbon structures which are polycyclic (for the structures having a plurality of alicyclic hydrocarbon groups which are of monocyclic types) include Formulae (1) to (51) described in the above-mentioned resin (B).

The alicyclic hydrocarbon structure which is polycyclic may further have a substituent, and examples of the substituent include an alkyl group (preferably having 1 to 6 carbon atoms), cycloalkyl group (preferably having 3 to 10 carbon atoms), aryl group (preferably having 6 to 15 carbon atoms), halogen atom, a hydroxyl group, an alkoxy group (preferably having 1 to 6 carbon atoms), a carboxyl group, a carbonyl group, a thiocarbonyl group, an alkoxycarbonyl group (preferably having 2 to 7 carbon atoms), and a group formed by combination thereof (preferably having a total number of carbon atoms of 1 to 30, and more preferably having a total number of carbon atoms of 1 to 15).

As the alicyclic hydrocarbon structure which is polycyclic, the structure represented by any one of Formulae (7), (23), (40), (41), and (51), or a structure having two monovalent groups having any one hydrogen atom in the structure of Formula (48) as a bonding arm are preferable, a structure represented by any one of Formulae (23), (40), and (51), or a structure having two monovalent groups having any one hydrogen atom in the structure of Formula (48) as a bonding arm are more preferable, and the structure represented by Formula (40) is the most preferable.

As the group having an alicyclic hydrocarbon structure which is polycyclic, a monovalent group having any one hydrogen atom in the alicyclic hydrocarbon structure which is polycyclic as a bonding arm is preferable.

The structure in which a hydrogen atom of a phenolic hydroxyl group is substituted with a group having the non-acid-decomposable alicyclic hydrocarbon structure which is polycyclic as described above is preferably included as a repeating unit having a structure in which a hydrogen atom of a phenolic hydroxyl group is substituted with a group having the non-acid-decomposable alicyclic hydrocarbon structure which is polycyclic as described above in the resin (C), and a repeating unit represented by General Formula (3A) is more preferably included in the resin (C).

(3A)

In General Formula (3A), $R_{13}$ represents a hydrogen atom or a methyl group.

X represents a group having a non-acid-decomposable alicyclic hydrocarbon structure which is polycyclic.

$Ar_1$ represents an aromatic ring.

m2 represents an integer of 1 or more.

$R_{13}$ in General Formula (3A) represents a hydrogen atom or a methyl group, and is particularly preferably a hydrogen atom.

Examples of the aromatic ring of $Ar_1$ in General Formula (3A) include an aromatic hydrocarbon ring having 6 to 18 carbon atoms, which may have a substituent, such as a benzene ring, a naphthalene ring, an anthracene ring, a fluorene ring, and a phenanthrene ring, and an aromatic heterocycle containing a heterocycle such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, and a thiazole ring. Among those, a benzene ring and a naphthalene ring are preferable from the viewpoint of resolution, and a benzene ring is the most preferable.

The aromatic ring of $Ar_1$ may have a substituent other than the group represented by —OX, and examples of the substituent include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms), with the alkyl group, the alkoxy group, and the alkoxycarbonyl group being preferable, and the alkoxy group being more preferable.

X represents a group having a non-acid-decomposable alicyclic hydrocarbon structure which is polycyclic. Specific examples of the group having the non-acid-decomposable alicyclic hydrocarbon structure which is polycyclic represented by X and a preferred range thereof are the same as those described above. X is more preferably a group represented by —Y—$X_2$ in General Formula (4A) which will be described later.

m2 is preferably an integer of 1 to 5, and most preferably 1. When m2 is 1 and $Ar_1$ is a benzene ring, the substitution position of —OX may be a para position, a meta position, or an ortho position with respect to the bonding moiety to the polymer main chain of the benzene ring, but is preferably a para position or a meta position, and more preferably a para position.

In the present invention, the repeating unit represented by General Formula (3A) is preferably a repeating unit represented by General Formula (4A).

If the resin (C) having the repeating unit represented by General Formula (4A) is used, the Tg of the resin (C) increases, and thus, a highly hard resist film is formed. As a result, the diffusivity or the dry etching resistance of an acid can be more reliably controlled.

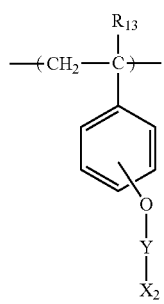

(4A)

In General Formula (4A), $R_{13}$ represents a hydrogen atom or a methyl group.

Y represents a single bond or a divalent linking group.

$X_2$ represents a non-acid-decomposable alicyclic hydrocarbon group which is polycyclic.

Preferred examples of the repeating unit represented by General Formula (4A), which is used in the present invention, will be described below.

$R_{13}$ in General Formula (4A) represents a hydrogen atom or a methyl group, and is particularly preferably a hydrogen atom.

In General Formula (4A), Y is preferably a divalent linking group. The divalent linking group of Y is preferably a carbonyl group, a thiocarbonyl group, an alkylene group (preferably having 1 to 10 carbon atoms, and more preferably having 1 to 5 carbon atoms), a sulfonyl group, —$COCH_2$—, —NH—, or a divalent linking group (preferably having a total number of carbon atoms of 1 to 20, and more preferably a total number of carbon atoms of 1 to 10) formed by combining these, more preferably a carbonyl group, —$COCH_2$—, a sulfonyl group, —CONH—, or —CSNH—, still more preferably a carbonyl group, or —$COCH_2$—, and particularly preferably a carbonyl group.

$X_2$ represents an alicyclic hydrocarbon group which is polycyclic, and is non-acid-decomposable. The alicyclic hydrocarbon group which is polycyclic preferably has a total number of carbon atoms of 5 to 40, and more preferably has a total number of carbon atoms of 7 to 30. The alicyclic hydrocarbon group which is polycyclic may have an unsaturated bond within a ring.

Such an alicyclic hydrocarbon group which is polycyclic may be a group having a plurality of alicyclic hydrocarbon groups which are of monocyclic types, or an alicyclic hydrocarbon group which is of a polycyclic type, and may be bridged. As the alicyclic hydrocarbon group which is of a monocyclic type, a cycloalkyl group having 3 to 8 carbon atoms is preferable, and examples thereof include a cyclopropyl group, a cyclopentyl group, a cyclohexyl group, a cyclobutyl group, and a cyclooctyl group. The alicyclic hydrocarbon group which is monocyclic has a plurality of these groups. The group having a plurality of alicyclic hydrocarbon groups which are of monocyclic types preferably has 2 to 4 alicyclic hydrocarbon groups which are of monocyclic types, and particularly preferably has two alicyclic hydrocarbon groups which are of monocyclic types.

Examples of the alicyclic hydrocarbon group which is of a polycyclic type include groups having bicyclo, tricyclo, or tetracyclo structures having 5 or more carbon atoms. A group having a polycyclic cyclo structure having 6 to 30 carbon atoms is preferable, and examples thereof include an adamantyl group, a norbornyl group, a norbornenyl group, an isobornyl group, a camphanyl group, a dicyclopentyl group, an α-pinanyl group, a tricyclodecanyl group, a tetracyclododecyl group, and an androstanyl group. Further, some of carbon atoms in the monocyclic or polycyclic cycloalkyl group may be substituted with heteroatoms such as an oxygen atom.

As the alicyclic hydrocarbon group which is polycyclic of $X_2$, an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group is preferable, and an adamantyl group is the most preferable from the viewpoint of dry etching resistance. Examples of the chemical formula of the alicyclic hydrocarbon structure which is polycyclic in the alicyclic hydrocarbon group which is polycyclic of $X_2$ include the same chemical formulae as those of the alicyclic hydrocarbon structure which is polycyclic in the above-mentioned group having an alicyclic hydrocarbon structure which is polycyclic, and a preferred range thereof is also the same. Examples of the alicyclic hydrocarbon group which is polycyclic of $X_2$ include monovalent groups having any one hydrogen atom in the above-mentioned alicyclic hydrocarbon structure which is polycyclic as a bonding arm.

The alicyclic hydrocarbon group may further have a substituent, and examples of the substituent include the same substituents mentioned as the substituent which the alicyclic hydrocarbon structure which is polycyclic may have.

The substitution position of —O—Y—$X_2$ in General Formula (4A) with respect to the bonding moiety to the polymer main chain of the benzene ring may be a para position, a meta position, or an ortho position, and the para position is preferable.

In the present invention, the repeating unit represented by General Formula (3A) is most preferably a repeating unit represented by General Formula (4').

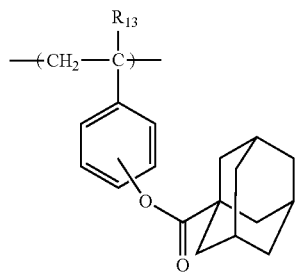

(4')

In General Formula (4'), $R_{13}$ represents a hydrogen atom or a methyl group.

$R_{13}$ in General Formula (4') represents a hydrogen atom or a methyl group, and is particularly preferably a hydrogen atom.

The substitution position of the adamantyl ester group in General Formula (4') with respect to the bonding moiety to the polymer main chain of the benzene ring may be a para position, a meta position, or an ortho position, and is preferably a para position.

Specific examples of the repeating unit represented by General Formula (3A) include the following ones.

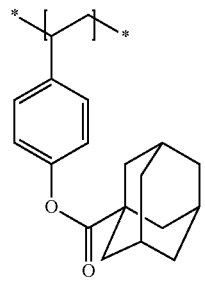 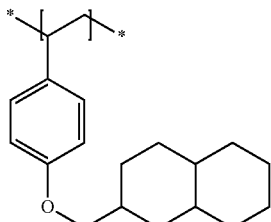

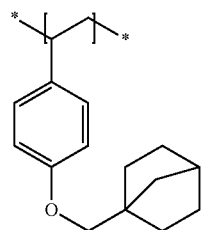 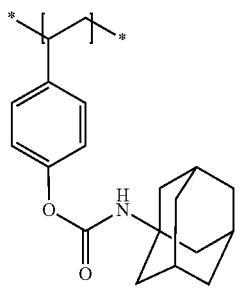

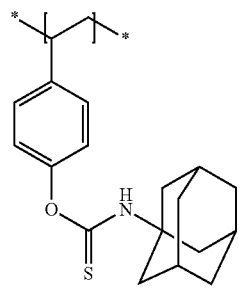 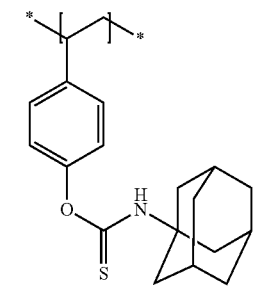

-continued

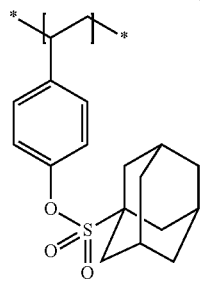

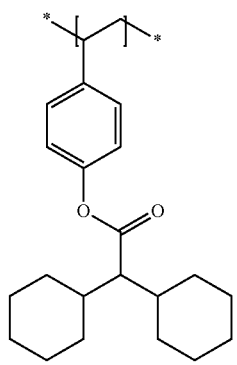

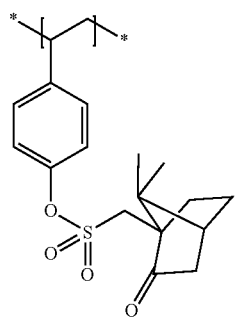 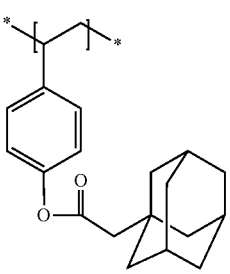

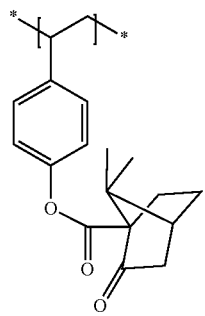

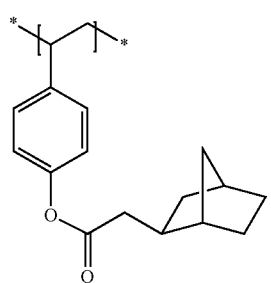

-continued
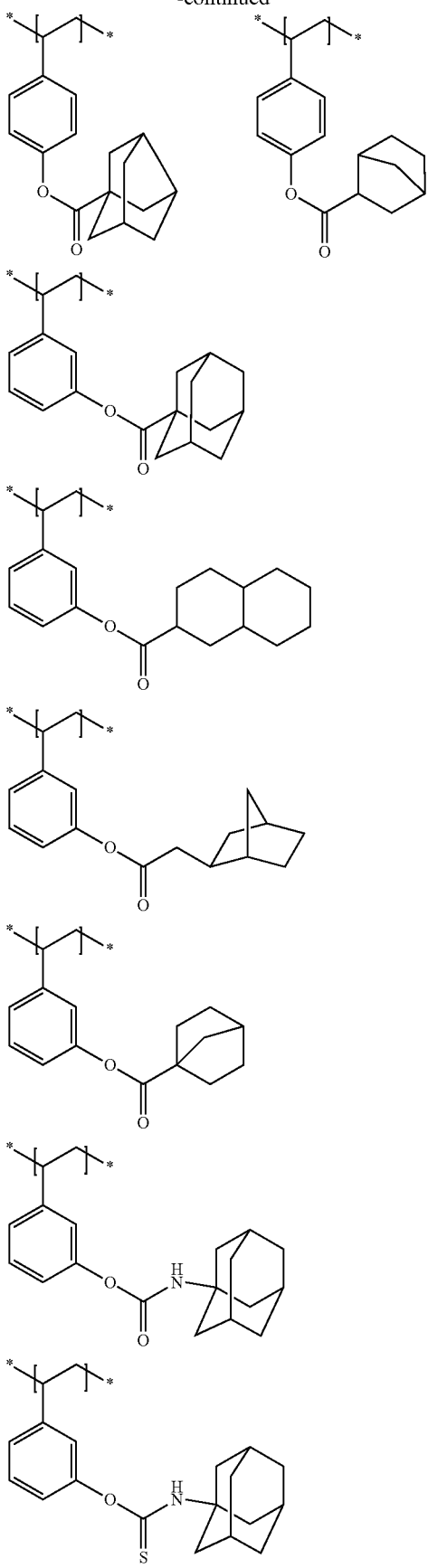
-continued
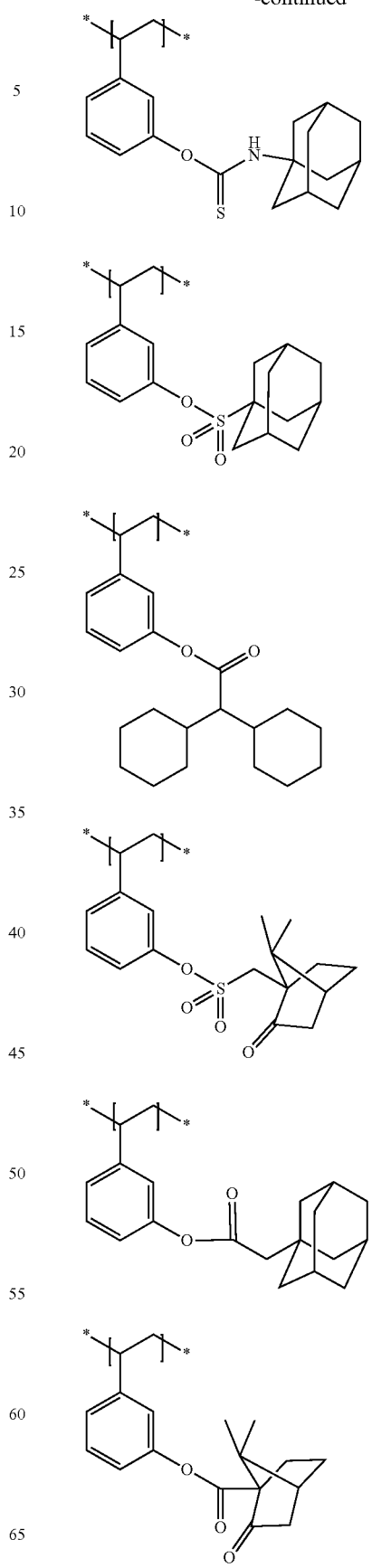

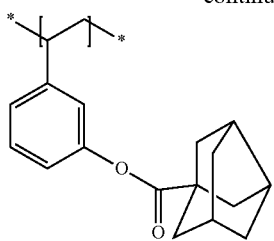
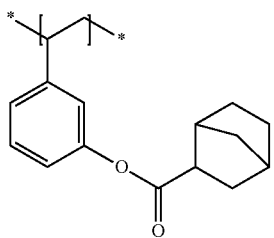
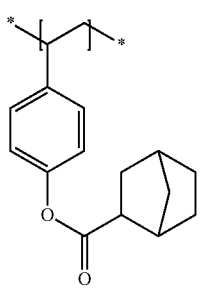
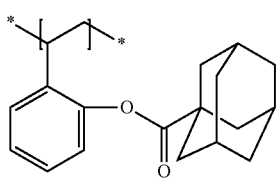
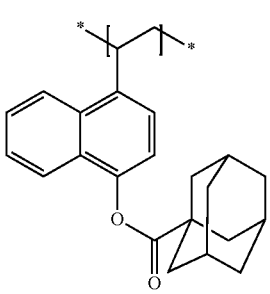
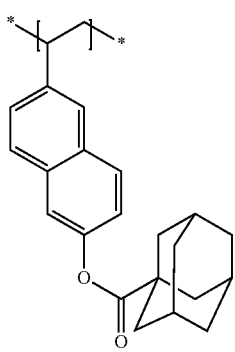

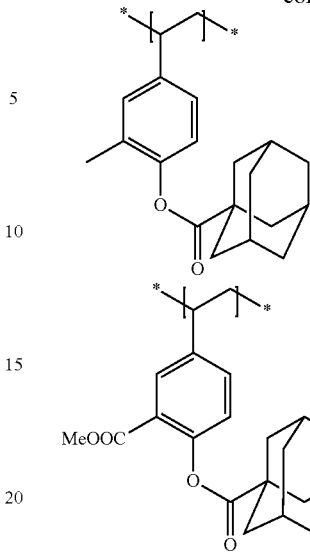
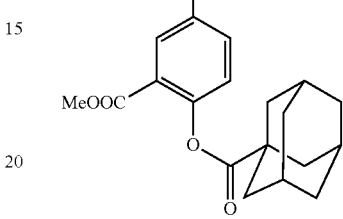
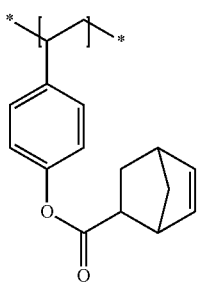

In a case where the resin (C) contains a repeating unit having a structure in which a hydrogen atom in a phenolic hydroxyl group is substituted with the group having a non-acid-decomposable alicyclic hydrocarbon structure which is polycyclic as described above, the content of the repeating unit is preferably 1% to 40% by mole, and more preferably 2% to 30% by mole, with respect to all the repeating units of the resin (C).

The resin (C) may further include a repeating unit having a structural moiety which decomposes upon irradiation with actinic rays or radiation to generate an acid in the side chain.

It is also preferable that the resin (C) further has the repeating unit as described below (hereinafter also referred to as "other repeating units") as the repeating units other than the repeating unit.

Examples of the polymerizable monomer for forming these other repeating units include styrene, alkyl-substituted styrene, alkoxy-substituted styrene, halogen-substituted styrene, O-alkylated styrene, O-acylated styrene, hydrogenated hydroxystyrene, maleic acid anhydride, an acrylic acid derivative (acrylic acid, acrylic acid ester, and the like), a methacrylic acid derivative (methacrylic acid, methacrylic acid ester, and the like), N-substituted maleimide, acrylonitrile, methacrylonitrile, vinylnaphthalene, vinylanthracene, and indene which may have a substituent.

The resin (C) may or may not contain these other repeating units, and in a case where it contains these other repeating units, the content of these other repeating units in the resin (C) is generally 1% to 30% by mole, preferably 1% to 20% by mole, and more preferably 2% to 10% by mole, with respect to all the repeating units constituting the resin (C).

The resin (C) may contain a repeating unit represented by General Formula (IV) or (V).

(IV)

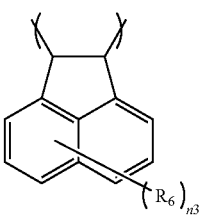

In the formula,

R$_6$ represents a hydrogen atom, a hydroxyl group, a linear, branched, or cyclic alkyl group, alkoxy group, or acyloxy group having 1 to 10 carbon atoms, a cyano group, a nitro group, an amino group, a halogen atom, an ester group (—OCOR or —COOR: R is an alkyl group having 1 to 6 carbon atoms or a fluorinated alkyl group), or a carboxyl group.

n3 represents an integer of 0 to 6.

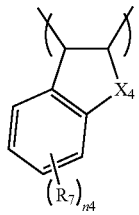

(V)

In the formula,

R$_7$ represents a hydrogen atom, a hydroxyl group, a linear, branched, or cyclic alkyl group, alkoxy group, or acyloxy group having 1 to 10 carbon atoms, a cyano group, a nitro group, an amino group, a halogen atom, an ester group (—OCOR or —COOR: R is an alkyl group having 1 to 6 carbon atom or a fluorinated alkyl group), or a carboxyl group.

n$_4$ represents an integer of 0 to 4.

X$_4$ is a methylene group, an oxygen atom, or a sulfur atom. R$_7$ is an aryl group, or aralkyl group having 6 to 20 carbon atoms, and may have a hydroxyl group, a linear, branched, or cyclic alkyl group or alkoxy group, an ester group (—OCOR or —COOR: R is an alkyl group having 1 to 6 carbon atoms), a ketone group (—COR: R is an alkyl group having 1 to 6 carbon atoms), a fluorine atom, a trifluoromethyl group, a nitro group, an amino group, or a cyano group.

Specific examples of the repeating unit represented by General Formula (IV) or General Formula (V) are shown below, but are not limited thereto.

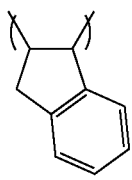 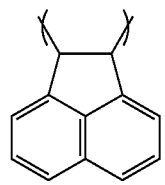

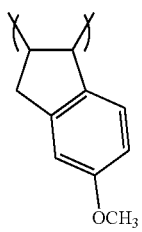 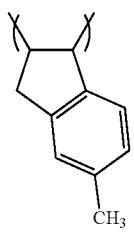

-continued

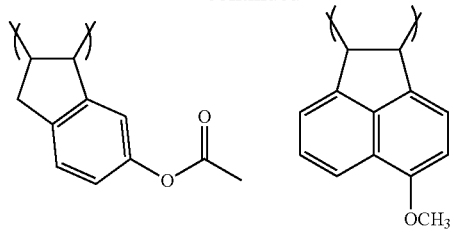

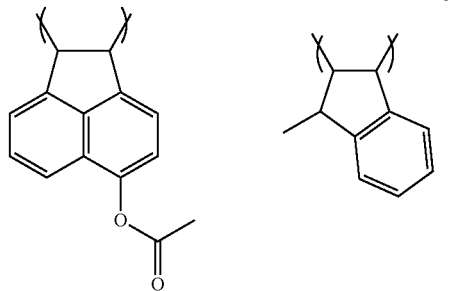

The resin (C) can be synthesized in accordance with a known radical polymerization method, an anion polymerization method, or a living radical polymerization method (an iniferter method or the like). For example, in the anion polymerization method, vinyl monomers can be dissolved in an appropriate organic solvent and reacted using a metal compound (butyllithium or the like) as an initiator, usually under cooling conditions, thereby obtaining a polymer.

As the resin (C), a polyphenol compound (for example, JP2008-145539A) produced by a condensation reaction of an aromatic ketone or an aromatic aldehyde with a compound containing 1 to 3 phenolic hydroxyl groups, a calixarene derivative (for example, JP2004-18421A), a Noria derivative (for example, JP2009-222920A), or a polyphenol derivative (for example, JP2008-94782A) can be applied, and may also be synthesized through modification by a polymer reaction.

In addition, the resin (C) is preferably synthesized through modification of a polymer synthesized by a radical polymerization method or an anion polymerization method by use of a polymer reaction.

The weight-average molecular weight of the resin (C) is preferably 1,000 to 200,000, more preferably 2,000 to 50,000, and still more preferably 2,000 to 15,000.

The dispersity (molecular weight distribution) (Mw/Mn) of the resin (C) is preferably 2.0 or less. From the viewpoint of improvement of sensitivity and resolution, the dispersity is preferably 1.0 to 1.80, more preferably 1.0 to 1.60, and most preferably 1.0 to 1.20. The use of living polymerization such as living anion polymerization preferably uniformizes the dispersity (molecular weight distribution) of the obtained high-molecular-weight compound. The weight-average molecular weight and the dispersity of the resin (C) are measured by means of the above-mentioned method.

The content of the resin (C) with respect to the composition of the present invention is preferably 30% to 95% by mass, more preferably 40% to 90% by mass, and particularly preferably 50% to 85% by mass, with respect to the total solid content of the composition.

Specific examples of the resin (C) are shown below, but the present invention is not limited thereto.

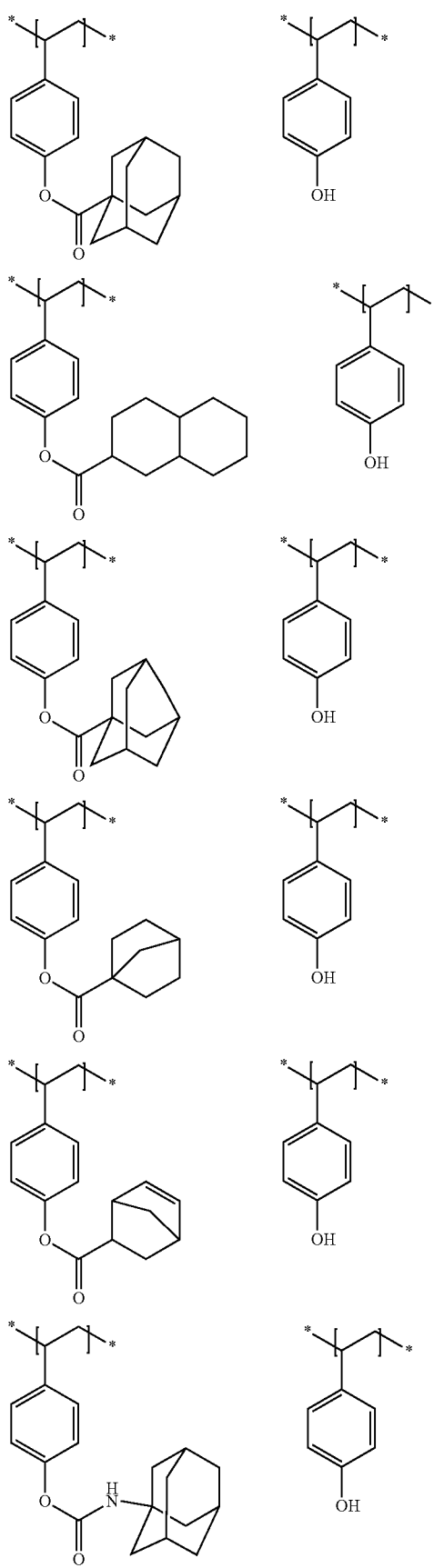
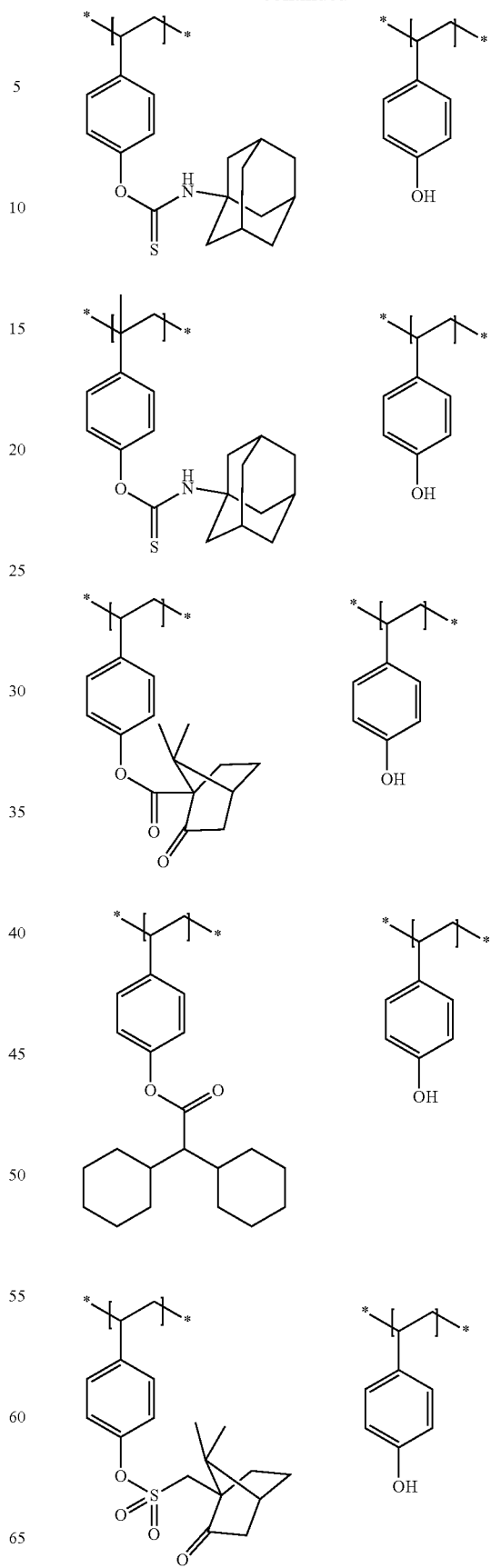
-continued

125
-continued
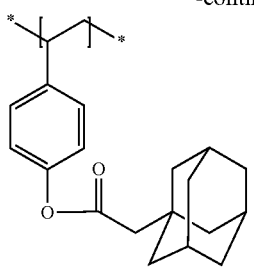 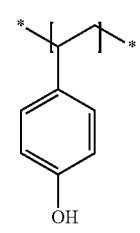
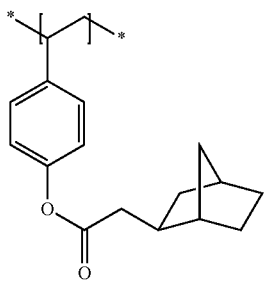 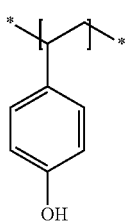
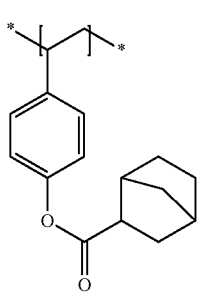 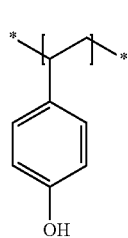
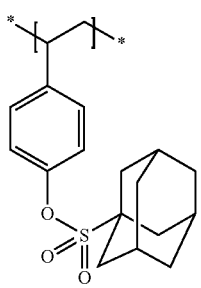 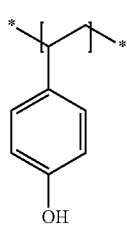
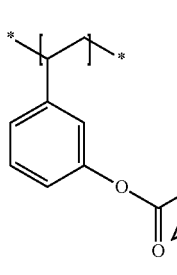 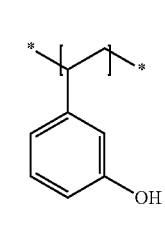
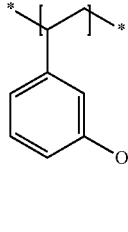 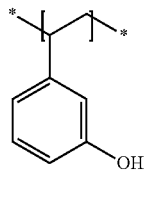
126
-continued
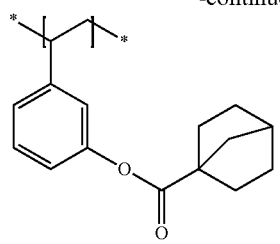 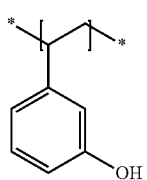
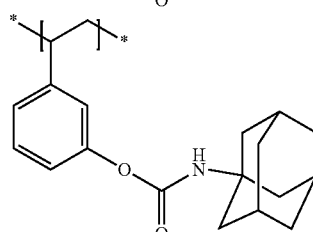 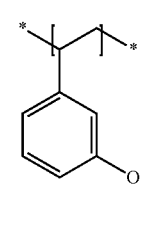
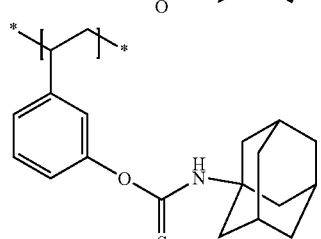 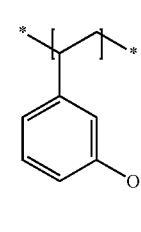
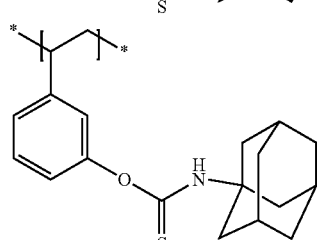 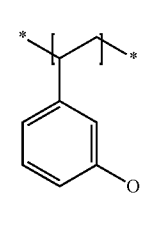
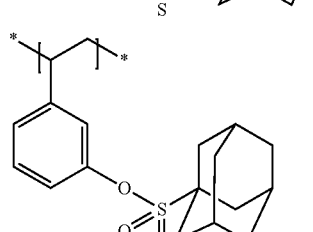 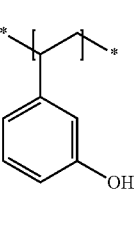
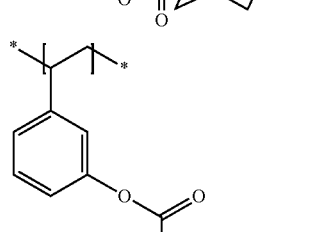 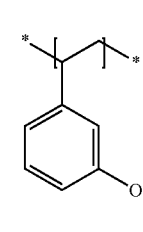
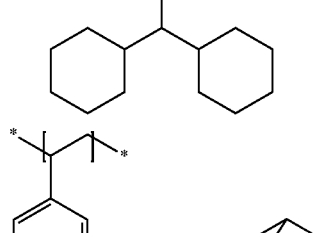 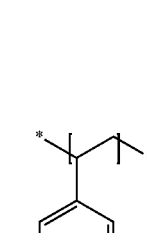

127
-continued
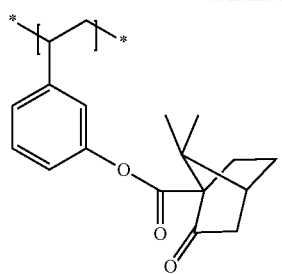 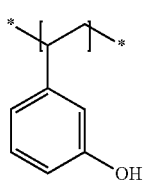
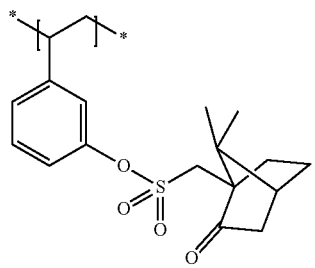 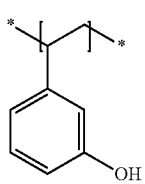
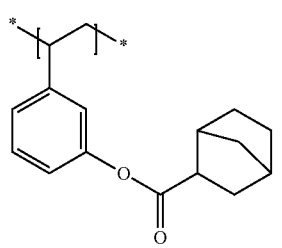 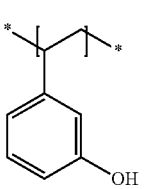
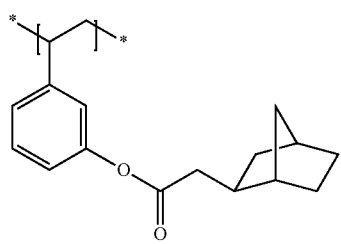 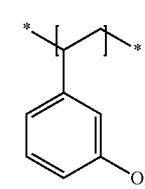
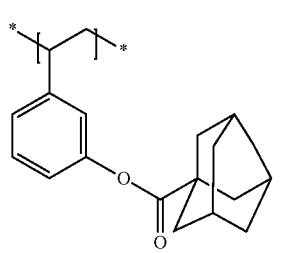 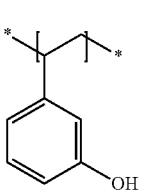
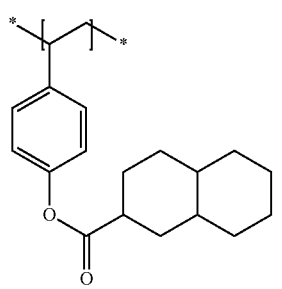 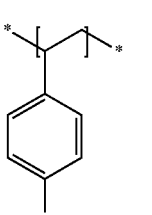
128
-continued
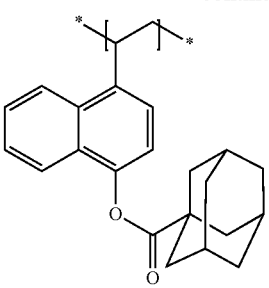 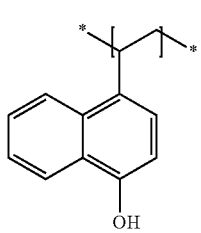
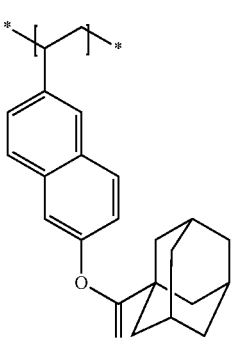 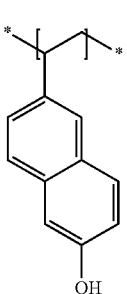
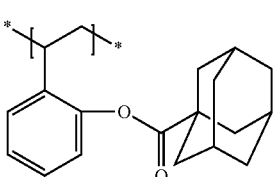 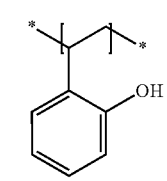
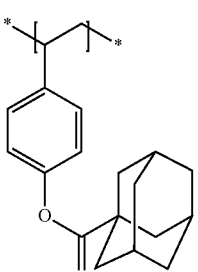 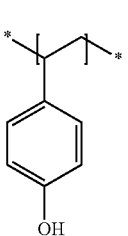
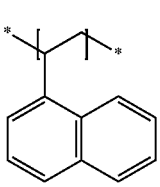
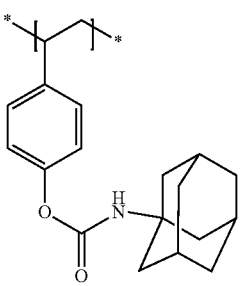 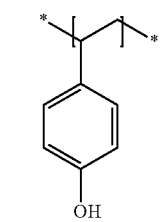

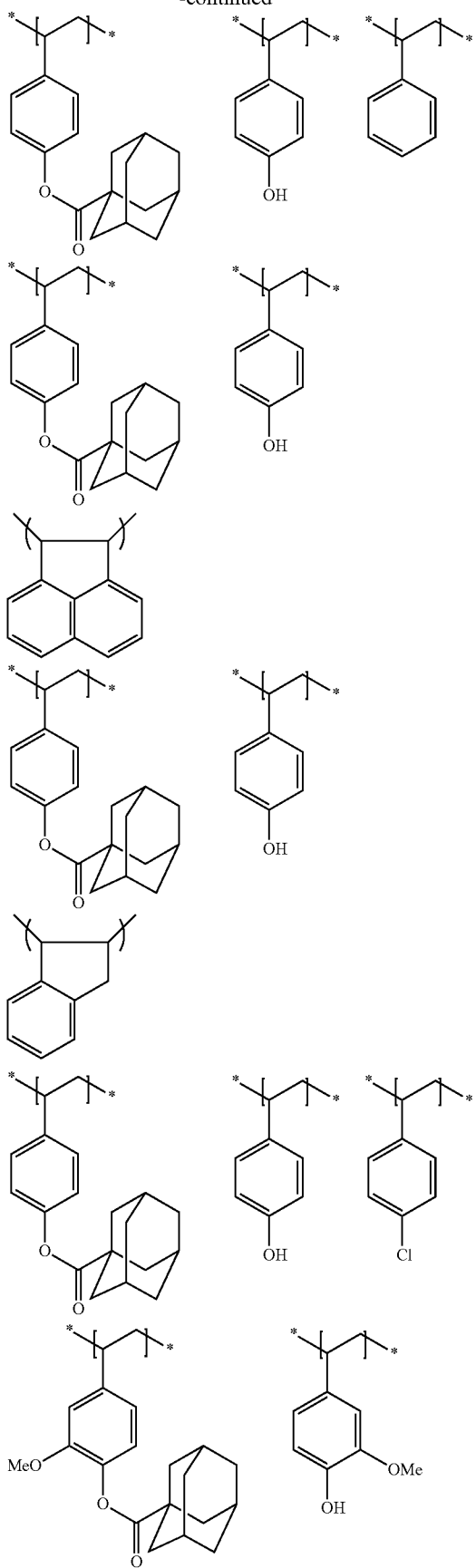

[Compound (D) which Generates Acid Upon Irradiation with Actinic Rays or Radiation]

The actinic ray-sensitive or radiation-sensitive resin composition of the present invention preferably includes a compound (D) which generates an acid upon irradiation with actinic rays or radiation (also referred to as a "compound (D)," an "acid generator," or a "photoacid generator").

The compound (D) which generates an acid upon irradiation with actinic rays or radiation may be in a form of a low-molecular-weight compound or in a form introduced into a part of a polymer. Further, a combination of the form of a low-molecular-weight compound and the form introduced into a part of a polymer may also be used.

In a case where the compound (D) which generates an acid upon irradiation with actinic rays or radiation is in the form of a low-molecular-weight compound, the molecular weight is preferably 3,000 or less, more preferably 2,000 or less, and still more preferably 1,000 or less.

In a case where the compound (D) which generates an acid upon irradiation with actinic rays or radiation is in the form introduced into a part of a polymer, it may be introduced into a part of the resin (C) described above or into a resin other than the resin (C).

Preferred aspects of the acid generator include an onium salt compound. Examples of such an onium salt compound include a sulfonium salt, an iodonium salt, and a phosphonium salt, with the sulfonium salt being particularly preferable.

Furthermore, other preferred aspects of the acid generator include a compound which generates a sulfonic acid, an imidic acid, or a methide acid upon irradiation with actinic rays or radiation. Examples of the acid generator in this aspect include a sulfonium salt, an iodonium salt, a phosphonium salt, oxime sulfonate, and imide sulfonate.

The acid generator is preferably a compound which generates an acid upon irradiation with electron beams or extreme ultraviolet rays.

In the present invention, preferred examples of the onium salt compound include a sulfonium compound represented by General Formula (7) and an iodonium compound represented by General Formula (8).

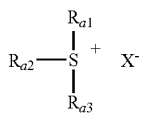

(7)

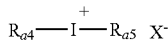

(8)

In General Formulae (7) and (8), $R_{a1}$, $R_{a2}$, $R_{a3}$, $R_{a4}$, and $R_{a5}$ each independently represent an organic group.

$X^-$ represents an organic anion.

Hereinafter, the sulfonium compound represented by General Formula (7) and the iodonium compound represented by General Formula (8) will be described in more detail.

$R_{a1}$, $R_{a2}$, and $R_{a3}$ in General Formula (7) and $R_{a4}$ and $R_{a5}$ in General Formula (8) each independently represent an organic group. Preferably, at least one of $R_{a1}$, $R_{a2}$, or $R_{a3}$, and at least one of $R_{a4}$ or $R_{a5}$ are each an aryl group. As the aryl group, a phenyl group, or a naphthyl group is preferable, and a phenyl group is more preferable.

Examples of the organic anion of $X^-$ in each of General Formulae (7) and (8) include a sulfonate anion, a carboxylate anion, a bis(alkylsulfonyl)amide anion, and a tris(alkylsulfonyl)methide anion. The organic anion is preferably an organic anion represented by General Formula (9), (10), or (11), and more preferably any of those of General Formula (9).

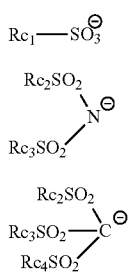

(9)

(10)

(11)

In General Formulae (9), (10), and (11), $Rc_1$, $Rc_2$, $Rc_3$, and $Rc_4$ each independently represent an organic group.

The organic anion of $X^-$ corresponds to a sulfonic acid, an imidic acid, a methide acid, or the like which is an acid generated by actinic rays or radiation, such as electron beams or extreme ultraviolet rays.

Examples of the organic groups of $Rc_1$, $Rc_2$, $Rc_3$, and $Rc_4$ include an alkyl group, an aryl group, and a group formed of a plurality of these groups linked to each other. Among these organic groups, an alkyl group having a fluorine atom or a fluoroalkyl group substituted at its 1-position, and a phenyl group having a fluorine atom or a fluoroalkyl group substituted therein are preferable. The incorporation of a fluorine atom or a fluoroalkyl group increases the acidity of an acid generated upon irradiation with light, whereby the sensitivity is improved. However, it is preferable that the terminal group contains no fluorine atom as a substituent.

Moreover, in the present invention, from the viewpoint of suppressing the diffusion of an acid after exposure into unexposed areas to attain improvement of resolution and pattern shape, the compound (D) is preferably a compound which generates an acid (more preferably sulfonic acid) having a volume of 130 Å³ or more, more preferably a compound which generates an acid (more preferably sulfonic acid) having a volume of 190 Å³ or more, still more preferably a compound which generates an acid (more preferably sulfonic acid) having a volume of 270 Å³ or more, and particularly preferably is a compound which generates an acid (more preferably sulfonic acid) having a volume of 400 Å³ or more. However, from the viewpoint of sensitivity and coating solvent solubility, the volume is preferably 2,000 Å³ or less, and more preferably 1,500 Å³ or less. The value of the volume was determined by means of "WinMOPAC" manufactured by Fujitsu Limited. That is, first, the chemical structure of the acid generated by each of the compounds was inputted. Subsequently, while regarding this structure as an initial structure, the most stable conformation of the acid was determined by a molecular force field calculation using an MM3 method. Thereafter, a molecular orbital calculation using a PM3 method was carried out with respect to the most stable conformation. Thus, the "accessible volume" of each acid can be calculated.

For specific examples of the compound (D), paragraphs [0368] to [0377] of JP2014-41328A, paragraphs [0240] to [0262] of JP2013-228681A ([0339] of the specification of the corresponding US2015/004533A), and paragraphs [0122] to [0142] of JP2008-111103A ([0112] to [0130] of the specification of the corresponding US2008/0118860A) can be incorporated herein by reference, the contents of which are incorporated in the present specification. Further, specific examples thereof include the following compounds, but are not limited thereto.

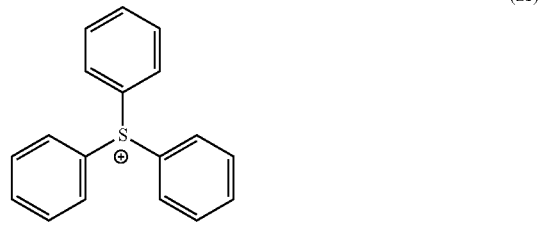

(z1)

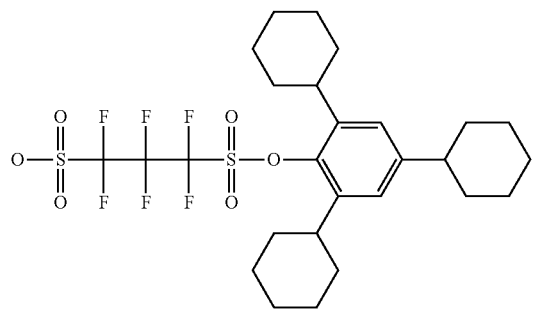

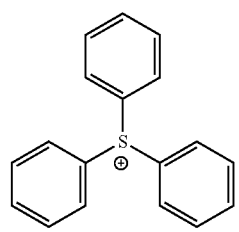

(z2)

-continued
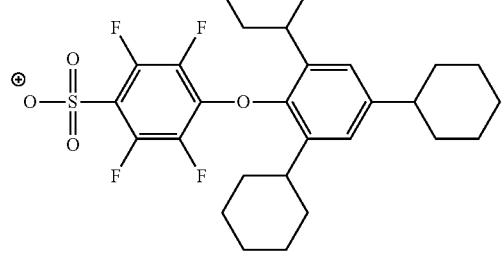
(z3)
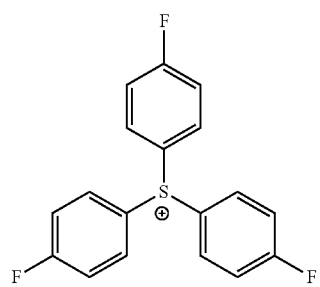
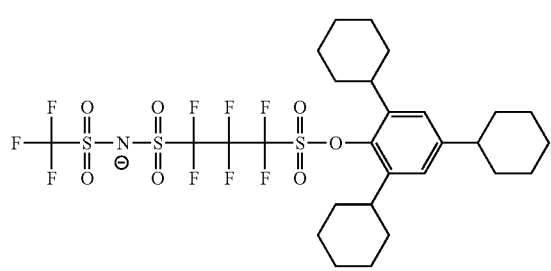
(z4)
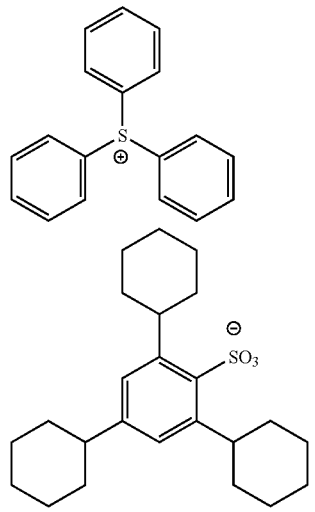
(z5)
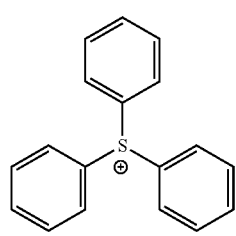
-continued
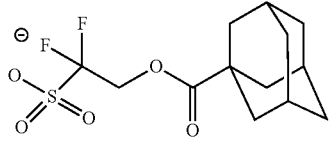
(z6)
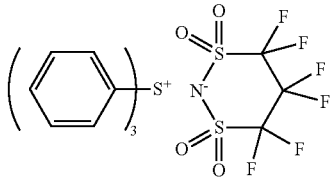
(z7)
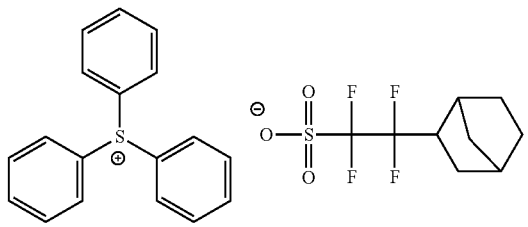
(z8)
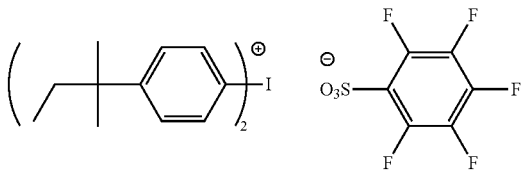
(z9)
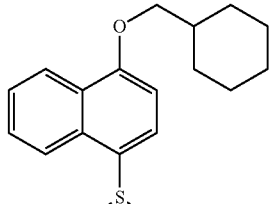
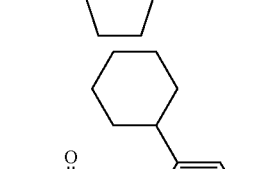
(z10)
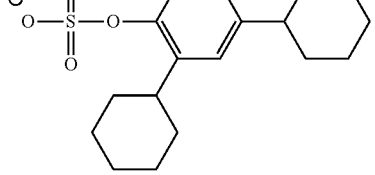
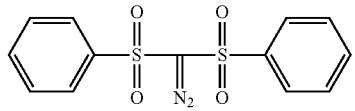

-continued
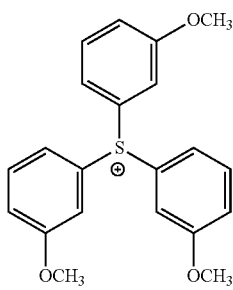
(z11)
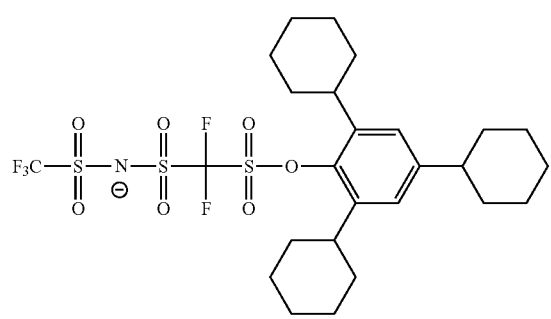
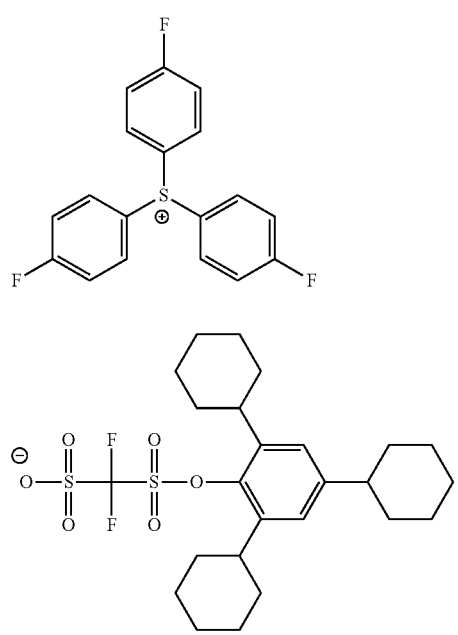
(z12)
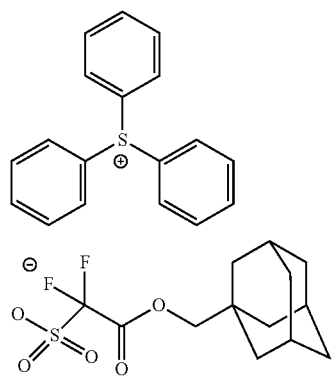
(z13)
-continued
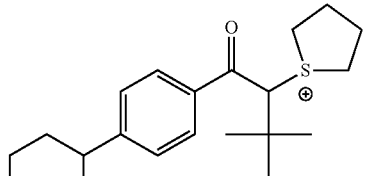
(z14)
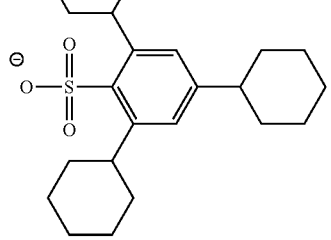
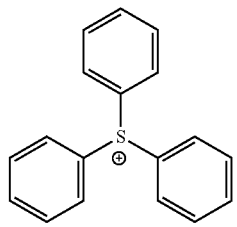
(z15)
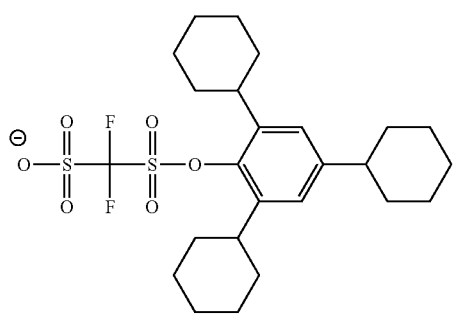
(z16)
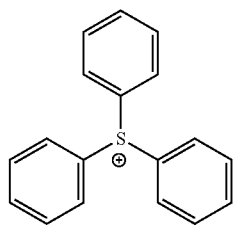
(z17)
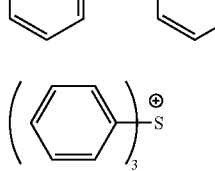
(z18)

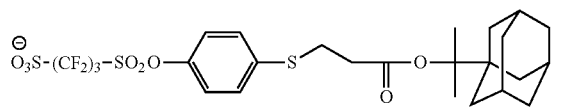
(z19)
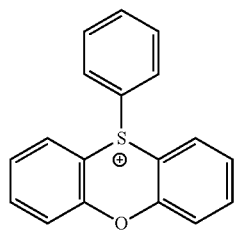
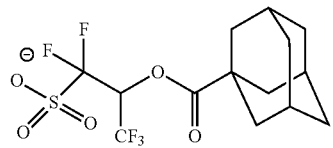
(z20)
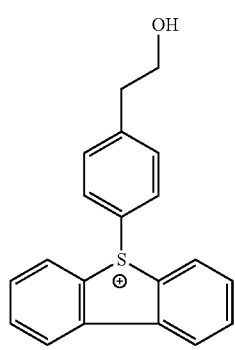
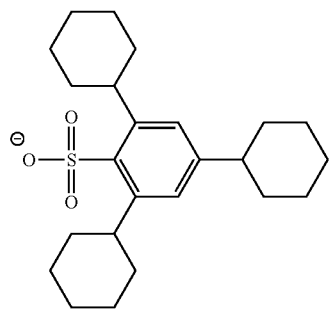
(z21)
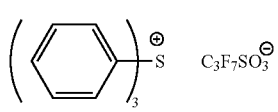
(z22)
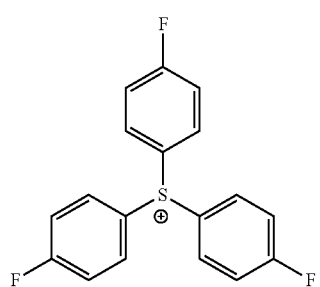
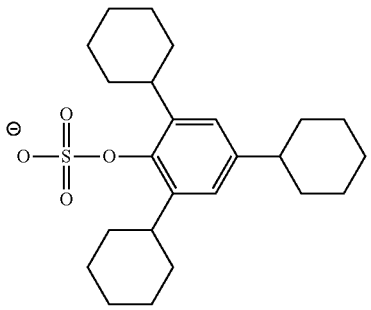
(z23)
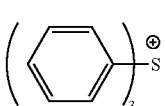 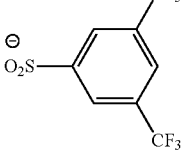
(z24)
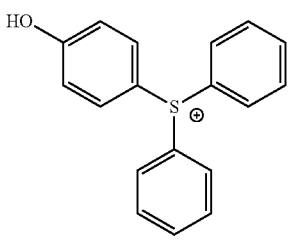 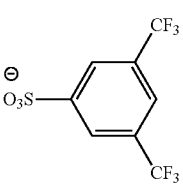
(z25)
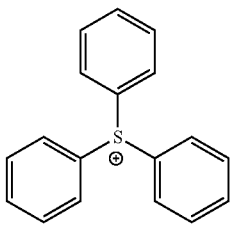
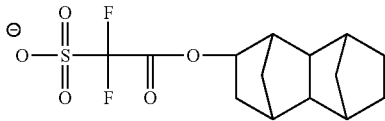
(z26)
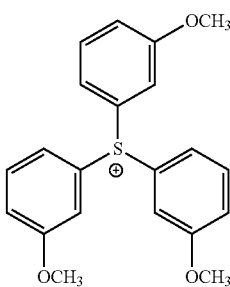

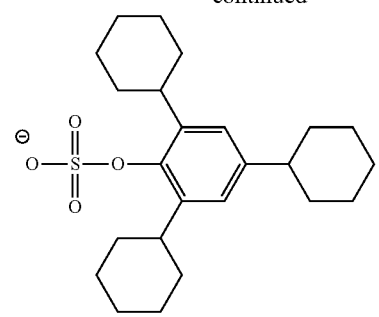
(z27)
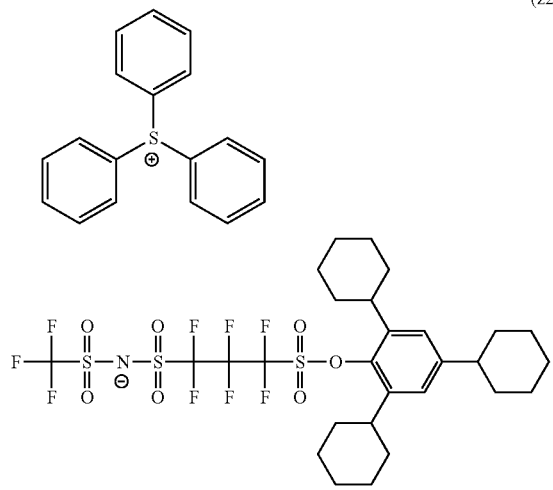
(z28)
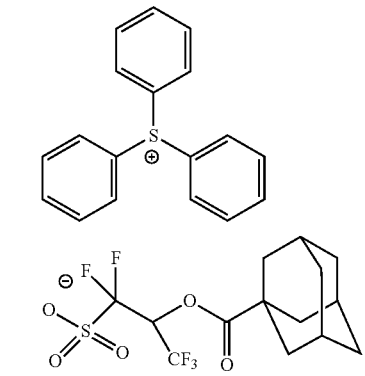
(z29)
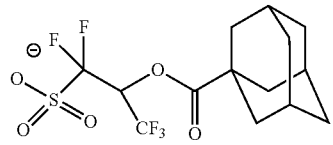
(z30)
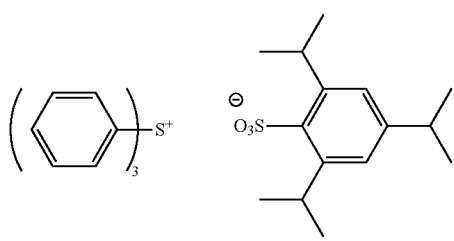
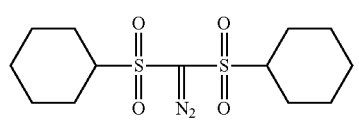
(z31)
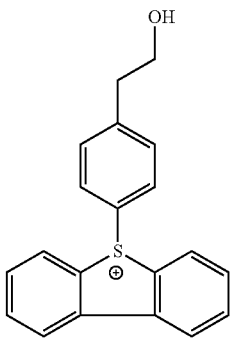
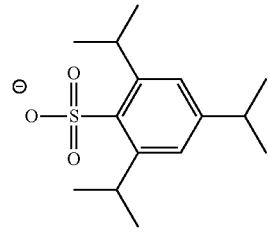
(z32)
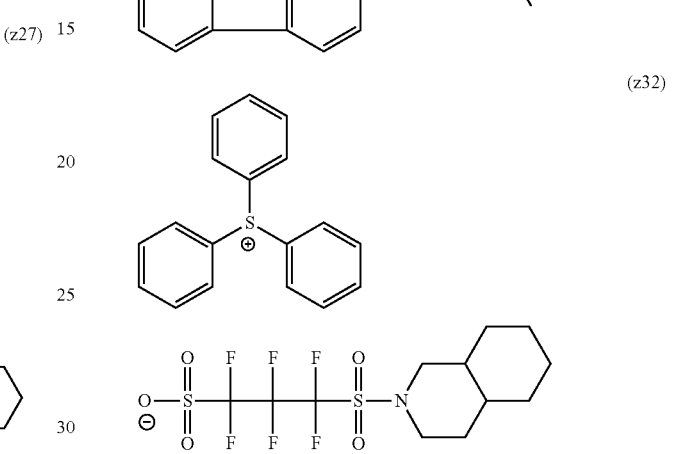
(z33)
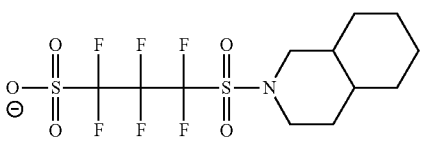
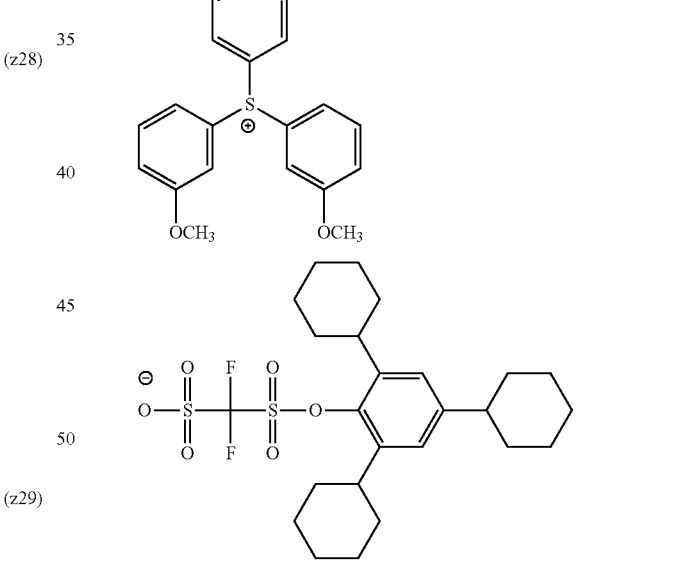
(z34)
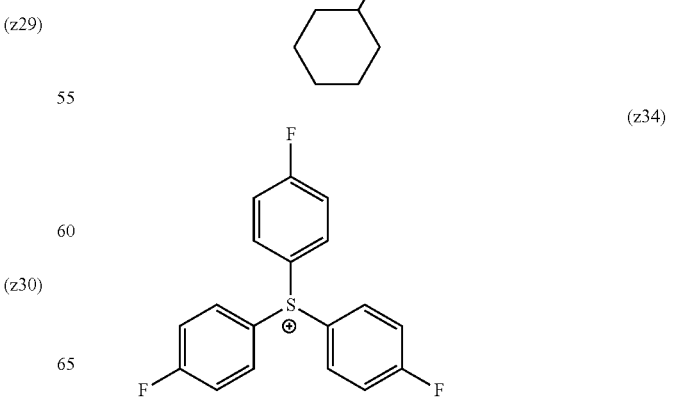

-continued

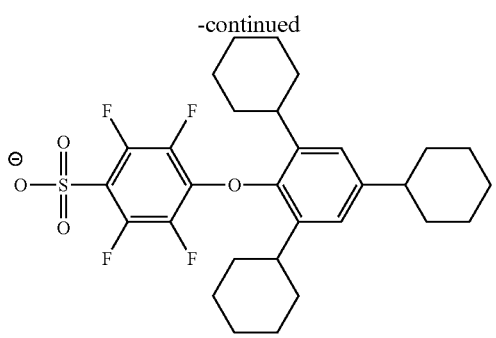

Moreover, as the acid generator (preferably an onium compound) used in the present invention, a high-molecular-weight acid generator in which a group (photoacid generating group) which generates an acid upon irradiation with actinic rays or radiation is introduced in the main chain or the side chain of the high-molecular-weight compound.

The content of the acid generator in the composition of the present invention is preferably 0.1% to 25% by mass, more preferably 0.5% to 20% by mass, and still more preferably 1% to 18% by mass, with respect to the total solid content of the composition.

The acid generator may be used singly or in combination of two or more kinds thereof.

<Basic Compound (E)>

It is preferable that the composition of the present invention further includes a basic compound (hereinafter also referred to as a "compound (E)") as an acid trapping agent. By using the basic compound, any performance a change over time from exposure to post-heating can be lessened. As such the basic compound, more specifically, compounds classified into (1) to (4) below can be used.

In addition, the composition of the present invention particularly preferably contains a basic compound whose basicity decreases upon irradiation with actinic rays or radiation, or an ammonium salt compound.

(1) Compound Represented by General Formula (BS-1)

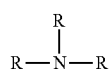

(BS-1)

In General Formula (BS-1),

R's each independently represent a hydrogen atom or an organic group. Here, at least one of three R's is an organic group. This organic group is a linear or branched alkyl group, a monocyclic or polycyclic cycloalkyl group, an aryl group, or an aralkyl group.

The number of carbon atoms in the alkyl group as R is not particularly limited, but is usually 1 to 20, and preferably 1 to 12.

The number of carbon atoms in the cycloalkyl group as R is not particularly limited, but is usually 3 to 20, and preferably 5 to 15.

The number of carbon atoms in the aryl group as R is not particularly limited, but is usually 6 to 20, and preferably 6 to 10. Specific examples thereof include a phenyl group and a naphthyl group.

The number of carbon atoms in the aralkyl group as R is not particularly limited, but is usually 7 to 20, and preferably 7 to 11. Specifically, examples thereof include a benzyl group.

A hydrogen atom in the alkyl group, the cycloalkyl group, the aryl group, or the aralkyl group as R may be substituted with a substituent. Examples of the substituent include an alkyl group, a cycloalkyl group, an aryl group, an aralkyl group, a hydroxyl group, a carboxy group, an alkoxy group, an aryloxy group, an alkylcarbonyloxy group, and an alkyloxycarbonyl group.

Furthermore, it is preferable that at least two of R's in the compound represented by General Formula (BS-1) are organic groups.

Specific examples of the compound represented by General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyl octadecylamine, dimethylundecylamine, N,N-dimethyldodecylamine, methyl dioctadecylamine, N,N-dibutylaniline, N,N-dihexylaniline, 2,6-diisopropylaniline, and 2,4,6-tri(t-butyl)aniline.

In addition, as the preferred basic compound represented by General Formula (BS-1), an alkyl group in which at least one R is substituted with a hydroxyl group is exemplified. Specific examples thereof include triethanolamine and N,N-dihydroxyethylaniline.

Moreover, the alkyl group as R may have an oxygen atom in the alkyl chain. That is, an oxyalkylene chain may be formed. As the oxyalkylene chain, —CH$_2$CH$_2$O— is preferable. Specific examples thereof include tris(methoxyethoxyethyl)amine and a compound disclosed after line 60 of column 3 in the specification of U.S. Pat. No. 6,040,112A.

Examples of the basic compound represented by General Formula (BS-1) include the following ones.

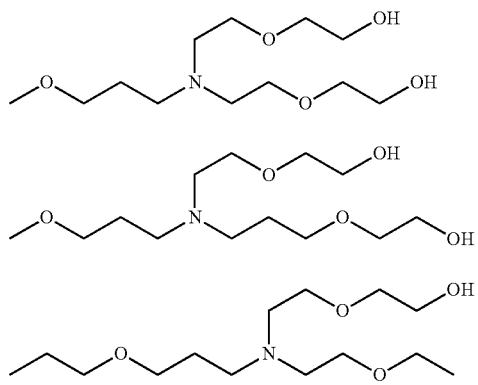

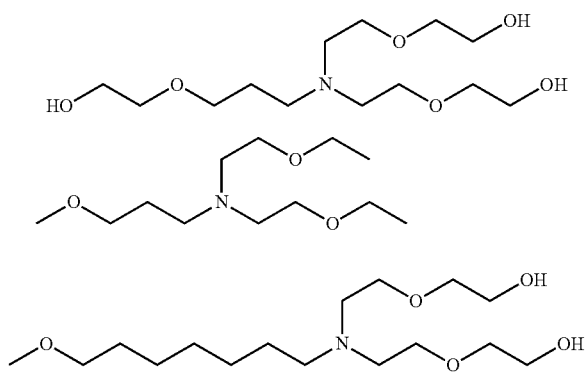

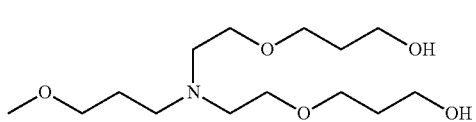
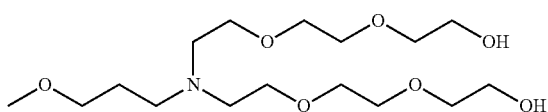
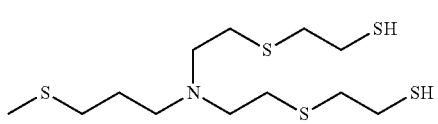
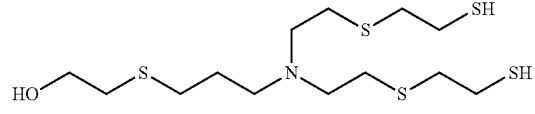
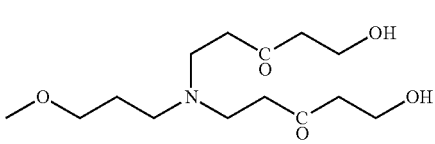
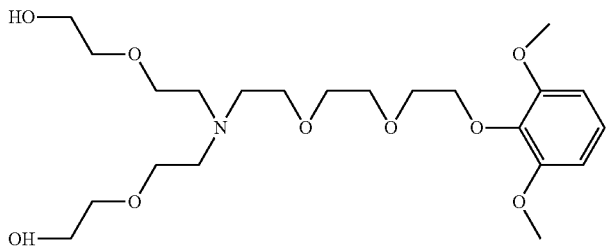
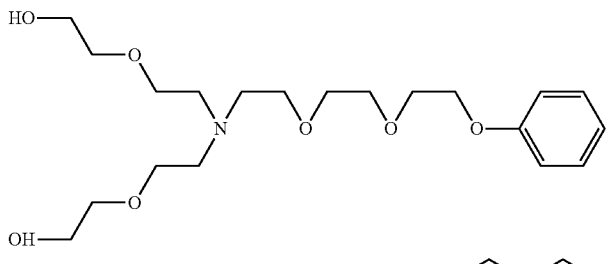
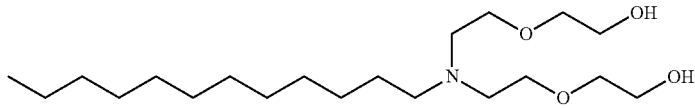
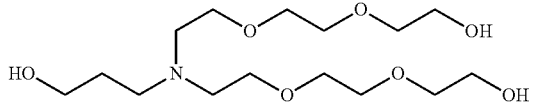
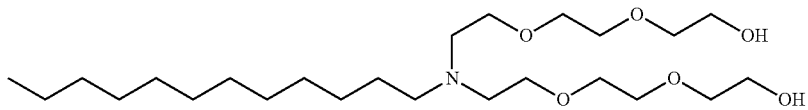
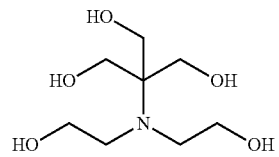

(2) Compound Having Nitrogen-Containing Heterocyclic Structure

The nitrogen-containing heterocycle may have aromaticity, or may not have aromaticity. The nitrogen-containing heterocycle may have a plurality of nitrogen atoms. Furthermore, the nitrogen-containing heterocycle may contain heteroatoms other than the nitrogen atom. Specific examples thereof include a compound having an imidazole structure (2-phenylbenzimidazole, 2,4,5-triphenylimidazole and the like), a compound having a piperidine structure [N-hydroxyethylpiperidine, bis(1,2,2,6,6-pentamethyl-4-piperidyl)sebacate, and the like], a compound having a pyridine structure (4-dimethylaminopyridine and the like), and a compound having an antipyrine structure (antipyrine, hydroxyantipyrine, and the like).

Furthermore, a compound having two or more ring structures is suitably used. Specific examples thereof include 1,5-diazabicyclo[4.3.0]non-5-ene and 1,8-diazabicyclo[5.4.0]undec-7-ene.

(3) Amine Compound Having Phenoxy Group

An amine compound having a phenoxy group is a compound having a phenoxy group at the terminal on the opposite side to the N atom of the alkyl group which is contained in an amine compound. The phenoxy group may have a substituent such as an alkyl group, an alkoxy group, a halogen atom, a cyano group, a nitro group, a carboxy group, a carboxylic acid ester group, a sulfonic acid ester group, an aryl group, an aralkyl group, an acyloxy group, and an aryloxy group.

This compound more preferably has at least one oxyalkylene chain between the phenoxy group and the nitrogen atom. The number of oxyalkylene chains in one molecule is preferably 3 to 9, and more preferably 4 to 6. Among the oxyalkylene chains, —$CH_2CH_2O$— is particularly preferable.

Specific examples thereof include 2-[2-{2-(2,2-dimethoxyphenoxyethoxy)ethyl}-bis-(2-methoxyethyl)]amine and the compounds (C1-1) to (C3-3) exemplified in paragraph [0066] in the specification of US2007/0224539A1.

An amine compound having a phenoxy group is obtained by, for example, heating a mixture of a primary or secondary amine having a phenoxy group and a haloalkyl ether to be reacted, by adding an aqueous solution of a strong base such as sodium hydroxide, potassium hydroxide, and tetraalkylammonium thereto, and by extracting the resultant product with an organic solvent such as ethyl acetate and chloroform. In addition, an amine compound having a phenoxy group can also be obtained by heating a mixture of a primary or secondary amine and a haloalkyl ether having a phenoxy group at the terminal to be reacted, by adding an aqueous solution of a strong base such as sodium hydroxide, potassium hydroxide, and tetraalkylammonium thereto, and by extracting the resultant product with an organic solvent such as ethyl acetate and chloroform.

(4) Ammonium Salt

An ammonium salt can also be appropriately used as the basic compound. Examples of the anion of the ammonium salt include halide, sulfonate, borate, and phosphate. Among these, halide and sulfonate are particularly preferable.

As the halide, chloride, bromide, and iodide are particularly preferable.

As the sulfonate, an organic sulfonate having 1 to 20 carbon atoms is particularly preferable. Examples of the organic sulfonate include alkyl sulfonate and aryl sulfonate having 1 to 20 carbon atoms.

The alkyl group included in the alkyl sulfonate may have a substituent. Examples of the substituent include a fluorine atom, a chlorine atom, a bromine atom, an alkoxy group, an acyl group, and an aryl group. Specific examples of the alkyl sulfonate include methanesulfonate, ethanesulfonate, butanesulfonate, hexanesulfonate, octanesulfonate, benzylsulfonate, trifluoromethanesulfonate, pentafluoroethanesulfonate, and nonafluorobutanesulfonate.

Examples of the aryl group included in the aryl sulfonate include a phenyl group, a naphthyl group, and an anthryl group. These aryl groups may have a substituent. As the substituent, for example, a linear or branched alkyl group having 1 to 6 carbon atoms or a cycloalkyl group having 3 to 6 carbon atoms is preferable. Specifically, for example, a methyl group, an ethyl group, an n-propyl group, an isopropyl group, an n-butyl group, an i-butyl group, a t-butyl group, an n-hexyl group, or a cyclohexyl group is preferable. Examples of other substituents include an alkoxy group having 1 to 6 carbon atoms, a halogen atom, cyano, nitro, an acyl group, and an acyloxy group.

The ammonium salt may be a hydroxide or a carboxylate. In this case, the ammonium salt is particularly preferably tetraalkylammonium hydroxide (tetraalkylammonium hydroxide such as tetramethylammonium hydroxide, tetraethylammonium hydroxide, and tetra-(n-butyl)ammonium hydroxide) having 1 to 8 carbon atoms.

Preferred examples of the basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine, and aminoalkylmorpholine. These may further have a substituent.

Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group, and a cyano group.

Particularly preferred examples of the basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine.

(5) Compound (PA) that has Proton-Accepting Functional Group and Generates Compound in which Proton-Accepting Properties are Reduced or Lost, or which is Changed from Having Proton-Accepting Properties to be Acidic, by being Decomposed Upon Irradiation with Actinic Rays or Radiation The composition according to the present invention may further include, as a basic compound, a compound [hereinafter also referred to as a compound (PA)] that has a proton-accepting functional group and generates a compound in which proton-accepting properties are reduced or lost, or which is changed from having proton-accepting properties to be acidic, by decomposing upon irradiation with actinic rays or radiation.

The proton-accepting functional group refers to a functional group having a group, or electron which is capable of electrostatically interacting with a proton, and for example, means a functional group with a macrocyclic structure, such as a cyclic polyether; or a functional group containing a nitrogen atom having an unshared electron pair not contributing to π-conjugation. The nitrogen atom having an unshared electron pair not contributing to π-conjugation is, for example, a nitrogen atom having a partial structure represented by the following general formula.

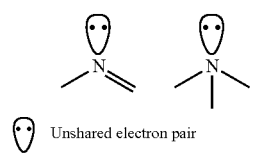

Unshared electron pair

Preferred examples of the partial structure of the proton-accepting functional group include crown ether, azacrown ether, primary to tertiary amines, pyridine, imidazole, and pyrazine structures.

The compound (PA) decomposes upon irradiation with actinic rays or radiation to generate a compound exhibiting deterioration in proton-accepting properties, no proton-accepting properties, or a change from the proton-accepting properties to acid properties. Here, exhibiting deterioration in proton-accepting properties, no proton-accepting properties, or a change from the proton-accepting properties to acid properties means a change of proton-accepting properties due to the proton being added to the proton-accepting functional group, and specifically a decrease in the equilibrium constant at chemical equilibrium in a case where a proton adduct is generated from the compound (PA) having the proton-accepting functional group and the proton.

Specific examples of the compound (PA) include the following compounds. With regard to the specific examples of the compound (PA), those described in paragraphs 0421 to 0428 of JP2014-41328A and paragraphs 0108 to 0116 of JP2014-134686A can be incorporated herein by reference, the contents of which are incorporated in the present specification.

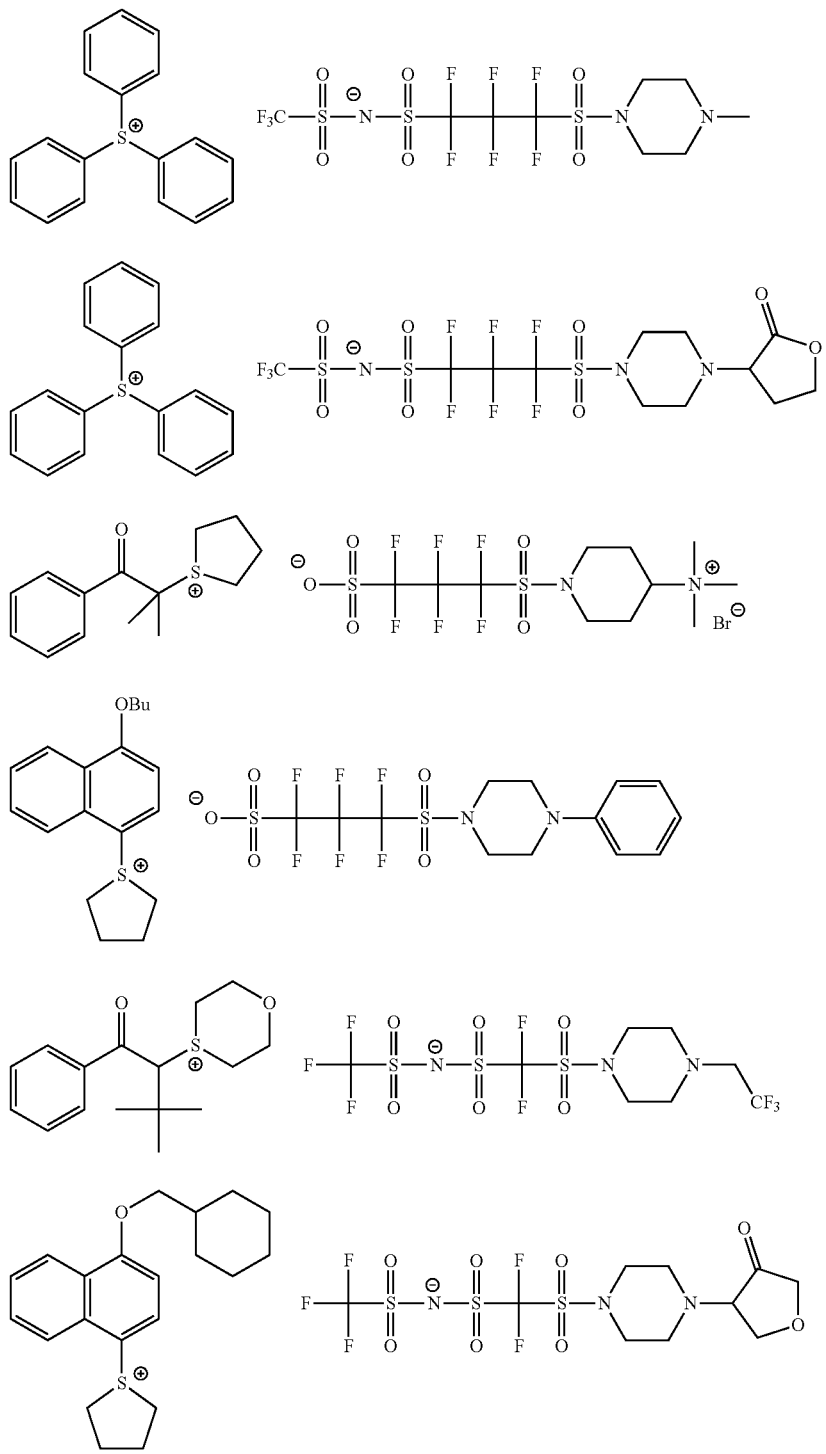

-continued

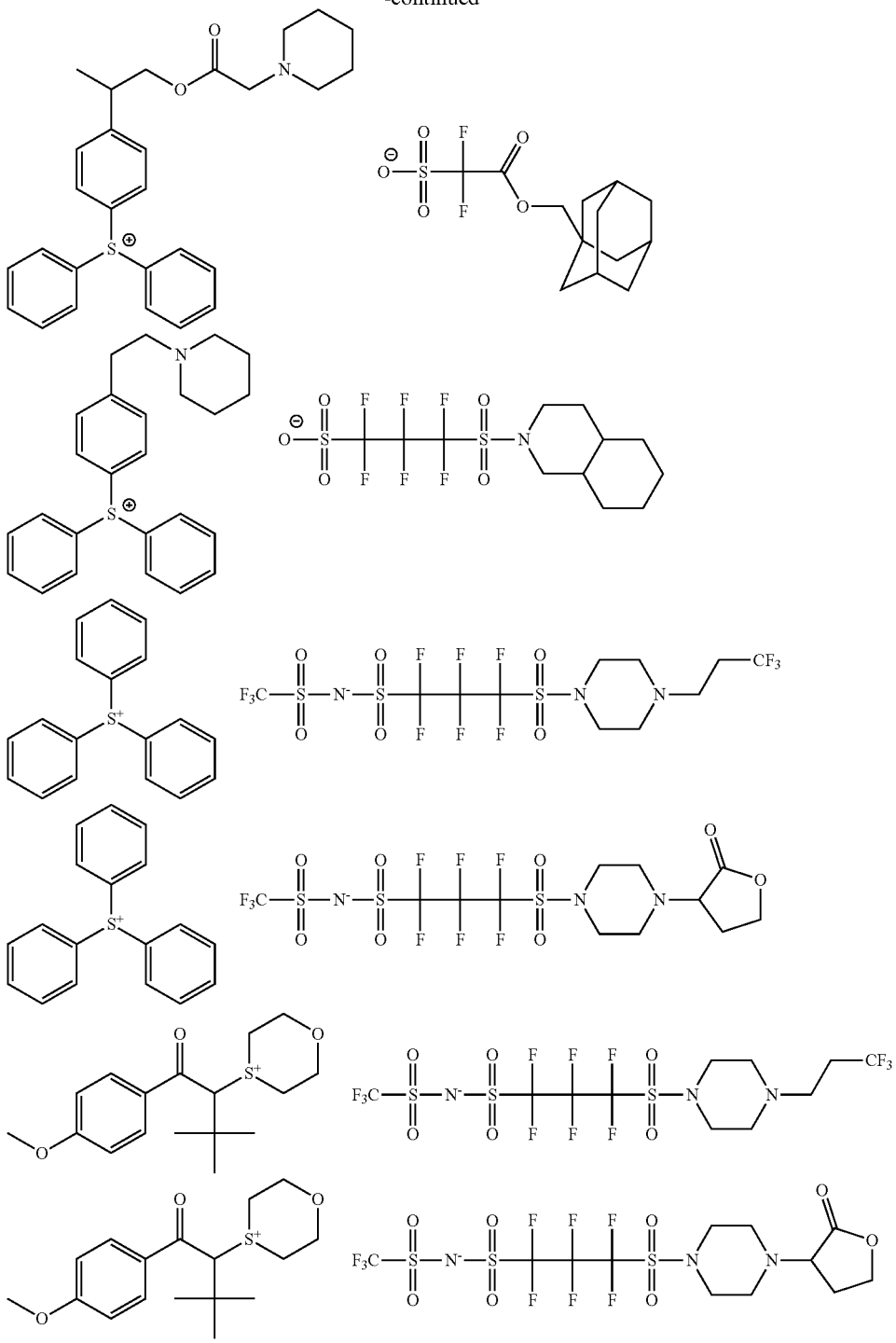

The compound (E) may be used singly or in combination of two or more kinds thereof.

The content of the compound (E) is usually in the range of 0.001% to 10% by mass, preferably 0.1% to 10% by mass, and more preferably 1% to 10% by mass, with respect to the total solid content of the composition of the present invention.

In addition, from the viewpoint of improvement of resolution, it is preferable that the volume of an acid produced from the compound (E) is large.

<Onium Carboxylate Salt>

The composition of the present invention may include an onium carboxylate salt. Examples of the onium carboxylate salt include a carboxylic acid sulfonium salt, a carboxylic acid iodonium salt, and a carboxylic acid ammonium salt. In particular, as the onium carboxylate salt, a carboxylic acid sulfonium salt, or a carboxylic acid iodonium salt is preferable. Further, in the present invention, it is preferable that the carboxylate residue in the onium carboxylate salt contains neither an aromatic group nor a carbon-carbon double bond. A particularly preferred anionic moiety thereof is a linear, branched, monocyclic, or polycyclic alkyl carboxylate anion having 1 to 30 carbon atoms. A more preferred anionic moiety is a carboxylate anion in which the alkyl group is partially or fully fluorinated. The alkyl in its chain may contain an oxygen atom. Accordingly, the transparency to light at a wavelength of 220 nm or less can be ensured, the sensitivity and the resolving power can be enhanced, and the iso/dense bias and the exposure margin can be improved.

The blend ratio of the onium carboxylate salt is preferably 1% to 15% by mass, and more preferably 2% to 10% by mass, with respect to the total solid content of the composition.

<Acid Proliferation Agent>

The actinic ray-sensitive or radiation-sensitive resin composition of the present invention may further include one kind or two or more kinds of the compounds (hereinafter also referred to as acid proliferation agents) that decompose by the action of an acid to generate an acid. The acid generated by each acid proliferation agent is preferably a sulfonic acid, a methide acid, or an imidic acid. The content of the acid proliferation agent is preferably 0.1% to 50% by mass, more preferably 0.5% to 30% by mass, and still more preferably 1.0% to 20% by mass, with respect to the total solid content of the composition.

The amount ratio of the acid proliferation agent to the acid generator (the solid content of the acid proliferation agent with respect to the total solid content of the composition/the solid content of the acid generator with respect to the total solid content of the composition) is not particularly limited, but is preferably 0.01 to 50, more preferably 0.1 to 20, and particularly preferably 0.2 to 1.0.

With regard to the acid proliferation agent, the description in [0381] of JP2014-41328A can be incorporated herein by reference, the contents of which are incorporated in the present specification.

<Organic Acid>

The actinic ray-sensitive or radiation-sensitive resin composition of the present invention may contain an organic acid. The organic acid neutralizes the basic compound in the actinic ray-sensitive or radiation-sensitive resin composition and prevents the temporal alkali decomposition of the resin (C), and thus, the temporal stability is improved.

In one aspect of the present invention, the content of the organic acid in the actinic ray-sensitive or radiation-sensitive resin composition of the present invention is more preferably more than 5% by mass and less than 15% by mass, and still more preferably more than 5% by mass and less than 10% by mass, with respect to the total solid content of the actinic ray-sensitive or radiation-sensitive resin composition.

Examples of the organic acid which can be used in the present invention include an organic carboxylic acid and an organic sulfonic acid, and among these, the organic carboxylic acid is preferable. Examples of the organic carboxylic acid include an aromatic organic carboxylic acid, an aliphatic carboxylic acid, an alicyclic carboxylic acid, an unsaturated aliphatic carboxylic acid, an oxycarboxylic acid, and an alkoxycarboxylic acid. Specific examples of the organic acid are not particularly limited, but include those represented by the structural formulae below. In one aspect of the present invention, the aromatic organic carboxylic acid is preferable, and benzoic acid, 2-hydroxy-3-naphthoic acid, 2-naphthoic acid, or the like is particularly preferable.

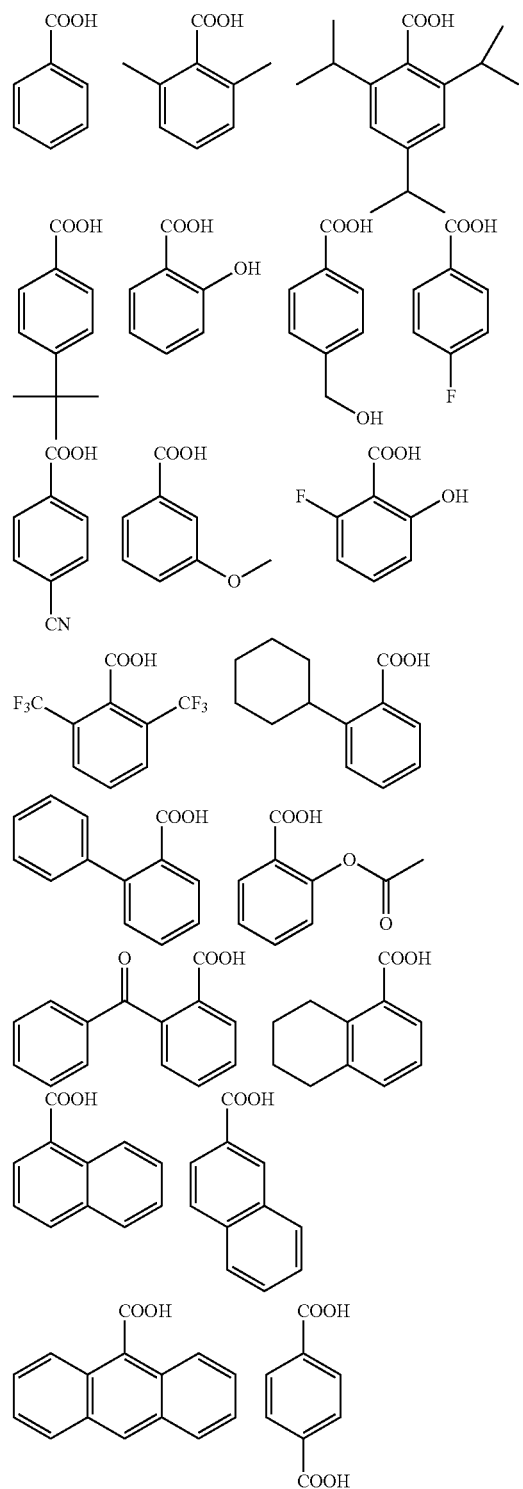

<Surfactant>

The actinic ray-sensitive or radiation-sensitive resin composition of the present invention may further include a surfactant in order to improve the coatability. Examples of the surfactant include, but not limited to, nonionic surfactants such as polyoxyethylene alkyl ethers, polyoxyethylene alkylallyl ethers, polyoxyethylene-polyoxypropylene block copolymers, sorbitan fatty acid esters, and polyoxyethylene sorbitan fatty acid esters, fluorinated surfactants such as MEGAFACE F171 and F176 (manufactured by DIC Corporation), FLORAD FC430 (manufactured by Sumitomo 3M Ltd.), SURFINOL E1004 (manufactured by Asahi Glass Co., Ltd.), and PF656 and PF6320 manufactured by OMNOVA Solutions, Inc., and organosiloxane polymers such as Polysiloxane Polymer KP-341 (manufactured by Kyoeisha Chemical Co., Ltd.).

In a case where the actinic ray-sensitive or radiation-sensitive resin composition of the present invention contains a surfactant, the amount of the surfactant to be used is preferably 0.0001% to 2% by mass, and more preferably 0.0005% to 1% by mass, with respect to the total amount (excluding the solvent) of the actinic ray-sensitive or radiation-sensitive resin composition.

<Solvent>

The composition of the present invention may include a solvent. Preferred examples of the solvent include ethylene glycol monoethyl ether acetate, cyclohexanone, 2-heptanone, propylene glycol monomethyl ether (PGME, alternative name: 1-methoxy-2-propanol), propylene glycol monomethyl ether acetate (PGMEA, alternative name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. These solvents may be used singly or in combination.

The solid contents of the composition of the present invention are dissolved in the solvent, and the solid contents are dissolved such that the concentration of the solid content is preferably 1% to 40% by mass, more preferably 1% to 30% by mass, and still more preferably 3% to 20% by mass.

<Actinic Ray-Sensitive or Radiation-Sensitive Film, and Mask Blank>

The present invention also relates to an actinic ray-sensitive or radiation-sensitive film including the composition of the present invention. Such a film is formed by, for example, applying the composition of the present invention onto a support such as a substrate. The thickness of this film is preferably 0.02 to 0.1 μm. As a coating method onto a substrate, an appropriate coating method such as spin coating, roll coating, flow coating, dip coating, spray coating, and doctor coating is used for coating onto a substrate, but the spin coating is preferable. The rotation speed is preferably 1,000 to 3,000 rpm. The coated film is prebaked at 60° C. to 150° C. for 1 to 20 minutes, and preferably at 80° C. to 120° C. for 1 to 10 minutes, thereby forming a thin film.

As the material constituting a substrate to be processed or a topmost surface layer thereof, for example, in a case of a semiconductor wafer, a silicon wafer can be used, and examples of the materials constituting the topmost surface layer include Si, $SiO_2$, SiN, SiON, TiN, WSi, BPSG, SOG, and an organic antireflection film.

Moreover, the present invention also relates to a mask blank including an actinic ray-sensitive or radiation-sensitive film, obtained in the above manner. In a case where a pattern is formed on a photomask blank for photomask fabrication in order to obtain the mask blank provided with such a resist film, examples of the usable transparent substrate include a transparent substrate of quartz, calcium fluoride, or the like. Generally, the substrate is laminated with necessary films selected from functional films, such as a light-shielding film, an antireflection film, and a phase shift film, and additionally, an etching stopper film and an etching mask film. As for the material of each of the functional films, a film containing silicon or a transition metal such as chromium, molybdenum, zirconium, tantalum, tungsten, titanium, and niobium is laminated. Examples of the material for use in the topmost surface layer include one whose main constituent material is silicon or a material including silicon and, contained therein, oxygen and/or nitrogen, a silicon compound material whose main constituent material is a material including the same and, contained therein, a transition metal, or a transition metal compound material whose main constituent material is a transition metal, particularly at least one selected from chromium, molybdenum, zirconium, tantalum, tungsten, titanium, niobium, or the like, or a material including the same and, contained therein, at least one element selected from oxygen, nitrogen, and carbon.

The light-shielding film may be a monolayer, but is more preferably in a multilayer structure including a plurality of materials superimposed one upon another by coating. In a case of the multilayer structure, the film thickness of each layer is not particularly limited, but is preferably 5 to 100 nm, and more preferably 10 to 80 nm. The thickness of the whole light-shielding film is not particularly limited, but is preferably 5 to 200 nm, and more preferably 10 to 150 nm.

In a case where pattern formation is performed using a composition on a photomask blank whose topmost surface layer contains a material containing chromium, and contained therein, oxygen or nitrogen among the above-mentioned materials, generally, it is likely to experience the occurrence of a constricted shape near the substrate, known as an undercut shape. This undercut problem can be alleviated by the use of the present invention, as compared with the related art.

The actinic ray-sensitive or radiation-sensitive film after irradiation with actinic rays or radiation (electron beams or the like) (hereinafter also referred to as exposure) and preferably bake (at usually 80° C. to 150° C., and more preferably 90° C. to 130° C.) is developed with water. Thus, a good pattern can be obtained. Further, using this pattern as a mask, an etching treatment, ion injection, or the like is appropriately carried out, thereby manufacturing a semiconductor nanocircuit, an imprint mold structure, or the like.

In addition, a process for manufacturing a mold for imprints by the use of the composition of the present invention is described in, for example, JP4109085B, JP2008-162101A, and "Fundamentals of Nanoimprint and Its Technology Development/Application Deployment—Technology of Nanoimprint Substrate and Its Latest Technology Deployment" edited by Yoshihiko Hirai, published by Frontier Publishing.

<Pattern Forming Method>

The composition of the present invention can be suitably used in the process for forming a negative tone pattern shown below. That is, the composition of the present invention can be preferably used in the process including applying the composition onto a substrate to form a resist film, irradiating the resist film with actinic rays or radiation (that is, exposure), and developing the exposed film using a developer to obtain a negative tone pattern. As this process, use can be made of any of the processes described in, for example, JP2008-292975A and JP2010-217884A.

The present invention further relates to a pattern forming method including exposing the resist film or a mask blank including the film, and developing the exposed resist film or the mask blank including the exposed film. In the present invention, the exposure is preferably performed using electron beams or extreme ultraviolet rays.

In the exposure to light (pattern forming step) of the resist film in, for example, the manufacturing of a precision integrated circuit element, first, it is preferable to subject the resist film of the present invention to patternwise irradiation with electron beams or extreme ultraviolet rays (EUV). The exposure is carried out in an exposure dose of, in a case of electron beams, approximately 0.1 to 20 μC/cm², and preferably approximately 3 to 10 μC/cm², and in a case of extreme ultraviolet rays, approximately 0.1 to 20 mJ/cm², and preferably approximately 3 to 15 mJ/cm². Subsequently, post-exposure heating (post-exposure bake) is carried out on a hot plate at 60° C. to 150° C. for 1 to 20 minutes, and preferably 80° C. to 120° C. for 1 to 10 minutes. Thereafter, development, rinsing, and drying are carried out to obtain a pattern. The development is carried out with a developer for 0.1 to 3 minutes, preferably 0.5 to 2 minutes by an ordinary method such as a dip method, a puddle method, and a spray method.

An alkali developer can be used as the developer.

Not only a quaternary ammonium salt whose representative is tetramethylammonium hydroxide is usually used as the alkali developer, but also an alkaline aqueous solution of, for example, an inorganic alkali, a primary amine, a secondary amine, a tertiary amine, an alcoholamine, a cycloamine, or the like can be used. Further, an appropriate amount of an alcohol and a surfactant can be added to the alkali developer before use. The alkali concentration of the alkali developer is usually 0.1% to 20% by mass. The pH of the alkali developer is usually 10.0 to 15.0.

Moreover, an appropriate amount of an alcohol and a surfactant can be added to the alkaline aqueous solution before use.

Since the composition of the present invention is a negative tone resist composition for use in the formation of a negative tone pattern, a film in unexposed areas is dissolved while the film in exposed areas is less likely to be dissolved in the developer due to the crosslinking of the compounds. Utilizing this, a desired pattern can be formed on substrates.

The pattern forming method of the present invention can be used in formation of a guide pattern (see, for example, ACS Nano Vol. 4 No. 8 Pages 4815 to 4823) in Directed Self-Assembly (DSA).

Furthermore, the resist pattern formed by the method can be used as a core material (core) in the spacer process disclosed in, for example, JP1991-270227A (JP-H03-270227A) and JP2013-164509A.

Moreover, in the pattern forming method of the present invention, a topcoat may be formed on the upper layer of the resist film. It is preferable that the topcoat is not mixed with a resist film, and can be uniformly applied onto the upper layer of the resist film.

The topcoat is not particularly limited, and a topcoat known in the related art can be formed according to a method known in the related art, and can also be formed, based on the description of paragraphs [0072] to [0082] of JP2014-059543A, for example.

It is preferable that various materials (for example, a developer, a resist solvent, a resist composition, a composition for forming an antireflection film, and a composition for forming a topcoat) used in the actinic ray-sensitive or radiation-sensitive resin composition of the present invention and the pattern forming method of the present invention do not include impurities such as a metal and a metal salt containing a halogen atom. The content of the impurities included in these materials is preferably 1 ppm or less, more preferably 10 ppb or less, still more preferably 100 ppt or less, and particularly preferably 10 ppt or less, but the material not having substantially metal components (within a detection limit of a determination device or less) is the most preferable.

Examples of a method for removing impurities such as metals from the various materials include filtration using a filter. As for the filter pore diameter, the pore size is preferably 10 nm or less, more preferably 5 nm or less, and still more preferably 3 nm or less. As for the materials of a filter, a polytetrafluoroethylene-made filter, a polyethylene-made filter, and a nylon-made filter are preferable. The filter may be formed of a composite material formed by combining this material with an ion exchange medium. As the filter, a filter which had been washed with an organic solvent in advance may be used. In the step of filtration using a filter, a plurality of kinds of filters may be connected in series or in parallel, and used. In a case of using a plurality of kinds of filters, a combination of filters having different pore diameters and/or materials may be used. In addition, various materials may be filtered plural times, and a step of filtering plural times may be a circulatory filtration step.

Moreover, examples of the method for reducing the impurities such as metals included in the various materials include a method of selecting raw materials having a small content of metals as raw materials constituting various materials, a method of subjecting raw materials constituting various materials to filtration using a filter, and a method of performing distillation under the condition with contamination being suppressed to the largest degree by, for example, lining the inside of a device with TEFLON (registered trademark). The preferred conditions for filtration using a filter, which is carried out for raw materials constituting various materials, are the same as the conditions.

In addition to filtration using a filter, removal of impurities by an adsorbing material may be carried out, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used.

Furthermore, the present invention also relates to a method for manufacturing an electronic device, including the pattern forming method of the present invention, and an electronic device manufactured by the manufacturing method.

The electronic device of the present invention is suitably mounted in electrical or electronic equipment (household electronic appliance, OA/media-related equipment, optical equipment, telecommunication equipment, and the like).

Examples

Hereinafter, the present invention will be described in detail with reference to Examples, but the contents of the present invention are not limited thereto.

The compounds used in Examples and Comparative Examples are shown below.

<Compound (A) Whose Dissolution Rate in Alkali Developer Decreases by Action of Acid>

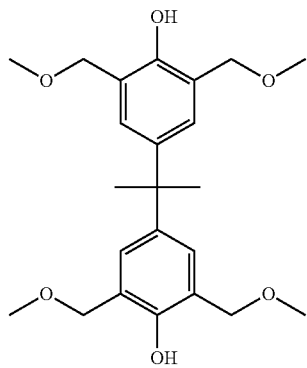

(A-1)

-continued
(A-2)
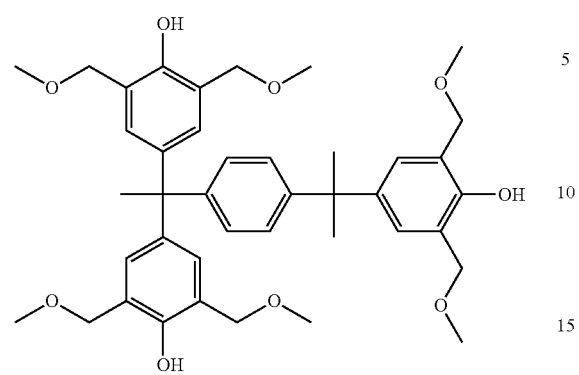
(A-3)
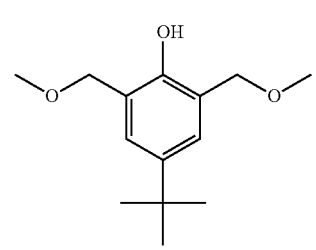
(A-4)
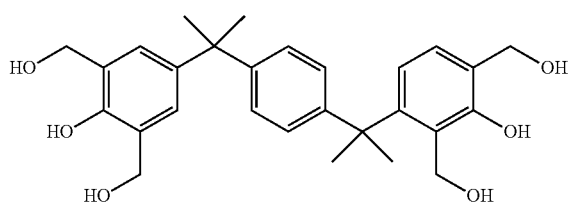
(A-5)
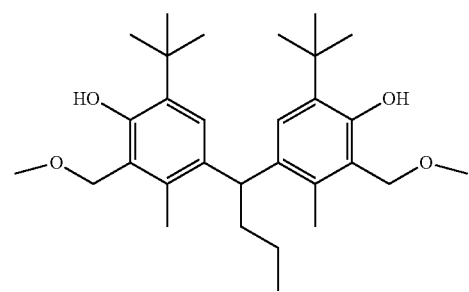
(A-6)
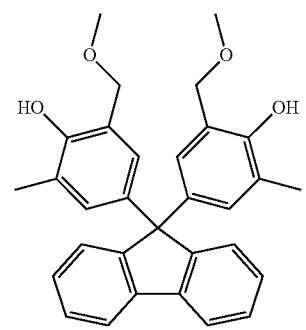
-continued
(A-7)
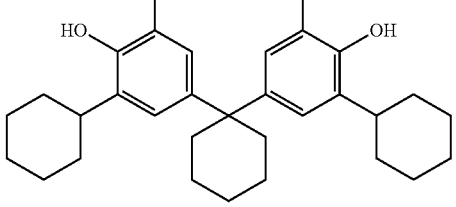
(A-8)
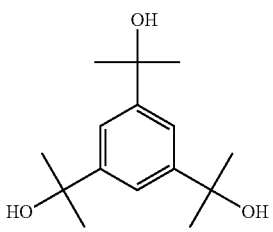
(A-9)
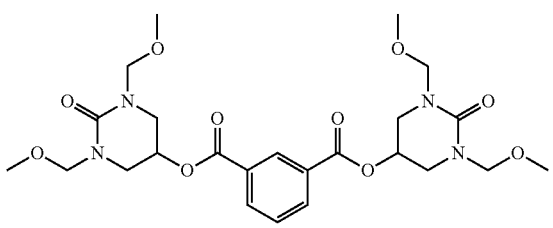
(A-10)
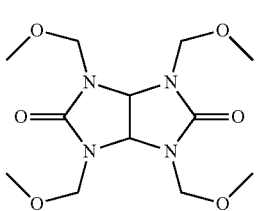
<Resin (B)>
Synthesis Example: Resin (Aa-2)
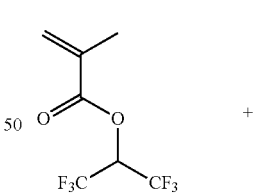
(4)
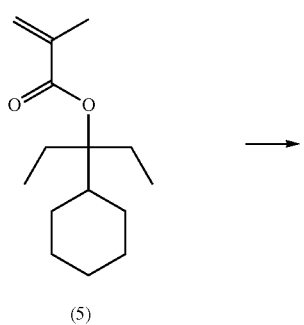
(5)

-continued (Aa-2)

As the resin (B), a resin (Aa-2) was synthesized in accordance with the following scheme.

7.08 g of a compound (4), 4.77 g of a compound (5), 0.58 g of a polymerization initiator V-601 (manufactured by Wako Pure Chemical Industries, Ltd.) were dissolved in 43.65 g of cyclohexanone. 23.50 g of cyclohexanone was put into a reaction container, and added dropwise to the system at 85° C. for 4 hours in a nitrogen gas atmosphere. The reaction solution was stirred under heating for 2 hours and then left to be cooled to room temperature.

The reaction solution was added dropwise to 1,000 g of heptane/ethyl acetate=9/1, and polymers were precipitated and filtered. Using 300 g of heptane/ethyl acetate=9/1, the filtered solid was washed. Thereafter, the solid after washing was dried under reduced pressure to obtain 5.57 g of a resin (Aa-2).

For this resin (Aa-2), the weight-average molecular weight and the dispersity were measured using GPC (manufactured by Tosoh Corporation; HLC-8120; Tsk gel Multipore HXL-M), with a use of THF as a solvent. Further, the compositional ratio was calculated by means of $^1$H-NMR or $^{13}$C-NMR, using NMR (manufactured by Bruker BioSpin K. K.; AVANCEIII400 Type).

[Other Resins (B)]

These respective resins which are appropriately selected from the resins (Aa-1) to (Aa-51) exemplified above and used in Examples were synthesized by the same method as those described in Synthesis Examples.

<Resin (C) Having Aromatic Ring>

As an alkali soluble resin, resins (P-1) to (P-11) shown below were used. These are shown together with the composition ratio (molar ratio), the weight-average molecular weight Mw, and the dispersity Mw/Mn. Here, the weight-average molecular weight Mw (in terms of polystyrene), the number-average molecular weight Mn (in terms of polystyrene), and the dispersity Mw/Mn were measured by the above-mentioned method.

(P-1)

Mw = 4600
Mw/Mn = 1.2

(P-2)

Mw = 8800
Mw/Mn = 1.5

(P-3)

Mw = 7200
Mw/Mn = 1.5

(P-4)

Mw = 12000
Mw/Mn = 1.2

(P-5)

Mw = 9200
Mw/Mn = 1.1

(P-6)

Mw = 4500
Mw/Mn = 1.1

-continued
(P-7)
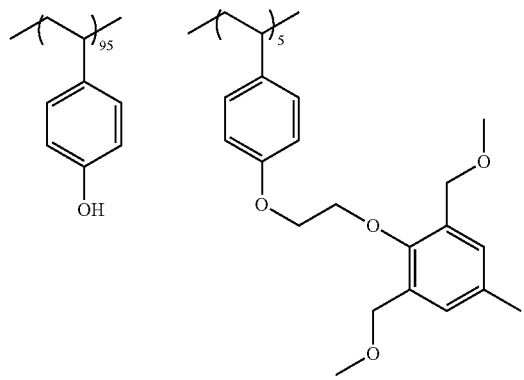
Mw = 4000
Mw/Mn = 1.1
(P-8)
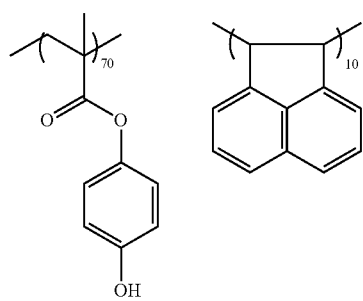
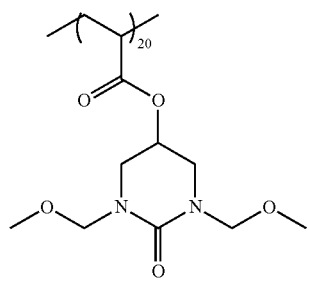
Mw = 10300
Mw/Mn = 1.5
(P-9)
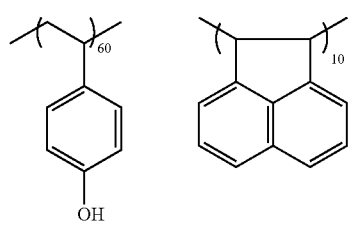
Mw = 3300
Mw/Mn = 1.6
-continued
(P-10)
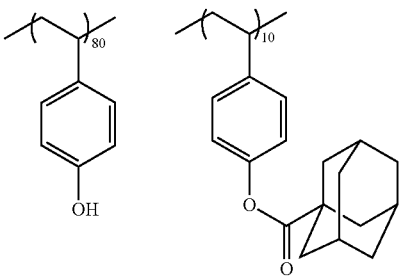
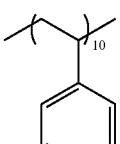
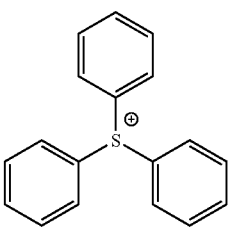
Mw = 4600
Mw/Mn = 1.2
(P-11)
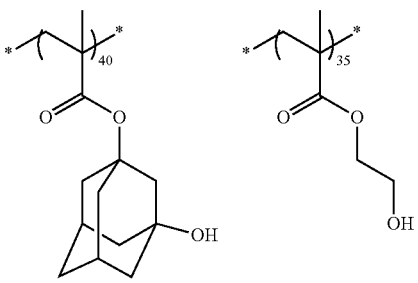
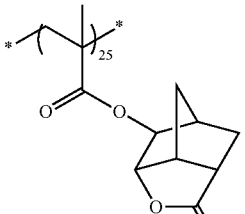
Mw = 7000
Mw/Mn = 1.5
<Photoacid Generator>
As the photoacid generator, a photoacid generator was appropriately selected from the acid generators z1 to z34 exemplified above, and used.
<Basic Compound>
As the basic compound, any one of the following compounds (N-1) to (N-13) was used.

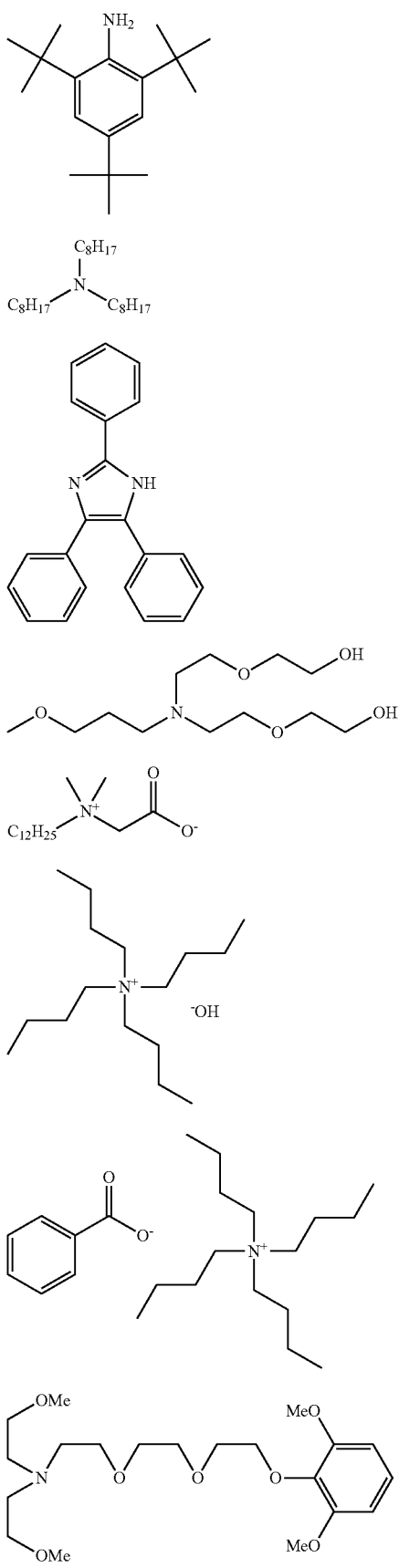
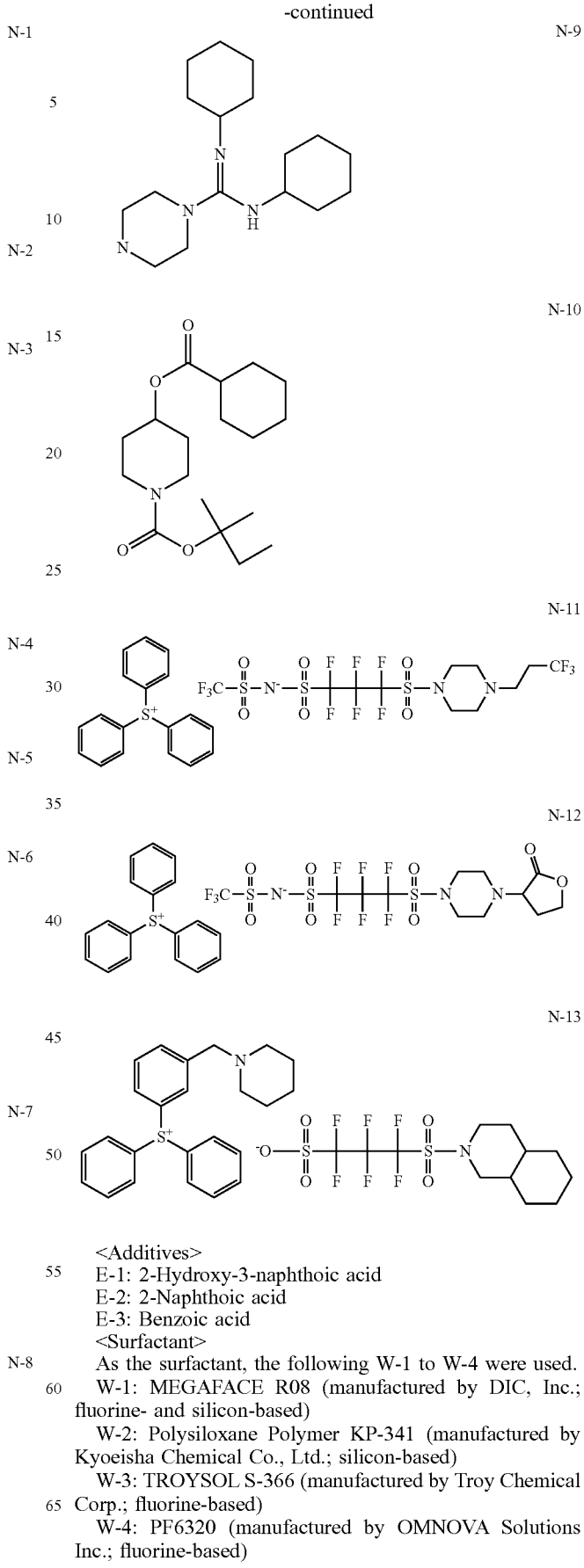

<Additives>
E-1: 2-Hydroxy-3-naphthoic acid
E-2: 2-Naphthoic acid
E-3: Benzoic acid
<Surfactant>
As the surfactant, the following W-1 to W-4 were used.
W-1: MEGAFACE R08 (manufactured by DIC, Inc.; fluorine- and silicon-based)
W-2: Polysiloxane Polymer KP-341 (manufactured by Kyoeisha Chemical Co., Ltd.; silicon-based)
W-3: TROYSOL S-366 (manufactured by Troy Chemical Corp.; fluorine-based)
W-4: PF6320 (manufactured by OMNOVA Solutions Inc.; fluorine-based)

<Solvent>

As the solvent, the following S-1 to S-4 were used.
S-1: PGMEA (b. p.=146° C.)
S-2: PGME (b. p.=120° C.)
S-3: Ethyl lactate (b. p.=155° C.)
S-4: Cyclohexanone (b. p.=157° C.)

<EB Exposure; Negative Tone; Alkali Development>

[Preparation of Support]

As a support, a 6-inch silicon wafer having Cr oxide deposited therein (a silicon wafer which had been subjected to a shielding film treatment used in an ordinary photomask blank) was prepared.

[Preparation of Resist Coating Liquid]

A composition having the composition shown in each of Tables 2 and 3 (the concentration (% by mass) of each component represents the concentration in the total solid content) was dissolved in a solvent to prepare a coating liquid composition having a concentration of the solid content of 1.5% by mass. The coating liquid composition was filtered through a polytetrafluoroethylene filter having a pore diameter of 0.04 μm to prepare a resist solution.

[Manufacture of Resist Film]

The resist coating liquid was applied onto the 6-inch wafer having Cr oxide deposited therein, using a spin coater Mark 8 manufactured by Tokyo Electron Limited, and dried on a hot plate at 140° C. for 90 seconds to obtain a resist film having a film thickness of 50 nm. That is, a resist-coated mask blank was obtained.

One inch is equal to 25.4 mm.

[Manufacture of Negative Tone Resist Pattern]

This resist film was patternwise irradiated with electron beams using an electron beam lithography device (manufactured by Elionix Inc.; ELS-7500, acceleration voltage 50 keV). After the irradiation, the resultant was heated on a hot plate at 110° C. for 90 seconds, dipped in a 2.38%-by-mass aqueous tetramethylammonium hydroxide (TMAH) solution for 60 seconds, rinsed with water for 30 seconds, and dried.

<EUV Exposure; Negative Tone; Alkali Development>

[Preparation of Resist Coating Liquid]

A composition having the composition shown in Table 4 (the concentration (% by mass) of each component represents the concentration in the total solid content) was dissolved in a solvent to prepare a coating liquid composition having a concentration of the solid content of 1.5% by mass. The coating liquid composition was filtered through a polytetrafluoroethylene filter having a pore diameter of 0.05 μm to prepare an actinic ray-sensitive or radiation-sensitive resin composition (resist composition) solution.

[Manufacture of Negative Tone Resist Pattern]

The actinic ray-sensitive or radiation-sensitive resin composition solution was applied onto a 6-inch Si wafer which had been subjected to a hexamethyldisilazane (HMDS) treatment in advance, using a spin coater Mark 8 manufactured by Tokyo Electron Limited, and dried on a hot plate at 100° C. for 60 seconds to obtain a resist film having a film thickness of 50 nm. That is, a resist-coated mask blank was obtained.

One inch is equal to 25.4 mm.

[EUV Exposure and Development]

A wafer having the obtained resist film applied thereon was patternwise exposed through an exposure mask (line:space=1:1), using an EUV exposure device (Micro Exposure Tool manufactured by Exitech, NA0.3, X-dipole, outer sigma 0.68, inner sigma 0.36). After irradiation, the wafer was heated on a hot plate at 100° C. for 60 seconds, then developed for 30 seconds by puddling with a 2.38%-by-mass aqueous tetramethylammoniumhydroxide (TMAH) solution, and rinsed with water. Thereafter, the wafer was rotated for 30 seconds at a rotation speed of 4,000 rpm, and then baked at 95° C. for 60 seconds to obtain a resist pattern of a 1:1 line-and-space pattern having a line width of 50 nm.

[Evaluation of Resist Pattern]

The obtained patterns were evaluated by the following methods with respect to the sensitivity, the resolving power, the scum, the collapse margin, and the line edge roughness (LER). The evaluation results are shown in Tables 2, 3, and 4.

[Sensitivity]

The cross-sectional shape of the obtained pattern was observed using a scanning electron microscope (S-4300, manufactured by Hitachi, Ltd.). The exposure dose at which a 1:1 line-and-space resist pattern having a line width of 50 nm was resolved was defined as a sensitivity. The smaller the value thereof, the higher the sensitivity.

[L/S Resolving Power]

The critical resolving power (a minimum line width providing the separation and the resolution of a line and a space (line:space=1:1)) at an exposure dose exhibiting the sensitivity was defined as an L/S resolving power (nm).

[Isolated Space Pattern Resolving Power]

The critical resolving power (a minimum space width providing the separation and the resolution of a line and a space) of the isolated space (line:space=100:1) in the sensitivity was determined. Further, this value was defined as an "isolated space pattern resolving power (nm)". The smaller the value thereof, the better the performance.

[Evaluation of Scum]

With regard to the isolated space pattern resolving power evaluation, scum was evaluated as follows.

A: Scum was not observed at all.

B: Scum was observed in the line width around the critical resolving power.

C: Scum was observed in the line width wider than the critical resolution.

[Collapse Margin]

When the irradiation dose was reduced from the optimal irradiation doses at a time of exposing a line pattern having a line width of 0.1 μM, a space width in a case where the line pattern starts to collapse was defined as an index of a "collapse margin". The larger the value thereof, the better the performance.

[Line Edge Roughness (LER)]

A 1:1 line-and-space pattern having a line width of 50 nm was formed at an exposure dose exhibiting the above sensitivity. At arbitrary 30 points included within 50 μm in the longitudinal direction of the pattern, the distance between an actual edge and a reference line on which an edge was supposed to be present was measured by means of a scanning electron microscope (S-9220, manufactured by Hitachi, Ltd.). Further, the standard deviation of the measured distances was determined to calculate 3a. The smaller the value thereof, the better the performance.

TABLE 2

| | Composition of resist | | | | | | | |
|---|---|---|---|---|---|---|---|---|
| | Resin (B) (% by mass) | Resin (C) (% by mass) | Photoacid generator (% by mass) | Basic compound (% by mass) | Compound (A) (% by mass) | Additive (% by mass) | Surfactant (% by mass) | Solvent (mass ratio) |
| Example 1 | Aa-3 3.0 | P-1 47.0 | z1 15.0 | N-10 5.0 | A-2 30.0 | — 0.0 | — 0.0 | S-1/S-2 50/50 |
| Example 2 | Aa-2 3.0 | P-1 47.0 | z1 15.0 | N-10 5.0 | A-2 30.0 | — 0.0 | — 0.0 | S-1/S-2 50/50 |
| Example 3 | Aa-37 3.0 | P-1 47.0 | z1 15.0 | N-10 5.0 | A-2 30.0 | — 0.0 | — 0.0 | S-1/S-2 50/50 |
| Example 4 | Aa-11 8.0 | P-5 57.9 | z27 12.0 | N-11 4.0 | A-2 18.0 | — 0.0 | W-2 0.1 | S-1/S-2 90/10 |
| Example 5 | Aa-12 8.0 | P-5 57.9 | z27 12.0 | N-11 4.0 | A-2 18.0 | — 0.0 | W-2 0.1 | S-1/S-2 90/10 |
| Example 6 | Aa-13 8.0 | P-5 57.9 | z27 12.0 | N-11 4.0 | A-2 18.0 | — 0.0 | W-2 0.1 | S-1/S-2 90/10 |
| Example 7 | Aa-14 8.0 | P-5 57.9 | z27 12.0 | N-11 4.0 | A-2 18.0 | — 0.0 | W-2 0.1 | S-1/S-2 90/10 |
| Example 8 | Aa-15 6.0 | P-1/P-5 50.0/8.0 | z33 10.0 | N-6 6.0 | A-6 20.0 | — 0.0 | — 0.0 | S-1/S-2 70/30 |
| Example 9 | Aa-16 6.0 | P-1/P-5 50.0/8.0 | z33 10.0 | N-6 6.0 | A-6 20.0 | — 0.0 | — 0.0 | S-1/S-2 70/30 |
| Example 10 | Aa-17 6.0 | P-1/P-5 50.0/8.0 | z33 10.0 | N-6 6.0 | A-6 20.0 | — 0.0 | — 0.0 | S-1/S-2 70/30 |
| Example 11 | Aa-18 6.0 | P-1/P-5 50.0/8.0 | z33 10.0 | N-6 6.0 | A-6 20.0 | — 0.0 | — 0.0 | S-1/S-2 70/30 |
| Example 12 | Aa-19 6.0 | P-1/P-5 50.0/8.0 | z33 10.0 | N-6 6.0 | A-6 20.0 | — 0.0 | — 0.0 | S-1/S-2 70/30 |
| Example 13 | Aa-36 0.5 | P-4 41.4 | z32 10.0 | N-9 3.0 | A-10 35.0 | E-3 10.0 | W-3 0.1 | S-1 100 |
| Example 14 | Aa-40 5.0 | P-6 68.0 | z4 8.0 | N-5 3.0 | A-1 15.0 | E-2 1.0 | — 0.0 | S-1/S-2 70/30 |
| Example 15 | Aa-40 5.0 | P-6 68.0 | z4 8.0 | N-5 3.0 | A-10 15.0 | E-2 1.0 | — 0.0 | S-1/S-2 70/30 |
| Example 16 | Aa-43 5.0 | P-5 59.0 | z32 6.0 | N-6 2.0 | A-6 23.0 | E-3 5.0 | — 0.0 | S-1/S-2 60/40 |

| | Evaluation results | | | | | |
|---|---|---|---|---|---|---|
| | Sensitivity (μC/cm$^2$) | L/S resolving power (nm) | Isolated space pattern resolving power (nm) | Scum | Collapse margin (nm) | LER (nm) |
| Example 1 | 35 | 34 | 40 | A | 137.5 | 4.2 |
| Example 2 | 38 | 36 | 44 | A | 137.5 | 4.7 |
| Example 3 | 42 | 38 | 46 | A | 137.5 | 5.0 |
| Example 4 | 44 | 40 | 48 | B | 125.0 | 5.3 |
| Example 5 | 42 | 38 | 46 | B | 137.5 | 5.1 |
| Example 6 | 39 | 36 | 44 | A | 137.5 | 4.8 |
| Example 7 | 36 | 34 | 42 | A | 137.5 | 4.5 |
| Example 8 | 37 | 34 | 42 | A | 137.5 | 4.3 |
| Example 9 | 48 | 40 | 48 | B | 125.0 | 5.3 |
| Example 10 | 45 | 38 | 46 | B | 125.0 | 5.0 |
| Example 11 | 43 | 38 | 44 | A | 125.0 | 4.7 |
| Example 12 | 40 | 36 | 42 | A | 137.5 | 4.6 |
| Example 13 | 36 | 36 | 44 | A | 137.5 | 4.4 |
| Example 14 | 39 | 34 | 44 | A | 137.5 | 4.4 |
| Example 15 | 41 | 38 | 48 | A | 137.5 | 4.9 |
| Example 16 | 37 | 32 | 42 | A | 137.5 | 4.1 |

TABLE 3

| | Composition of resist | | | | | | | |
|---|---|---|---|---|---|---|---|---|
| | Resin (B) (% by mass) | Resin (C) (% by mass) | Photoacid generator (% by mass) | Basic compound (% by mass) | Compound (A) (% by mass) | Additive (% by mass) | Surfactant (% by mass) | Solvent (mass ratio) |
| Example 17 | Aa-43 10.0 | P-5 54.0 | z32 6.0 | N-6 2.0 | A-6 23.0 | E-3 5.0 | — 0.0 | S-1/S-2 60/40 |
| Example 18 | Aa-43 20.0 | P-5 44.0 | z32 6.0 | N-6 2.0 | A-6 23.0 | E-3 5.0 | — 0.0 | S-1/S-2 60/40 |
| Example 19 | Aa-43 30.0 | P-5 34.0 | z32 6.0 | N-6 2.0 | A-6 23.0 | E-3 5.0 | — 0.0 | S-1/S-2 60/40 |

TABLE 3-continued

| | Resin (B) | Resin (C) | Photoacid generator | Basic compound | Compound (A) | Additive | Surfactant | Solvent (mass ratio) |
|---|---|---|---|---|---|---|---|---|
| Example 20 | Aa-45 1.0 | P-2 54.9 | z5 5.0 | N-2 1.0 | A-3 35.0 | E-1 3.0 | W-1 0.1 | S-1/S-2 80/20 |
| Example 21 | Aa-45 1.0 | P-2 54.9 | z5 5.0 | N-2 1.0 | A-8 35.0 | E-1 3.0 | W-1 0.1 | S-1/S-2 80/20 |
| Example 22 | Aa-48 7.0 | P-3 60.9 | z13 9.0 | N-3 3.0 | A-4 12.0 | E-1 8.0 | W-4 0.1 | S-2/S-4 20/40 |
| Example 23 | Aa-44 3.0 | P-1 54.0 | z32 11.0 | N-13 6.0 | A-6 26.0 | — 0.0 | — 0.0 | S-1/S-2 80/20 |
| Example 24 | Aa-47 5.0 | P-7 60.0 | z27 30.0 | N-4 5.0 | — 0.0 | — 0.0 | — 0.0 | S-1/S-2/S-3 70/20/10 |
| Example 25 | Aa-46 2.0 | P-8 63.9 | z34 18.0 | N-7 6.0 | A-3 5.0 | E-2 5.0 | W-3 0.1 | S-1/S-2/S-4 60/20/20 |
| Example 26 | Aa-20/Aa-50 5.0/5.0 | P-9 58.0 | z19 25.0 | N-8 7.0 | — 0.0 | — 0.0 | — 0.0 | S-1/S-3 90/10 |
| Example 27 | Aa-1 15.0 | P-10 65.0 | — 0.0 | N-12 10.0 | A-9 10.0 | — 0.0 | — 0.0 | S-2 100 |
| Example 28 | Aa-10 2.0 | P-4 61.0 | z17 11.0 | N-13 6.0 | A-2/A-3 15.0/5.0 | — 0.0 | — 0.0 | S-1/S-2 80/20 |
| Example 29 | Aa-25 3.0 | P-2 55.9 | z31/z20 5.0/5.0 | N-1 6.0 | A-5 25.0 | — 0.0 | W-4 0.1 | S-1/S-2 60/40 |
| Example 30 | Aa-42 5.0 | P-5/P-6 52.0 | z14 12.0 | N-12 6.0 | A-7 25.0 | — 0.0 | — 0.0 | S-1/S-2 80/20 |
| Comparative Example 1 | Aa-48 7.0 | P-11 60.9 | z13 9.0 | N-3 3.0 | A-4 12.0 | E-1 8.0 | W-4 0.1 | S-2/S-4 20/40 |
| Comparative Example 2 | — 0.0 | P-5/P-6 57.0 | z14 12.0 | N-12 6.0 | A-7 25.0 | — | — | S-1/S-2 80/20 |

Evaluation results

| | Sensitivity (μC/cm$^2$) | L/S resolving power (nm) | Isolated space pattern resolving power (nm) | Scum | Collapse margin (nm) | LER (nm) |
|---|---|---|---|---|---|---|
| Example 17 | 38 | 34 | 44 | A | 137.5 | 4.3 |
| Example 18 | 41 | 38 | 46 | A | 137.5 | 4.8 |
| Example 19 | 43 | 40 | 48 | A | 137.5 | 5.1 |
| Example 20 | 36 | 36 | 42 | A | 137.5 | 4.4 |
| Example 21 | 39 | 38 | 46 | A | 137.5 | 4.8 |
| Example 22 | 44 | 42 | 50 | B | 125.0 | 5.1 |
| Example 23 | 35 | 32 | 40 | A | 137.5 | 4.0 |
| Example 24 | 36 | 36 | 48 | A | 137.5 | 4.5 |
| Example 25 | 45 | 42 | 48 | B | 125.0 | 4.9 |
| Example 26 | 43 | 42 | 50 | B | 137.5 | 5.1 |
| Example 27 | 40 | 38 | 42 | A | 137.5 | 4.1 |
| Example 28 | 45 | 40 | 44 | A | 137.5 | 4.4 |
| Example 29 | 42 | 40 | 44 | A | 137.5 | 4.5 |
| Example 30 | 38 | 34 | 46 | A | 137.5 | 4.7 |
| Comparative Example 1 | 62 | 50 | 58 | C | 87.5 | 6.1 |
| Comparative Example 2 | 56 | 48 | 56 | C | 100.0 | 6.0 |

TABLE 4

Composition of resist

| | Resin (B) (% by mass) | Resin (C) (% by mass) | Photoacid generator (% by mass) | Basic compound (% by mass) | Compound (A) (% by mass) | Additive (% by mass) | Surfactant (% by mass) | Solvent (mass ratio) |
|---|---|---|---|---|---|---|---|---|
| Example 31 | Aa-12 8.0 | P-5 57.9 | z27 12.0 | N-11 4.0 | A-2 18.0 | — 0.0 | W-2 0.1 | S-1/S-2 90/10 |
| Example 32 | Aa-36 0.5 | P-4 41.4 | z32 10.0 | N-9 3.0 | A-10 35.0 | E-3 10.0 | W-3 0.1 | S-1 100 |
| Example 33 | Aa-40 5.0 | P-6 68.0 | z4 8.0 | N-5 3.0 | A-1 15.0 | E-2 1.0 | — 0.0 | S-1/S-2 70/30 |
| Example 34 | Aa-45 1.0 | P-2 54.9 | z5 5.0 | N-2 1.0 | A-3 35.0 | E-1 3.0 | W-1 0.1 | S-1/S-2 80/20 |
| Example 35 | Aa-48 7.0 | P-3 60.9 | z13 9.0 | N-3 3.0 | A-4 12.0 | E-1 8.0 | W-4 0.1 | S-2/S-4 20/40 |
| Example 36 | Aa-44 3.0 | P-1 54.0 | z32 11.0 | N-13 6.0 | A-6 26.0 | — 0.0 | — 0.0 | S-1/S-2 80/20 |
| Example 37 | Aa-47 5.0 | P-7 60.0 | z27 30.0 | N-4 5.0 | — 0.0 | — 0.0 | — 0.0 | S-1/S-2/S-3 70/20/10 |
| Example 38 | Aa-46 2.0 | P-8 63.9 | z34 18.0 | N-7 6.0 | A-3 5.0 | E-2 5.0 | W-3 0.1 | S-1/S-2/S-4 60/20/20 |

TABLE 4-continued

| | | | | | | | | | |
|---|---|---|---|---|---|---|---|---|---|
| Example 39 | Aa-20/Aa-50 5.0/5.0 | P-9 58.0 | z19 25.0 | N-8 7.0 | — 0.0 | — 0.0 | — 0.0 | S-1/S-3 90/10 | |
| Example 40 | Aa-1 15.0 | P-10 65.0 | — 0.0 | N-12 10.0 | A-9 10.0 | — 0.0 | — 0.0 | S-2 100 | |
| Example 41 | Aa-42 5.0 | P-5/P-6 52.0 | z14 12.0 | N-12 6.0 | A-7 25.0 | — 0.0 | — 0.0 | S-1/S-2 80/20 | |
| Comparative Example 3 | Aa-48 7.0 | P-11 60.9 | z13 9.0 | N-3 3.0 | A-4 12.0 | E-1 8.0 | W-4 0.1 | S-2/S-4 20/40 | |
| Comparative Example 4 | — 0.0 | P-5/P-6 57.0 | z14 12.0 | N-12 6.0 | A-7 25.0 | — 0.0 | — 0.0 | S-1/S-2 80/20 | |

| | Evaluation results | | | | | |
|---|---|---|---|---|---|---|
| | Sensitivity ($\mu J/cm^2$) | L/S resolving power (nm) | Isolated space pattern resolving power (nm) | Scum | Collapse margin (nm) | LER (nm) |
| Example 31 | 29 | 32 | 36 | B | 137.5 | 4.1 |
| Example 32 | 25 | 30 | 34 | A | 137.5 | 3.5 |
| Example 33 | 27 | 28 | 34 | A | 137.5 | 3.5 |
| Example 34 | 25 | 30 | 34 | A | 137.5 | 3.5 |
| Example 35 | 31 | 36 | 40 | B | 125.0 | 4.1 |
| Example 36 | 25 | 26 | 32 | A | 137.5 | 3.2 |
| Example 37 | 25 | 30 | 38 | A | 137.5 | 3.6 |
| Example 38 | 32 | 36 | 38 | B | 125.0 | 3.9 |
| Example 39 | 30 | 36 | 40 | B | 137.5 | 4.1 |
| Example 40 | 28 | 32 | 34 | A | 137.5 | 3.3 |
| Example 41 | 27 | 28 | 36 | A | 137.5 | 3.8 |
| Comparative Example 3 | 43 | 44 | 48 | C | 87.5 | 5.0 |
| Comparative Example 4 | 39 | 42 | 46 | C | 100.0 | 5.0 |

From Tables 2 to 4, it could be seen that in Examples 1 to 41, patterns having excellent sensitivity, resolution, and collapse performance, suppressed generation of scum, and excellent line edge roughness performance were formed, as compared with Comparative Examples 1 and 3 in which the resin (C) was not included, and Comparative Examples 2 and 4 in which the resin (B) was not included.

Examples 24, 26, 37, and 39 are Examples in which the resin (C) included the repeating unit represented by General Formula (L-1) or (L-2) described above, and the resin (C) satisfied the requirements of the compound (A).

In addition, in Examples above, even when the resin (C), the resin (B), the acid generator, the basic compound, the compound (A), the additive, and the surfactant are changed within the above-mentioned preferred ranges, the same performance is exhibited.

According to the present invention, it is possible to provide an actinic ray-sensitive or radiation-sensitive resin composition capable of forming a pattern which has excellent sensitivity, resolution, and collapse performance, suppressed generation of scum, and excellent line edge roughness performance in the formation of an ultrafine pattern (for example, a pattern having a line width of 50 nm or less), as well as an actinic ray-sensitive or radiation-sensitive film, a mask blank having the actinic ray-sensitive or radiation-sensitive film, a pattern forming method, a method for manufacturing an electronic device, including the pattern forming method, and an electronic device, each using the actinic ray-sensitive or radiation-sensitive resin composition.

While the present invention has been described in detail and with reference to specific embodiments thereof, it will be apparent to one skilled in the art that various changes and modifications can be made therein without departing from the spirit and scope of the present invention.

What is claimed is:

1. An actinic ray-sensitive or radiation-sensitive resin composition comprising:

a compound (A) whose dissolution rate in an alkali developer decreases by the action of an acid;

a resin (B) including a repeating unit having one or more groups selected from the group consisting of a fluorine atom, a group having a fluorine atom, a group having a silicon atom, an alkyl group having 6 or more carbon atoms, and a cycloalkyl group having 5 or more carbon atoms; and a resin (C) having an aromatic ring, different from the resin (B), wherein the resin (B) further includes a repeating unit having a group which decomposes by the action of an acid, and wherein the resin (B) contains at least one of a repeating unit represented by General Formula (A1) or a repeating unit represented by General Formula (A2), wherein the repeating unit represented by General Formula (A1) is selected from the group consisting of the repeating units shown below:

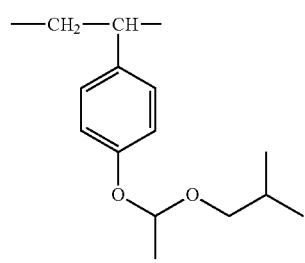

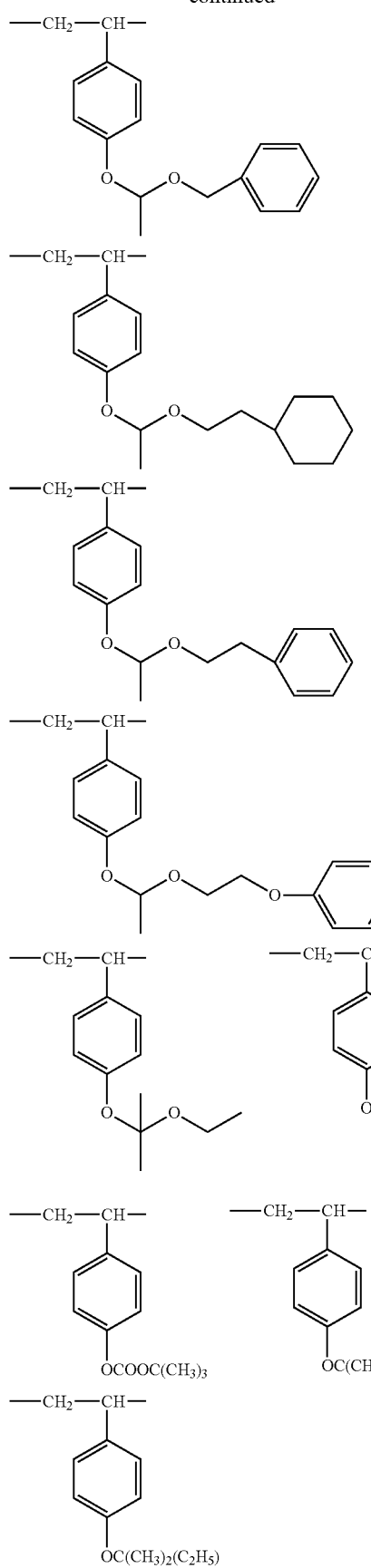
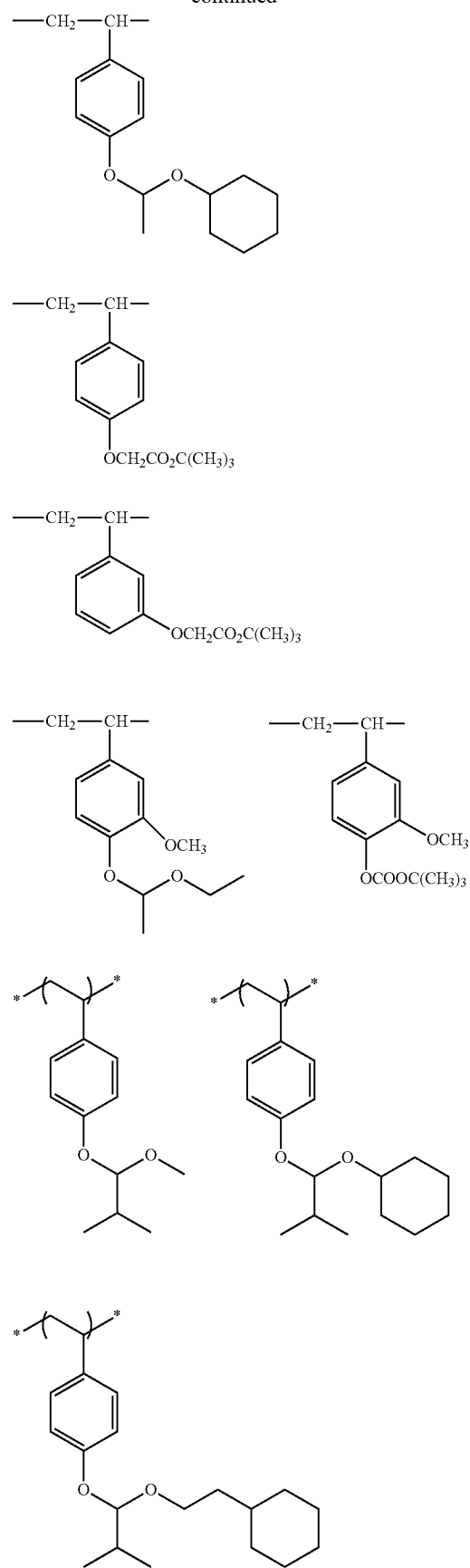

175
-continued
176
-continued
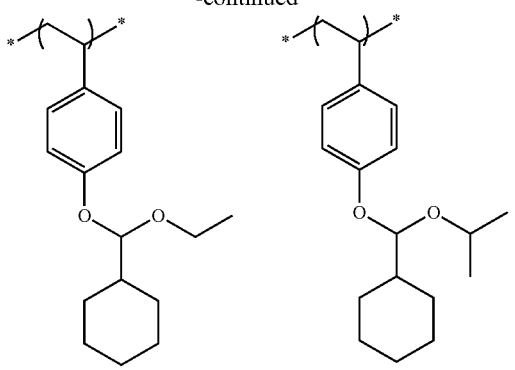
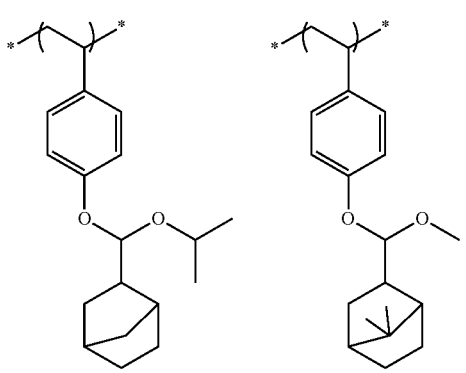
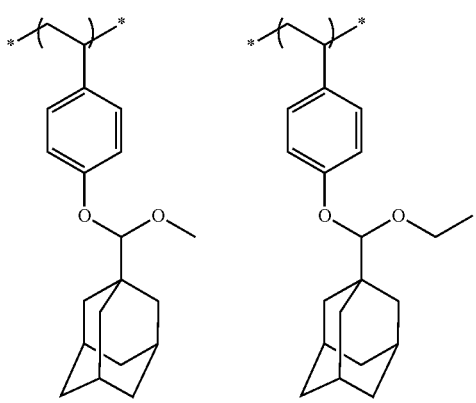
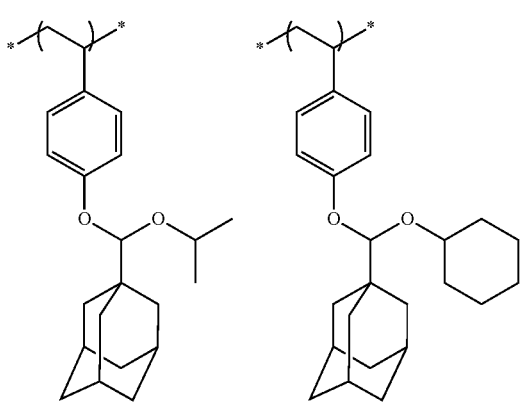
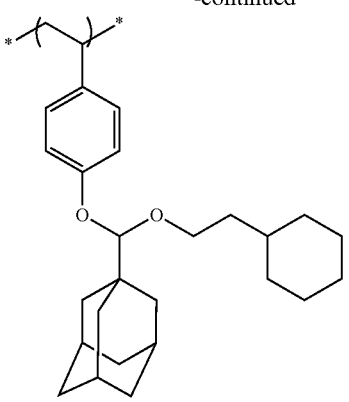
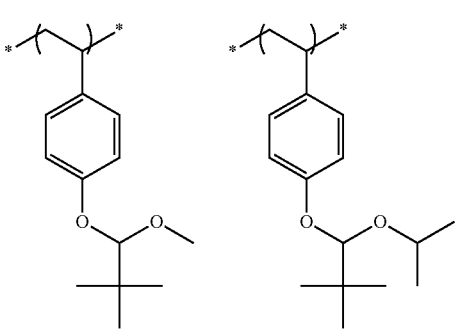
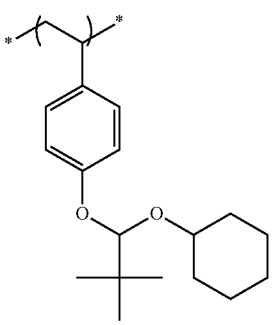
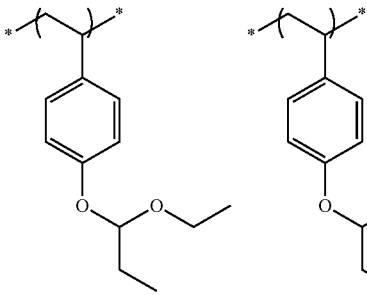
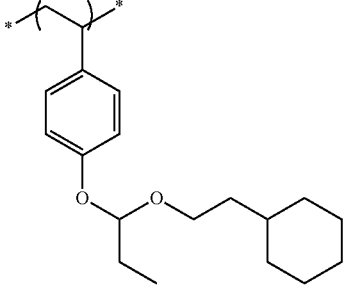

-continued
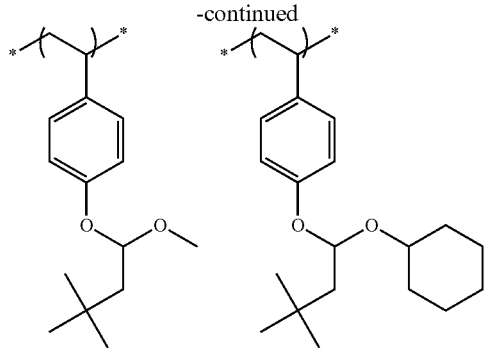
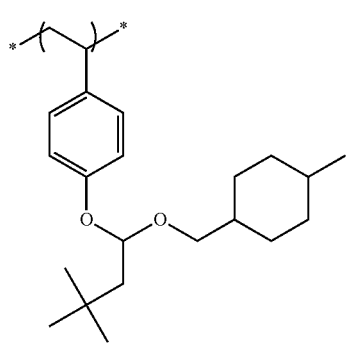
and
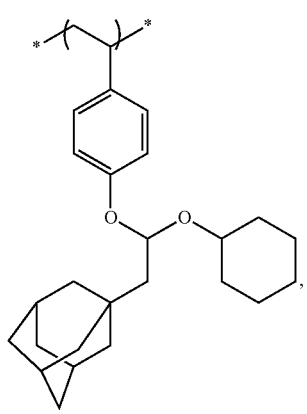
,
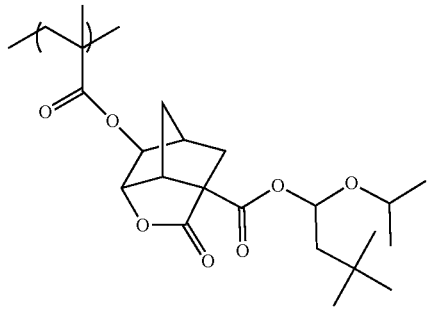
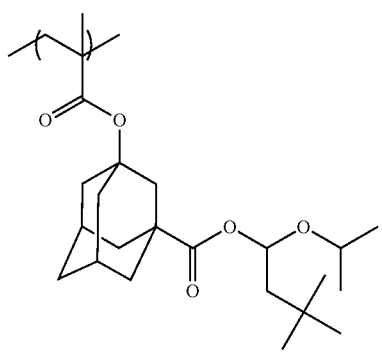
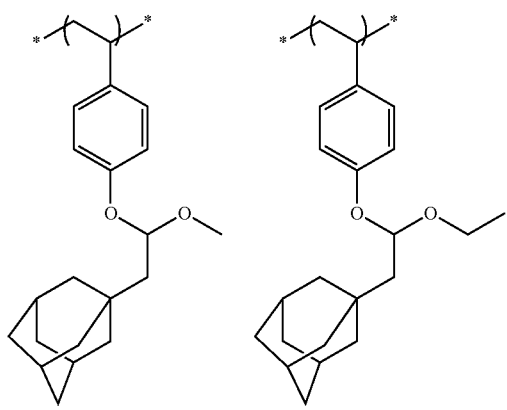
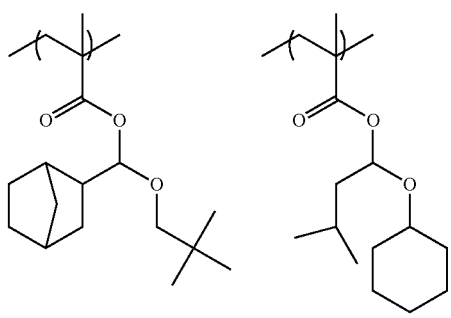
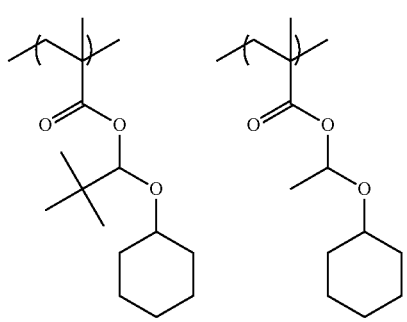
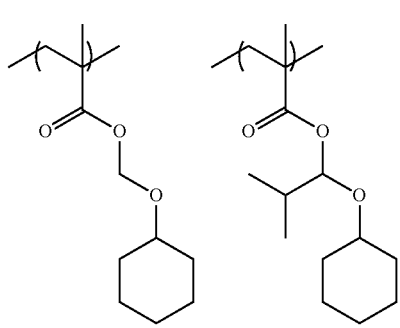
wherein the repeating unit represented by General Formula (A2) is selected from the group consisting of the repeating units shown below:

179
-continued
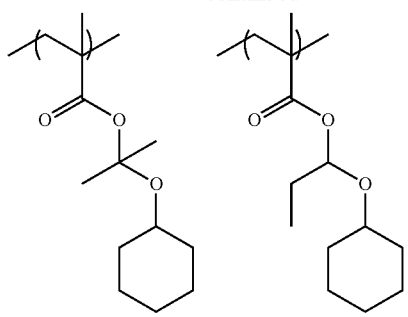
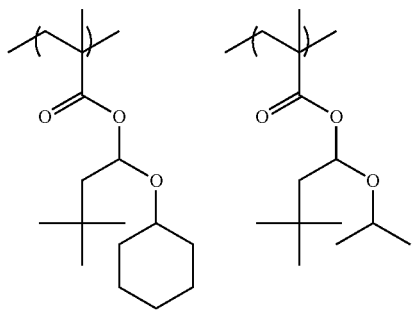
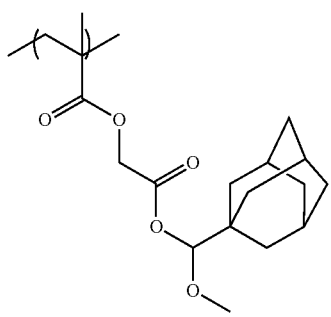
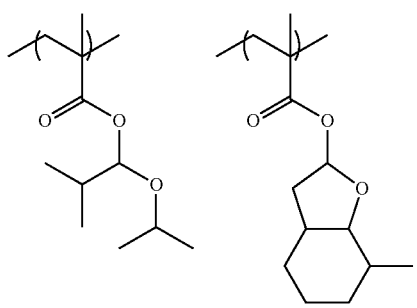
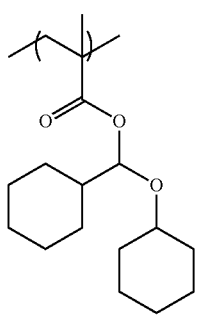
180
-continued
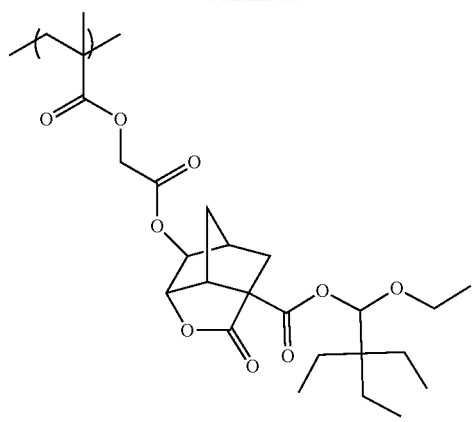
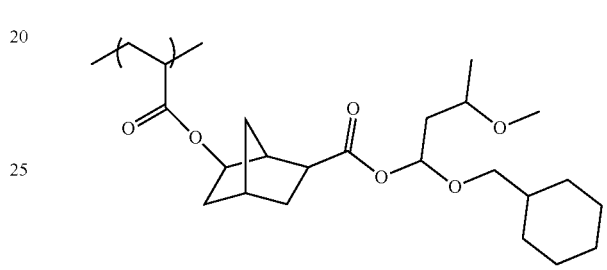
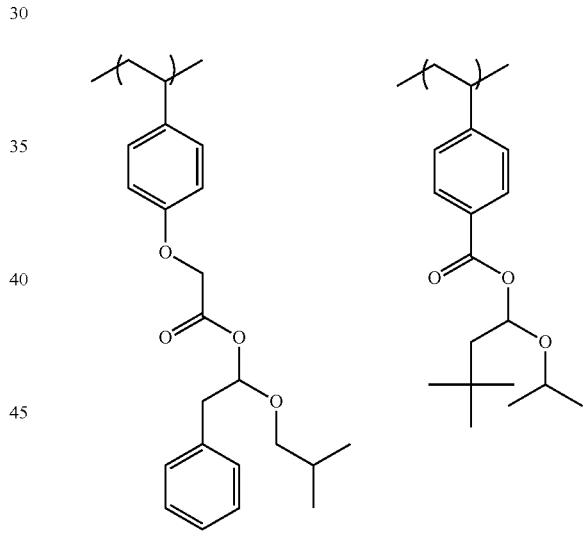
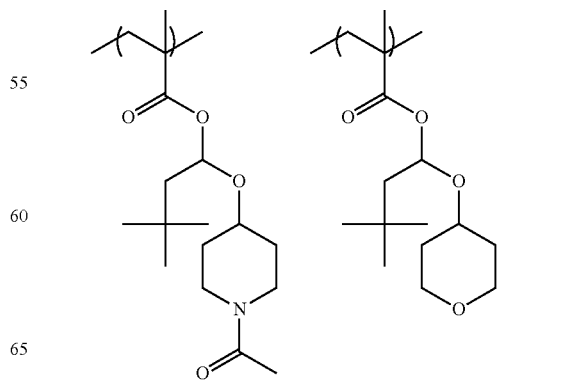

181
-continued
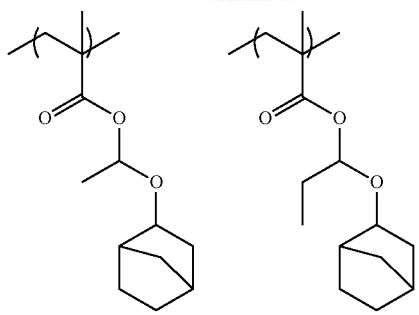
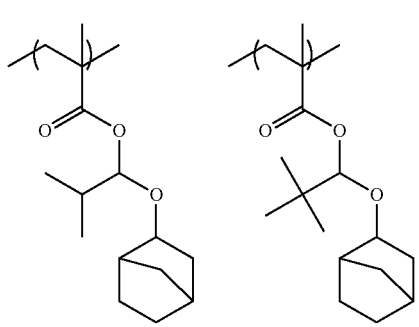
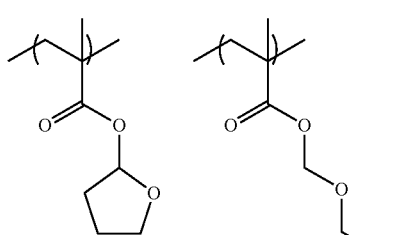
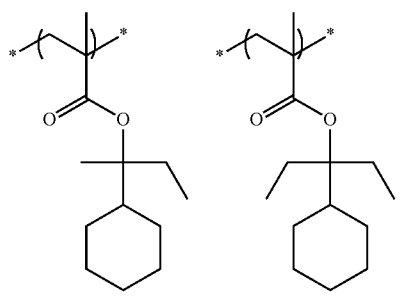
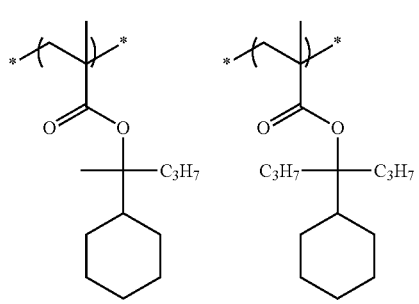
182
-continued
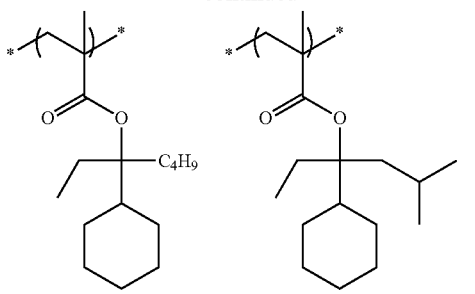
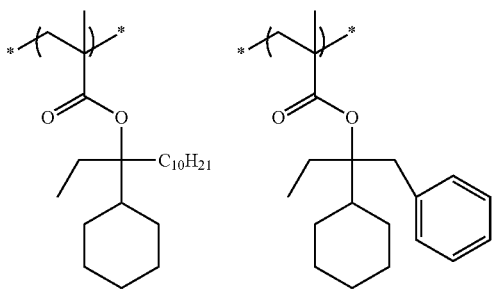
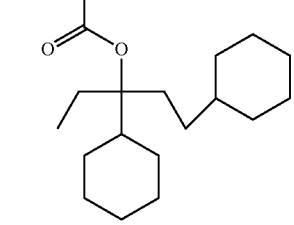
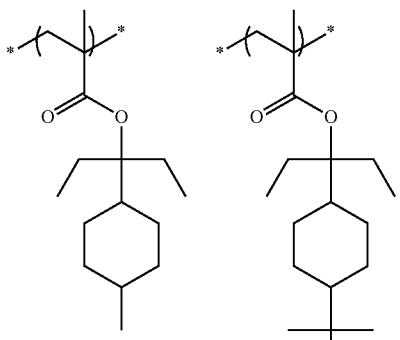
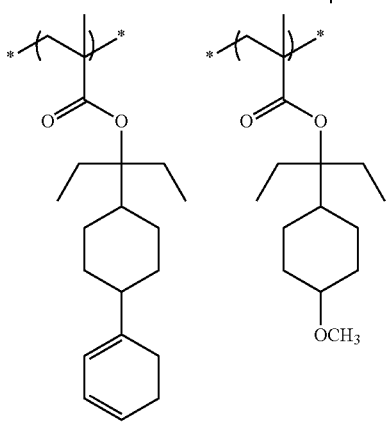

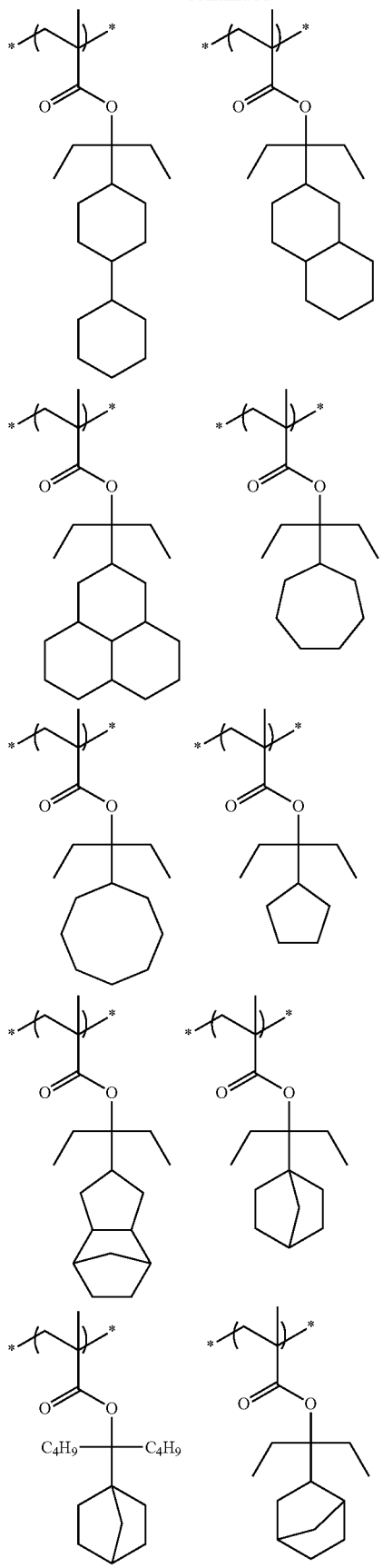
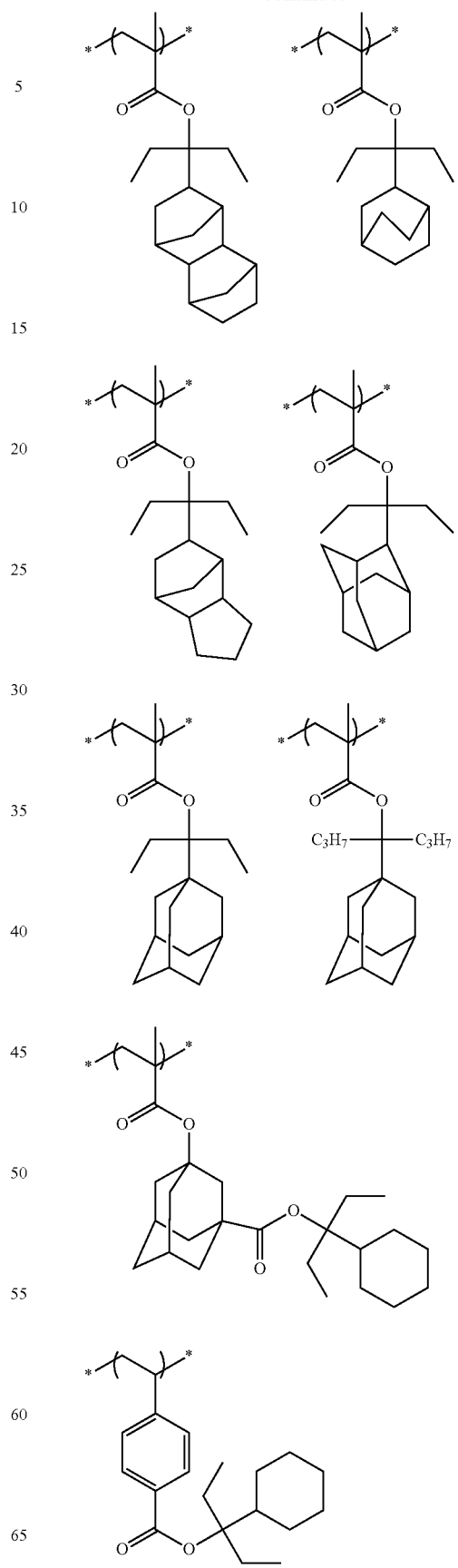

185
-continued
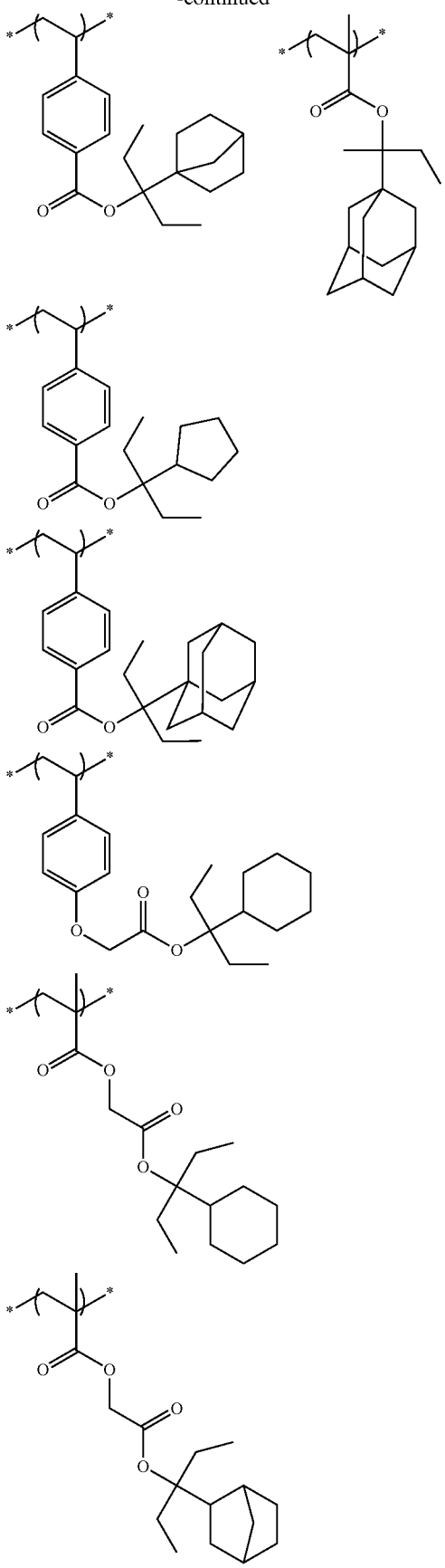
186
-continued
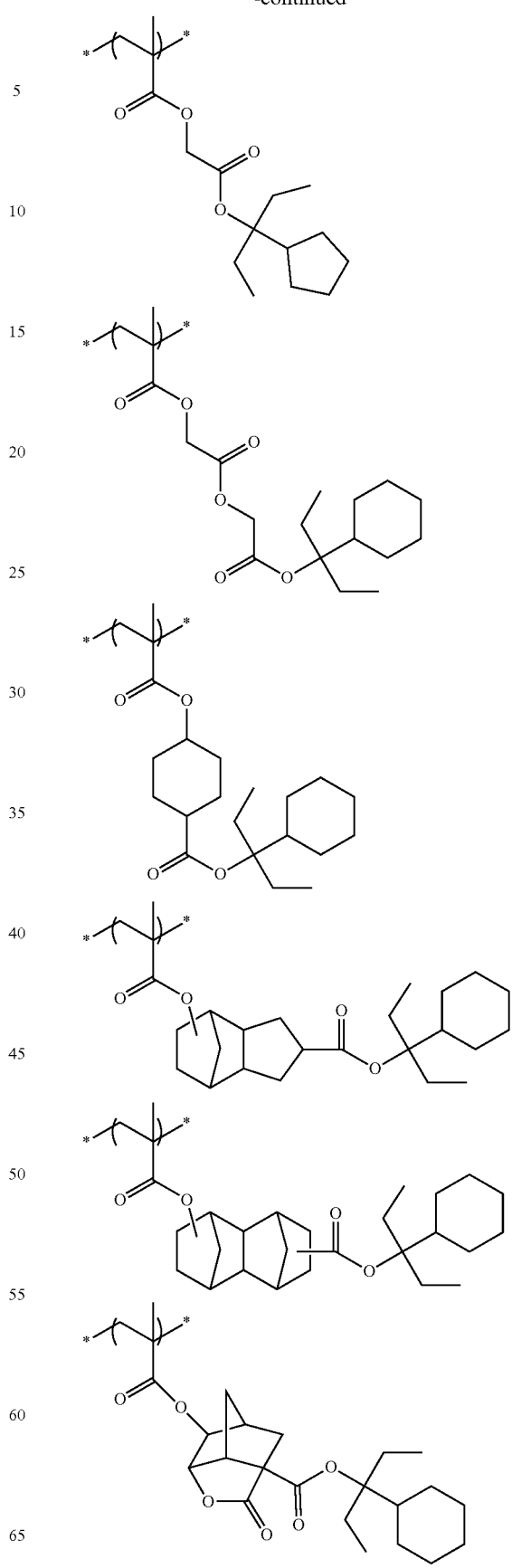

-continued

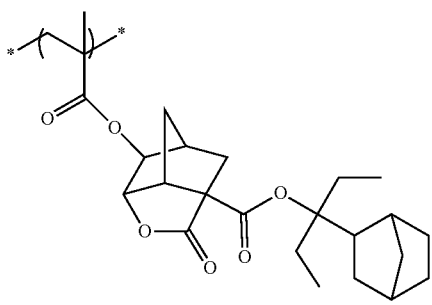

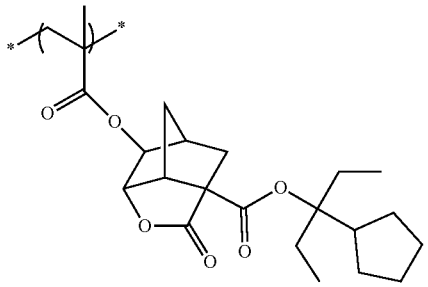

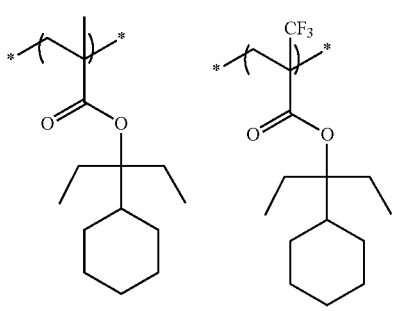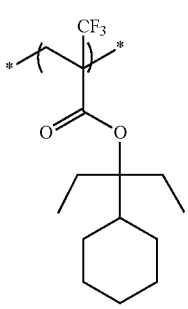

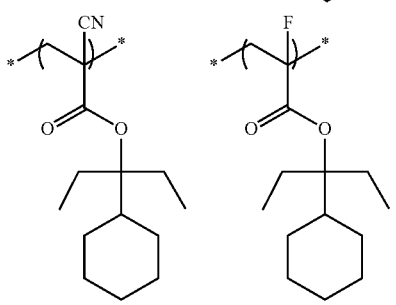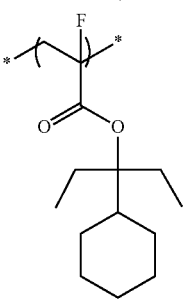

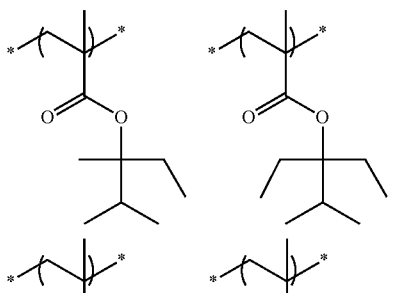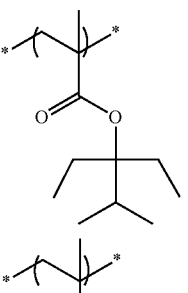

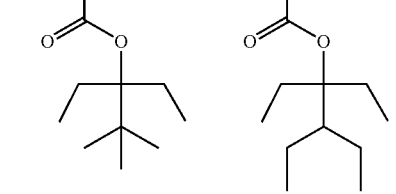

-continued

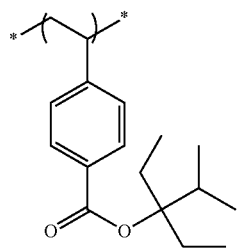 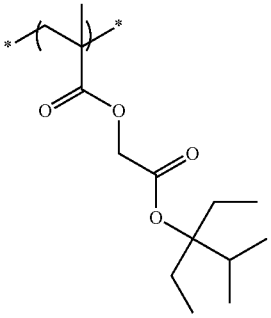

and

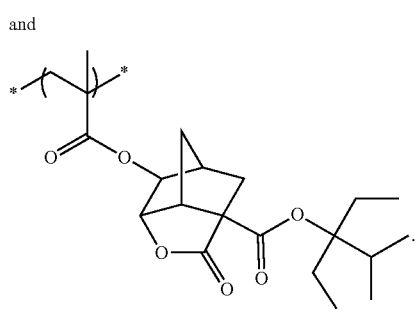

2. The actinic ray-sensitive or radiation-sensitive resin composition according to claim 1,
wherein the content of the resin (B) with respect to the total solid content in the actinic ray-sensitive or radiation-sensitive resin composition is 0.01% to 30% by mass.

3. The actinic ray-sensitive or radiation-sensitive resin composition according to claim 1,
wherein the resin (C) is a resin having a repeating unit represented by General Formula (30),

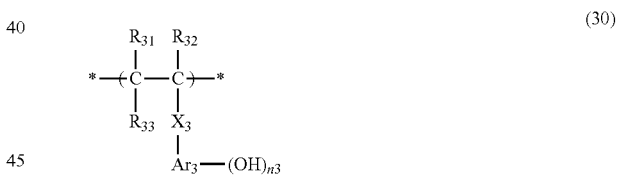

in General Formula (30), $R_{31}$, $R_{32}$, and $R_{33}$ each independently represent a hydrogen atom, an alkyl group, a cycloalkyl group, a halogen atom, a cyano group, or an alkoxycarbonyl group, $R_{33}$ may be bonded to $Ar_3$ to form a ring, and in this case, $R_{33}$ represents an alkylene group, $X_3$ represents a single bond or a divalent linking group, $Ar_3$ represents an (n3+1)-valent aromatic ring group, and in a case where $Ar_3$ is bonded to $R_{33}$ to form a ring, $Ar_3$ represents an (n3+2)-valent aromatic ring group, and n3 represents an integer of 1 to 4.

4. The actinic ray-sensitive or radiation-sensitive resin composition according to claim 1,
wherein the compound (A) is a phenol derivative.

5. The actinic ray-sensitive or radiation-sensitive resin composition according to claim 1,
wherein the compound (A) has a structure represented by General Formula (1),

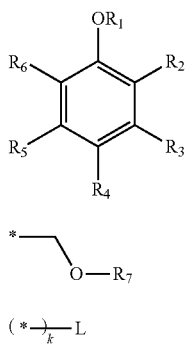

(1)

(2)

(3)

in General Formula (1), $R_1$ to $R_6$ each independently represent a hydrogen atom, an organic group having 1 to 50 carbon atoms, or a bonding moiety to a linking group or a single bond represented by L in General Formula (3), provided that at least one of $R_2$ to $R_6$ is a structure represented by General Formula (2), in General Formula (2), $R_7$ represents a hydrogen atom or an organic group having 1 to 30 carbon atoms, and * represents a bonding moiety in any one of $R_2$ to $R_6$, and in General Formula (3), L represents a linking group or a single bond, * represents a bonding moiety in any one of $R_1$ to $R_6$, and k represents an integer of 2 to 5.

6. The actinic ray-sensitive or radiation-sensitive resin composition according to claim 1, further comprising a compound which generates an acid upon irradiation with actinic rays or radiation.

7. The actinic ray-sensitive or radiation-sensitive resin composition according to claim 6,
wherein the compound which generates an acid upon irradiation with actinic rays or radiation is a sulfonium salt.

8. The actinic ray-sensitive or radiation-sensitive resin composition according to claim 1, further comprising a basic compound whose basicity decreases upon irradiation with actinic rays or radiation, or an ammonium salt compound.

9. An actinic ray-sensitive or radiation-sensitive film formed using the actinic ray-sensitive or radiation-sensitive resin composition according to claim 1.

10. A mask blank comprising the actinic ray-sensitive or radiation-sensitive film according to claim 9.

11. A pattern forming method comprising:
a step of applying the actinic ray-sensitive or radiation-sensitive resin composition according to claim 1 onto a substrate to form a film;
a step of exposing the film; and
a step of developing the exposed film to form a negative tone pattern.

12. The pattern forming method according to claim 11,
wherein the step of exposing the film is a step of exposing the film using electron beams or extreme ultraviolet rays.

13. A method for manufacturing an electronic device, comprising the pattern forming method according to claim 11.

\* \* \* \* \*